US00RE48576E

(19) United States
(12) Reissued Patent
Kimura

(10) Patent Number: US RE48,576 E
(45) Date of Reissued Patent: *Jun. 1, 2021

(54) SEMICONDUCTOR DEVICE AND DRIVING METHOD THEREOF

(71) Applicant: Semiconductor Energy Laboratory Co., Ltd., Atsugi (JP)

(72) Inventor: Hajime Kimura, Kanagawa (JP)

(73) Assignee: Semiconductor Energy Laboratory Co., Ltd., Atsugi (JP)

( * ) Notice: This patent is subject to a terminal disclaimer.

(21) Appl. No.: 16/204,021

(22) Filed: Nov. 29, 2018

Related U.S. Patent Documents

Reissue of:
(64) Patent No.: 9,508,759
Issued: Nov. 29, 2016
Appl. No.: 14/529,237
Filed: Oct. 31, 2014

U.S. Applications:
(63) Continuation of application No. 13/532,171, filed on Jun. 25, 2012, now Pat. No. 8,878,589.

(30) Foreign Application Priority Data

Jun. 30, 2011 (JP) ..... 2011-145262

(51) Int. Cl.
*H01L 29/10* (2006.01)
*H01L 27/12* (2006.01)
(Continued)

(52) U.S. Cl.
CPC ..... *H01L 27/1255* (2013.01); *G09G 3/3233* (2013.01); *H01L 27/1225* (2013.01);
(Continued)

(58) Field of Classification Search
CPC ..... G09G 3/3233; G09G 3/3659; G09G 2300/0852; G09G 2320/045; G09G 2300/0861; H01L 27/1225; H01L 27/1255
See application file for complete search history.

(56) References Cited

U.S. PATENT DOCUMENTS 5,432,477 A * 7/1995 Nishiyama ..... H03G 1/0023 327/563
5,550,066 A 8/1996 Tang et al.
(Continued)

FOREIGN PATENT DOCUMENTS

EP 1003150 A 5/2000
EP 1061497 A 12/2000
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Deandra M Hughes
(74) *Attorney, Agent, or Firm* — Fish & Richardson P.C.

(57) ABSTRACT

To reduce adverse effect of variations in threshold voltage. A semiconductor device includes a transistor including a gate connected to one electrode of a capacitor and one terminal of a SW1, a source and a drain one of which is connected to one terminal of a SW2 and one terminal of a SW3 and the other of which is connected to the other terminal of the SW1 and one terminal of a SW4; a first wiring electrically connected to the other terminal of the SW2; a second wiring electrically connected to the other terminal of the SW4; a load including electrodes one of which is connected to one electrode of the capacitor and the other terminal of the SW3; and a third wiring connected to the other electrode of the load.

7 Claims, 99 Drawing Sheets

(51) Int. Cl.
*G09G 3/32* (2016.01)
*G09G 3/36* (2006.01)
*G09G 3/3233* (2016.01)

(52) U.S. Cl.
CPC ... *G09G 3/3659* (2013.01); *G09G 2300/0819* (2013.01); *G09G 2300/0852* (2013.01); *G09G 2300/0861* (2013.01); *G09G 2320/045* (2013.01)

(56) References Cited

U.S. PATENT DOCUMENTS 5,731,856 A 3/1998 Kim et al.
5,744,864 A 4/1998 Cillessen et al.
5,872,473 A * 2/1999 Williams ..... H03K 19/018571 327/108
5,949,259 A * 9/1999 Garcia ..... H03F 3/3001 326/26
6,048,573 A 4/2000 Tang et al.
6,229,506 B1 5/2001 Dawson et al.
6,294,274 B1 9/2001 Kawazoe et al.
6,362,798 B1 3/2002 Kimura et al.
6,448,836 B2 * 9/2002 Kokubun ..... H03F 3/45753 327/307
6,563,174 B2 5/2003 Kawasaki et al.
6,583,775 B1 6/2003 Sekiya et al. ..... G09G 3/2081 345/76
6,611,130 B2 8/2003 Chang
6,727,522 B1 4/2004 Kawasaki et al.
6,750,833 B2 6/2004 Kasai
6,859,193 B1 2/2005 Yumoto ..... G09G 3/325 345/82
6,873,216 B2 * 3/2005 Seya ..... H03K 5/1254 327/379
6,891,356 B2 5/2005 Kimura et al.
6,909,242 B2 6/2005 Kimura
7,015,884 B2 3/2006 Kwon
7,049,190 B2 5/2006 Takeda et al.
7,061,014 B2 6/2006 Hosono et al.
7,064,346 B2 6/2006 Kawasaki et al.
7,105,868 B2 9/2006 Nause et al.
7,106,125 B1 * 9/2006 Drapkin ..... H04L 25/0278 327/379
7,145,532 B2 12/2006 Kageyama et al.
7,173,584 B2 2/2007 Kimura et al.
7,211,825 B2 5/2007 Shih et al
7,253,665 B2 8/2007 Kimura ..... G09G 3/325 315/169.1
7,282,782 B2 10/2007 Hoffman et al.
7,297,977 B2 11/2007 Hoffman et al.
7,323,356 B2 1/2008 Hosono et al.
7,324,101 B2 1/2008 Miyazawa
7,365,713 B2 4/2008 Kimura
7,385,224 B2 6/2008 Ishii et al.
7,402,506 B2 7/2008 Levy et al.
7,411,209 B2 8/2008 Endo et al.
7,429,985 B2 9/2008 Kimura et al.
7,453,065 B2 11/2008 Saito et al.
7,453,087 B2 11/2008 Iwasaki
7,456,810 B2 11/2008 Kimura
7,462,862 B2 12/2008 Hoffman et al.
7,468,304 B2 12/2008 Kaji et al.
7,501,293 B2 3/2009 Ito et al.
7,542,019 B2 6/2009 Park et al.
7,554,362 B2 6/2009 Kimura ..... G09G 3/3241 326/68
7,671,826 B2 3/2010 Kimura ..... H01L 27/15 345/76
7,674,650 B2 3/2010 Akimoto et al.
7,679,585 B2 3/2010 Kimura ..... G09G 3/3233 345/76
7,732,819 B2 6/2010 Akimoto et al.
7,911,233 B2 3/2011 Kimura
7,924,244 B2 4/2011 Kimura et al. ..... G09G 3/30 345/76
8,299,821 B2 * 10/2012 Chen ..... G09G 3/3677 326/21
8,325,111 B2 12/2012 Kimura
8,334,825 B2 12/2012 Kim
8,368,427 B2 2/2013 Kimura
8,723,550 B2 5/2014 Kimura
8,803,768 B2 8/2014 Kimura et al. ..... G09G 3/3233 345/76
9,257,082 B2 2/2016 Kimura et al.
2001/0046027 A1 11/2001 Tai et al.
2002/0056838 A1 5/2002 Ogawa
2002/0070913 A1 6/2002 Kimura et al.
2002/0132454 A1 9/2002 Ohtsu et al.
2003/0090481 A1 5/2003 Kimura
2003/0189401 A1 10/2003 Kido et al.
2003/0218222 A1 11/2003 Wager, III et al.
2004/0038446 A1 2/2004 Takeda et al.
2004/0127038 A1 7/2004 Carcia et al.
2005/0017302 A1 1/2005 Hoffman
2005/0199959 A1 9/2005 Chiang et al.
2006/0035452 A1 2/2006 Carcia et al.
2006/0043377 A1 3/2006 Hoffman et al.
2006/0091793 A1 5/2006 Baude et al.
2006/0108529 A1 5/2006 Saito et al.
2006/0108636 A1 5/2006 Sano et al.
2006/0110867 A1 5/2006 Yabuta et al.
2006/0113536 A1 6/2006 Kumomi et al.
2006/0113539 A1 6/2006 Sano et al.
2006/0113549 A1 6/2006 Den et al.
2006/0113565 A1 6/2006 Abe et al.
2006/0169973 A1 8/2006 Isa et al.
2006/0170111 A1 8/2006 Isa et al. ..... H01L 21/288 257/775
2006/0197092 A1 9/2006 Hoffman et al.
2006/0208977 A1 9/2006 Kimura ..... G09G 3/3291 345/76
2006/0228974 A1 10/2006 Thelss et al.
2006/0231882 A1 10/2006 Kim et al.
2006/0238135 A1 10/2006 Kimura
2006/0244107 A1 11/2006 Sugihara et al.
2006/0256047 A1 11/2006 Kimura et al.
2006/0284171 A1 12/2006 Levy et al.
2006/0284172 A1 12/2006 Ishii
2006/0290617 A1 12/2006 Miyazawa
2006/0292777 A1 12/2006 Dunbar
2007/0018917 A1 1/2007 Miyazawa
2007/0024187 A1 2/2007 Shin et al.
2007/0046191 A1 3/2007 Saito
2007/0052025 A1 3/2007 Yabuta
2007/0054507 A1 3/2007 Kaji et al.
2007/0090365 A1 4/2007 Hayashi et al.
2007/0108446 A1 5/2007 Akimoto
2007/0126664 A1 6/2007 Kimura ..... H01L 27/15 345/76
2007/0152217 A1 7/2007 Lai et al.
2007/0172591 A1 7/2007 Seo et al.
2007/0187678 A1 8/2007 Hirao et al.
2007/0187760 A1 8/2007 Furuta et al.
2007/0194379 A1 8/2007 Hosono et al.
2007/0252928 A1 11/2007 Ito et al.
2007/0272922 A1 11/2007 Kim et al.
2007/0287296 A1 12/2007 Chang
2008/0006877 A1 1/2008 Mardilovich et al.
2008/0038882 A1 2/2008 Takechi et al.
2008/0038929 A1 2/2008 Chang
2008/0050595 A1 2/2008 Nakagawara et al.
2008/0073653 A1 3/2008 Iwasaki
2008/0083950 A1 4/2008 Pan et al.
2008/0106191 A1 5/2008 Kawase
2008/0128689 A1 6/2008 Lee et al.
2008/0129195 A1 6/2008 Ishizaki et al.
2008/0166834 A1 7/2008 Kim et al.
2008/0182358 A1 7/2008 Cowdery-Corvan et al.
2008/0224133 A1 9/2008 Park et al.
2008/0225061 A1 9/2008 Kimura et al.
2008/0254569 A1 10/2008 Hoffman et al.
2008/0258139 A1 10/2008 Ito et al.

(56) References Cited

U.S. PATENT DOCUMENTS

| | | | | |
|---|---|---|---|---|
| 2008/0258140 | A1 | 10/2008 | Lee et al. | |
| 2008/0258141 | A1 | 10/2008 | Park et al. | |
| 2008/0258143 | A1 | 10/2008 | Kim et al. | |
| 2008/0296568 | A1 | 12/2008 | Ryu et al. | |
| 2008/0316152 | A1 | 12/2008 | Kimura et al. | |
| 2009/0009676 | A1 | 1/2009 | Kimura et al. | |
| 2009/0051674 | A1 | 2/2009 | Kimura et al. | G09G 3/3291 345/204 |
| 2009/0068773 | A1 | 3/2009 | Lai et al. | |
| 2009/0073325 | A1 | 3/2009 | Kuwabara et al. | |
| 2009/0114910 | A1 | 5/2009 | Chang | |
| 2009/0134399 | A1 | 5/2009 | Sakakura et al. | |
| 2009/0152506 | A1 | 6/2009 | Umeda et al. | |
| 2009/0152541 | A1 | 6/2009 | Maekawa et al. | |
| 2009/0225010 | A1 | 9/2009 | Kimura | G09G 3/3233 345/76 |
| 2009/0278122 | A1 | 11/2009 | Hosono et al. | |
| 2009/0280600 | A1 | 11/2009 | Hosono et al. | |
| 2009/0322716 | A1* | 12/2009 | Azami | H03K 19/01714 345/204 |
| 2010/0065844 | A1 | 3/2010 | Tokunaga | |
| 2010/0092800 | A1 | 4/2010 | Itagaki et al. | |
| 2010/0109002 | A1 | 5/2010 | Itagaki et al. | |
| 2010/0220092 | A1 | 9/2010 | Kimura | G09G 3/22 345/213 |
| 2010/0220117 | A1 | 9/2010 | Kimura | G09G 3/3233 345/690 |
| 2010/0271111 | A1* | 10/2010 | Jinta | H03K 19/017 327/530 |
| 2011/0204928 | A1* | 8/2011 | Umezaki | H01L 27/1225 327/109 |
| 2011/0205144 | A1 | 8/2011 | Kimura et al. | G09G 3/3225 345/92 |
| 2012/0050252 | A1 | 3/2012 | Akimoto et al. | |
| 2013/0003269 | A1* | 1/2013 | Kimura | G09G 3/3233 361/679.01 |
| 2014/0079176 | A1* | 3/2014 | Qian | G11C 19/28 377/77 |
| 2014/0110731 | A1* | 4/2014 | Umezaki | H03K 3/356 257/88 |
| 2014/0346506 | A1 | 11/2014 | Kimura et al. | |

FOREIGN PATENT DOCUMENTS

| | | | |
|---|---|---|---|
| EP | 1220191 | A | 7/2002 |
| EP | 1594116 | A | 11/2005 |
| EP | 1610292 | A | 12/2005 |
| EP | 1737044 | A | 12/2006 |
| EP | 1744299 | A | 1/2007 |
| EP | 1918904 | A | 5/2008 |
| EP | 1968038 | A | 9/2008 |
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 09-081053 | A | 3/1997 |
| JP | 11-505377 | | 5/1999 |
| JP | 11-272233 | A | 10/1999 |
| JP | 2000-044236 | A | 2/2000 |
| JP | 2000-150900 | A | 5/2000 |
| JP | 2000-259098 | A | 9/2000 |
| JP | 2001-060076 | A | 3/2001 |
| JP | 2002-076356 | A | 3/2002 |
| JP | 2002-215096 | A | 7/2002 |
| JP | 2002-289859 | A | 10/2002 |
| JP | 2003-086000 | A | 3/2003 |
| JP | 2003-086808 | A | 3/2003 |
| JP | 2003-195810 | A | 7/2003 |
| JP | 2003-202833 | A | 7/2003 |
| JP | 2003-330416 | A | 11/2003 |
| JP | 2004-103957 | A | 4/2004 |
| JP | 2004-145278 | A | 5/2004 |
| JP | 2004-273614 | A | 9/2004 |
| JP | 2004-273732 | A | 9/2004 |
| JP | 2006-039527 | A | 2/2006 |
| JP | 2006-146153 | A | 6/2006 |
| JP | 2007-025192 | A | 2/2007 |
| JP | 2008-033364 | A | 2/2008 |
| JP | 2008-134625 | A | 6/2008 |
| JP | 2008-165159 | A | 7/2008 |
| JP | 2008-216962 | A | 9/2008 |
| JP | 2010-188584 | A | 9/2010 |
| JP | 2012-047894 | A | 3/2012 |
| KR | 2007-0003671 | A | 1/2007 |
| KR | 2007-0058320 | A | 6/2007 |
| KR | 2011-0025604 | A | 3/2011 |
| WO | WO-1998/048403 | | 10/1998 |
| WO | WO-1999/048078 | | 9/1999 |
| WO | WO-2004/114391 | | 12/2004 |

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Nowatari.H et al., "60.2: Intermediate Connector With Suppressed Voltage Loss for White Tandem OLEDs", SID Digest '09 : SID International Symposium Digest of Technical Papers, May 31, 2009. vol. 40, pp. 899-902.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of the Technical Papers, May 20, 2008, vol. 39, pp. 633-636.

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Goh.J et al., "P-72:A Novel Pixel Circuit for Active-Matrix Organic Light-Emitting Diodes", SID Digest '03 : SID International Symposium Digest of Technical Papers, 2003, vol. 34, pp. 494-497.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 23, pp. 181-184.

Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 84, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) ,2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Sumposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

In

Sn

Zn

O

In

Ga

Zn

O

SEMICONDUCTOR DEVICE AND DRIVING METHOD THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This application is a continuation of U.S. application Ser. No. 13/532,171, filed Jun. 25, 2012, now allowed, which claims the benefit of a foreign priority application filed in Japan as Serial No. 2011-145262 on Jun. 30, 2011, both of which are incorporated by reference.]

*This application is a Reissue application of U.S. application Ser. No. 14/529,237, filed Oct. 31, 2014, now U.S. Pat. No. 9,508,759, issued Nov. 29, 2016, which is a continuation of U.S. application Ser. No. 13/532,171, filed Jun. 25, 2012, now U.S. Pat. No. 8,878,589, issued Nov. 4, 2014, and claims the benefit of a foreign priority application filed in Japan as Serial No. 2011-145262 on Jun. 30, 2011. This application claims priority to each of these prior applications, and the disclosures of the prior applications are considered part of (and are incorporated by reference in) the disclosure of this application.*

BACKGROUND OF THE INVENTION

1. Field of the Invention

The present invention relates to semiconductor devices, display devices, light-emitting devices, methods for manufacturing these devices, and method for driving these devices. In particular, the present invention relates to a display device including a current-driving-type light-emitting element which changes in luminance depending on current. The present invention relates to an electronic device including the display device.

2. Description of the Related Art

In recent years, flat panel displays such as liquid crystal displays (LCDs) are becoming widespread. Researches on the display (ELD) including an organic EL element, which is not an LCD are actively carried out (Patent Document 1). The organic EL is a current-driving-type light-emitting element changing in luminance depending on current and also referred to as an electroluminescent element, an organic light-emitting diode, an OLED, or the like. For example, methods for correcting variations in threshold voltage of transistors have been examined (see Patent Document 1).

REFERENCE

[Patent Document 1] Japanese Published Patent Application No. 2003-195810.

SUMMARY OF THE INVENTION

It is an object of one embodiment of the present invention to provide a structure with which adverse effect of variations in threshold voltage of transistors can be reduced. Alternatively, it is an object of one embodiment of the present invention to provide a novel structure with which adverse effect of variations in mobility of transistors can be reduced.

Alternatively, it is an object of one embodiment of the present invention to provide a novel structure with which adverse effect of deterioration of a transistor can be reduced. Alternatively, it is an object of one embodiment of the present invention to provide a novel structure with which adverse effect of deterioration of a display element can be reduced. Alternatively, it is an object of one embodiment of the present invention to provide a novel structure with which display unevenness can be reduced. Alternatively, it is an object of one embodiment of the present invention to provide a novel structure with which an image can be displayed with high display quality. Alternatively, it is an object of one embodiment of the present invention to provide a structure which can achieve a desired circuit with a small number of transistors. Alternatively, it is an object of one embodiment of the present invention to provide a structure which can achieve a desired circuit with a small number of wirings.

Note that the descriptions of these problems do not disturb the existence of other problems. Note that in one embodiment of the present invention, there is no need to achieve all the objects. Other objects will be apparent from and can be derived from the description of the specification, the drawings, the claims, and the like.

One embodiment of the present invention is a semiconductor device which includes a transistor including a gate electrically connected to one of electrodes of a capacitor and one of terminals of a first switch, a source and a drain one of which is electrically connected to one of terminals of a second switch and one of terminals of a third switch and the other of which is electrically connected to the other of the terminals of the first switch and one of terminals of a fourth switch; a first wiring electrically connected to the other of the terminals of the second switch; a second wiring electrically connected to the other of the terminals of the fourth switch, a load including electrodes one of which is electrically connected to the one of the electrodes of the capacitor and the other of the terminals of the third switch; and a third wiring connected to the other of the electrodes of the load. The first wiring is electrically connected to a circuit having a function of supplying a first potential and a second potential. The second wiring is electrically connected to a circuit having a function of supplying a third potential. The third wiring is electrically connected to a circuit having a function of supplying a fourth potential. The first potential is lower than the fourth potential. The second potential is used for controlling the amount of current flowing between the second wiring supplied with the third potential and the third wiring supplied with the fourth potential by the transistor.

One embodiment of the present invention is a semiconductor device which includes a transistor including a gate electrically connected to one of electrodes of a capacitor and one of terminals of a first switch, a source and a drain one of which is electrically connected to one of terminals of a second switch and one of terminals of a third switch and the other of which is electrically connected to the other of the terminals of the first switch and one of terminals of a fourth switch; a first wiring electrically connected to the other of the terminals of the second switch; a second wiring electrically connected to the other of the terminals of the fourth switch, a load including electrodes one of which is electrically connected to the one of the electrodes of the capacitor and the other of the terminals of the third switch; and a third wiring connected to the other of the electrodes of the load. The first wiring is electrically connected to a circuit having a function of supplying a first potential. The second wiring is electrically connected to a circuit having a function of supplying a second potential and a third potential. The third wiring is electrically connected to a circuit having a function of supplying a fourth potential. The second potential is lower than the fourth potential. The first potential is used for controlling the amount of current flowing between the second wiring supplied with the third potential and the third wiring supplied with the fourth potential by the transistor.

One embodiment of the present invention is a semiconductor device which includes a transistor including a gate electrically connected to one of electrodes of a capacitor and one of terminals of a first switch, a source and a drain one of which is electrically connected to one of terminals of a second switch, one of terminals of a third switch, and one of terminals of a fourth switch and the other of which is electrically connected to the other of the terminals of the first switch and one of terminals of a fifth switch; a first wiring electrically connected to the other of the terminals of the second switch; a second wiring electrically connected to the other of the terminals of the fourth switch; a third wiring electrically connected to the other of the terminals of the fifth switch; a load including electrodes one of which is electrically connected to the one of the electrodes of the capacitor and the other of the terminals of the third switch; and a fourth wiring connected to the other of the electrodes of the load. The first wiring is electrically connected to a circuit having a function of supplying a first potential. The second wiring is electrically connected to a circuit having a function of supplying a second potential. The third wiring is electrically connected to a circuit having a function of supplying a third potential. The fourth wiring is electrically connected to a circuit having a function of supplying a fourth potential. The second potential is lower than the fourth potential. The first potential is used for controlling the amount of current flowing between the third wiring supplying the third potential and the fourth wiring supplying the fourth potential by the transistor.

In the semiconductor device according to one embodiment of the present invention, the switches are transistors.

In the semiconductor device according to one embodiment of the present invention, the switches are transistors and the transistors have the same polarity.

In the semiconductor device according to one embodiment of the present invention, the load is preferably the display element with a rectification property.

In one embodiment of the present invention, adverse effect of variations in threshold voltage of transistors can be reduced. Alternatively, according to one embodiment of the present invention, adverse effect of variations in mobility of transistors can be reduced. Alternatively, according to one embodiment of the present invention, adverse effect of deterioration of a transistor can be reduced. Alternatively, according to one embodiment of the present invention, adverse effect of deterioration of a display element can be reduced. Alternatively, according to one embodiment of the present invention, display unevenness can be reduced. Alternatively, according to one embodiment of the present invention, an image can be displayed with high display quality. Alternatively, according to one embodiment of the present invention, a desired circuit with a small number of transistors can be achieved. Alternatively, according to one embodiment of the present invention, a desired circuit with a small number of wirings can be achieved. Alternatively, one embodiment of the present invention can be manufactured through a small number of steps.

DETAILED DESCRIPTION OF THE INVENTION

Figure 1B:
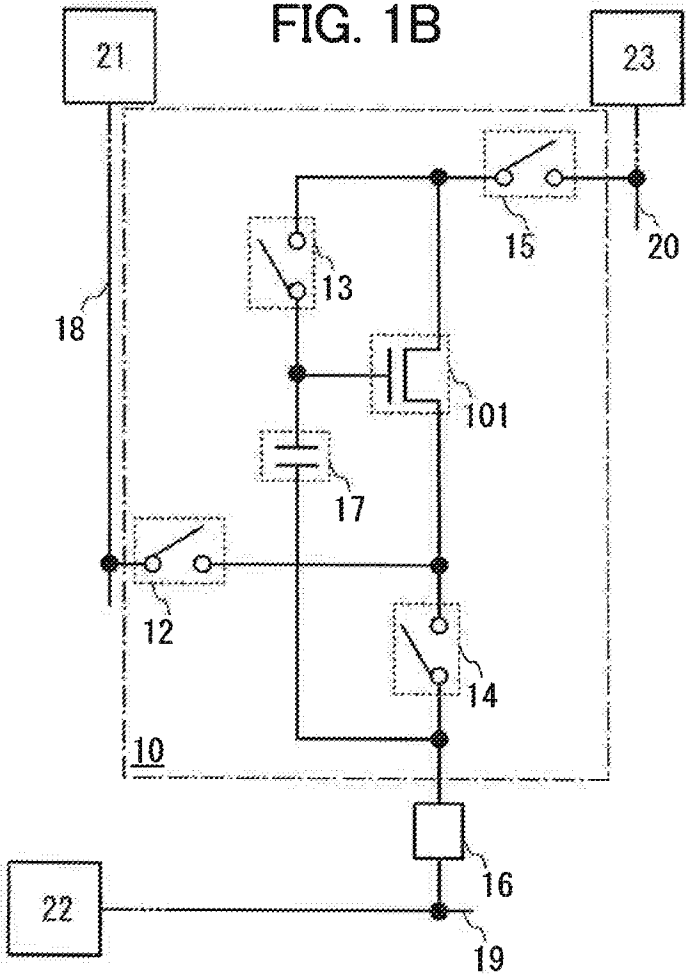
FIGS. 1A and 1B are circuit diagrams each illustrating an example of a circuit of one embodiment of the present invention.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below. Note that in the structures described below, the same portions or portions having similar functions are denoted by the same reference numerals in common in different drawings and repetitive description thereof will be omitted.

Note that what is described (or part thereof) in one embodiment can be applied to, combined with, or exchanged with another content in the same embodiment and/or what is described (or part thereof) in another embodiment or other embodiments.

Note that the structure of a diagram (or part of the diagram) illustrated in one embodiment can be combined with the structure of another part of the diagram, the structure of a different diagram (or part of the different diagram) illustrated in the embodiment, and/or the structure of a diagram (or part of the diagram) illustrated in one or more different embodiments.

Note that the size, the thickness, or regions in diagrams are sometimes exaggerated for simplicity. Thus, one aspect of one embodiment of the present invention is not limited to such scales. Alternatively, the drawings are perspective views of ideal examples. Thus, one aspect of one embodiment of the present invention is not limited to shapes and the like illustrated in the drawings. For example, the drawings can include variations in shape due to a manufacturing technique or dimensional deviation.

Note that an explicit description "X and Y are connected" indicates the case where X and Y are electrically connected, the case where X and Y are connected in terms of the function, the case where X and Y are directly connected, or the like. Here, each of X and Y denotes an object (e.g., a device, an element, a circuit, a wiring, an electrode, a terminal, a conductive film, a layer, or the like). Accordingly, another connection relation shown in drawings and texts is included without being limited to a predetermined connection relation, for example, the connection relation shown in the drawings and the texts.

For example, in the case where X and Y are electrically connected, one or more elements which enable electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, the switch has a function of determining whether current flows or not by being turning on or off (becoming an on state and an off state). Alternatively, the switch has a function of determining and changing a current path. For example, the switch has a function of determining whether current flows through a current path 1 or a current path 2 and switching the paths.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that an explicit expression "X and Y are electrically connected" means that X and Y are electrically connected, X and Y are functionally connected, and X and Y are directly connected. That is, when it is explicitly described that "A and B are electrically connected", the description is the same as the case where it is explicitly only described that "A and B are connected".

Note that even when independent components are electrically connected to each other in a circuit diagram, there is the case where one conductive layer has functions of a plurality of components (e.g., a wiring and an electrode), such as the case where part of a wiring functions as an electrode. The expression "electrically connected" in this specification also means that one conductive layer has functions of a plurality of components.

Note that it might be possible for those skilled in the art to constitute one embodiment of the invention even when portions to which all terminals of an active element (e.g., a transistor or a diode), a passive element (e.g., a capacitor or a resistor), or the like are connected are not specified. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that it might be possible for those skilled in the art to specify the invention when at least a connection portion of a circuit is specified. Alternatively, it might be possible for those skilled in the art to specify the invention when at least a function of a circuit is specified. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that various people can implement the present invention described in this specification and the like. However, different people may implement the present invention in a joint effort with each other. For example, when an invention relating to a transmission/reception system is impremented, Company A manufactures and sells transmitting devices, and Company B manufactures and sells receiving devices, in some cases. As another example, when an invention relating to a light emitting device including TFTs and light-emitting elements is impremented, Company A manufactures and sells semiconductor devices including TFTs and Company B buys the semiconductor devices, deposits light-emitting elements to the semiconductor devices, and completes light emitting devices, in some cases.

In such a case, with one embodiment of the present invention, a person can file a patent infringement suit against Company A and Company B. That is, one embodiment of the present invention with which a person can file a patent infringement suit against Company A and Company B is clear and regarded as being described in this specification or the like. For example, in the case of a transmission/reception system, one embodiment of the present invention can be constituted of only a transmitting device and can be constituted of only a receiving device. The embodiment of the present invention is clear and regarded as being described in this specification or the like. As another example, in the case of a light emitting device including a TFT and a light-emitting element, one embodiment of the present invention can be constituted of only a semiconductor device including a TFT and can be constituted of only a light emitting device including a TFT and a light-emitting element. The embodiment of the present invention is clear and regarded as being described in this specification or the like.

The invention excluding content which is not specified in the drawings and texts in this specification can be constituted. Alternatively, when the range of a value (e.g., the maximum and minimum values) is described, part of the range is arbitrarily shortened and part of the range is removed, so that an invention can be specified by a range part of which is removed from the number range. In this manner, it is possible to specify the scope of the present invention so that a conventional technology is excluded, for example.

As a specific example, a diagram of a circuit including a first transistor to a fifth transistor is illustrated. In that case, it can be specified that a circuit of an invention does not include a sixth transistor. Alternatively, it can be specified that a circuit of an invention does not include a capacitor. Further alternatively, it can be specified that a circuit of an invention does not include a sixth transistor with a particular connection relation. Still alternatively, it can be specified that a circuit of an invention does not include a capacitor with a particular connection relation. For example, it can be specified that a circuit of an invention does not include the sixth transistor whose gate is connected to a gate of the third transistor. Alternatively, it can be specified that a circuit of an invention does not include the capacitor whose first electrode is connected to the gate of the third transistor.

As another specific example, a description says that "a voltage is preferably higher than or equal to 3 V and lower than or equal to 10 V". In that case, for example, it can be specified that an invention excludes the case where the voltage is higher than or equal to −2 V and lower than or equal to 1 V. Alternatively, for example, it can be specified that an invention excludes the case where the voltage is higher than or equal to 13 V. Note that for example, it can be specified that in an invention, the voltage is higher than or equal to 5 V and lower than or equal to 8 V. Note that for example, it can be specified that in an invention, the voltage is approximately 9 V. Note that for example, it can be specified that in an invention, the voltage is higher than or equal to 3 V and lower than 9 V and higher than 9V and lower than or equal to 10 V.

As another specific example, a description says that "a voltage is preferably 10 V". In that case, for example, it can be specified that an invention excludes the case where the voltage is higher than or equal to −2 V and lower than or equal to 1 V. Alternatively, for example, it can be specified that an invention excludes the case where the voltage is higher than or equal to 13 V.

As another specific example, a description says about a property of a film that "the film is an insulating film". In that case, for example, it can be specified that in an invention, the insulating film is not an organic insulating film. Alternatively, for example, it can be specified that in an invention, the insulating film is not an organic insulating film.

As another specific example, a description says about a stacked structure that "a film is provided between A and B". In that case, for example, it can be specified that in an invention, the film is not a stacked film of four or more layers. Alternatively, for example, it can be specified that in an invention, a conductive film is not provided between A and the film.

Embodiment 1

An embodiment of the present invention can be used for not only a pixel including a light-emitting element but also a variety of analog circuits functioning as current sources. First, in this embodiment, examples of a basic principle of a circuit disclosed in the present invention is described.

Figure 1A:
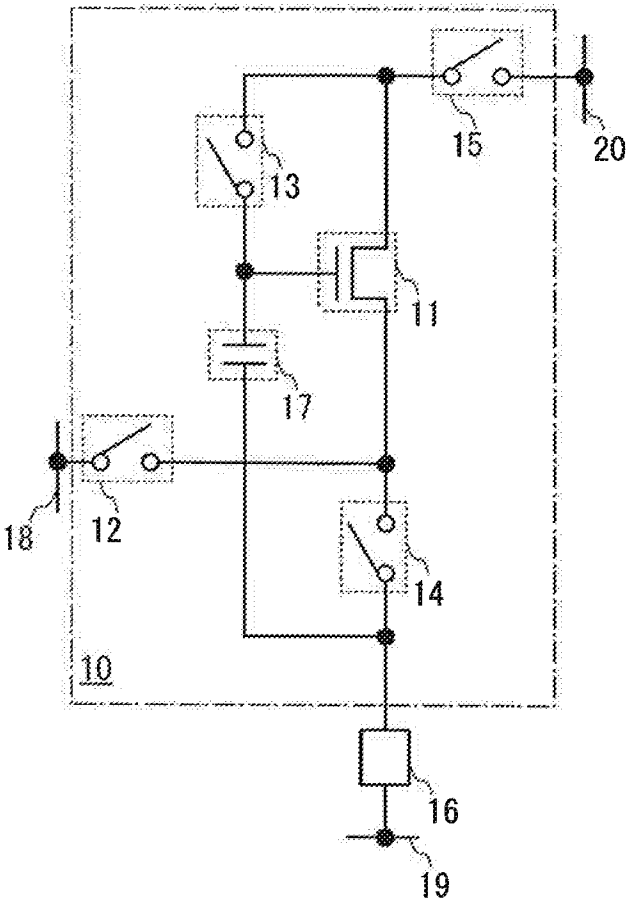

First, FIG. 1A illustrates a circuit configuration of one embodiment of the present invention. A semiconductor device 10 functions as at least a current source, for example. Accordingly, for example, the semiconductor device 10 has a function of supplying a constant current even when the level of voltage applied to a wiring 20 and terminals of a load 16 is changed. For example, the semiconductor device 10 can supply a constant current to the load 16 even when the potential of the load 16 is changed.

Note that there is a voltage source as a power source different from a current source. The voltage source has a function of supplying a constant voltage even when current flowing through a circuit connected to the voltage source is changed. Accordingly, the voltage source and the current source both have a similar function. However, the voltage source and the current source are different. Specifically, the voltage source and the current source are different in what they supply, which is voltage or current. Further, the voltage source and the current source are different. Specifically, the voltage source and the current source are different in parameter, change of which enables the voltage source or the current source to supply voltage or current. The current source has a function of supplying a constant current event when voltage between both ends is changed. The voltage source has a function of supplying a constant voltage even when current is changed.

The circuit configuration illustrated in FIG. 1A has a circuit for discharging electric charge held in a gate of a transistor in order to correct variations in current characteristics due to variations in threshold voltage of the transistor or the like. In practice, the circuit has a connection relation so that variations in current characteristics of the transistor can be corrected by controlling the switching of a plurality of switches provided between wirings.

The semiconductor device 10 illustrated in FIG. 1A includes a switch 12, a switch 13, a switch 14, a switch 15, a capacitor 17, and a transistor 11 which allows the semiconductor device 10 to operate as a current source. The semiconductor device 10 is connected to the load 16, a wiring 18, and the wiring 20. The load 16 is connected to a wiring 19. Note that in this embodiment, the transistor 11 which allows the semiconductor device to operate as a current source is an n-channel transistor, for example.

Next, a connection relation of components of the semiconductor device 10 is described.

A gate of the transistor 11 is connected to one of electrodes (terminals) of the capacitor 17 and one of terminals of the switch 13. A first terminal (one of a source and a drain) of the transistor 11 is connected to one of terminals of the switch 12 and one of terminals of the switch 14. A second terminal (the other of the source and the drain) of the transistor 11 is connected to the other of the terminals of the switch 13 and one of terminals of the switch 15. Note that one of terminals is also referred to as a first terminal and the other of the terminals is also referred to as a second terminal.

The other of the terminals of the switch 12 is connected to the wiring 18.

The other of the terminals of the switch 15 is connected to the wiring 20.

One of terminals of the load 16 is connected to the other of the terminals of the switch 14 and the other of the electrodes (terminals) of the capacitor 17. The other of the terminals of the load 16 is connected to the wiring 19.

Note that in this specification, a semiconductor device means any device which can function by utilizing semiconductor characteristics; a light emitting device, a display device, a semiconductor circuit, and an electronic device are included as examples of the semiconductor device in some cases.

Note that in this specification, a load means an object having a rectifying property, an object having a capacitive property, an object having a resistive property, a circuit including a switch, a pixel circuit, or the like. For example, the object having a rectifying property has current-voltage characteristics showing different resistance values based on the direction of an applied bias, and has an electric property which allows current to flow only in one direction. In the circuit configuration illustrated in FIG. 1A, for example, the load 16 is provided so that current flows from the transistor 11 to the wiring 19.

Alternatively, other examples of the load 16 are a display element (liquid crystal element), a light-emitting element (an EL element), and part of a display element or a light-emitting element (e.g., a pixel electrode, an anode electrode, and a cathode electrode).

Note that a transistor is an element having at least three terminals: a gate, a drain, and a source. In addition, the transistor has a channel region between a drain (drain terminal, a drain region, or a drain electrode) and a source (source terminal, a source region, or a source electrode), and current can flow through the drain, the channel region, and the source. Here, since the source and the drain of the transistor may change depending on the structure, the operating condition, and the like of the transistor, it is difficult to define which is a source or a drain. Therefore, in this document (the specification, the claims, the drawings, and the like), a region functioning as a source and a drain is not called the source or the drain in some cases. In such a case, for example, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a first region and the other thereof may be referred to as a second region. Still alternatively, one of the source and the drain may be referred to as a source region and the other thereof may be called a drain region.

Note that terms such as "first", "second", "third", and the like are used for distinguishing various elements, members, regions, layers, and areas from others. Therefore, the terms such as "first", "second", "third", and the like do not limit the number of the elements, members, regions, layers, areas, or the like. Further, for example, "first" can be replaced with "second", "third", or the like.

Note that the switch has a function of operating by bringing terminals into a conduction state (ON) or a non-conduction state (OFF) and a function of determining whether or not current flows. The switch can be an electrical switch, a mechanical switch, or the like. For example, the switch can be formed using a transistor, a diode, and a micro electro mechanical system (MEMS) technology similarly to a digital micromirror device (DMD). Alternatively, the switch may be a logic circuit in which transistors are combined. Note that in the case of using a transistor, a polarity (conductivity type) thereof is not particularly limited. Note that a transistor having a low off-state current is preferably used and a configuration in which the transistor has an appropriate polarity in accordance with an input potential is preferable.

Examples of a transistor with lower off-state current are a transistor provided with an LDD region, a transistor with a multi-gate structure, and a transistor including an oxide semiconductor in a semiconductor layer. Alternatively in the case where a combination of transistors functions as a switch, a complementary switch may be employed by using both re-channel and p-channel transistors. A complementary switch achieves an appropriate operation even when a potential input to the switch is relatively changed in comparison with an output potential.

Note that when a transistor is used as a switch, the switch includes an input terminal (one of a source and a drain), an output terminal (the other of the source and the drain), and a terminal for controlling conduction (gate) in some cases. On the other hand, when a diode is used as a switch, the switch does not have a terminal for controlling electrical conduction in some cases. Therefore, when a diode is used as a switch, the number of wirings for controlling terminals can be reduced as compared to the case of using a transistor.

Note that for example, a transistor with a structure where gate electrodes are formed above and below a channel can be used as a transistor. With the structure where the gate electrodes are formed above and below the channel, a circuit structure where a plurality of transistors are connected in parallel is provided. Thus, a channel region is increased, so that the amount of current can be increased. Alternatively, by employing the structure where gate electrodes are formed above and below the channel, a depletion layer is easily formed; thus, a subthreshold swing (an S value) can be reduced.

Note that for example, a transistor with a structure where a source electrode or a drain electrode overlaps with a channel region (or part of it) can be used as a transistor. By using the structure where the source electrode or the drain electrode may overlap with the channel region (or part of it), an unstable operation due to electric charge accumulated in part of the channel region can be prevented.

Note that the capacitor 17 may have a structure in which an insulating film is sandwiched between wirings, semiconductor layers, electrodes, or the like, for example. The capacitor 17 has a function of capable of holding voltage in accordance with characteristics of the transistor 11 (e.g., voltage in accordance with a threshold voltage and a voltage in accordance with mobility). Alternatively, the capacitor 17 has a function of capable of holding voltage (e.g., a video signal) in accordance with the amount of current supplied to the load 16.

Note that as illustrated in FIG. 1B, the wiring 18 is connected to a circuit 21 having at least a function of supplying Vinit or Vsig by switching Vinit and Vsig, for example. An example of the circuit 21 is a source driver (signal line driver circuit). Accordingly, the wiring 18 has a function of capable of transmitting or supplying Vinit and/or Vsig.

The potential Vinit initializes the potential of each node in the semiconductor device, for example. For example, Vinit is supplied before Vsig which is a signal for making current flow to the load 16.

An example of Vsig is a signal for controlling the amount of current flowing to the load 16. Therefore, a potential to be supplied depends on the amount of current to be supplied to the load 16. For example, when current supplied to the load 16 is constant, Vsig is a signal with a constant potential. When current supplied to the load 16 is not constant, Vsig is a signal with a potential which changes over time depending on the amount of current to be supplied to the load 16.

Note that as illustrated in FIG. 1B, the wiring 19 is connected to a circuit 22 having at least a function of supplying Vcat, for example. An example of the circuit 22 is a power supply circuit. Accordingly, the wiring 19 has a function of capable of transmitting or supplying Vcat.

The potential Vcat is set to make current flow from the first electrode side of the load 16 to the second electrode side of the load 16 in a period in which current flows to the load 16.

Note that as illustrated in FIG. 1B, the wiring 20 is connected to at least a circuit 23 for supplying VDD. An example of the circuit 23 is a power supply circuit. Accordingly, the wiring 20 has a function of capable of transmitting or supplying VDD. Alternatively, the wiring 20 has a function of capable of supplying current to the transistor 11. Alternatively, the wiring 20 has a function of capable of supplying current to the load 16.

The potential VDD is set to make current flow from the first electrode side of the load 16 to the second electrode side of the load 16 through the transistor 11. Therefore, for example, VDD is higher than Vcat.

Note that each of the switch 12, the switch 13, the switch 14, and the switch 15 which are illustrated in FIG. 1A can be a transistor. Thus, as an example, FIG. 2A illustrates the case where an n-channel transistor is used as each of the switch 12, the switch 13, the switch 14, and the switch 15. Note that components in common with those in FIG. 1A are denoted by common reference numerals, and the description thereof is omitted. All of the transistors have the same polarity as illustrated in FIG. 2A, whereby the semiconductor device can be manufactured in a small number of steps. Thus, the manufacturing cost can be reduced.

In FIG. 2A, a transistor 12T corresponds to the switch 12, a transistor 13T corresponds to the switch 13, a transistor 14T corresponds to the switch 14, and a transistor 15T corresponds to the switch 15.

A gate of the transistor 12T is connected to a wiring 31. A first terminal of the transistor 12T is connected to the first terminal of the transistor 11 and a first terminal of the transistor 14T. A second terminal of the transistor 12T is connected to the wiring 18. Therefore, the transistor 12T is in a conduction state when the potential of the wiring 31 is at an H level, and the transistor 12T is in a non-conduction state when the potential of the wiring 31 is at an L level.

Further, a gate of the transistor 13T is connected to a wiring 32. A first terminal of the transistor 13T is connected to the gate of the transistor 11 and the one of the electrodes of the capacitor 17. A second terminal of the transistor 13T is connected to a first terminal of the transistor 15T and the second terminal of the transistor 11. Therefore, the transistor 13T is in a conduction state when the potential of the wiring 32 is at an H level, and the transistor 13T is in a non-conduction state when the potential of the wiring 32 is at an L level.

Furthermore, a gate of the transistor 14T is connected to a wiring 33. A first terminal of the transistor 14T is connected to the first terminal of the transistor 11 and the first terminal of the transistor 12T. A second terminal of the transistor 14T is connected to the first electrode of the load 16 and the other electrode of the capacitor 17. Therefore, the transistor 14T is in a conduction state when the potential of the wiring 33 is at an H level, and the transistor 14T is in a non-conduction state when the potential of the wiring 33 is at an L level.

In addition, a gate of the transistor 15T is connected to a wiring 34. The first terminal of the transistor 15T is connected to the second terminal of the transistor 11 and the second terminal of the transistor 13T. A second terminal of the transistor 15T is connected to the wiring 20. Therefore, the transistor 15T is in a conduction state when the potential of the wiring 34 is at an H level, and the transistor 15T is in a non-conduction state when the potential of the wiring 34 is at an L level.

Note that for example, the wiring 31 is connected to a circuit 24A, the wiring 32 is connected to a circuit 24B, the wiring 33 is connected to a circuit 24C, and the wiring 34 is connected to a circuit 24D. The circuits 24A to 24D each have a function of supplying a signal at an H level or an L level, for example. An example of each of the circuits 24A to 24D is a gate driver (scan line driver circuit) or the like. Accordingly, the wiring 31 has a function of capable of transmitting or supplying a signal at an H level or an L level. Alternatively, the wiring 31 has a function of capable of controlling a conduction state of the switch 12 or the transistor 12T. The wiring 32 has a function of capable of controlling a conduction state of the switch 13 or the transistor 13T. The wiring 33 has a function of capable of controlling a conduction state of the switch 14 or the transistor 14T. The wiring 34 has a function of capable of controlling a conduction state of the switch 15 or the transistor 15T.

Note that the wiring 31, the wiring 32, the wiring 33, and the wiring 34 can function as different wirings. However, one embodiment of the present invention is not limited thereto. The wirings 31 to 34 can be combined into one wiring; therefore, it is possible to form a circuit with a small number of wirings.

Figure 93:
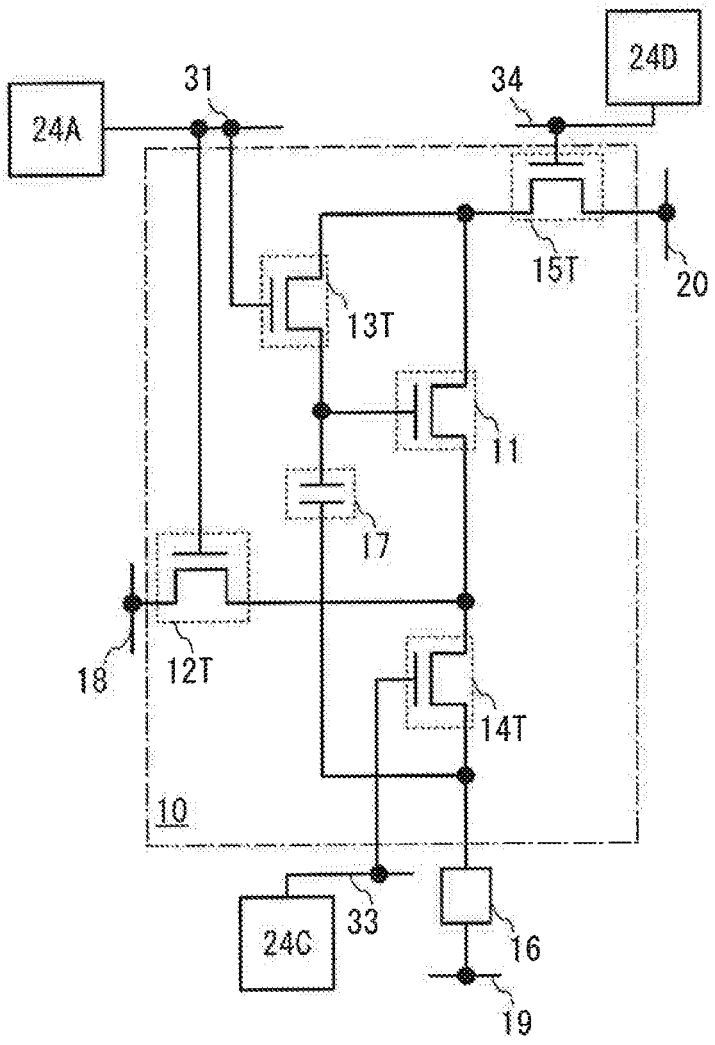
FIG. 93 is a circuit diagram illustrating an example of a semiconductor device of one embodiment of the present invention.

For example, the wiring 31 and the wiring 32 can be combined into one wiring. Therefore, the wiring 31 can be connected to the wiring 32 to be one wiring. At this time, the transistor 12T and the transistor 13T preferably have the same polarity. FIG. 93 shows a circuit diagram of this case.

Figure 94:
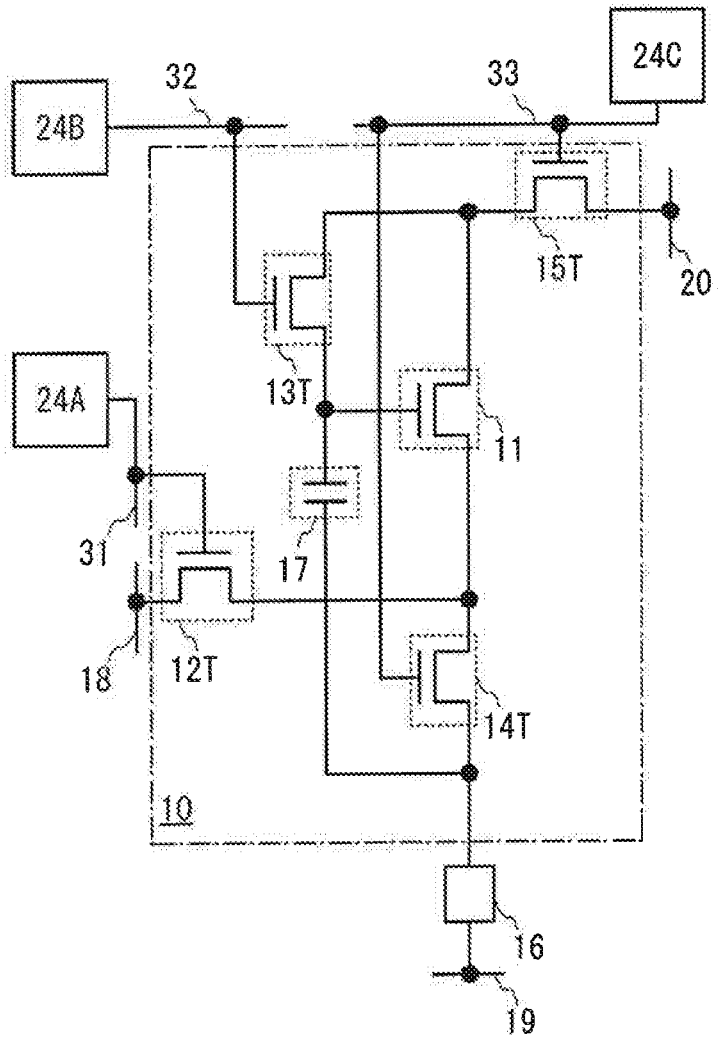
FIG. 94 is a circuit diagram illustrating an example of a semiconductor device of one embodiment of the present invention.

For example, the wiring 33 and the wiring 34 can be combined into one wiring. Therefore, the wiring 33 can be connected to the wiring 34 to be one wiring. At this time, the transistor 14T and the transistor 15T preferably have the same polarity. FIG. 94 shows a circuit diagram of this case.

Figure 95:
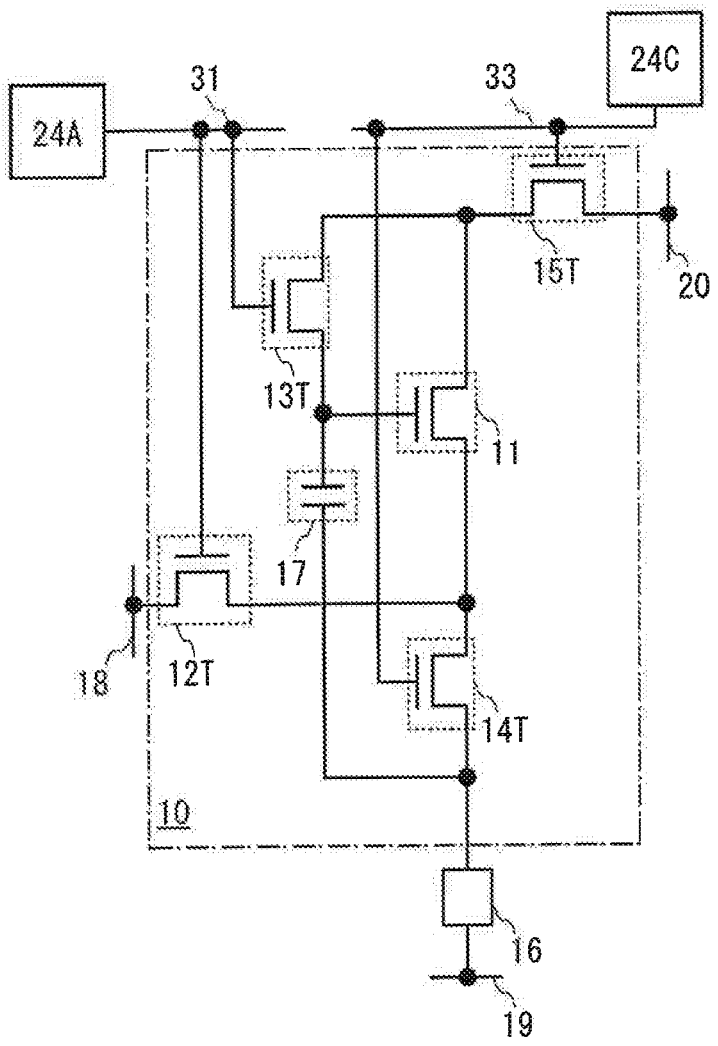
FIG. 95 is a circuit diagram illustrating an example of a semiconductor device of one embodiment of the present invention.

Note that the wiring 31 and the wiring 32 can be combined into one wiring and the wiring 33 and the wiring 34 can be combined into one wiring. FIG. 95 shows a circuit diagram in that case.

In many cases, the transistor 11 operates in a saturation region at the time of passing current. Therefore, the transistor 11 preferably has a longer channel length or gate length than the transistor 12T, the transistor 13T, the transistor 14T, or the transistor 15T. When the channel length or the gate length is longer, characteristics in a saturation region have a flat slope; accordingly, a kink effect can be reduced. Note that one embodiment of the present invention is not limited to these examples.

In many cases, the transistor 11 operates in a saturation region at the time of passing current. Therefore, the transistor 11 preferably has a larger channel width or gate width than the transistor 12T, the transistor 13T, the transistor 14T, or the transistor 15T. When the channel width or the gate width is larger, a large amount of current can flow even in a saturation region. Note that one embodiment of the present invention is not limited to these examples.

Next, the operation of the semiconductor device 10 illustrated in FIG. 1A is described. The operation of the semiconductor device 10 illustrated in FIG. 1A can be mainly divided into a first operation, a second operation, and a third operation. Note that one embodiment of the present invention is not limited thereto, and another operation can be added or part of the operation can be skipped.

Figure 2B:
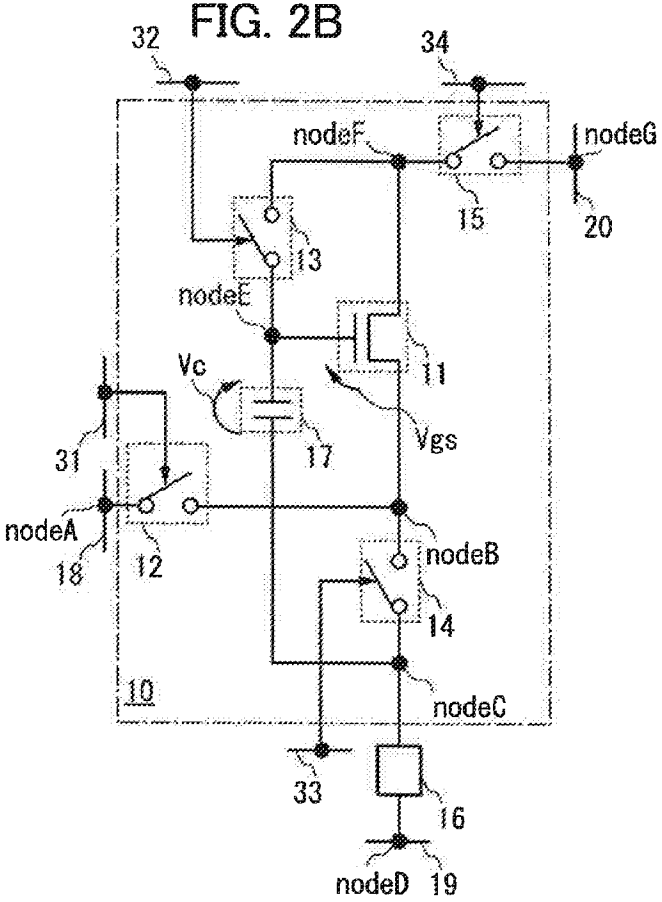
FIGS. 2A and 2B are circuit diagrams each illustrating an example of a semiconductor device of one embodiment of the present invention.
Figure 2A:
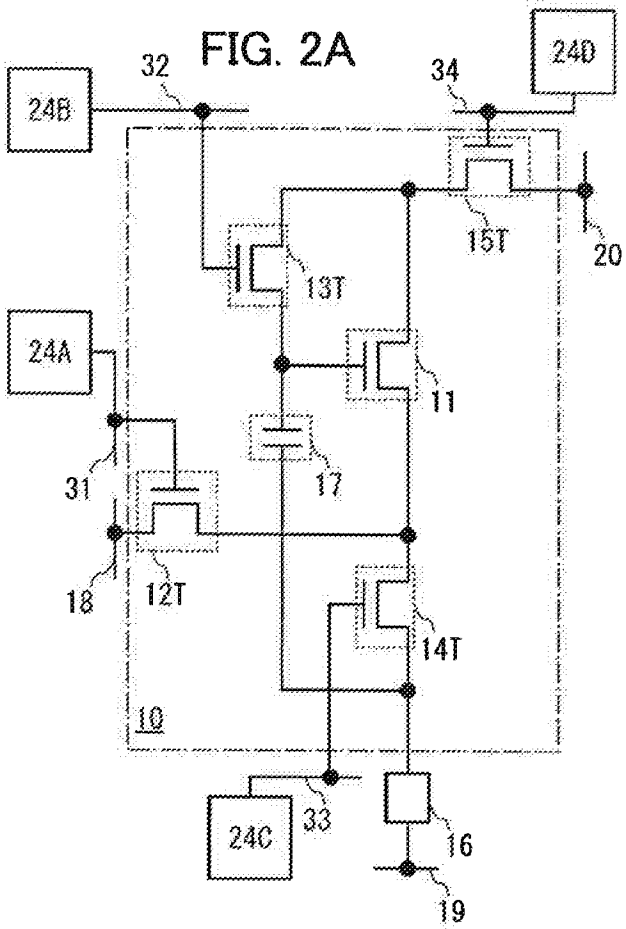

Note that in order to explain the operation of the circuit configuration illustrated in FIG. 1A, FIG. 2B shows symbols representing the potentials of nodes between elements and the potentials of wirings. FIG. 2B also shows Vgs between the one of the terminals (mainly serving as a source) and the gate of the transistor 11 and Vc between the electrodes of the capacitor 17.

A nodeA, a nodeB, a nodeC, a nodeD, a nodeE, a nodeF, and a nodeG correspond to nodes and wirings illustrated in FIG. 2B. The potential of the nodeA corresponds to the potential of the wiring 18. The potential of the nodeB corresponds to the potential of a wiring connecting the first terminal of the transistor 11, the first terminal of the switch 12, and the first terminal of the switch 14. The potential of the nodeC corresponds to the potential of a wiring connecting the second terminal of the switch 14, the one of the terminals of the load 16, and the other of the electrodes of the capacitor 17. The potential of the nodeD corresponds to the potential of the wiring 19. The potential of the nodeE corresponds to the potential of a wiring connecting the gate of the transistor 11, the one of electrodes of the capacitor 17, and the first terminal of the switch 13. The potential of the nodeF corresponds to the potential of a wiring connecting the second terminal of the transistor 11, the second terminal of the switch 13, and the first terminal of the switch 15. The potential of the nodeG corresponds to the potential of the wiring 20.

Figure 3A:
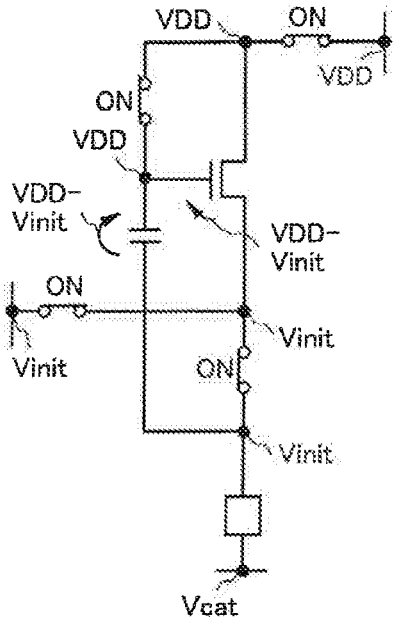
FIGS. 3A to 3C are circuit diagrams illustrating an example of a semiconductor device of one embodiment of the present invention.

First, the first operation is described with reference to FIG. 3A. Note that reference numerals of elements in FIG. 3A are omitted. Note that in the drawings, a conduction state and a non-conduction state of the switches are denoted by ON and OFF. In addition, how Vgs, Vc, the potential of the nodeA, the potential of the nodeB, the potential of the nodeC, the potential of the nodeD, the potential of the nodeE, the potential of the nodeF, and the potential of the nodeG, which are illustrated in FIG. 2B, are applied is described.

The first operation initializes the potential of each node. Specifically, the nodeA is set at Vinit, the nodeD is set at Vcat, and the nodeG is set at VDD. Then, the switch 12, the switch 13, the switch 14, and the switch 15 are turned on. Thus, the nodeB is set at Vinit, the nodeC is set at Vinit, the nodeE is set at VDD, and the nodeF is set at VDD. Further, Vgs becomes (VDD−Vinit), and Vc becomes (VDD−Vinit).

As described above, in the first operation, Vinit at the nodeB and the nodeC is equal to or lower than Vcat at the nodeD, for example. With this structure, current is prevented from flowing to the load 16 in the first operation. Accordingly, problems caused by current flowing to the load 16 can be reduced. Further, when Vinit is lower than Vcat, the load 16 can be reverse biased. In that case, deterioration of the load 16 can be reduced and the load 16 can be repaired.

In the first operation, VDD at the nodeE and the nodeF is higher than Vcat at the nodeD. With this structure, Vgs can be higher than the threshold voltage of the transistor 11 in the first operation. Alternatively, electric charge can be charged in the capacitor 17.

Figure 3B:
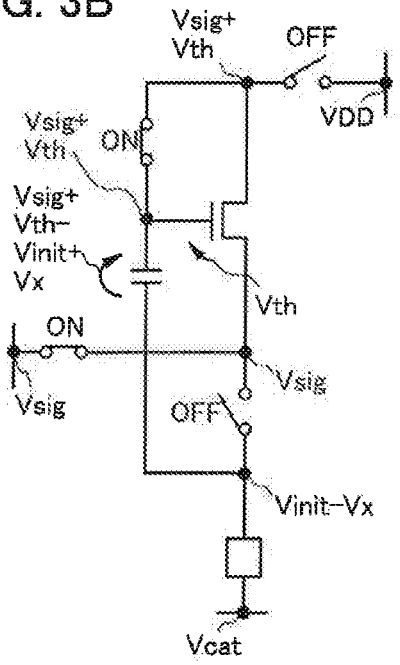

Next, the second operation is described with reference to FIG. 3B, as in FIG. 3A.

The second operation is the operation for obtaining the threshold voltage of the transistor 11 as Vgs by discharging the potential of the gate of the transistor 11 (or the electric charge charged in the capacitor 17). Specifically, the nodeA is set at Vsig, the nodeD is set at Vcat, and the nodeG is set at VDD. Then, the switch 12 and the switch 13 are turned on, and the switch 14 and the switch 15 are turned off. Accordingly, the potential of the nodeB becomes Vsig, the potential of the nodeC becomes (Vinit−Vx), the potential of the nodeE becomes (Vsig+Vth), and the potential of the nodeF becomes (Vsig+Vth). Further, Vgs becomes Vth and Vc becomes (Vsig+Vth−Vinit+Vx).

As described above, Vsig at the nodeB in the second operation is the potential used for controlling the amount of current flowing between the wiring 20 and the wiring 19 with the use of the transistor 11 in the third operation. By the second operation, the potential of the nodeE corresponding to the potential of the gate of the transistor 11 can be (Vsig+Vth) which includes the threshold voltage of the transistor 11.

In the second operation, Vx of the potential of the nodeC (Vinit−Vx) changes when the nodeC is set in an electrically floating state. In this case, the amount of changes in Vx depends on a ratio of parasitic capacitance of the load 16 to the capacitance of the capacitor 17. Note that Vx is preferably set to a low potential in advance. Specifically, the parasitic capacitance of the load 16 is set to be sufficiently larger than the capacitance of the capacitor 17, whereby Vx can be low. It is preferable that the parasitic capacitance of the load 16 be two times or more, more preferably four times or more the capacitance of the capacitor 17.

Further, VDD at the nodeD and the nodeE in the first operation is discharged by the second operation. By the discharging, Vgs is decreased to the threshold voltage Vth of the transistor 11 and is set in a steady state. Therefore, the discharging makes the nodeD and the nodeE are set in a steady state at (Vsig+Vth). In addition, at the time of terminating the second operation, (Vsig+Vth−Vinit+Vx) is held as Vc.

Note that in some cases, it takes a very long time until Vgs becomes equal to the threshold voltage Vth of the transistor 11. Accordingly, in many case, the semiconductor device is driven while Vgs is not completely decreased to the threshold voltage Vth. That is, in many cases, the second operation is terminated while Vgs is slightly higher than the threshold voltage Vth. In other words, at the time of terminating the second operation, Vgs is based on the threshold voltage.

Note that in the second operation, the switch 14 and the switch 15 are turned off and the potential of the nodeB is set to Vsig. These operations can be performed at the same time or at different timings.

It is preferable that, for example, the potential of the nodeB be changed from Vinit to Vsig at the same time as or after the switch 14 is turned off. This is because the potential of the nodeC can be easily held at an appropriate potential.

Alternatively, it is preferable that, for example, the potential of the nodeB be changed from Vinit to Vsig before or at the same time as the switch 15 is turned off. This is because the gate potential of the transistor 101 can be quickly lowered.

Figure 3C:
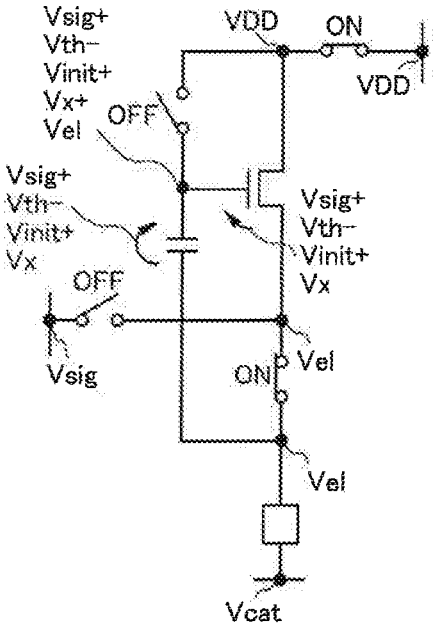

Next, the third operation is described with reference to FIG. 3C, as in FIGS. 3A and 3B.

The third operation is the operation for outputting current to the load 16 with the use of the transistor 11 as part of a current source. Specifically, the nodeA is set at Vsig, for example, though it can be any potential, the nodeD is set at Vcat, and the nodeG is set at VDD. Then, the switch 14 and the switch 15 are turned on, and the switch 12 and the switch 13 are turned off. Accordingly, the nodeB and the nodeC become Vel, the nodeE becomes (Vsig+Vth−Vinit+Vx+Vel), and the nodeF becomes VDD. In addition, Vgs becomes (Vsig+Vth−Vinit+Vx) and Vc becomes (Vsig+Vth−Vinit+Vx).

Note that in the third operation, the potentials of the nodeB, the nodeC, and the nodeF are increased while the nodeE is kept in an electrically floating state. Accordingly, the potential of the nodeE is increased by capacitive coupling while (Vsig+Vth−Vinit+Vx) is held as Vc, thereby becoming (Vsig+Vth−Vinit+Vx+Vel). That is, an increase in the potential of the nodeC leads to an increase in the potential of the nodeE by bootstrap operation.

The semiconductor device can operate even when the potential of the nodeC is increased; therefore, adverse effect of deterioration in voltage current characteristics of the load (e.g., a display element and a light-emitting element) can be reduced even when the deterioration is caused.

The potential Vel which is the potentials of the nodeB and the nodeC is set when the potential of the nodeF is increased to VDD and current flows to the load 16 through the transistor 11 which allows the semiconductor device to operate as a current source by the third operation. Specifically, the potential ranges from VDD to Vcat.

In the third operation, Vgs of the transistor 11 becomes (Vsig+Vth−Vinit+Vx), which includes the threshold voltage of the transistor 11. The amount of current of the transistor 11 depends on (Vgs−Vth). Accordingly, through the above operations, adverse effect of variations in the threshold voltage of the transistor on the amount of current supplied to the load can be reduced. Alternatively, even when the threshold voltage is changed by deterioration of the transistor, adverse effect of the change can be reduced. Therefore, in the case of a display element, display unevenness can be reduced and display can be performed with high quality.

Note that in the third operation, the switch 12 and the switch 13 are turned off and the switch 14 and the switch 15 are turned on. These operations can be performed at the same time or at different timings.

For example, it is preferable that the switch 14 and the switch 15 be turned on after the switch 12 and the switch 13 are turned off. This is because Vc can be easily held at an appropriate potential.

Alternatively, for example, it is preferable that the switch 12 be turned off after the switch 13 is turned off. This is because Vc can be easily held at an appropriate potential.

Note that FIG. 1A illustrates the circuit configuration of this embodiment but one embodiment of the present invention is not limited thereto. The locations of the switches or the number of switches can be changed and/or appropriate voltage can be supplied so that the operations become similar to the operations described in FIGS. 3A to 3C in which the threshold voltage of the transistor is corrected. In such a manner, a variety of circuits can be employed.

Figure 4A:
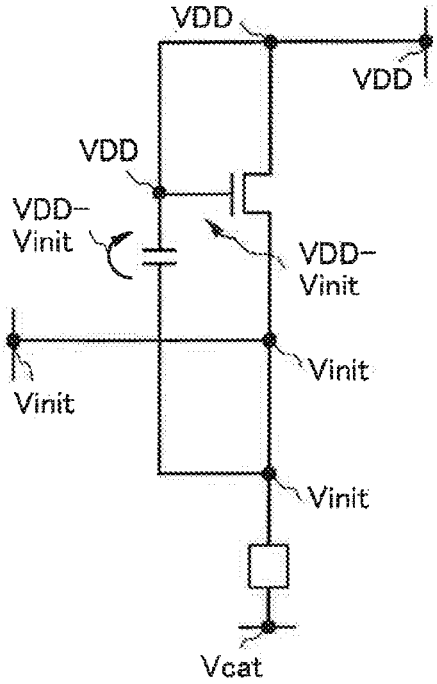
FIGS. 4A to 4C are circuit diagrams illustrating an example of a semiconductor device of one embodiment of the present invention.
Figure 4B:
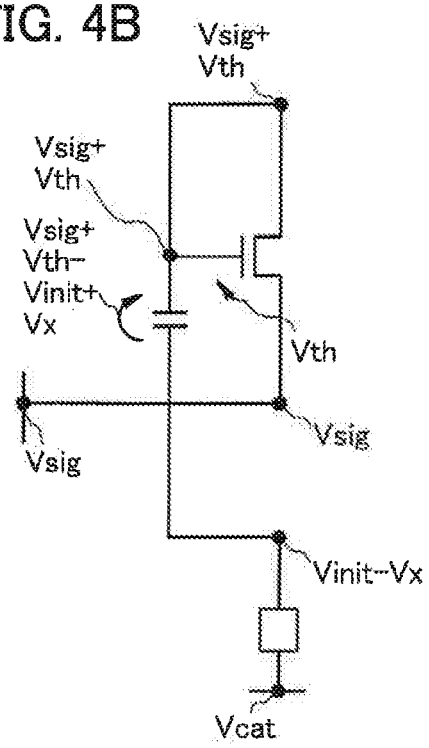
Figure 4C:
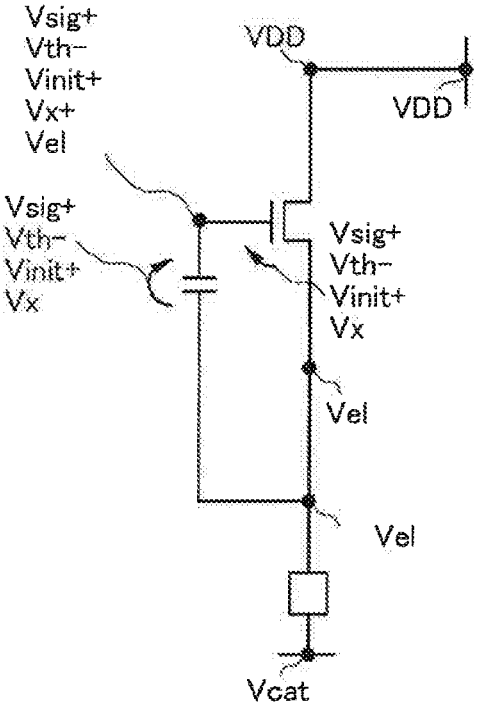

For example, specifically, the switch 12, the switch 13, the switch 14, and the switch 15 can be provided at any place and the number of switches is not limited as long as the switches can control a conduction state and a non-conduction state between nodes. In the case of the first operation described with reference to FIG. 3A, a connection relation illustrated in FIG. 4A may be employed. In the case of the second operation described with reference to FIG. 3B, a connection relation illustrated in FIG. 4B can be employed. In the case of the third operation described with reference to FIG. 3C, a connection relation illustrated in FIG. 4C can be employed. The potential of each node can have any level unless the node affects the operations.

Note that the operation for correcting the threshold voltage of the transistor is described with reference to FIGS. 3A to 3C but one embodiment of the present invention is not limited thereto. For example, the operation for correcting variations in the mobility of the transistor 11 may be performed between the second operation in FIG. 3B and the third operation in FIG. 3C. FIGS. 5A to 5D illustrate the case where the operation for correcting variations in the mobility of the transistor 11 is added to the first to third operations which are described with reference to FIGS. 3A to 3C.

Figure 5A:
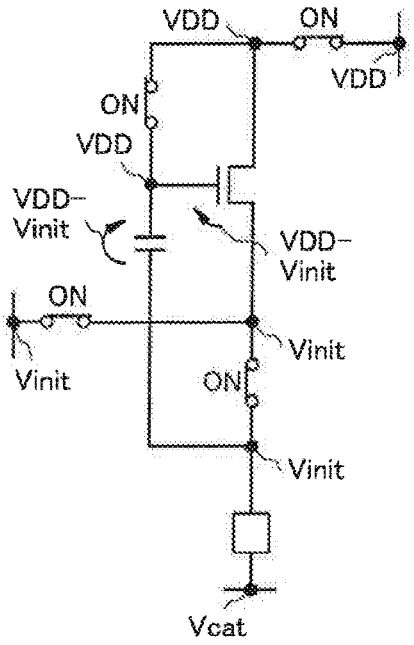
FIGS. 5A to 5D are circuit diagrams illustrating an example of a semiconductor device of one embodiment of the present invention.
Figure 5B:
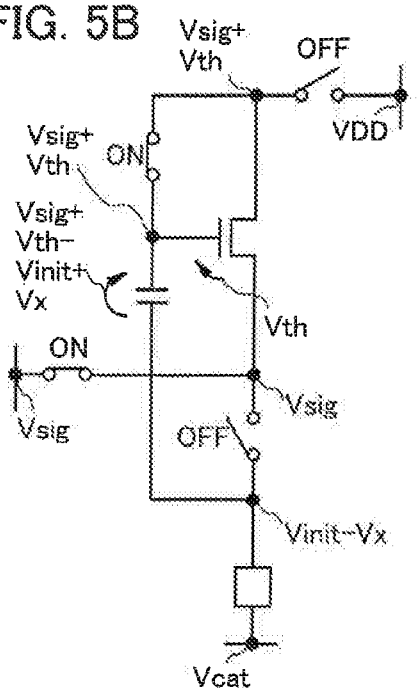

Note that a first operation illustrated in FIG. 5A is the same as the first operation described with reference to FIG. 3A; therefore, the description thereof is omitted. A second operation illustrated in FIG. 5B is the same as the second operation described with reference to FIG. 3B; therefore, the description thereof is omitted.

Figure 5C:
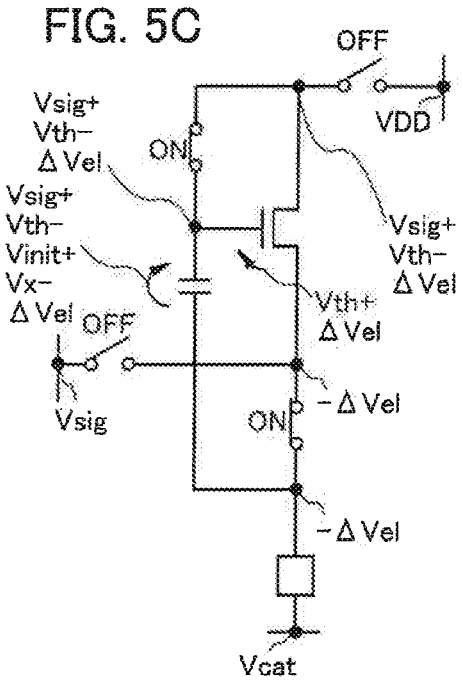

Next, a third operation is described with reference to FIG. 5C, as in FIGS. 3A and 3B.

In the third operation, the transistor 11 is turned on with the use of the potential held in the gate of the transistor 11 (electric charge stored in the capacitor 17), and the mobility of the transistor 11 is corrected with the use of the amount of current flowing therethrough. Specifically, the nodeA is set at Vsig though it can be any potential, the nodeD is set at Vcat, and the nodeG is set at VDD though it can be any potential. Then, the switch 13 and the switch 14 are turned on, and the switch 12 and the switch 15 are turned off. Then, the amount of change in potentials of the nodeB and the nodeC is −ΔVel, the nodeE and the nodeF become (Vsig+Vth−ΔVel). In addition, Vgs becomes (Vth+ΔVel) and Vc becomes (Vsig+Vth−Vinit+Vx−ΔVel).

Note that in the third operation, the potentials of the nodeB and the nodeC are changed by turning on the switch 14. The amount of changes in the potentials corresponds to −ΔVel. When the amount of change in the potentials of the nodeB and the nodeC becomes −ΔVel, Vgs becomes (Vth+ΔVel) and higher than the threshold voltage Vth; as a result, current flows through the transistor 11. When current flows through the transistor 11, each of the potentials of the nodeE and the nodeF is decreased to (Vsig+Vth−ΔVel) and Vc becomes (Vsig+Vth−Vinit+Vx−ΔVel).

The amount of current flowing to the transistor 11 changes depending on the mobility of the transistor 11. Accordingly, the potential of the nodeE corresponding to the gate of the transistor 11 can be set so as to include the amount of change in potential corresponding to the mobility of the transistor 11.

In the third operation, the potential of the gate of the transistor 11 becomes (Vsig+Vth−ΔVel) which is set in consideration of the mobility of the transistor 11. Accordingly, through the above operations, adverse effect of variations in the mobility of the transistor on the amount of current supplied to the load can be reduced. Alternatively, even when mobility is changed by deterioration of the transistor, adverse effect of the change can be reduced.

Figure 5D:
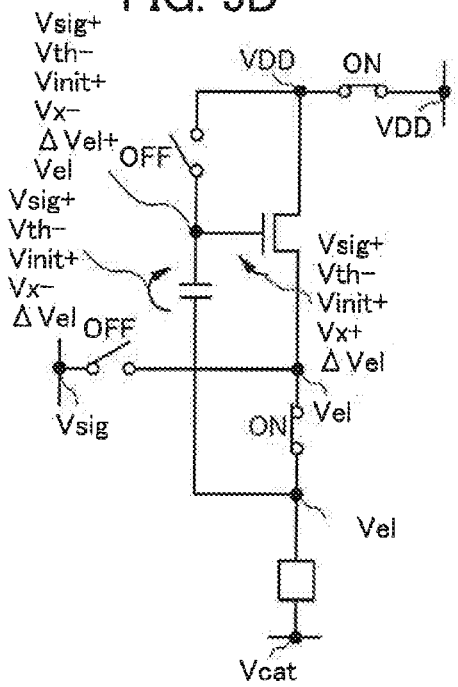

Next, a fourth operation is described with reference to FIG. 5D, as in FIGS. 3A and 3B. Note that the fourth operation illustrated in FIG. 5D is similar to the third operation described with reference to FIG. 3C; therefore, only an aspect different from the third operation with reference to FIG. 3C is described.

By the fourth operation, the nodeB and the nodeC are set at Vel, the nodeE is set at (Vsig+Vth−Vinit+Vx−ΔVel+Vel), and the nodeF is set at VDD. The potential Vgs becomes (Vsig+Vth−Vinit+Vx−ΔVel) and Vc becomes (Vsig+Vth−Vinit+Vx).

In the fourth operation, Vgs of the transistor 11 becomes (Vsig+Vth−Vinit+Vx+ΔVel), which can be set in consideration of the threshold voltage and the mobility of the transistor 11. Accordingly, through the above operations, adverse effect of variations in the threshold voltage and the mobility of the transistor on the amount of current supplied to the load can be reduced.

The location of the switch or the number of switches can be changed and appropriate voltage can be supplied so as to achieve the similar operation to the operation described in FIGS. 5A to 5D in which the threshold voltage of the transistor is corrected. In such a manner, a variety of circuits can be employed.

Figure 6A:
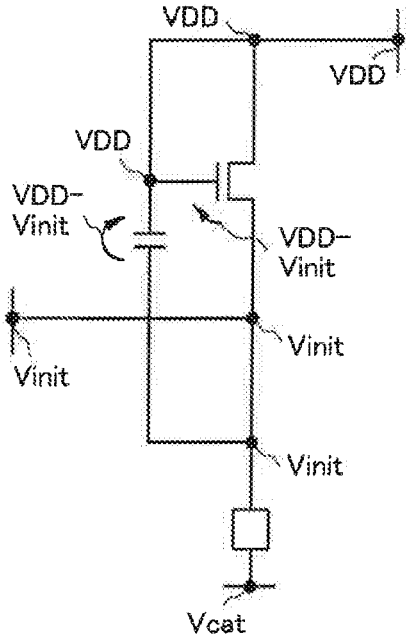
FIGS. 6A to 6D are circuit diagrams each illustrating an example of a semiconductor device of one embodiment of the present invention.
Figure 6B:
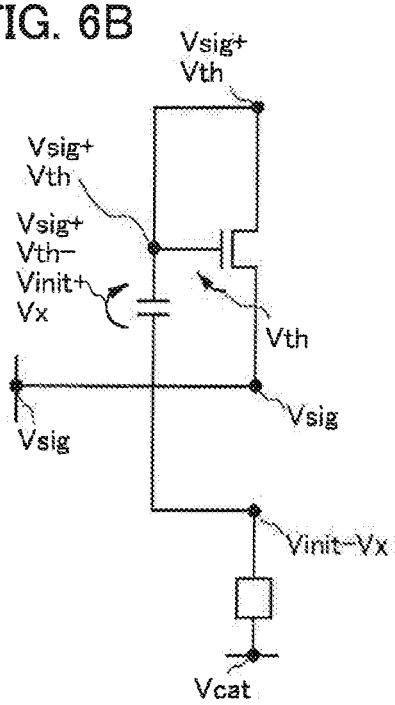
Figure 6C:
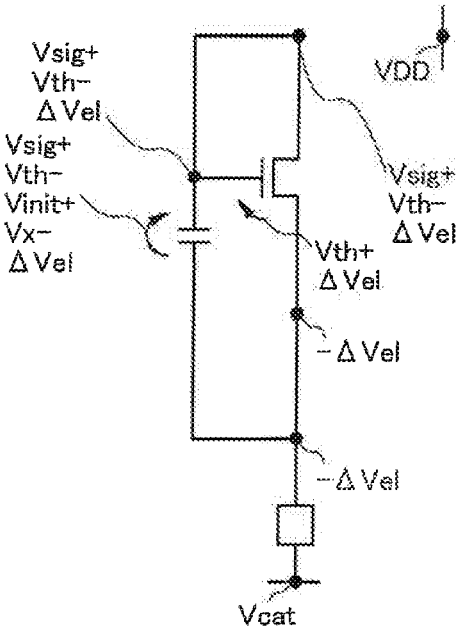
Figure 6D:
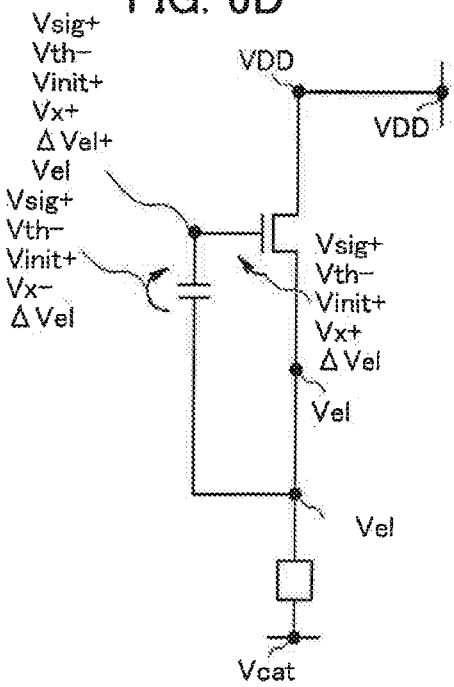

For example, specifically, the switch 12, the switch 13, the switch 14, and the switch 15 can be provided any place and the numbers thereof is not limited as long as the switches can control a conduction state and a non-conduction state between nodes. In the case of the first operation described with reference to FIG. 5A, a connection relation illustrated in FIG. 6A can be employed. In the case of the second operation described with reference to FIG. 5B, a connection relation illustrated in FIG. 6B can be employed. In the case of the third operation described with reference to FIG. 5C, a connection relation illustrated in FIG. 6C can be employed. In the case of the fourth operation described with reference to FIG. 5D, a connection relation illustrated in FIG. 6D can be employed. The potential of each node can have any level unless the node affects the operations.

Note that FIG. 1A illustrates the circuit configuration of this embodiment but one embodiment of the present invention is not limited thereto. The number of switches or the locations of the switches can be changed and a variety of circuits can be employed.

Figure 7:
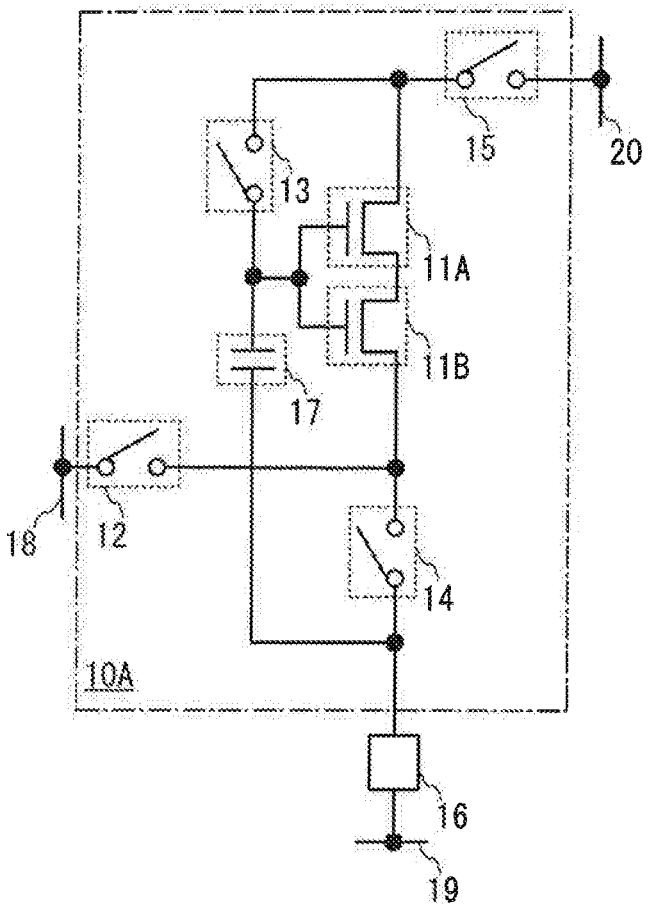
FIG. 7 is a circuit diagram illustrating an example of a semiconductor device of one embodiment of the present invention.

For example, as in a semiconductor device 10A illustrated in FIG. 7, the transistor 11A and the transistor 11B which have gates connected to each other and which are connected in series can be used as transistors which allow the semiconductor device to serve as a current source. Note that components in common with those in FIG. 1A are denoted by common reference numerals, and the description thereof is omitted.

Figure 8:
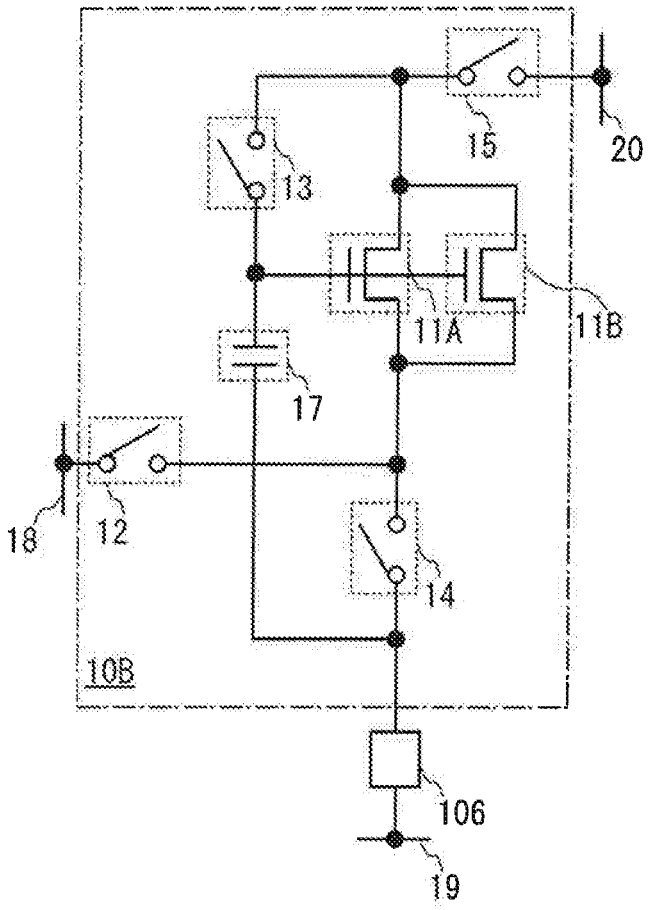
FIG. 8 is a circuit diagram illustrating an example of a semiconductor device of one embodiment of the present invention.

As another example, as in a semiconductor device 10B illustrated in FIG. 8, the transistor 11A and the transistor 11B which have gates connected to each other and which are connected in parallel can be used as transistors which allow the semiconductor device to serve as a current source. Note that components in common with those in FIG. 1A are denoted by common reference numerals, and the description thereof is omitted.

Figure 9:
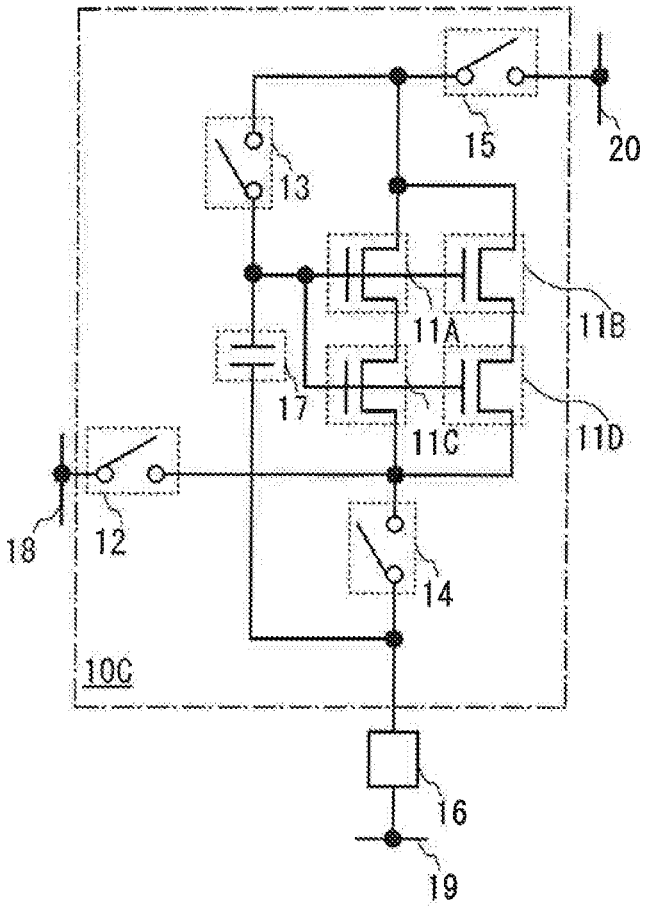
FIG. 9 is a circuit diagram illustrating an example of a semiconductor device of one embodiment of the present invention.

As another example, as in a semiconductor device 10C illustrated in FIG. 9, the transistor 11A, the transistor 11B, the transistor 11C, and the transistor 11D which have gates connected to each other and which are connected in series and parallel can be used as transistors which allow the semiconductor device to serve as a current source. Note that components in common with those in FIG. 1A are denoted by common reference numerals, and the description thereof is omitted.

The channel width and/or the channel length of the transistor 11 can be changed by application of the structures illustrated in FIG. 7, FIG. 8, and FIG. 9. With the structures illustrated in FIG. 7, FIG. 8, and FIG. 9 in which channel widths and/or channel lengths of a plurality of transistors can be changed after the transistors are combined, adverse effect of variations in characteristics of the transistors can be smaller in comparison with the structure in which transistors each having a large channel width and/or a large channel length is provided in advance.

Note that FIG. 1A, FIG. 2A, or the like illustrates an example of a circuit configuration; accordingly, a transistor can be provided additionally. On the other hand, in each node in FIG. 1A, FIG. 2A, or the like, it is also possible not to provide an additional transistor, switch, passive element, or the like. For example, it is possible not to increase the number of transistors directly connected to the nodeA, the nodeB, the nodeC, the nodeD, the nodeE, the nodeF, or/and the nodeG. Accordingly, for example, the following structure can be used: only the transistor 14T is directly connected to the nodeC and the other transistors are not directly connected to the nodeC.

Therefore, a circuit can be formed with a small number of transistors in the case where a transistor is not added.

Note that variations in the threshold voltage or the like of a transistor is corrected in this embodiment, but one embodiment of the present invention is not limited thereto. For example, current can be supplied to the load 16 and the semiconductor device can be driven without performing the operation for correcting variations in threshold voltage.

This embodiment shows an example of a basic principle. Thus, part of or the whole of this embodiment can be freely combined with, applied to, or replaced with part of or the whole of another embodiment.

Embodiment 2

In this embodiment, an example of a configuration different from the circuit configuration of the semiconductor device described in Embodiment 1 is described.

Figure 10:
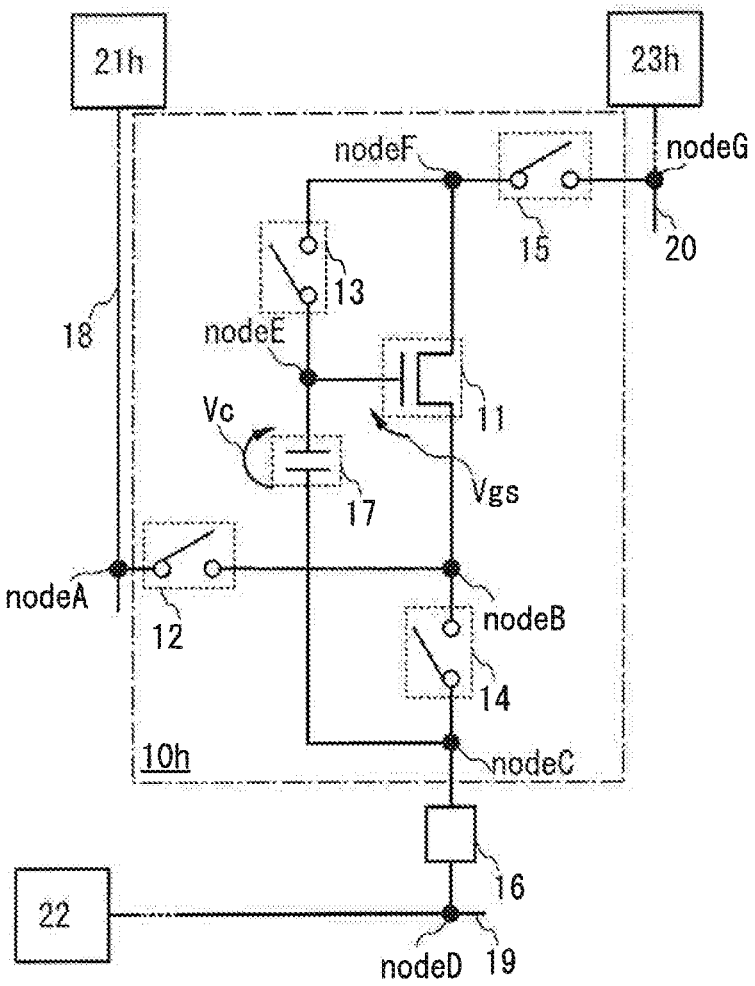
FIG. 10 is a circuit diagram illustrating an example of a semiconductor device of one embodiment of the present invention.

FIG. 10 illustrates a semiconductor device 10h having a circuit configuration similar to the semiconductor device 10 illustrated in FIG. 1A. The semiconductor device 10h illustrated in FIG. 10 is different from the semiconductor device 10 illustrated in FIG. 1A in that the semiconductor device 10h is connected to a circuit 21h and a circuit 23h. The circuit 21h has at least a function of supplying Vsig and Vinit to the wiring 18, and the circuit 23h has at least a function of supplying Vinit or VDD to the wiring 20, switching them as necessary. Note that components in common with those in FIG. 1A are denoted by common reference numerals, and the description thereof is omitted. An example of the circuit 21h is a source driver (signal line driver circuit). Examples of the circuit 23h are a gate driver (scan line driver circuit) and a power supply circuit.

Next, the operation of the semiconductor device 10h illustrated in FIG. 10 is described. The operation of the semiconductor device 10h illustrated in FIG. 10 can be mainly divided into a first operation, a second operation, a third operation, and a fourth operation. One operation is added to the operations of the semiconductor device 10 illustrated in FIG. 1A or the like. The second operation, the third operation, and the fourth operation of the semiconductor device 10h illustrated in FIG. 10 correspond to the first operation, the second operation, and the third operation of the semiconductor device 10 illustrated in FIG. 1A, respectively.

Note that in order to explain the operation of the circuit configuration illustrated in FIG. 10, FIG. 10 shows symbols representing the potentials of nodes between elements and the potentials of wirings, as FIG. 2B does. The operation of the circuit configuration illustrated in FIG. 10 is explained with symbols of Vgs and Vc, as in FIG. 2B.

In the first operation, a potential for initialization is applied to some extent at each node before initialization of the potential of each node (initialization before initialization). Specifically, the nodeG is set at Vinit and the nodeD is set at Vcat. The nodeA can be set at any potential. In addition, the switch 14 and the switch 15 are turned on, and the switch 12 and the switch 13 are turned off. The nodeB and the nodeC are then set at Vinit or the potential ΔVinit which is close to Vinit. The nodeE is set at Vy and the nodeF is set at Vinit. Note that Vgs and Vc are omitted because the first operation uses Vy which is a signal of an operation before the first operation.

The potential Vy is input before the first operation. The case where Vy enables the transistor 11 to operate as part of a current source is explained. The potential Vy is set so that current flows between the first terminal and the second terminal of the transistor 11 in the first operation. Usually, Vinit is very low and accordingly the transistor 11 is turned on because of Vy in many cases.

Therefore, in the first operation, the nodeF is set at Vinit and current flows between the first terminal and the second terminal of the transistor 11; as a result, the nodeB and the nodeC are set at Vinit or the potential ΔVinit which is close to Vinit.

That is, the first operation decreases the potentials of the nodeB and the nodeC. By the decrease in the potentials of the nodeB and the nodeC in the first operation, the following second operation can initialize the potential of each node at high speed. In particular, when the load 16 has large capacitance, the following operation can be performed smoothly by the decrease in the potentials of the nodeB and the nodeC in advance. Note that even if the potentials of the nodeB and the nodeC cannot be sufficiently decreased, it is not a problem unless subsequent operations are adversely affected.

The second operation is the same as the first operation described with reference to FIG. 3A and therefore the description thereof is omitted.

In the second operation, the switch 12 and the switch 13 are turned on and the potential of the nodeG is set to VDD, and these operations can be performed at the same time or at different timings.

It is preferable that, for example, the potential of the nodeG be changed from Vinit to VDD before or at the same time as the switch 13 is turned on. This is because the potential of the nodeE can be increased easily in that case.

Figure 11A:
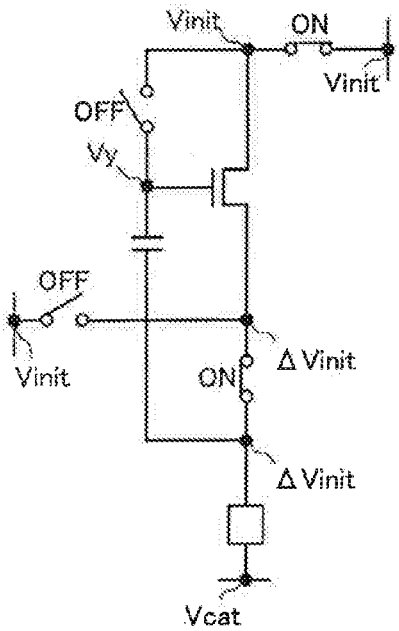
FIGS. 11A to 11D are circuit diagrams illustrating an example of a semiconductor device of one embodiment of the present invention.
Figure 11B:
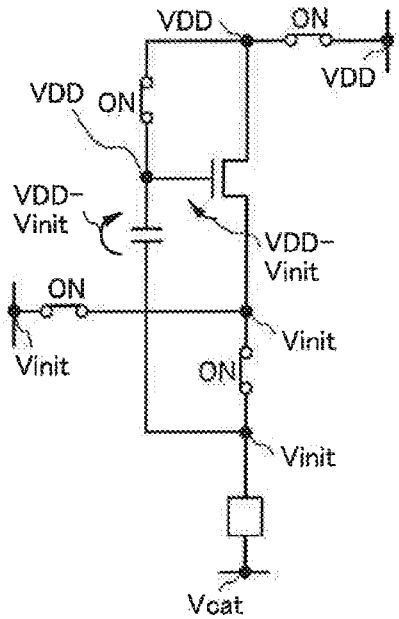
Figure 11C:
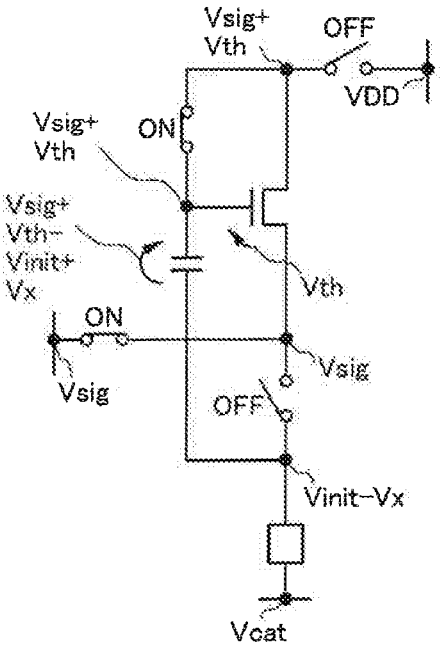
Figure 11D:
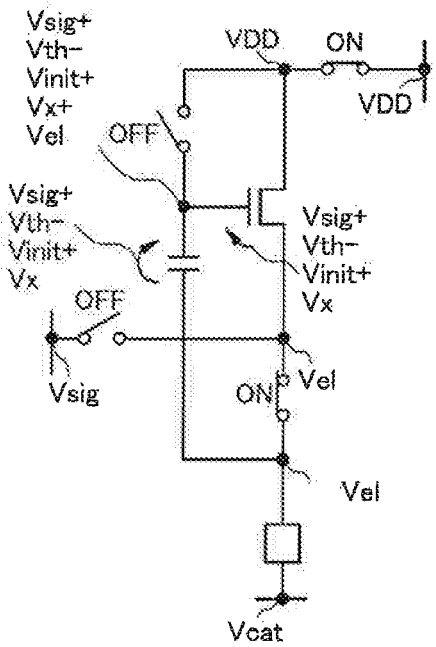

Then, the third operation illustrated in FIG. 11C is the same as the second operation described with reference to FIG. 3B and therefore the description thereof is omitted. Then, the fourth operation illustrated in FIG. 11D is the same as the third operation described with reference to FIG. 3C and therefore the description thereof is omitted.

The location of the switch or the number of switches can be changed and appropriate voltage can be supplied so as to achieve the similar operation to the operation described in FIGS. 11A to 11D in which the threshold voltage of the transistor is corrected. In such a manner, a variety of circuits can be employed.

Figure 12A:
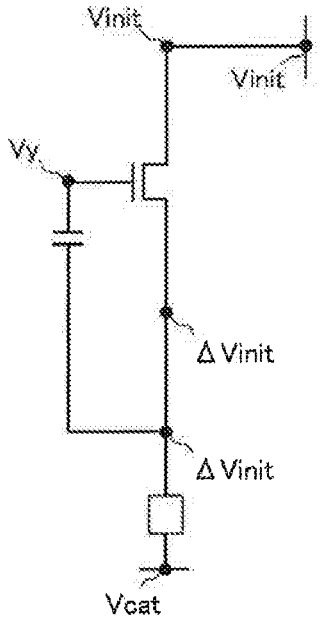
FIGS. 12A to 12D are circuit diagrams each illustrating an example of a semiconductor device of one embodiment of the present invention.
Figure 12B:
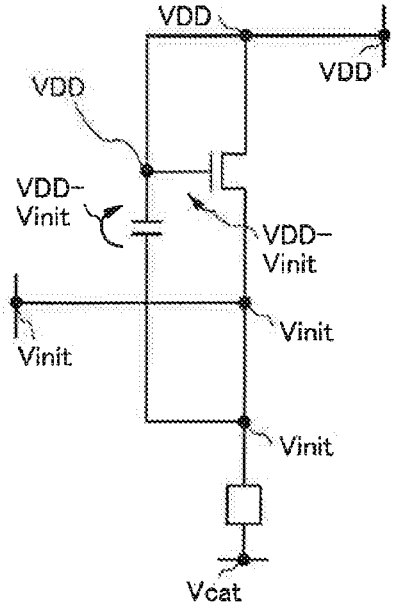
Figure 12C:
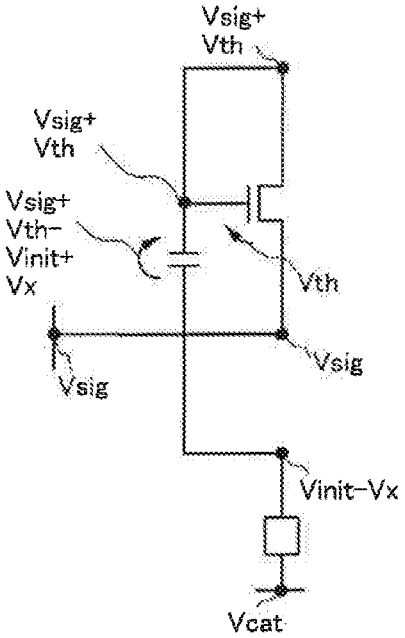
Figure 12D:
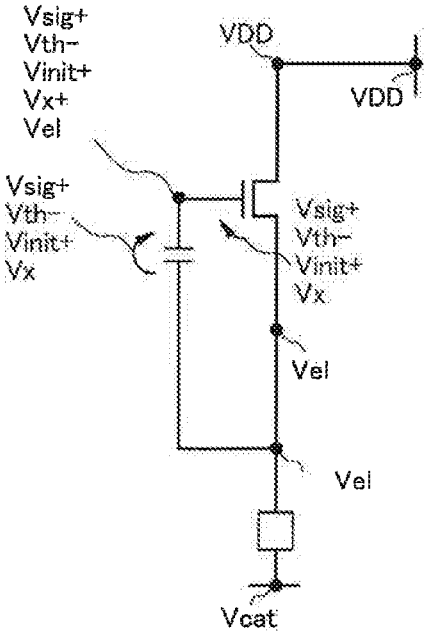

For example, specifically, the switch 12, the switch 13, the switch 14, and the switch 15 can be provided any place and the numbers thereof is not limited as long as the switches can control a conduction state and a non-conduction state between nodes. In the case of the first operation described with reference to FIG. 11A, a connection relation illustrated in FIG. 12A can be employed. In the case of the second operation described with reference to FIG. 11B, a connection relation illustrated in FIG. 12B can be employed. In the case of the third operation described with reference to FIG. 11C, a connection relation illustrated in FIG. 12C can be employed. In the case of the fourth operation described with reference to FIG. 11D, a connection relation illustrated in FIG. 12D can be employed. The potential of each node can have any level unless the node affects the operations.

Note that the operation for correcting the threshold voltage of the transistor is described with reference to FIGS. 11A to 11D but one embodiment of the present invention is not limited thereto. For example, the operation for correcting variations in the mobility of the transistor 11 may be performed between the third operation in FIG. 11C and the fourth operation in FIG. 11D.

The operation for correcting the mobility of the transistor 11 is described with reference to FIG. 13A.

The operation for correcting the mobility of the transistor 11 is the same as the third operation described with reference to FIG. 5C and the description thereof is omitted.

In the operation for correcting the mobility of the transistor 11, the potential of the gate of the transistor 11 becomes (Vsig+Vth−ΔVel) which is set in consideration of the mobility of the transistor 11. Accordingly, through the above operation, adverse effect of variations in the mobility of the transistor on the amount of current supplied to the load can be reduced.

Figure 13A:
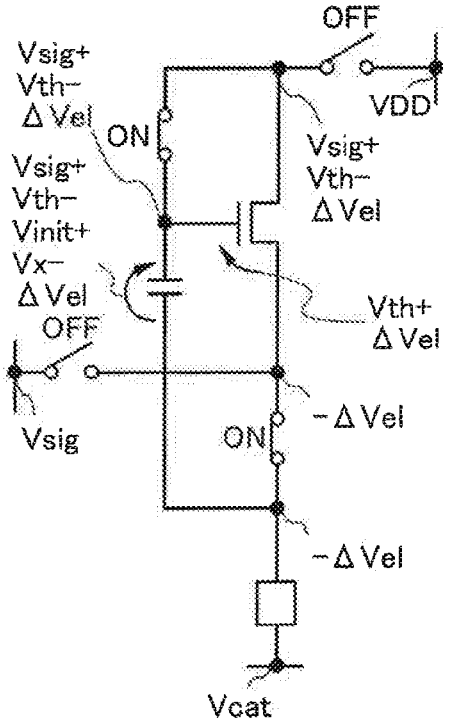
FIGS. 13A and 13B are circuit diagrams each illustrating an example of a semiconductor device of one embodiment of the present invention.

The location of the switch or the number of switches can be changed and appropriate voltage can be supplied so as to achieve the similar operation to the operation described in FIG. 13A in which the mobility of the transistor is corrected. In such a manner, a variety of circuits can be employed.

Figure 13B:
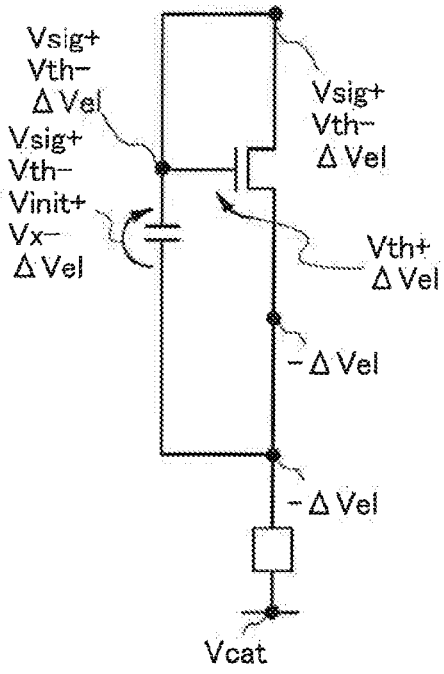

For example, specifically, the switch 12, the switch 13, the switch 14, and the switch 15 can be provided any place and the numbers thereof is not limited as long as the switches can control a conduction state and a non-conduction state between nodes. In the case of the operation for correcting the mobility of the transistor described with reference to FIG. 13A, a connection relation illustrated in FIG. 13B can be employed. The potential of each node can have any level unless the node affects the operations.

The potential of the wiring 20 is switched between Vinit and VDD in the circuit configuration illustrated in FIG. 10, but another configuration can be used. For example, a configuration illustrated in FIG. 14 may be employed: a wiring 20A and a wiring 20B are provided instead of the wiring 20, and Vinit is supplied from a circuit 23A connected to the wiring 20A and VDD is supplied from a circuit 23B connected to the wiring 20B. At this time, a switch 15A provided between the wiring 20A and the nodeF and a switch 15B provided between the wiring 20B and the nodeF may perform switching so as to achieve the similar operation to the operation described with reference to FIGS. 11A to 11D. That is, the circuit 23A has a function of supplying Vinit and examples of the circuit 23A are a power supply circuit and a voltage follower circuit. The circuit 23B has a function of supplying VDD and an example of the circuit 23B is a power supply circuit. In addition, the switching of the switch 15A is controlled with a wiring 34A and the switching of the switch 15B is controlled with a wiring 34B. As an example, the wiring 34A and the wiring 34B are connected to a circuit 25A and a circuit 25B, respectively. The circuit 25A and the circuit 25B each have at least a function of supplying an H-level signal or an L-level signal. An example of each of the circuit 25A and the circuit 25B is a gate driver (scan line driver circuit).

As described above, in the circuit configuration described in this embodiment, initialization before initialization can be performed by switching of the potential of the wiring 20 between Vinit and VDD. Accordingly, the potential of each node can be initialized at high speed. In the fourth operation, Vgs of the transistor 11 becomes (Vsig+Vth−Vinit+Vx), which includes the threshold voltage of the transistor 11. Accordingly, with this structure, adverse effect of variations in the threshold voltage of the transistor on the amount of current supplied to the load can be reduced.

Figure 14:
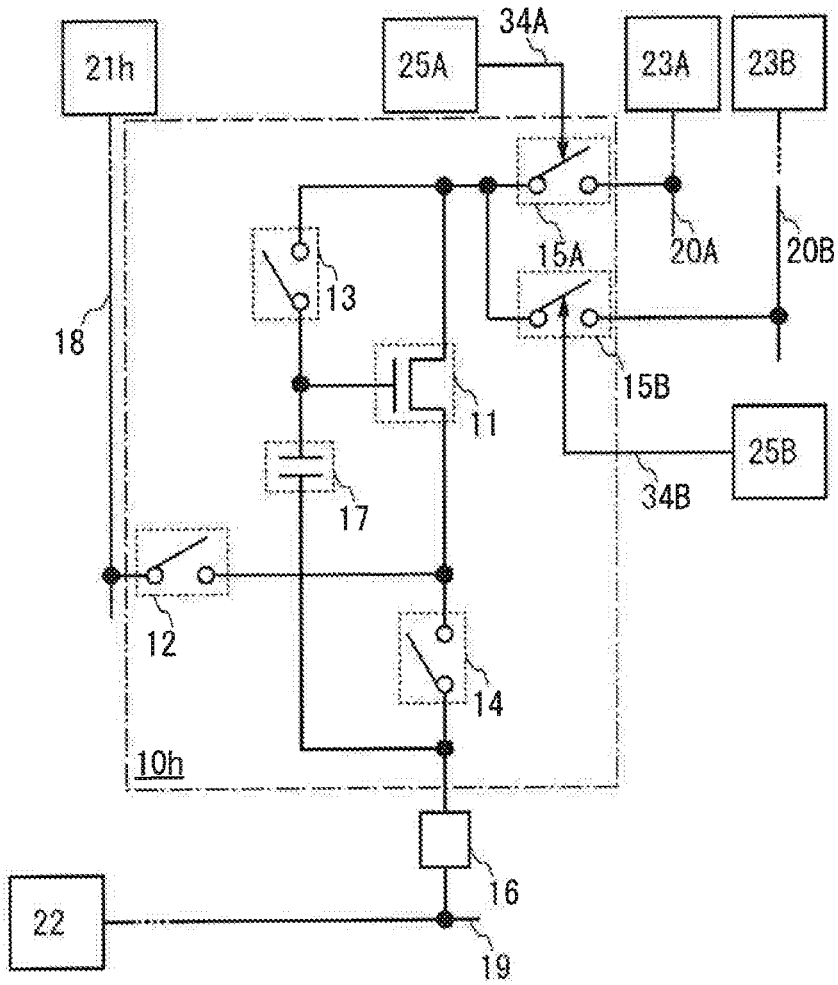
FIG. 14 is a circuit diagram illustrating an example of a semiconductor device of one embodiment of the present invention.

Note that FIG. 14, or the like illustrates an example of a circuit configuration; accordingly, a transistor can be provided additionally. In each node in FIG. 14, or the like, it is possible not to provide an additional transistor, switch, a passive element, or the like. For example, transistors directly connected to the nodeA, the nodeB, the nodeC, the nodeD, the nodeE, the nodeF, or/and the nodeG are not additionally provided. Accordingly, for example, the following structure can be used: only the transistor 14T is directly connected to the nodeC and the other transistors are not directly connected to the nodeC.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 3

In this embodiment, an example of a configuration different from the circuit configurations of the semiconductor devices described in Embodiments 1 and 2 is described.

Figure 15:
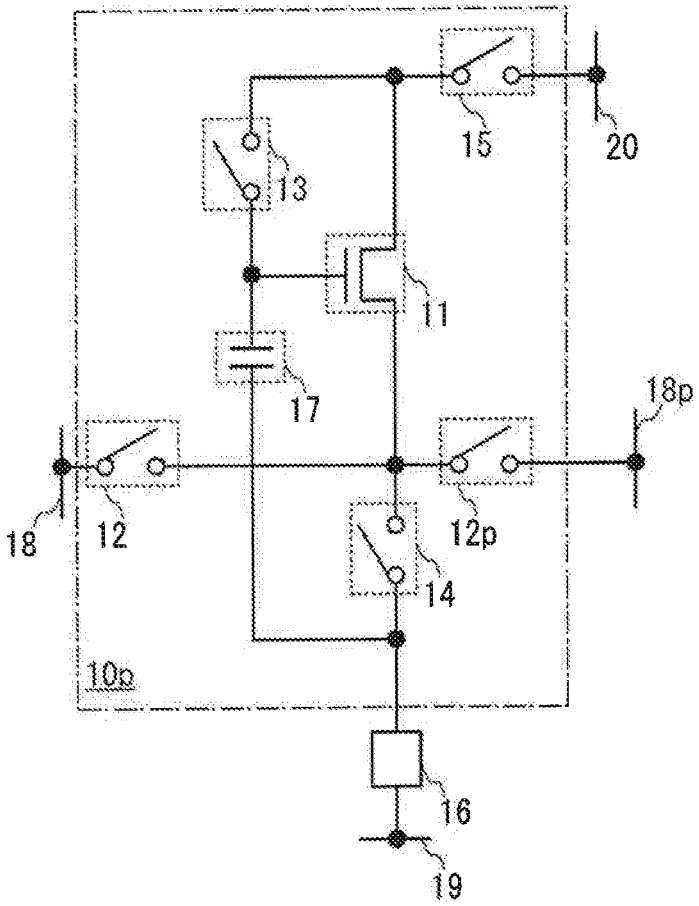
FIG. 15 is a circuit diagram illustrating an example of a semiconductor device of one embodiment of the present invention.

FIG. 15 illustrates a semiconductor device 10p having a circuit configuration similar to the semiconductor device 10 illustrated in FIG. 1A. The semiconductor device 10p illustrated in FIG. 15 is different from the semiconductor device 10 illustrated in FIG. 1A in that the potential supplied to the wiring 18 is Vsig, a wiring 18p and a switch 12p are provided, and Vinit is supplied from the wiring 18p. Note that components in common with those in FIG. 1A are denoted by common reference numerals, and the description thereof is omitted.

In FIG. 15, a first terminal of the switch 12p is connected to the first terminal of the transistor 11, the first terminal of the switch 12, and the first terminal of the switch 14. A second terminal of the switch 12p is connected to the wiring 18p.

Next, the operation of the semiconductor device 10h illustrated in FIG. 15 is described. The operation of the semiconductor device 10h illustrated in FIG. 15 can be mainly divided into the first operation, the second operation, and the third operation.

Figure 16:
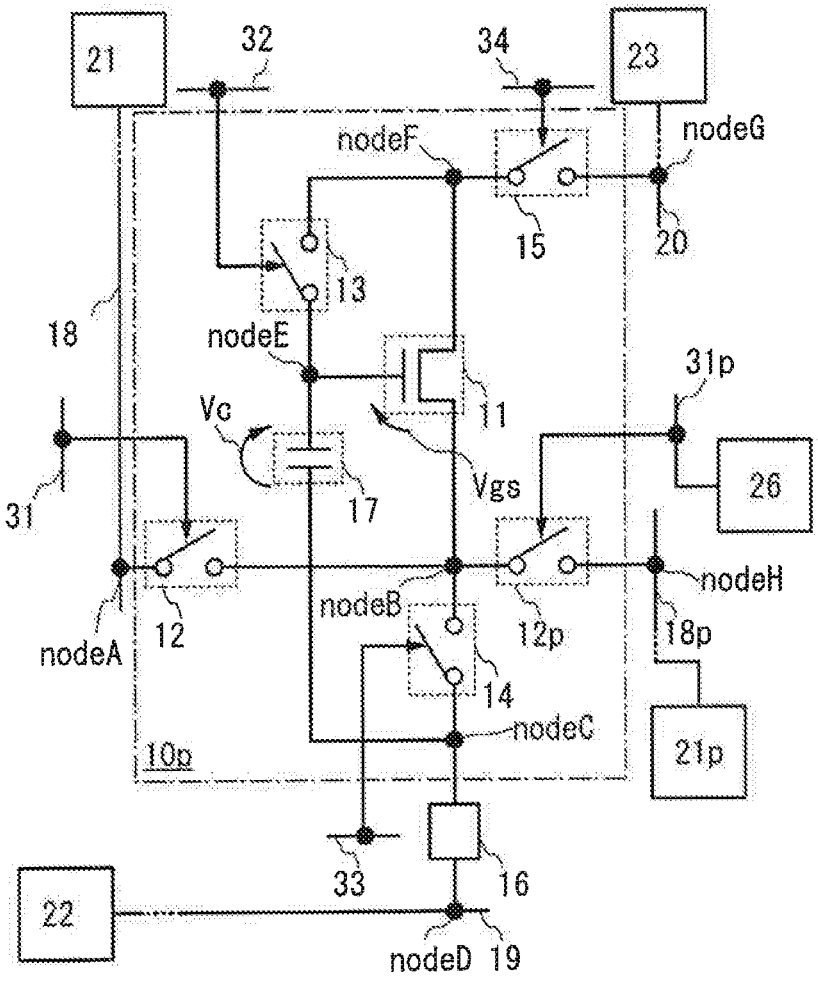
FIG. 16 is a circuit diagram illustrating an example of a semiconductor device of one embodiment of the present invention.

Note that in order to explain the operation of the circuit configuration illustrated in FIG. 15, FIG. 16 shows symbols representing the potentials of nodes between elements and the potentials of wirings. FIG. 16 also shows Vgs between the one of the terminals (mainly serving as a source) and the gate of the transistor 11 and Vc between the electrodes of the capacitor 17. The switching of the switch 12p is controlled with a wiring 31p. In FIG. 16, a circuit 26 is connected to the wiring 31p and has at least a function of supplying an H-level signal or an L-level signal. An example of the circuit 26 is a gate driver (scan line driver circuit). Further, in FIG. 16, a circuit 21p is connected to the wiring 18p and has a function of supplying Vinit to the wiring 18p. An example of the circuit 21p is a power supply circuit and a voltage follower circuit.

A nodeA, a nodeB, a nodeC, a nodeD, a nodeE, a nodeF, a nodeG, and a nodeH correspond to nodes and wirings illustrated in FIG. 16. The potential of the nodeA corresponds to the potential of the wiring 18. The potential of the nodeB corresponds to the potential of a wiring connecting the first terminal of the transistor 11, the first terminal of the switch 12, the first terminal of the switch 14, and the first terminal of the switch 12p. The potential of the nodeC corresponds to the potential of a wiring connecting the second terminal of the switch 14, the one of the terminals of the load 16, and the other of the electrodes of the capacitor 17. The potential of the nodeD corresponds to the potential of the wiring 19. The potential of the nodeE corresponds to the potential of a wiring connecting the gate of the transistor 11, the one of electrodes of the capacitor 17, and the first terminal of the switch 13. The potential of the nodeF corresponds to the potential of a wiring connecting the second terminal of the transistor 11, the second terminal of the switch 13, and the first terminal of the switch 15. The potential of the nodeG corresponds to the potential of the wiring 20. The potential of the nodeE the nodeH corresponds to the potential of the wiring 18p.

Figure 17A:
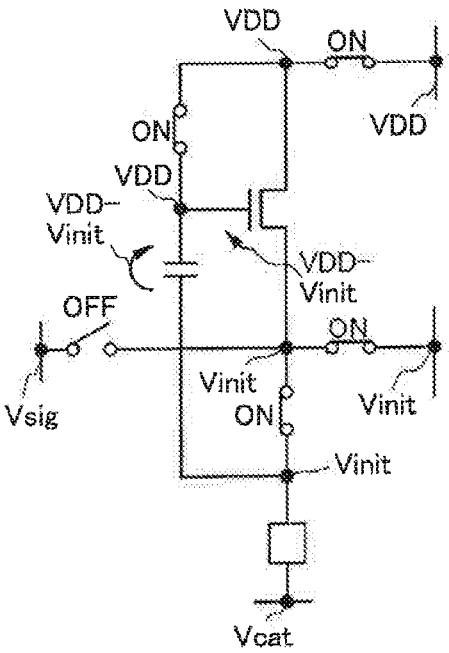
FIGS. 17A to 17C are circuit diagrams illustrating an example of a semiconductor device of one embodiment of the present invention.

First, the first operation is described with reference to FIG. 17A. Note that reference numerals of elements in FIG. 17A are omitted. A conduction state and a non-conduction state of the switches are denoted by ON and OFF. In addition, how Vgs, Vc, the potential of the nodeA, the potential of the nodeB, the potential of the nodeC, the potential of the nodeD, the potential of the nodeE, the potential of the nodeF, the potential of the nodeG, and the potential of the nodeH, which are illustrated in FIG. 16, are applied is described.

The first operation initializes the potential of each node. Specifically, the nodeA is set at any potential, the nodeD is set at Vcat, the nodeG is set at VDD, and the nodeH is set at Vinit. Then, the switch 12p, the switch 13, the switch 14, and the switch 15 are turned on, and the switch 12 is turned off. Thus, the nodeB is set at Vinit, the nodeC is set at Vinit, the nodeE is set at VDD, and the nodeF is set at VDD. Further, Vgs becomes (VDD−Vinit), and Vc becomes (VDD−Vinit).

The first operation described with reference to FIG. 17A is different from that of described with reference to FIG. 3A in Embodiment 1 in that Vinit supplied to the nodeB and the nodeC is supplied from the wiring 18p through the switch 12p. With the structure, initialization can be performed without change in potential of the wiring 18 and the initialization of each node can be performed at high speed. Alternatively, initialization of each node of the above semiconductor device 10p can be performed while a potential is supplied from the wiring 18 to another semiconductor device 10p connected to the wiring 18. Therefore, an operation period for the initialization can be longer.

Next, the second operation is described with reference to FIG. 17B, as in FIG. 17A.

The second operation is the operation for obtaining the threshold voltage of the transistor 11 with the use of Vgs by discharging the potential of the gate of the transistor 11 (or the electric charge of the capacitor 17). Specifically, the nodeA is set at Vsig, the nodeD is set at Vcat, the nodeG is set at VDD, and the nodeH is set at Vinit though it can be any potential. Then, the switch 12 and the switch 13 are turned on, and the switch 14, the switch 12p, and the switch 15 are turned off. Thus, the potential of the nodeB becomes Vsig, the potential of the nodeC becomes (Vinit−Vx), the potential of the nodeE becomes (Vsig+Vth), and the potential of the nodeF becomes (Vsig+Vth). Further, Vgs becomes Vth and Vc becomes (Vsig+Vth−Vinit+Vx).

Figure 17B:
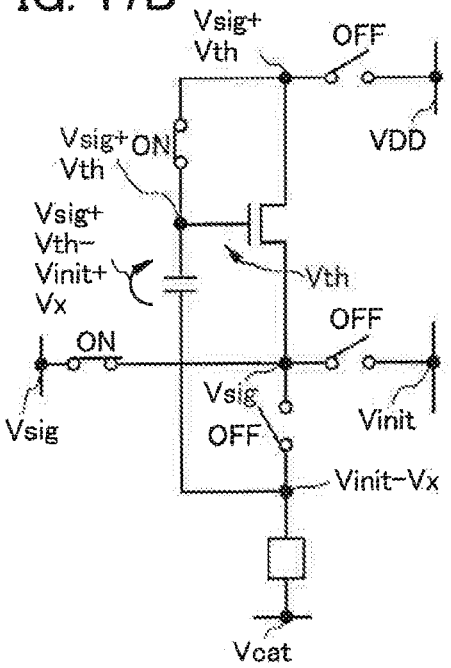

The second operation described with reference to FIG. 17B is different from that described in Embodiment 1 with reference to FIG. 3B in that the switch 12p is turned off. Therefore, the second operation in this embodiment is the same as the second operation described with reference to FIG. 3B. By the second operation, the potential of the nodeE corresponding to the potential of the gate of the transistor 11 can be (Vsig+Vth) which includes the threshold voltage of the transistor 11.

Note that in the second operation, the switch 14, the switch 15, and the switch 12p are turned off and the switch 12 is turned on, and these operations can be performed at the same time or at different timings.

For example, it is preferable that the switch 12 be turned on at the same time as or after the switch 12p is turned off. This is because a short circuit between the nodeA and the nodeH can be prevented easily.

Next, the third operation is described with reference to FIG. 17C, as in FIGS. 17A and 17B.

The third operation is the operation for outputting current to the load 16 with the use of the transistor 11 as part of a current source. Specifically, the nodeA is set at Vsig though it can be any potential, the nodeD is set at Vcat, the nodeG is set at VDD, and the nodeH can be set at Vinit though it can be any potential. Then, the switch 14 and the switch 15 are turned on, and the switch 12, the switch 12p, and the switch 13 are turned off. Then, the nodeB and the nodeC become Vel, the nodeE becomes (Vsig+Vth−Vinit+Vx+Vel), and the nodeF becomes VDD. In addition, Vgs becomes (Vsig+Vth−Vinit+Vx) and Vc becomes (Vsig+Vth−Vinit+Vx).

Figure 17C:
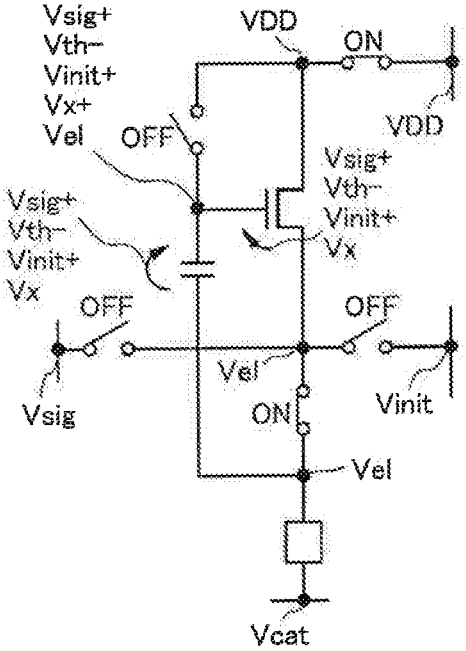

The third operation described with reference to FIG. 17C is different from that described in Embodiment 1 with reference to FIG. 3C in that the switch 12p is turned off. Therefore, the third operation in this embodiment is the same as the third operation described with reference to FIG. 3C. By the third operation, Vgs of the transistor 11 becomes (Vsig+Vth−Vinit+Vx), which includes the threshold voltage of the transistor 11. Accordingly, through the above operations, adverse effect of variations in the threshold voltage of the transistor on the amount of current supplied to the load can be reduced.

Note that FIG. 15 illustrates the circuit configuration of this embodiment but one embodiment of the present invention is not limited thereto. The location of the switch or the number of switches can be changed and appropriate voltage can be supplied so as to achieve the similar operation to the operation described in FIGS. 17A to 17C in which the threshold voltage of the transistor is corrected. In such a manner, a variety of circuits can be employed.

Figure 18A:
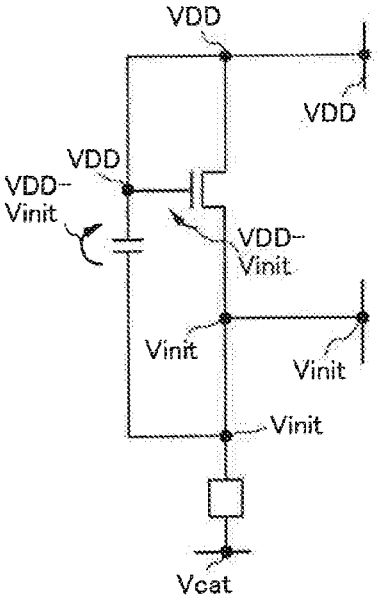
FIGS. 18A to 18C are circuit diagrams each illustrating an example of a semiconductor device of one embodiment of the present invention.
Figure 18B:
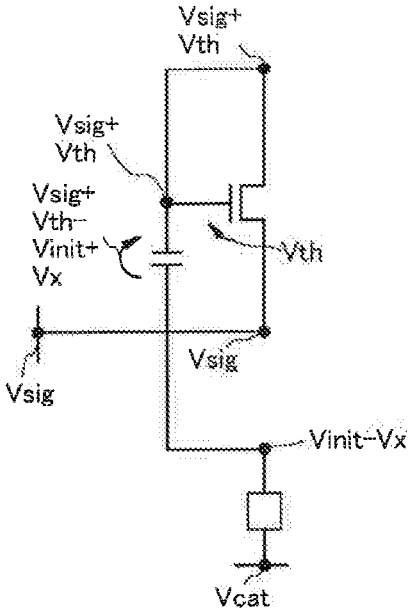
Figure 18C:
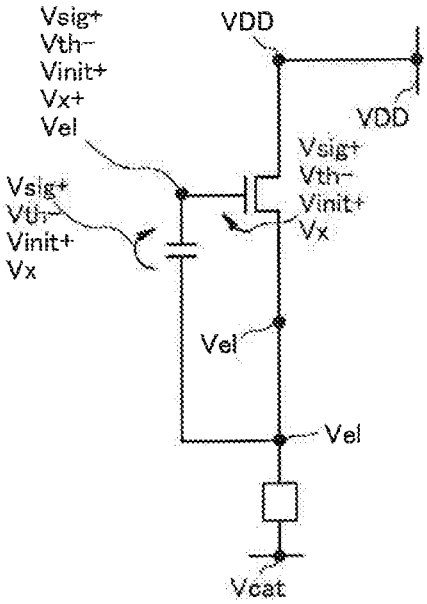

For example, specifically, the switch 12, the switch 12p, the switch 13, the switch 14, and the switch 15 can be provided any place and the numbers thereof is not limited as long as the switches can control a conduction state and a non-conduction state between nodes. In the case of the first operation described with reference to FIG. 17A, a connection relation illustrated in FIG. 18A can be employed. In the case of the second operation described with reference to FIG. 17B, a connection relation illustrated in FIG. 18B can be employed. In the case of the third operation described with reference to FIG. 17C, a connection relation illustrated in FIG. 18C can be employed. The potential of each node can have any level unless the node affects the operations.

As described above, in the circuit configuration described in this embodiment, the wiring 18p is provided and the initialization can be performed with the use of Vinit supplied from the wiring 18p through the switch 12p. Accordingly, time for initializing the potential of each node can be long. Alternatively, the initialization with the use of Vinit is not necessarily performed by using the wiring 18, which can save time allowing time for the second operation to be longer. In the third operation, Vgs of the transistor 11 becomes (Vsig+Vth−Vinit+Vx), which includes the threshold voltage of the transistor 11. Accordingly, with this structure, adverse effect of variations in the threshold voltage of the transistor on the amount of current supplied to the load can be reduced.

Note that the operation for correcting mobility can be performed with the use of the circuits illustrated in FIG. 15 and FIG. 16, as the operations illustrated in FIG. 5C, FIG. 6C, FIG. 13A, and FIG. 13B.

Note that FIG. 15, or the like illustrates an example of a circuit configuration; accordingly, a transistor can be provided additionally. In each node in FIG. 15, or the like, it is possible not to provide an additional transistor, switch, a passive element, or the like. For example, transistors directly connected to the nodeA, the nodeB, the nodeC, the nodeD, the nodeE, the nodeF, or/and the nodeG are not additionally provided. Accordingly, for example, the following structure can be used: only the transistor 14T is directly connected to the nodeC and the other transistors are not directly connected to the nodeC.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 4

The operations of the circuit configurations are described in Embodiments 1 to 3 under the assumption that the parasitic capacitance of the load 16 is utilized; however, another configuration can be used. In this embodiment, a configuration in which a capacitor is electrically connected in parallel to the load 16 provided in the circuit configuration in any of the above embodiments.

Figure 19:
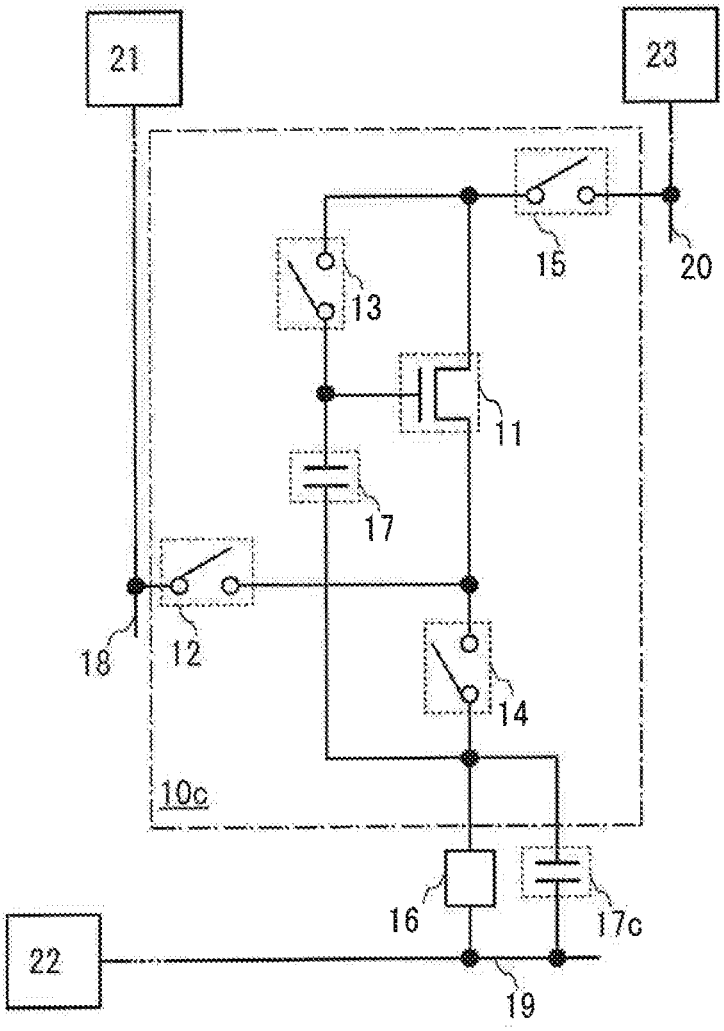
FIG. 19 is a circuit diagram illustrating an example of a semiconductor device of one embodiment of the present invention.
Figure 20:
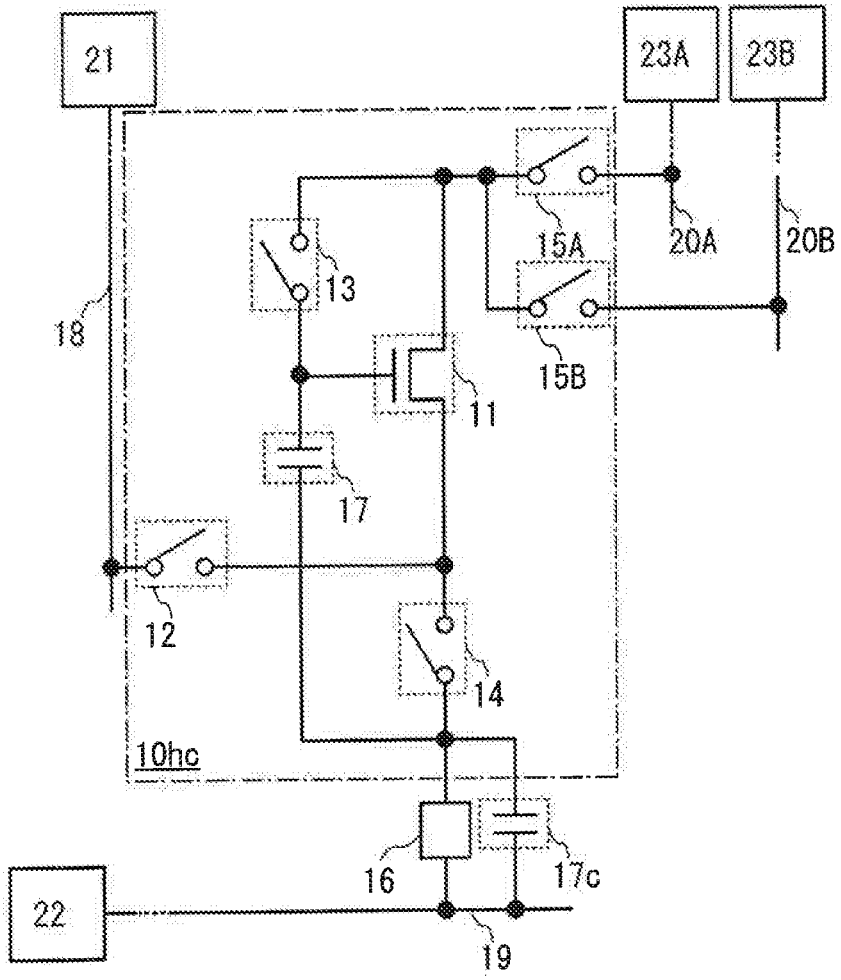
FIG. 20 is a circuit diagram illustrating an example of a semiconductor device of one embodiment of the present invention.
Figure 21:
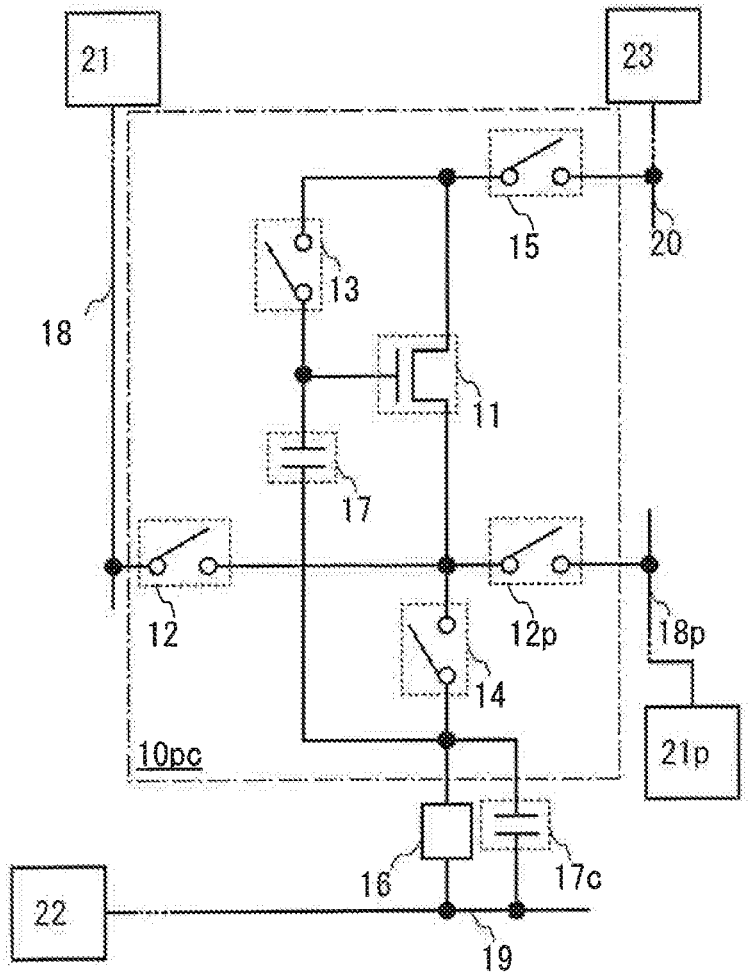
FIG. 21 is a circuit diagram illustrating an example of a semiconductor device of one embodiment of the present invention.
Figure 78:
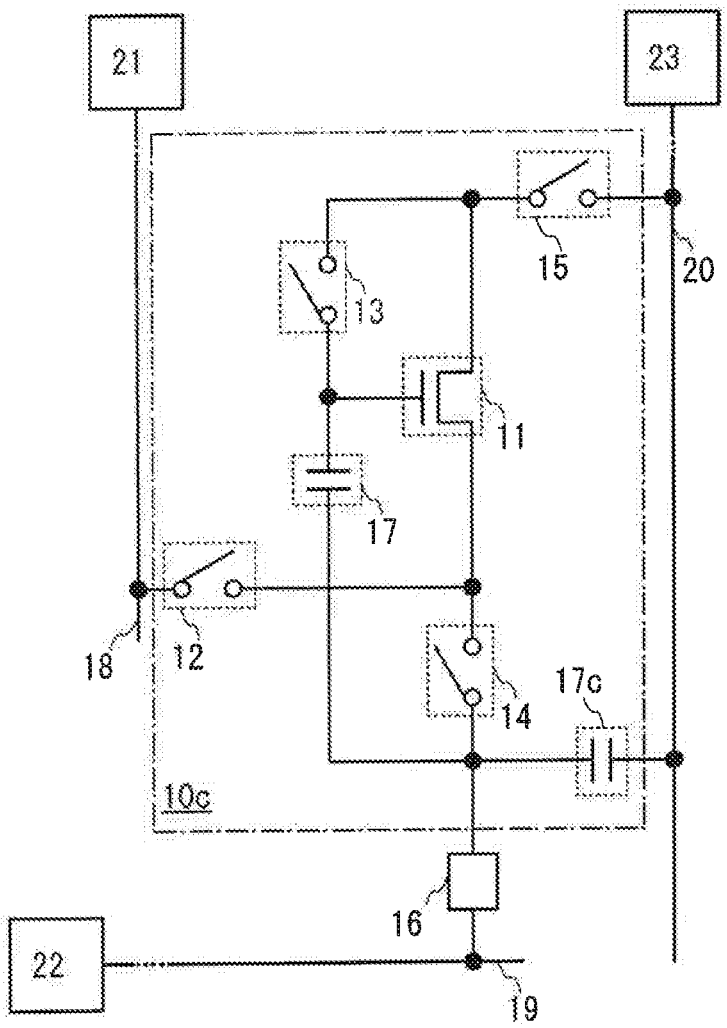
FIG. 78 is a circuit diagram illustrating an example of a semiconductor device of one embodiment of the present invention.
Figure 79:
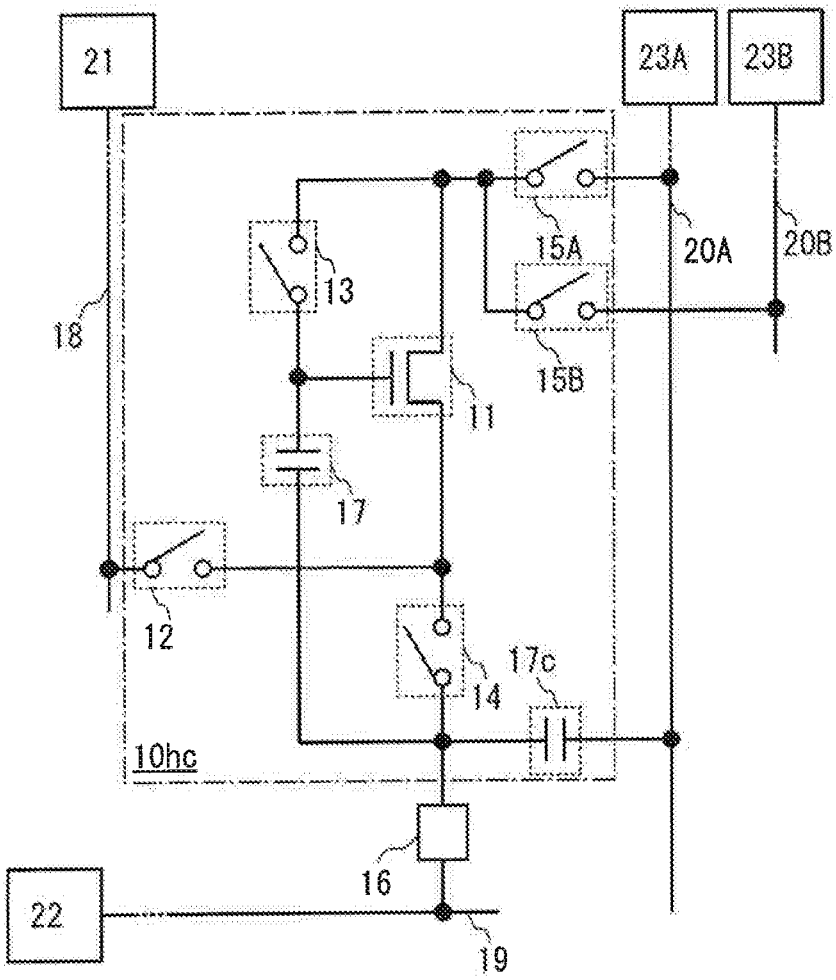
FIG. 79 is a circuit diagram illustrating an example of a semiconductor device of one embodiment of the present invention.
Figure 80:
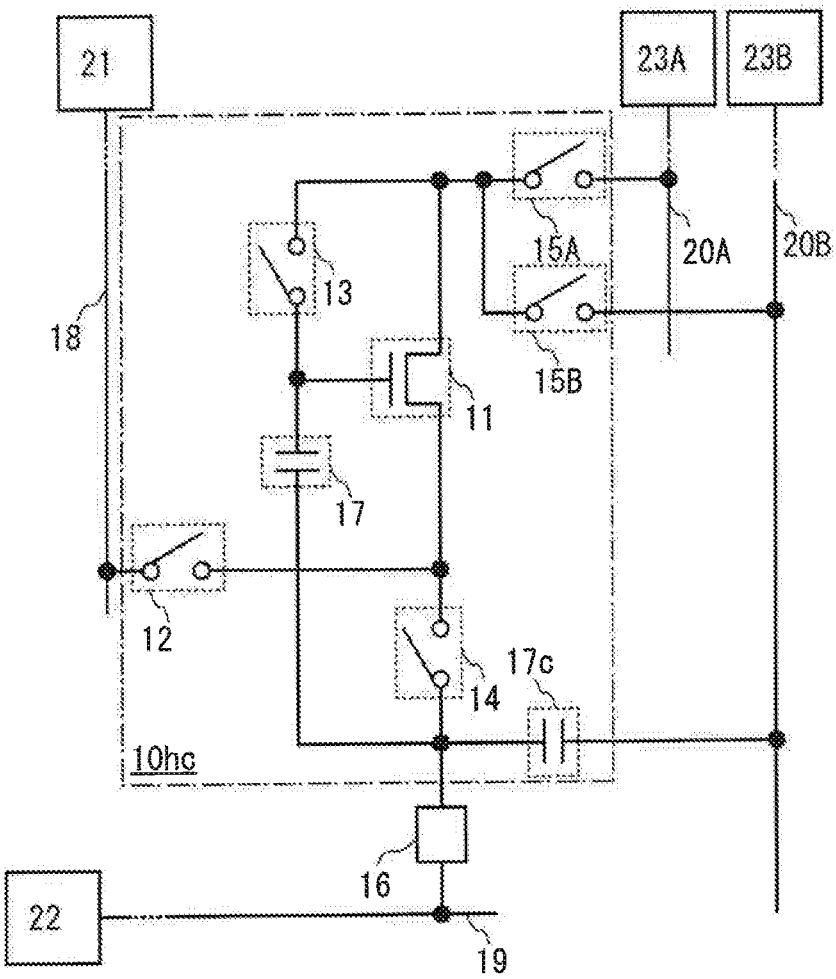
FIG. 80 is a circuit diagram illustrating an example of a semiconductor device of one embodiment of the present invention.
Figure 81:
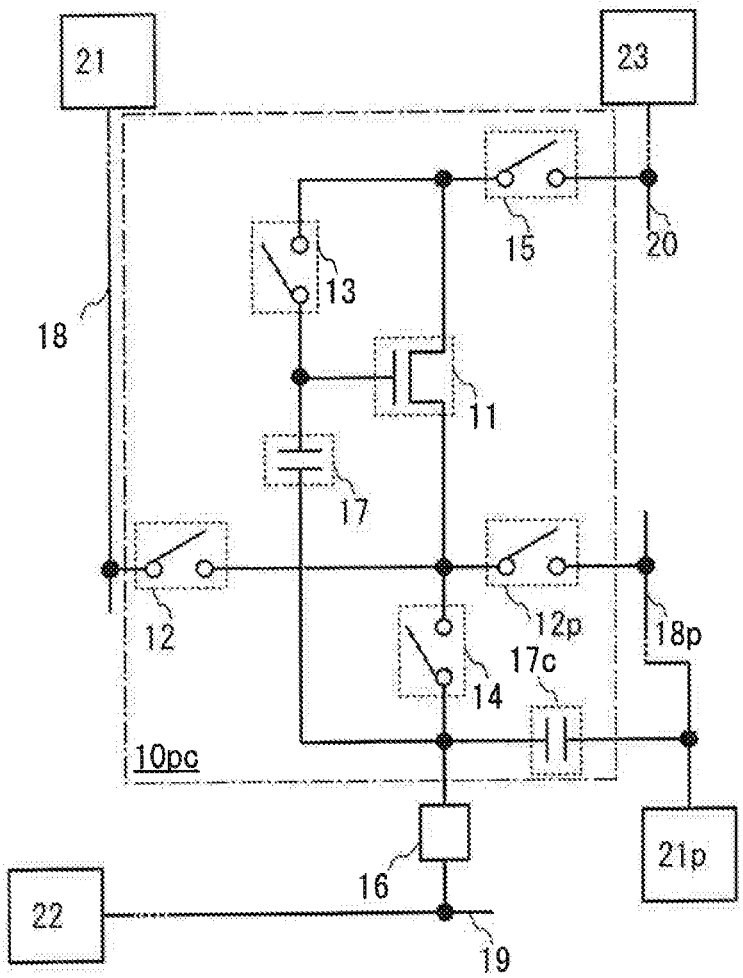
FIG. 81 is a circuit diagram illustrating an example of a semiconductor device of one embodiment of the present invention.

FIG. 19 illustrates a semiconductor device 10c and is different from FIG. 1A in that a capacitor 17c is electrically connected in parallel to the load 16 connected to the semiconductor device 10c. The capacitor 17c can be connected to the wiring 20 as illustrated in FIG. 78. Alternatively, the capacitor 17c can be connected to the wiring 32, the wiring 33, the wiring 34, the wiring 31p, the wiring 18p, or the like. Further alternatively, the capacitor 17c can be connected to the wiring 32, the wiring 33, the wiring 34, the wiring 31p, or the like of another semiconductor device 10c. Further, FIG. 20 illustrates a semiconductor device 10hc and is different from FIG. 14 in that the capacitor 17c is electrically connected in parallel to the load 16 connected to the semiconductor device 10hc. The capacitor 17c can be connected to the wiring 20A or the wiring 20B as illustrated in FIG. 79 or FIG. 80. Moreover, FIG. 21 illustrates a semiconductor device 10pc and is different from FIG. 15 in that a capacitor 17c is electrically connected in parallel to the load 16 connected to the semiconductor device 10hc. The capacitor 17c can be connected to the wiring 18p as illustrated in FIG. 81.

The capacitor 17c is electrically connected to the load 16 as illustrated in FIG. 19, FIG. 20, and FIG. 21, so that variations in electric charge at the nodeC can be small or Vx can be low in the operation for initialization and the operation for obtaining threshold voltage which are described in any of the above embodiments. When Vx can be low, the semiconductor device can supply a more accurate amount of current to the load 16.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 5

In this embodiment, a configuration different from the circuit configurations of the semiconductor devices described in Embodiments 1 to 4 is described.

Figure 22:
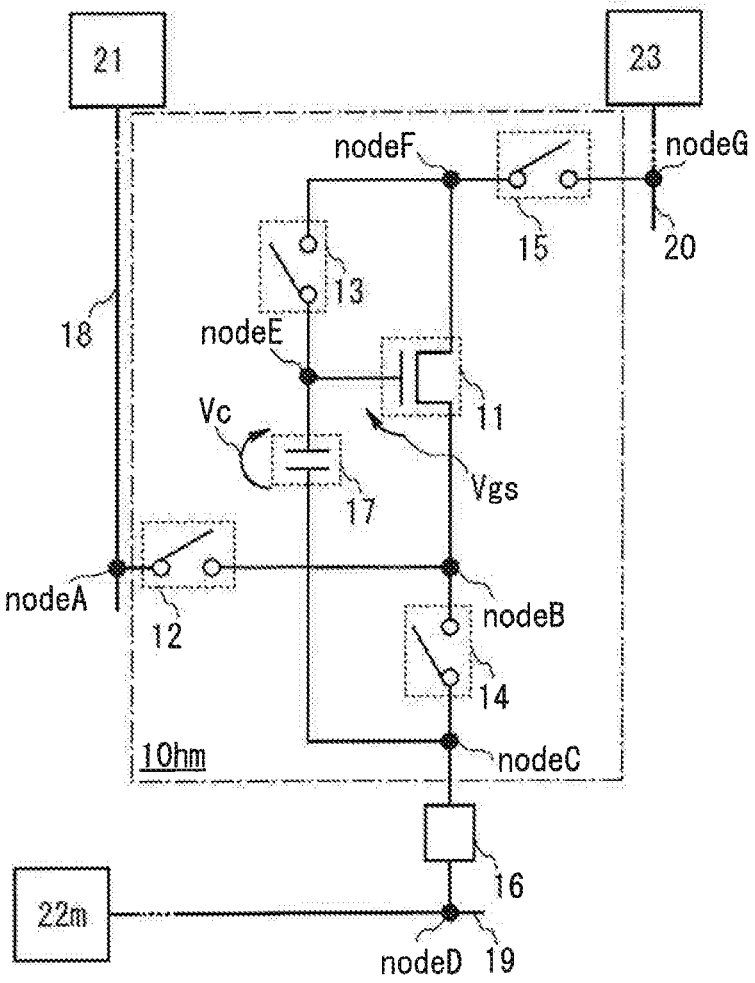
FIG. 22 is a circuit diagram illustrating an example of a semiconductor device of one embodiment of the present invention.

FIG. 22 illustrates a semiconductor device 10hm having a circuit configuration similar to the semiconductor device 10 illustrated in FIG. 1A. The semiconductor device 10hm illustrated in FIG. 22 is different from the semiconductor device 10 illustrated in FIG. 1A in that the semiconductor device 10hm is connected to a circuit 22m. The circuit 22m which has a function of supplying a potential to the wiring 19 has a function of supplying Vup or Vcat, switching them as necessary. Note that components in common with those in FIG. 1A are denoted by common reference numerals, and the description thereof is omitted.

The potential Vup can be higher than Vcat. The potential Vup is high, so that Vinit is prevented from being too low.

Next, the operation of the semiconductor device 10hm illustrated in FIG. 22 is described. The operation of the semiconductor device 10hm illustrated in FIG. 22 can be mainly divided into a first operation, a second operation, and a third operation.

Note that in order to explain the operation of the circuit configuration illustrated in FIG. 22, FIG. 22 shows symbols representing the potentials of nodes between elements and the potentials of wirings, as FIG. 2B does. The operation of the circuit configuration illustrated in FIGS. 23A to 23C is explained with symbols of Vgs and Vc, as in FIG. 2B.

Figure 23A:
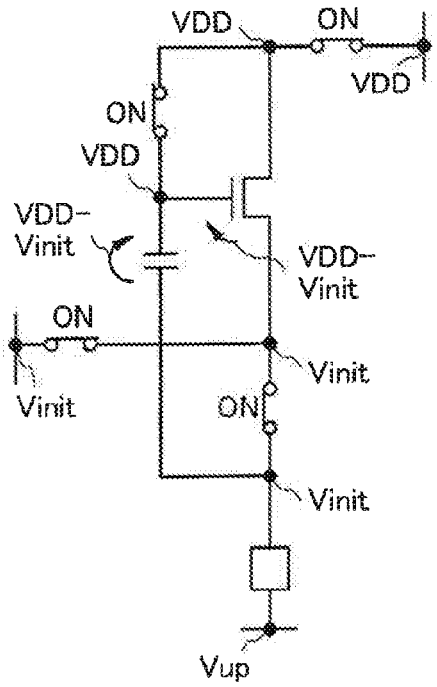
FIGS. 23A to 23C are circuit diagrams illustrating an example of a semiconductor device of one embodiment of the present invention.

The first operation illustrated in FIG. 23A is the same as the first operation described with reference to FIG. 3A except that the nodeD is set at Vup. The description of the same portions is omitted. When the nodeD is set at Vup, current flowing to the load 16 in the first operation can be reduced more surely. Alternatively, a normal operation can be performed with ease without making Vinit extremely low. Therefore, another potential can have smaller amplitude, resulting in reduction in power consumption.

The potential Vup is higher than Vinit and Vsig. Alternatively, Vup is approximately equal to Vinit. Note that the potential is preferably set so as not to cause dielectric breakdown of the load 16.

Figure 23B:
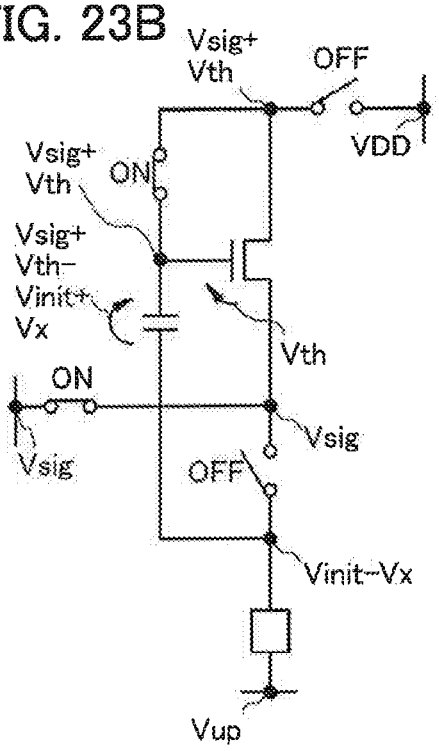
Figure 23C:
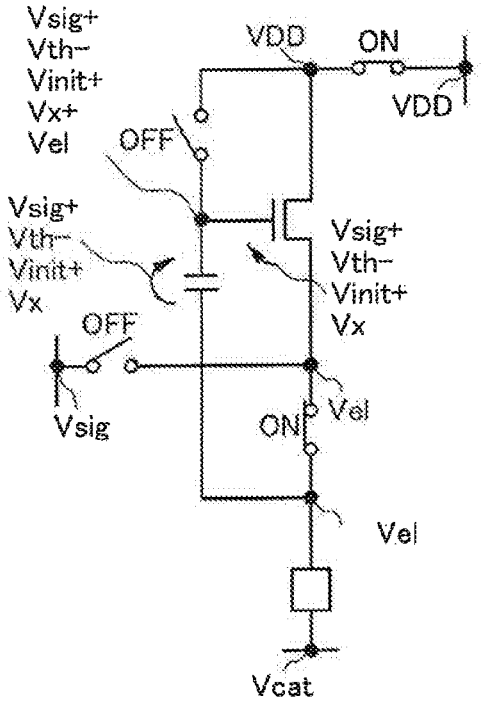

The second operation illustrated in FIG. 23B is the same as the second operation described with reference to FIG. 3B except that the nodeD is set at Vup. The description of the same portions is omitted. When the nodeD is set at Vup, current flowing to the load 16 in the second operation can be reduced more surely.

Figure 31A:
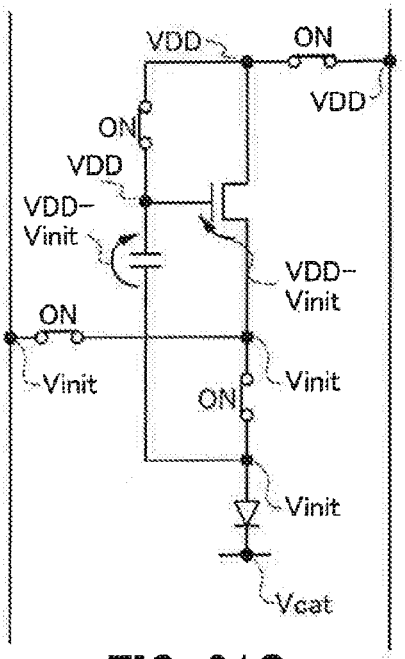
FIGS. 31A to 31C are circuit diagrams illustrating an example of a pixel of one embodiment of the present invention.
Figure 31B:
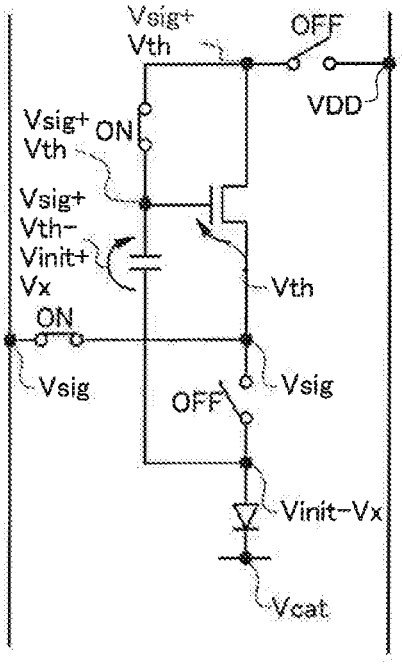
Figure 31C:
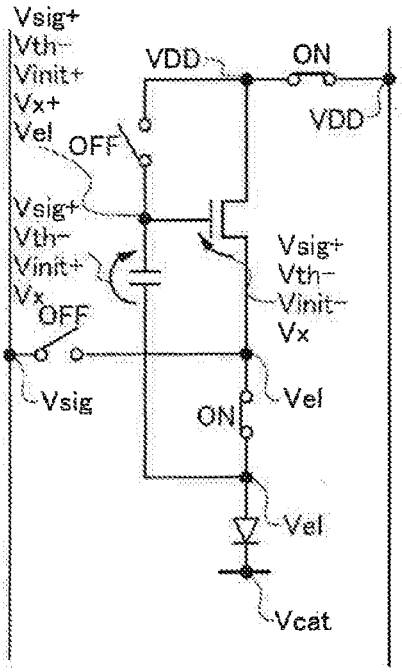

Then, the third operation illustrated in FIG. 23C is the same as the third operation described with reference to FIG. 31C and therefore the description thereof is omitted. Note that the third operation illustrated in FIG. 23C is different from the first operation described with reference to FIG. 23A and the second operation described with reference to FIG. 23B in that the nodeD is set at Vcat and current flows through the load.

With the structure described with reference to FIGS. 23A to 23C, only when the transistor 11 is completely set to allow the semiconductor device to serve as a current source, current can flow without causing malfunction.

Note that the operation for correcting mobility can be performed with the use of the circuits illustrated in FIG. 22, as the circuits illustrated in FIG. 5C, FIG. 6C, FIG. 13A, and FIG. 13B.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 6

In this embodiment, the structure used for part of a signal line driver circuit of a display device including the semiconductor device described in any of the above embodiments is explained.

Figure 24:
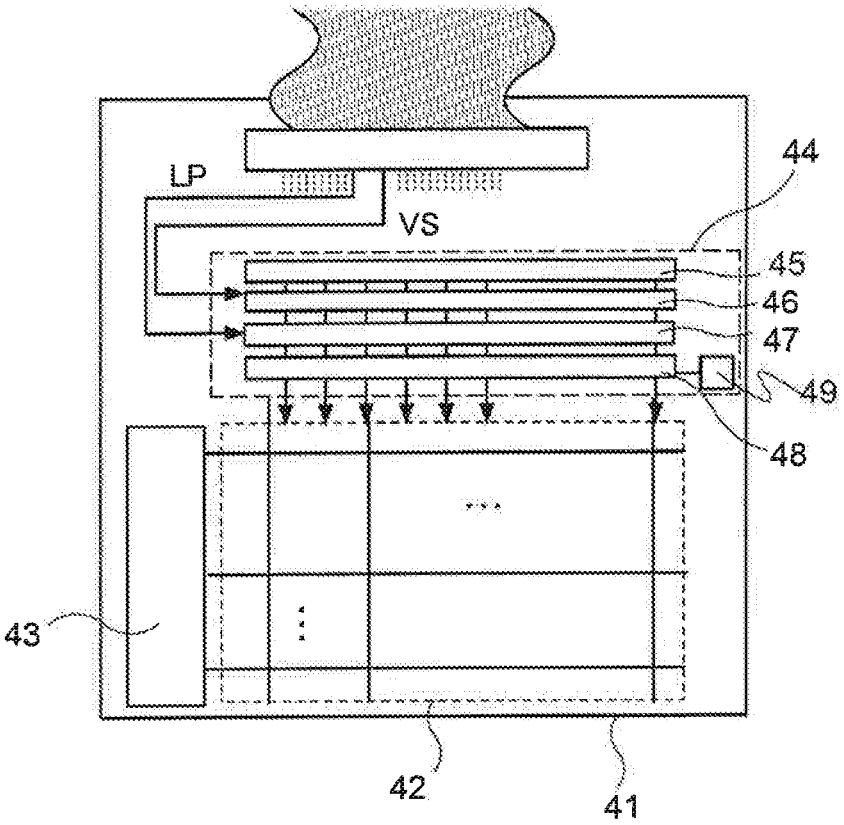
FIG. 24 is a circuit diagram illustrating an example of a semiconductor device of one embodiment of the present invention.

As illustrated in FIG. 24, a display device 41 to which the semiconductor device described in any of the above embodiments is applied includes a pixel region 42, a gate line driver circuit 43, and a signal line driver circuit 44. The gate line driver circuit 43 sequentially outputs a select signal to the pixel region 42. The signal line driver circuit 44 sequentially outputs a video signal to the pixel region 42. The pixel region 42 displays an image by controlling the state of light in accordance with a video signal. The video signal input from the signal line driver circuit 44 to the pixel region 42 is a current. That is, a display element and an element for controlling the display element arranged in each pixel change their states according to the video signal (current) input from the signal line driver circuit 44. Examples of the display elements arranged in pixels are an EL element, an element used in an FED (Field Emission Display), a liquid crystal element, electronic ink, an electrophoresis element, a grating light valve (GLV), and the like. Display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Display devices having electronic ink or electrophoretic elements include electronic paper and the like.

Note that the number of the gate line driver circuits 43 and the signal line driver circuits 44 may be more than one.

The signal line driver circuit 44 can be divided into a plurality of portions in its configuration. As an example, it can be roughly divided into a shift register 45, a first latch circuit 46 (LAT1), a second latch circuit 47 (LAT2), and a digital to analog converter circuit 48. The digital to analog converter circuit 48 has a function of converting a voltage into a current, and it may also have a function of providing a gamma correction. That is, the digital to analog converter circuit 48 has a circuit which outputs a current (video signal) to a pixel, namely a current source circuit to which the semiconductor device described in any of the above embodiments can be applied.

In addition, a pixel has a display element such as an EL element. The pixel has a circuit which outputs a current (video signal) to the display element, namely a current source circuit to which the semiconductor device described in any of the above embodiments can also be applied.

Next, the operation of the signal line driver circuit 44 is described briefly. The shift register 45 is formed by using a plurality of columns of flip-flop circuits (FFs) and the like, and a clock signal (S-CLK), a start pulse (SP), and an inverted clock signal (S-CLKb) are input to the shift register 45. Sampling pulses are sequentially outputted in accordance with these signals.

The sampling pulse outputted from the shift register 45 is input to the first latch circuit 46 (LAT1). The first latch circuit 46 (LAT1) is input with a video signal (VS) from the video signal line and holds a video signal in each column in response to the timing at which the sampling pulses are input. Note that a video signal has a digital value in the case where the digital to analog converter circuit 48 is disposed. Further, a video signal in this stage is often a voltage.

However, in a case where the first latch circuit 46 and the second latch circuit 47 are circuits which can store analog values, the digital to analog converter circuit 48 can be omitted in many cases. In that case, a video signal is a current in many cases. Further, in a case where data output to the pixel region 42 has a binary value, that is a digital value, the digital to analog converter circuit 48 can be omitted in many cases.

When the retainment of the video signals up to the last column is completed in the first latch circuit 46 (LAT1), a latch pulse LP is input from a latch control line in a horizontal retrace period and the video signals held in the first latch circuit 46 (LAT1) are transferred to the second latch circuit 47 (LAT2) all at once. After that, the video signals of one row, which are held in the second latch circuit 47 (LAT2), are input to the digital to analog converter circuit 48 at once. Then, a signal output from the digital to analog converter circuit 48 is input to the pixel region 42.

While the video signal held in the second latch circuit 47 (LAT2) is input to the digital to analog converter circuit 48 and then inputted to the pixel region 42, a sampling pulse is outputted from the shift register 45 again. In other words, two operations are performed at the same time. Accordingly, a line sequential driving can be enabled. These operations are repeated thereafter.

When a current source circuit in the digital to analog converter circuit 48 is a circuit which performs the set operation and the output operation, a circuit to supply a current to the current source circuit is required. In that case, a reference current source circuit 49 is disposed.

Note that a part or all of the signal line driver circuit may be provided outside a substrate having the pixel region 42, and for example, it may be constructed of an external IC chip. In that case, the IC chip and the substrate are connected by using COG (Chip On Glass), TAB (Tape Auto Bonding), a printed substrate or the like.

Note that a configuration of the signal line driver circuit or the like is not limited to FIG. 24.

Figure 25:
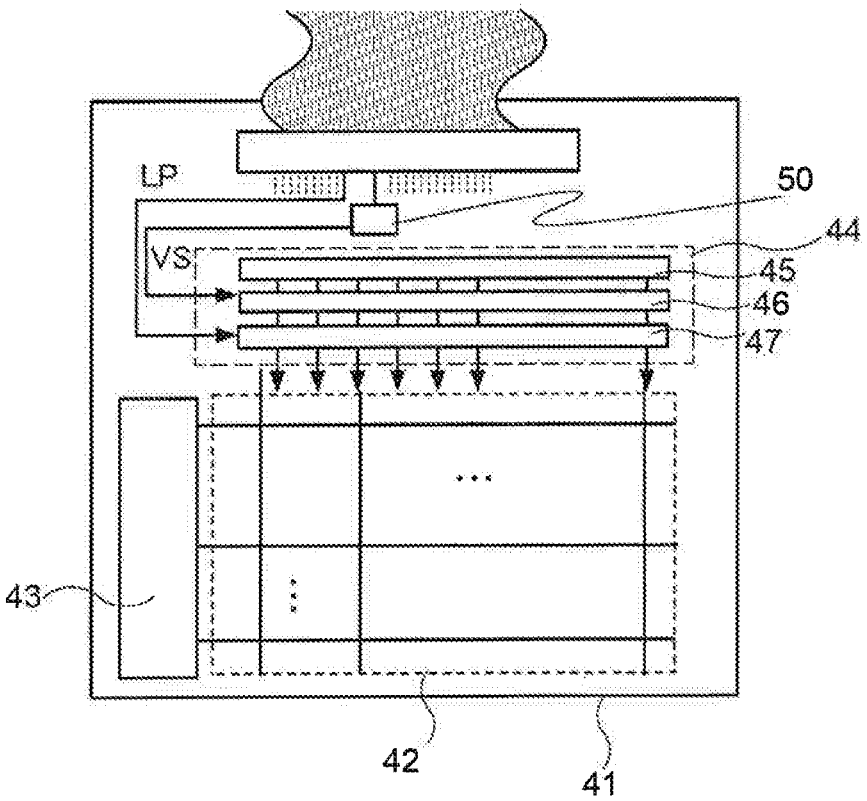
FIG. 25 is a circuit diagram illustrating an example of a semiconductor device of one embodiment of the present invention.

For example, in a case where the first latch circuit 46 and the second latch circuit 47 can store analog values, a video signal VS (analog current) is input to the first latch circuit 46 (LAT1) from a reference current source circuit 50 as illustrated in FIG. 25 in some cases. Further, the second latch circuit 47 is not included in FIG. 25 in some cases.

Next, a specific configuration where the semiconductor device described in any of the above embodiments is applied to the signal line driver circuit 44 is described.

Figure 26:
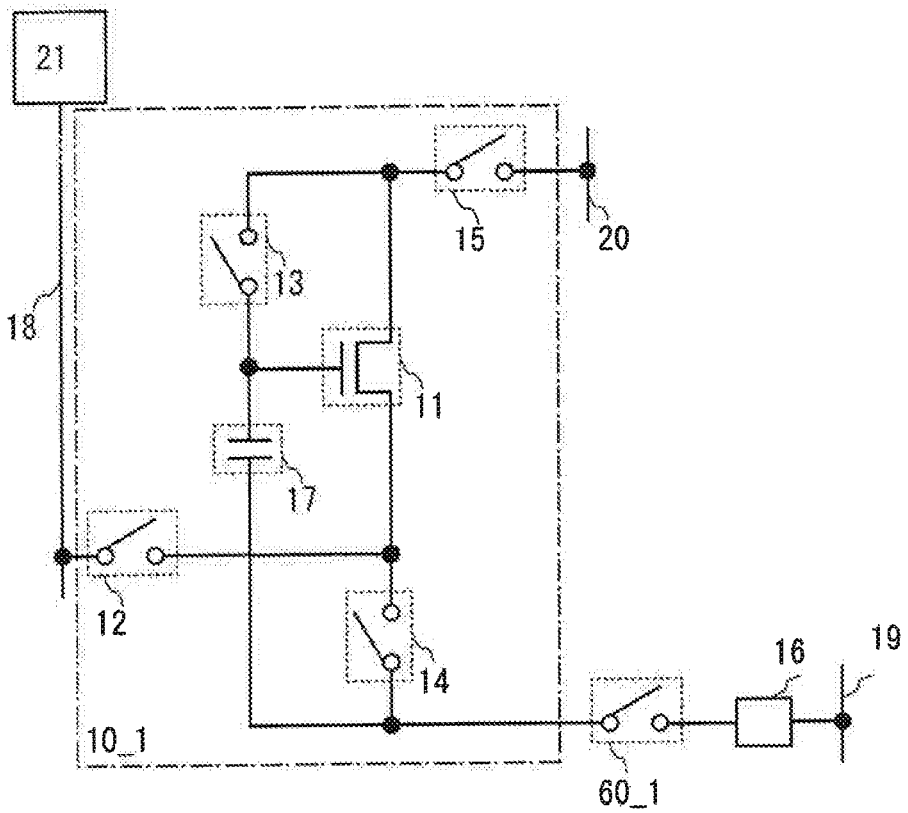
FIG. 26 is a circuit diagram illustrating an example of a semiconductor device of one embodiment of the present invention.

First, FIG. 26 illustrates an example of a circuit configuration of the semiconductor device described in any of the above embodiments which is applied to the signal line driver circuit. The semiconductor device 10_1 illustrated in FIG. 26 has the configuration similar to the semiconductor device 10 described with reference to FIG. 1A in Embodiment 1. Note that components in common with those in FIG. 1A are denoted by common reference numerals, and the description thereof is omitted. Current in accordance with Vsig of the circuit 21 can be output to the load because variations in the threshold voltage of the transistor 11 can be reduced.

Supply of current in accordance with Vsig set in the semiconductor device 10_1 is controlled by the switching of a switch 60_1 provided between the semiconductor device 10_1 and the load 16. In that case, for example, the plurality of semiconductor devices 10_1 are provided and the amount of current flowing to the load can be controlled by the switches 60_1.

Figure 27:
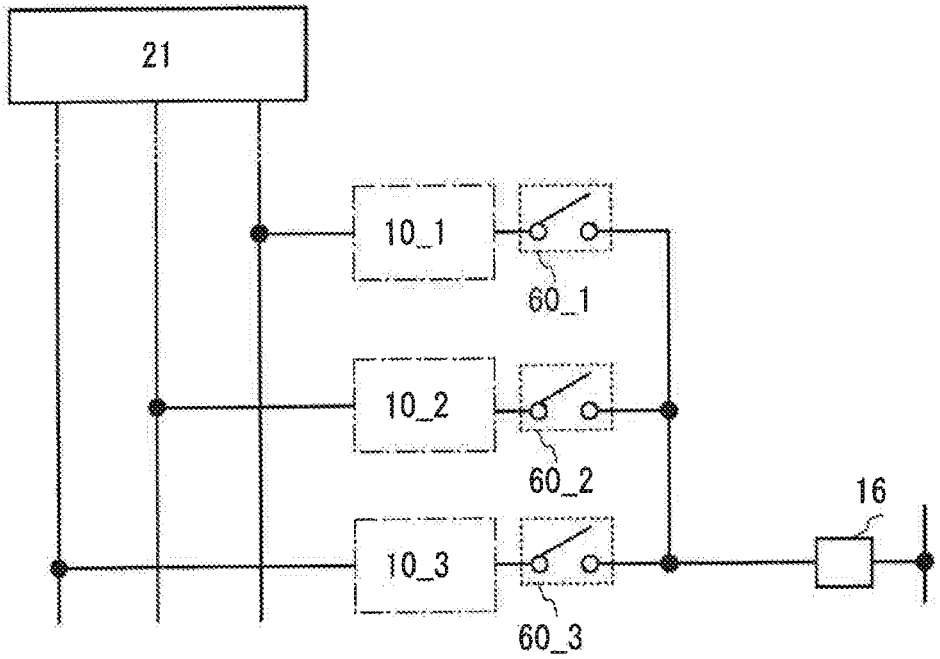
FIG. 27 is a circuit diagram illustrating an example of a semiconductor device of one embodiment of the present invention.

For example, the following structure illustrated in FIG. 27 can be also used: the semiconductor devices 10_1 to 10_3 are provided as the plurality of semiconductor devices and the amount of current flowing to the load 16 is changed by control of the switches 60_1 to 60_3. The amounts of currents flowing at the semiconductor devices 10_1 to 10_3 are set in the circuit 21 so as to differ from each other or be the same as each other, and the amount of current flowing to the load 16 may be controlled by the switching of the switches.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 7

In this embodiment, an example of the case where the circuit configuration which is one embodiment of the present invention is applied to a pixel of a display device is described.

Figure 28A:
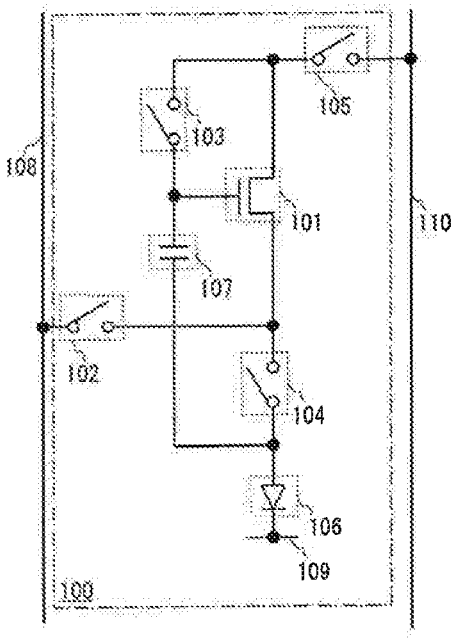
FIGS. 28A and 28B are circuit diagrams each illustrating an example of a pixel of one embodiment of the present invention.

FIG. 28A illustrates a circuit configuration of a pixel. Note that in this embodiment, an re-channel transistor is described as an example. In the structure described below, a light-emitting element is used as a display element included in the pixel.

The circuit configuration illustrated in FIG. 28A has a circuit for discharging electric charge held in a gate of a transistor in order to correct variations in current characteristics due to variations in threshold voltage of the transistor or the like. In practice, the pixel circuit has a connection relation so that variations in current characteristics of the transistor can be corrected by controlling the switching of a plurality of switches provided between wirings.

The pixel 100 illustrated in FIG. 28A includes a switch 102, a switch 103, a switch 104, a switch 105, a light-emitting element 106, a capacitor 107, and a transistor 101 which allows the pixel 100 to operate as a current source. Note that in this embodiment, the transistor 101 which allows the semiconductor device to operate as a current source is an n-channel transistor, for example.

Next, a connection relation of components in the pixel 100 is described.

A gate of the transistor 101 is connected to one of electrodes of the capacitor 107 and one of terminals of the switch 103. A first terminal (one of a source and a drain) of the transistor 101 is connected to one of terminals of the switch 102 and one of terminals of the switch 104. A second terminal (the other of the source and the drain) of the transistor 101 is connected to the other of the terminals of the switch 103 and one of terminals of the switch 105. Note that one of terminals is also referred to as a first terminal and the other of the terminals is also referred to as a second terminal.

The other of the terminals of the switch 102 is connected to the wiring 108.

The other of the terminals of the switch 105 is connected to the wiring 110.

One of electrodes of the light-emitting element 106 is connected to the other of the terminals of the switch 104 and the other of the electrodes of the capacitor 107. The other of the electrodes of the light-emitting element 106 is connected to the wiring 109.

Note that in this embodiment, a pixel corresponds to a display unit controlling the luminance of one color component (e.g., any one of R (red), G (green), and B (blue)). Therefore, in a color display device, the minimum display unit of a color image is composed of three pixels of an R pixel, a G pixel and a B pixel. Note that the color of the color elements is not necessarily of three varieties and may be of three or more varieties or may include a color other than RGB.

An example of the light-emitting element is an EL element. Examples of an EL element are an element including an anode, a cathode, and an EL layer interposed between the anode and the cathode, and the like. Examples of an EL layer are a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low-molecular material, a layer including a high-molecular material and a low-molecular material, and the like. Note that the present invention is not limited thereto, and various types of EL elements can be used.

Figure 28B:
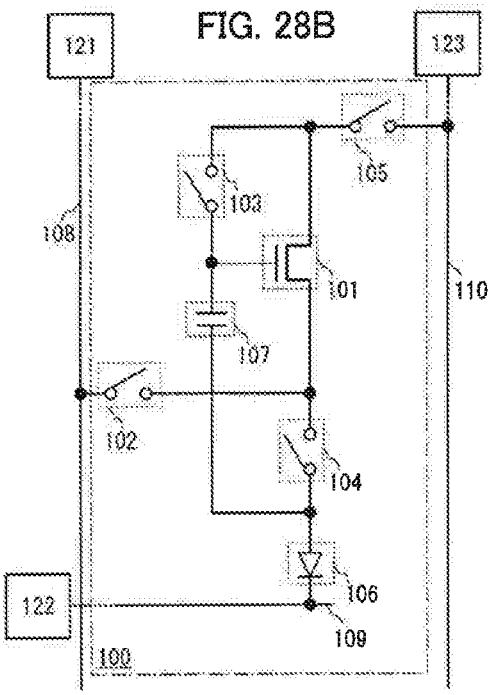

Note that as illustrated in FIG. 28B, the wiring 108 is connected to a circuit 121 having at least a function of supplying Vinit or Vsig by switching Vinit and Vsig. An example of the circuit 121 is a source driver (signal line driver circuit). Accordingly, the wiring 108 has a function of capable of transmitting or supplying Vinit and/or Vsig.

The potential Vinit initializes the potential of each node in the pixel before Vsig which is a video signal is supplied, for example. Note that Vinit may be different depending on pixels, rows, or columns. Alternatively, Vinit may be different depending on colors of pixels.

An example of Vsig is a video signal. Therefore, the potential to be supplied to pixels depends on an image to be displayed. When the image to be displayed is a moving image, the potential to be supplied varies over time in some cases. Further, when the image to be displayed is a still image, the fixed potential is supplied in some cases.

Note that as illustrated in FIG. 28B, the wiring 109 is connected to a circuit 122 having at least a function of supplying Vcat, for example. An example of the circuit 122 is a power supply circuit. Accordingly, the wiring 109 has a function of capable of transmitting or supplying Vcat.

The potential Vcat is set to make current flow from the side of one of electrodes (an anode) of the light-emitting element 106 to the side of the other of the electrodes (cathode) of the light-emitting element 106 in a period in which the light-emitting element 106 emits light. If the cathodes of the light-emitting elements 106 in pixels are the same, the wiring of each pixel is supplied with Vcat. The potential Vcat may be different depending on pixels, rows, or columns. Alternatively, Vcat may be different depending on colors of pixels.

Note that as illustrated in FIG. 28B, the wiring 110 is connected to at least a circuit 123 for supplying VDD. An example of the circuit 123 is a power supply circuit. Accordingly, the wiring 110 has a function of capable of transmitting or supplying VDD. Alternatively, the wiring 110 has a function of capable of supplying current to the transistor 101. Alternatively, the wiring 110 has a function of capable of supplying current to the light-emitting element 106.

The potential VDD is set to make current flow from the side of the one of the electrodes of the light-emitting element 106 to the side of the other of the electrodes of the light-emitting element 106 through the transistor 101. Therefore, for example, VDD is higher than Vcat. When the characteristics of the light-emitting elements 106 in pixels are the same, the same VDD can be supplied to the wiring of each pixel. The potential VDD may be different depending on pixels, rows, or columns. Alternatively, VDD may be different depending on colors of pixels.

Figure 29A:
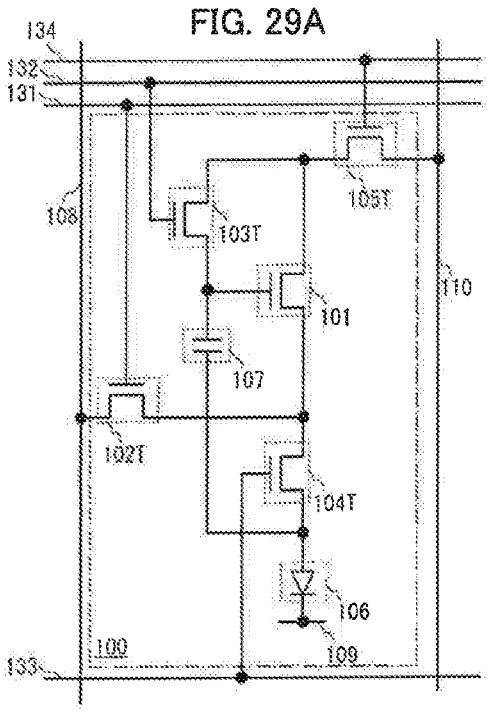
FIGS. 29A and 29B are circuit diagrams each illustrating an example of a pixel of one embodiment of the present invention.

Note that each of the switch 102, the switch 103, the switch 104, and the switch 105 which are illustrated in FIG. 28A can be a transistor. Thus, as an example, FIG. 29A illustrates the case where an n-channel transistor is used as each of the switch 102, the switch 103, the switch 104, and the switch 105. Note that components in common with those in FIG. 28A are denoted by common reference numerals, and the description thereof is omitted. All of the transistors have the same polarity as illustrated in FIG. 29A, whereby the semiconductor device can be manufactured in a small number of steps. Thus, the manufacturing cost can be reduced.

In FIG. 29A, a transistor 102T corresponds to the switch 102, a transistor 103T corresponds to the switch 103, a transistor 104T corresponds to the switch 104, and a transistor 105T corresponds to the switch 105.

A gate of the transistor 102T is connected to a wiring 131. A first terminal of the transistor 102T is connected to the first terminal of the transistor 101 and a first terminal of the transistor 104T. A second terminal of the transistor 102T is connected to the wiring 108. Therefore, the transistor 102T is in a conduction state when the potential of the wiring 131 is at an H level, and the transistor 102T is in a non-conduction state when the potential of the wiring 131 is at an L level.

Further, a gate of the transistor 103T is connected to a wiring 132. A first terminal of the transistor 103T is connected to the gate of the transistor 101 and the one of the electrodes of the capacitor 107. A second terminal of the transistor 103T is connected to a first terminal of the transistor 105T and the second terminal of the transistor 101. Therefore, the transistor 103T is in a conduction state when the potential of the wiring 132 is at an H level, and the transistor 103T is in a non-conduction state when the potential of the wiring 132 is at an L level.

Furthermore, a gate of the transistor 104T is connected to a wiring 133. A first terminal of the transistor 104T is connected to the first terminal of the transistor 101 and the first terminal of the transistor 102T. A second terminal of the transistor 104T is connected to the first electrode of the light-emitting element 106 and the other electrode of the capacitor 107. Therefore, the transistor 104T is in a conduction state when the potential of the wiring 133 is at an H level, and the transistor 104T is in a non-conduction state when the potential of the wiring 133 is at an L level.

In addition, a gate of the transistor 105T is connected to a wiring 134. The first terminal of the transistor 105T is connected to the second terminal of the transistor 101 and the second terminal of the transistor 103T. A second terminal of the transistor 105T is connected to the wiring 110. Therefore, the transistor 105T is in a conduction state when the potential of the wiring 134 is at an H level, and the transistor 105T is in a non-conduction state when the potential of the wiring 134 is at an L level.

Note that the wiring 131, the wiring 132, the wiring 133, and the wiring 134 can function as different wirings. However, one embodiment of the present invention is not limited thereto. The wirings 131 to 134 can be combined into one wiring; therefore, it is possible to form a circuit with a small number of wirings.

Figure 96:
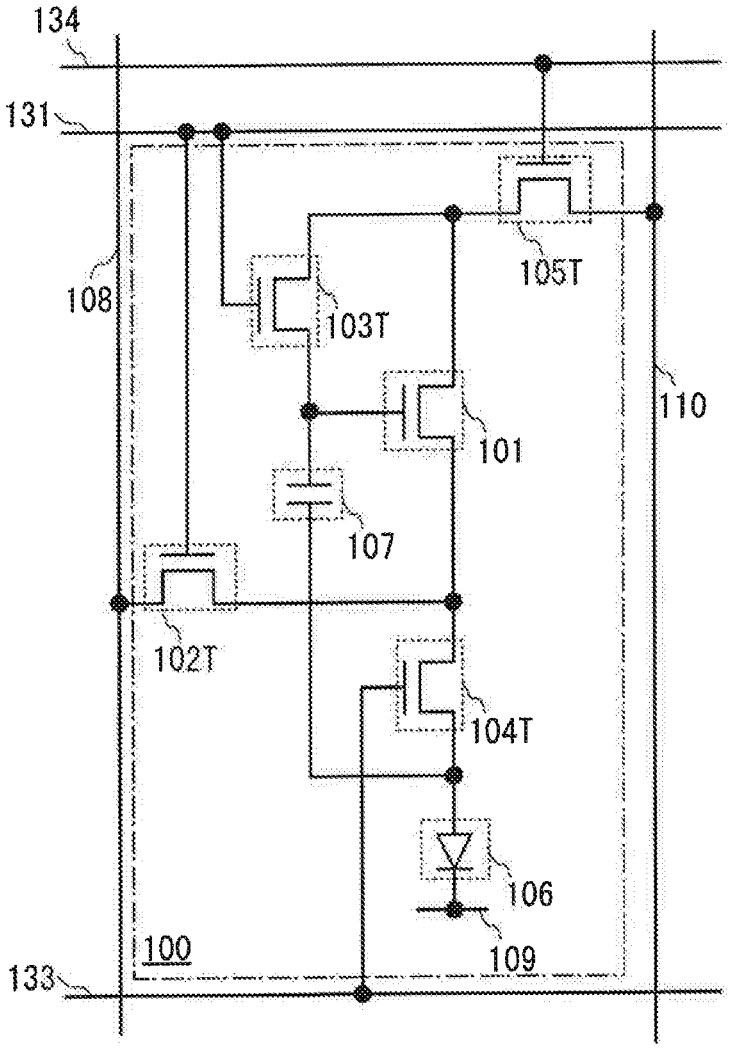
FIG. 96 is a circuit diagram illustrating an example of a pixel of one embodiment of the present invention.

For example, the wiring 131 and the wiring 132 can be combined into one wiring. Therefore, the wiring 131 can be connected to the wiring 132 to be one wiring. At this time, the transistor 102T and the transistor 103T preferably have the same polarity. FIG. 96 shows a circuit diagram of this case.

Figure 97:
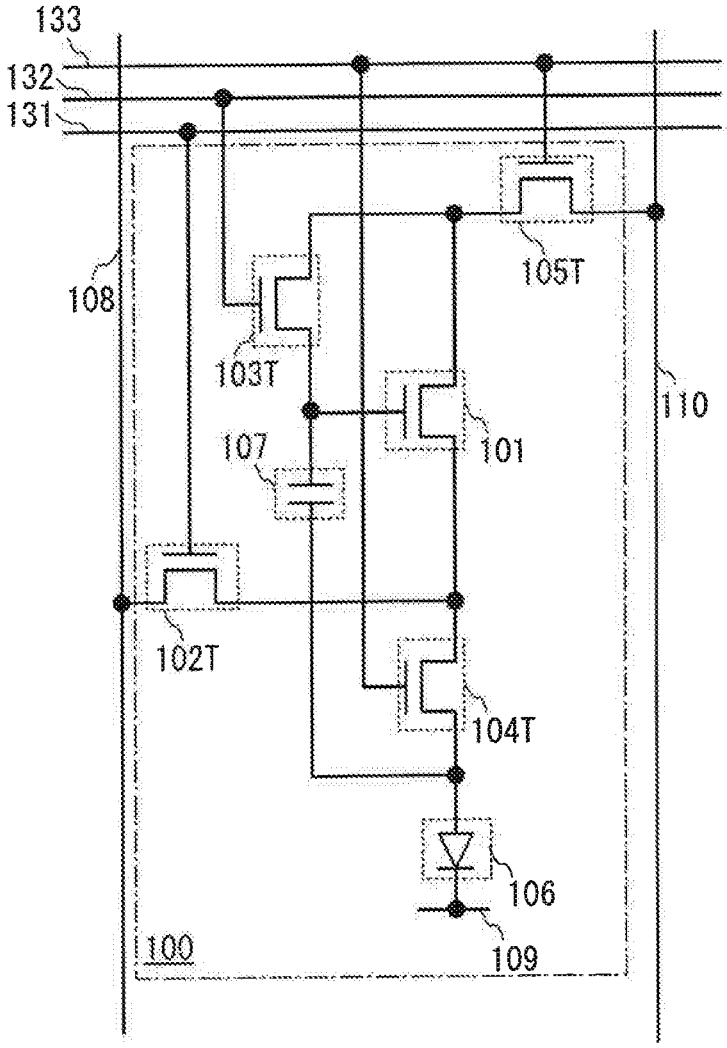
FIG. 97 is a circuit diagram illustrating an example of a pixel of one embodiment of the present invention.

For example, the wiring 133 and the wiring 134 can be combined into one wiring. Therefore, the wiring 133 can be connected to the wiring 134 to be one wiring. At this time, the transistor 104T and the transistor 105T preferably have the same polarity. FIG. 97 shows a circuit diagram of this case.

Figure 98:
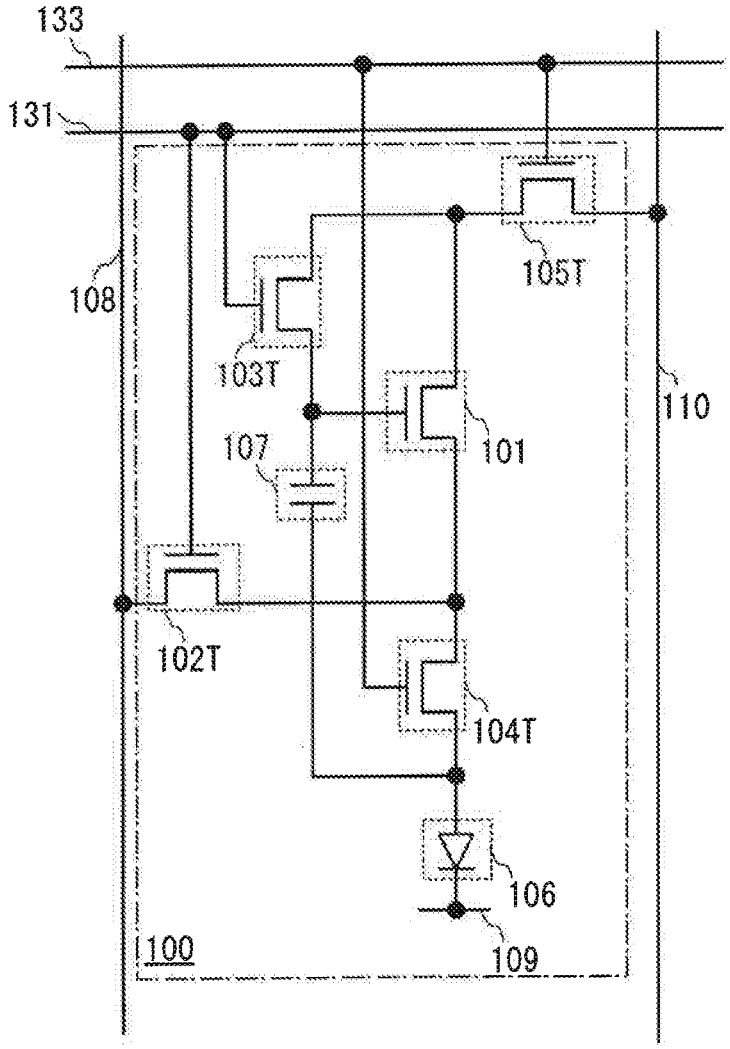
FIG. 98 is a circuit diagram illustrating an example of a pixel of one embodiment of the present invention.

Note that the wiring 131 and the wiring 132 can be combined into one wiring and the wiring 133 and the wiring 134 can be combined into one wiring. FIG. 98 shows a circuit diagram in that case.

In many cases, the transistor 101 operates in a saturation region at the time of passing current. Therefore, the transistor 101 preferably has a longer channel length or gate length than the transistor 102T, the transistor 103T, the transistor 104T, or the transistor 105T. When the channel length or the gate length is longer, characteristics in a saturation region have a flat slope; accordingly, a kink effect can be reduced. Note that one embodiment of the present invention is not limited to these examples.

In many cases, the transistor 101 operates in a saturation region at the time of passing current. Therefore, the transistor 101 preferably has a larger channel width or gate width than the transistor 102T, the transistor 103T, the transistor 104T, or the transistor 105T. When the channel width or the gate width is larger, a large amount of current can flow even in a saturation region. Note that one embodiment of the present invention is not limited to these examples.

Here, a display device including the pixel 100 is described with reference to a block diagram of FIG. 30.

The display device includes a signal line driver circuit 201, a scan line driver circuit 202A, a scan line driver circuit 202B, a scan line driver circuit 202C, a scan line driver circuit 202D, and a pixel region 203. The pixel region 203 is provided with a plurality of signal lines S1 to Sn (n is a natural number) extended from the signal line driver circuit 201 in a column direction; a plurality of scan lines Ga1 to Gam (m is a natural number) extended from the scan line driver circuit 202A in a row direction; a plurality of scan lines Gb1 to Gbm extended from the scan line driver circuit 202B in a row direction; a plurality of scan lines Gc1 to Gcm extended from the scan line driver circuit 202C in a row direction; a plurality of scan lines Gd1 to Gdm extended from the scan line driver circuit 202D in a row direction; a plurality of pixels 100 provided in matrix, connected to respective signal lines S1 to Sn, and connected to respective scan lines Ga1 to Gam, Gb1 to Gbm, Gc1 to Gcm, and Gd1 to Gdm; and power supply lines P1 to Pn which are parallel to the signal lines S1 to Sn. The pixel 100 is connected to the signal line Sj (one of the signal lines S1 to Sn), the scan line Gai (one of the scan lines Ga1 to Gam), the scan line Gbi (one of the scan lines Gb1 to Gbm), the scan line Gci (one of the scan lines Gc1 to Gcm), the scan line Gdi (one of the scan lines Gd1 to Gdm), and the power supply line Pj (one of the power supply lines P1 to Pn). Note that i and j are natural numbers.

The scan line Gai corresponds to the wiring 131 in FIG. 29A. The scan line Gbj corresponds to the wiring 132 in FIG. 29A. The scan line Gcj corresponds to the wiring 133 in FIG. 29A. The scan line Gdj corresponds to the wiring 134 in FIG. 29A. The signal line Sj corresponds to the wiring 108 in FIG. 29A. The power supply line Pj corresponds to the wiring 110 in FIG. 29A. Although not illustrated in FIG. 30, a cathode line which the pixels use in common and the cathode line corresponds to the wiring 109.

A scan line is selected with the use of a signal output from the scan line driver circuits 202A to 202D. The potential of each node of the pixels 100 connected to the selected scan line is initialized (first operation). Then, a video signal is written to the initialized pixel 100 to obtain the threshold voltage of a transistor (second operation). After the threshold voltage of the transistor is obtained by writing of the video signal, the operation moves to light emission. The pixel emits light in accordance with the video signal written to the pixel (third operation). In this manner, the initialization of the pixel 100, obtaining of the threshold voltage, and light-emitting operation are sequentially performed.

Next, the operation of the pixel 100 illustrated in FIG. 28A is described. The operation of the pixel 100 illustrated in FIG. 28A can be mainly divided into a first operation, a second operation, and a third operation. Note that one embodiment of the present invention is not limited thereto, and another operation can be added or part of the operation can be skipped.

Figure 29B:
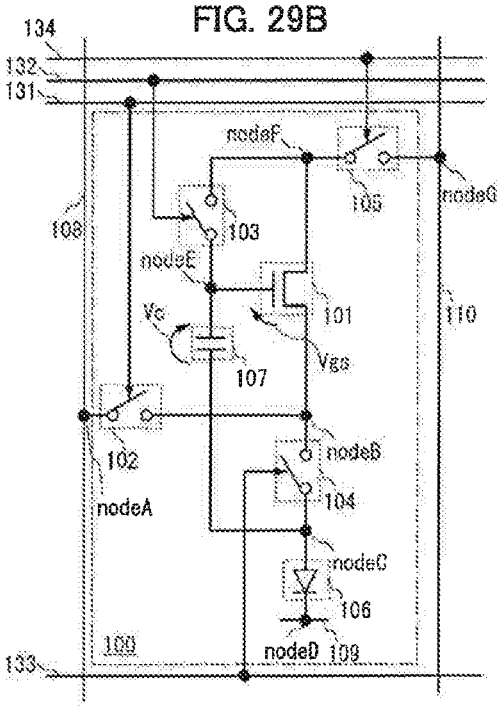

Note that in order to explain the operation of the circuit configuration illustrated in FIG. 28A, FIG. 29B shows symbols representing the potentials of nodes between elements and the potentials of wirings. FIG. 29B also shows Vgs between the one of the terminals (mainly serving as a source) and the gate of the transistor 101 and Vc between the electrodes of the capacitor 107.

A nodeA, a nodeB, a nodeC, a nodeD, a nodeE, a nodeF, and a nodeG correspond to nodes and wirings illustrated in FIG. 29B. The potential of the nodeA corresponds to the potential of the wiring 108. The potential of the nodeB corresponds to the potential of a wiring connecting the first terminal of the transistor 101, the first terminal of the switch 102, and the first terminal of the switch 104. The potential of the nodeC corresponds to the potential of a wiring connecting the second terminal of the switch 104, the one of the electrodes of the light-emitting element 106, and the other of the electrodes of the capacitor 107. The potential of the nodeD corresponds to the potential of the wiring 109. The potential of the nodeE corresponds to the potential of a wiring connecting the gate of the transistor 101, the one of electrodes of the capacitor 107, and the first terminal of the switch 103. The potential of the nodeF corresponds to the potential of a wiring connecting the second terminal of the transistor 101, the second terminal of the switch 103, and the first terminal of the switch 105. The potential of the nodeG corresponds to the potential of the wiring 110.

First, the first operation is described with reference to FIG. 31A. Note that reference numerals of elements in FIG. 31A are omitted. Note that in the drawings, a conduction state and a non-conduction state of the switches are denoted by ON and OFF. In addition, how Vgs, Vc, the potential of the nodeA, the potential of the nodeB, the potential of the nodeC, the potential of the nodeD, the potential of the nodeE, the potential of the nodeF, and the potential of the nodeG, which are illustrated in FIG. 29B, are applied is described.

The first operation initializes the potential of each node in the pixel 100. Specifically, the nodeA is set at Vinit, the nodeD is set at Vcat, and the nodeG is set at VDD. Then, the switch 102, the switch 103, the switch 104, and the switch 105 are turned on. Thus, the nodeB is set at Vinit, the nodeC is set at Vinit, the nodeE is set at VDD, and the nodeF is set at VDD. Further, Vgs becomes (VDD−Vinit), and Vc becomes (VDD−Vinit).

As described above, in the first operation, Vinit at the nodeB and the nodeC is equal to or lower than Vcat at the nodeD, for example. With this structure, current is prevented from flowing to the light-emitting element 106 in the first operation. Accordingly, problems caused by current flowing to the light-emitting element 106 can be reduced. Further, when Vinit is lower than Vcat, the light-emitting element 106 can be reverse biased. In that case, deterioration of the light-emitting element 106 can be reduced and the light-emitting element 106 can be repaired.

In the first operation, VDD at the nodeE and the nodeF is higher than Vcat at the nodeD. With this structure, Vgs can be higher than the threshold voltage of the transistor 101 in the first operation. Alternatively, electric charge can be charged in the capacitor 107.

Next, the second operation is described with reference to FIG. 31B, as in FIG. 31A.

The second operation is the operation for obtaining the threshold voltage of the transistor 101 as Vgs by discharging the potential of the gate of the transistor 101 (or the electric charge charged in the capacitor 107). Specifically, the nodeA is set at Vsig, the nodeD is set at Vcat, and the nodeG is set at VDD. Then, the switch 102 and the switch 103 are turned on, and the switch 104 and the switch 105 are turned off. Accordingly, the potential of the nodeB becomes Vsig, the potential of the nodeC becomes (Vinit−Vx), the potential of the nodeE becomes (Vsig+Vth), and the potential of the nodeF becomes (Vsig+Vth). Further, Vgs becomes Vth and Vc becomes (Vsig+Vth−Vinit+Vx).

As described above, Vsig at the nodeB in the second operation is the potential used for controlling the amount of current flowing between the wiring 110 and the wiring 109 with the use of the transistor 101 in the third operation. By the second operation, the potential of the nodeE corresponding to the potential of the gate of the transistor 101 can be (Vsig+Vth) which includes the threshold voltage of the transistor 101.

In the second operation, Vx of the potential of the nodeC (Vinit−Vx) changes when the nodeC is set in an electrically floating state. In this case, the amount of changes in Vx depends on a ratio of capacitance of the light-emitting element 106 to the capacitance of the capacitor 107. Note that Vx is preferably set to a low potential in advance. Specifically, the capacitance of the light-emitting element 106 is set to be sufficiently larger than the capacitance of the capacitor 107, whereby Vx can be low. It is preferable that the capacitance of the light-emitting element 106 be two times or more, more preferably four times or more the capacitance of the capacitor 107.

Further, VDD at the nodeD and the nodeE in the first operation is discharged by the second operation. By the discharging, Vgs is decreased to the threshold voltage Vth of the transistor 101 and is set in a steady state. Therefore, the discharging makes the nodeD and the nodeE are set in a steady state at (Vsig+Vth). In addition, at the time of terminating the second operation, (Vsig+Vth−Vinit+Vx) is held as Vc.

Note that in some cases, it takes a very long time until Vgs becomes equal to the threshold voltage Vth of the transistor 101. Accordingly, in many case, the semiconductor device is driven while Vgs is not completely decreased to the threshold voltage Vth. That is, in many cases, the second operation is terminated while Vgs is slightly higher than the threshold voltage Vth. In other words, at the time of terminating the second operation, Vgs is based on the threshold voltage.

Note that in the second operation, the switch 104 and the switch 105 are turned off and the potential of the nodeB is set to Vsig. These operations can be performed at the same time or at different timings.

It is preferable that, for example, the potential of the nodeB be changed from Vinit to Vsig at the same time as or after the switch 104 is turned off. This is because the potential of the nodeC can be easily held at an appropriate potential.

Alternatively, it is preferable that, for example, the potential of the nodeB be changed from Vinit to Vsig before or at the same time as the switch 105 is turned off. This is because the gate potential of the transistor can be quickly lowered.

Next, the third operation is described with reference to FIG. 31C, as in FIGS. 31A and 31B.

The third operation is the operation for outputting current to the light-emitting element 106 and emitting light with the use of the transistor 101 as part of a current source. Specifically, the nodeA is set at Vsig, for example, though it can be any potential, the nodeD is set at Vcat, and the nodeG is set at VDD. Then, the switch 104 and the switch 105 are turned on, and the switch 102 and the switch 103 are turned off. Accordingly, the nodeB and the nodeC become Vel, the nodeE becomes (Vsig+Vth−Vinit+Vx+Vel), and the nodeF becomes VDD. In addition, Vgs becomes (Vsig+Vth−Vinit+Vx) and Vc becomes (Vsig+Vth−Vinit+Vx).

Note that in the third operation, the potentials of the nodeB, the nodeC, and the nodeF are increased while the nodeE is kept in an electrically floating state. Accordingly, the potential of the nodeE is increased by capacitive coupling while (Vsig+Vth−Vinit+Vx) is held as Vc, thereby becoming (Vsig+Vth−Vinit+Vx+Vel). That is, an increase in the potential of the nodeC leads to an increase in the potential of the nodeE by bootstrap operation.

The semiconductor device can operate even when the potential of the nodeC is increased; therefore, adverse effect of deterioration in voltage current characteristics of the light-emitting element 106 can be reduced even when the deterioration is caused.

The potential Vel which is the potentials of the nodeB and the nodeC is set when the potential of the nodeF is increased to VDD and current flows to the light-emitting element 106 through the transistor 101 which allows the semiconductor device to operate as a current source by the third operation. Specifically, the potential ranges from VDD to Vcat.

In the third operation, Vgs of the transistor 101 becomes (Vsig+Vth−Vinit+Vx), which includes the threshold voltage of the transistor 101. The amount of current of the transistor 101 depends on (Vgs−Vth). Accordingly, through the above operations, adverse effect of variations in the threshold voltage of the transistor on the amount of current supplied to the light-emitting element can be reduced. Alternatively, even when the threshold voltage is changed by deterioration of the transistor, adverse effect of the change can be reduced. Therefore, display unevenness can be reduced and display can be performed with high quality.

Note that in the third operation, the switch 102 and the switch 103 are turned off and the switch 104 and the switch 105 are turned on. These operations can be performed at the same time or at different timings.

For example, it is preferable that the switch 104 and the switch 105 be turned on after the switch 102 and the switch 103 are turned off. This is because Vc can be easily held at an appropriate potential.

Alternatively, for example, it is preferable that the switch 102 be turned off after the switch 103 is turned off. This is because Vc can be easily held at an appropriate potential.

Note that FIG. 28A illustrates the circuit configuration of this embodiment but one embodiment of the present invention is not limited thereto. The locations of the switches or the number of switches can be changed and/or appropriate voltage can be supplied so that the operations become similar to the operations described in FIGS. 31A to 31C in which the threshold voltage of the transistor is corrected. In such a manner, a variety of circuits can be employed.

Figure 32A:
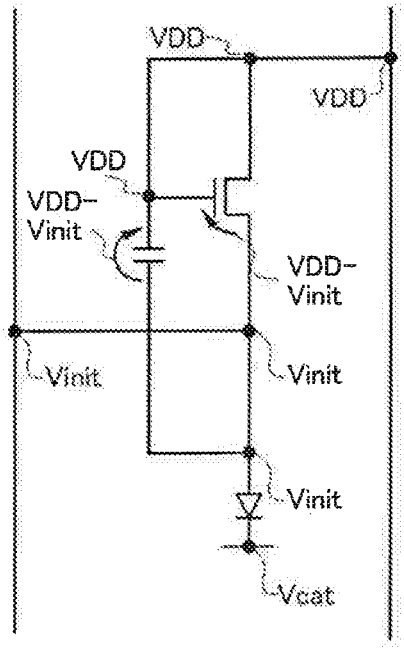
FIGS. 32A to 32C are circuit diagrams each illustrating an example of a pixel of one embodiment of the present invention.
Figure 32B:
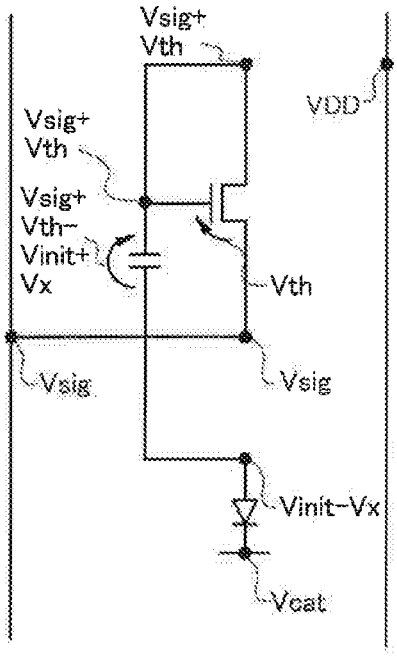
Figure 32C:
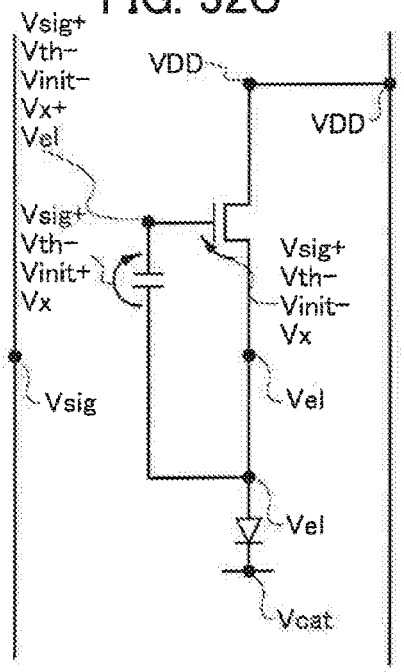

For example, specifically, the switch 102, the switch 103, the switch 104, and the switch 105 can be provided at any place and the number of switches is not limited as long as the switches can control a conduction state and a non-conduction state between nodes. In the case of the first operation described with reference to FIG. 31A, a connection relation illustrated in FIG. 32A may be employed. In the case of the second operation described with reference to FIG. 31B, a connection relation illustrated in FIG. 32B can be employed. In the case of the third operation described with reference to FIG. 31C, a connection relation illustrated in FIG. 32C can be employed. The potential of each node can have any level unless the node affects the operations.

Note that the operation for correcting the threshold voltage of the transistor is described with reference to FIGS. 31A to 31C but one embodiment of the present invention is not limited thereto. For example, the operation for correcting variations in the mobility of the transistor 101 may be performed between the second operation in FIG. 31B and the third operation in FIG. 31C. FIGS. 33A to 33D illustrate the case where the operation for correcting variations in the mobility of the transistor 101 is added to the first to third operations which are described with reference to FIGS. 31A to 31C.

Figure 33A:
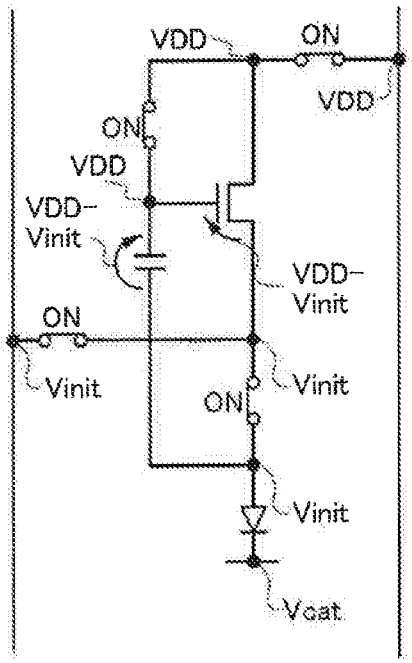
FIGS. 33A to 33D are circuit diagrams illustrating an example of a pixel of one embodiment of the present invention.
Figure 33B:
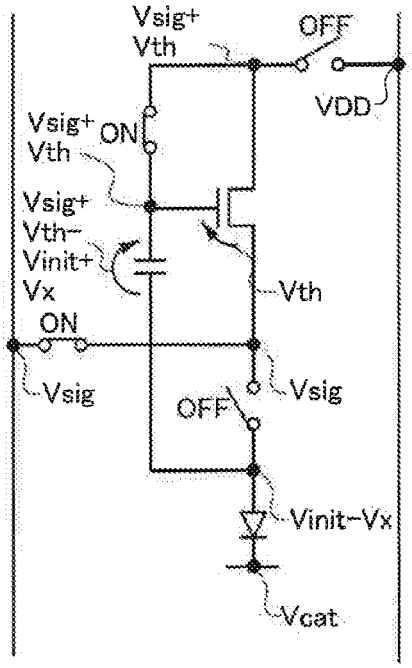

Note that a first operation illustrated in FIG. 33A is the same as the first operation described with reference to FIG. 31A; therefore, the description thereof is omitted. A second operation illustrated in FIG. 33B is the same as the second operation described with reference to FIG. 31B; therefore, the description thereof is omitted.

Figure 33C:
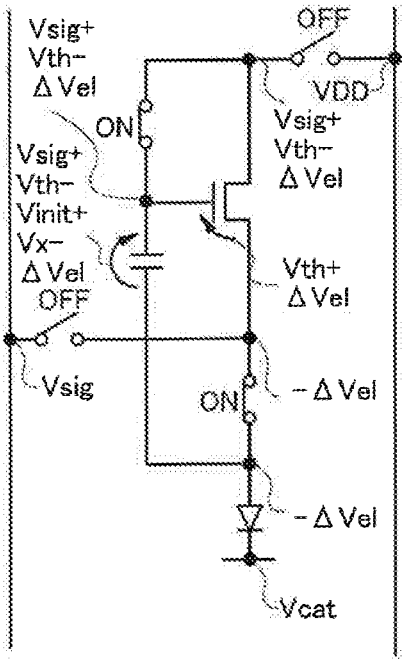

Next, a third operation is described with reference to FIG. 33C, as in FIGS. 31A and 31B.

In the third operation, the transistor 101 is turned on with the use of the potential held in the gate of the transistor 101 (electric charge stored in the capacitor 107), and the mobility of the transistor 101 is corrected with the use of the amount of current flowing therethrough. Specifically, the nodeA is set at Vsig though it can be any potential, the nodeD is set at Vcat, and the nodeG is set at VDD. Then, the switch 103 and the switch 104 are turned on, and the switch 102 and the switch 105 are turned off. Then, the amount of change in potentials of the nodeB and the nodeC is −ΔVel, the nodeE and the nodeF become (Vsig+Vth−ΔVel). In addition, Vgs becomes (Vth+ΔVel) and Vc becomes (Vsig+Vth−Vinit+Vx−ΔVel).

Note that in the third operation, the potentials of the nodeB and the nodeC are changed by turning on the switch 104. The amount of changes in the potentials corresponds to −ΔVel. When the amount of change in the potentials of the nodeB and the nodeC becomes −ΔVel, Vgs becomes (Vth+ΔVel) and higher than the threshold voltage Vth; as a result, current flows through the transistor 101. When current flows through the transistor 101, each of the potentials of the nodeE and the nodeF is decreased to (Vsig+Vth−ΔVel) and Vc becomes (Vsig+Vth−Vinit+Vx−ΔVel).

The amount of current flowing to the transistor 101 changes depending on the mobility of the transistor 101. Accordingly, the potential of the nodeE corresponding to the gate of the transistor 101 can be set so as to include the amount of change in potential corresponding to the mobility of the transistor 101.

In the third operation, the potential of the gate of the transistor 101 becomes (Vsig+Vth−ΔVel) which is set in consideration of the mobility of the transistor 101. Accordingly, through the above operations, adverse effect of variations in the mobility of the transistor on the amount of current supplied to the light-emitting element can be reduced. Alternatively, even when mobility is changed by deterioration of the transistor, adverse effect of the change can be reduced.

Figure 33D:
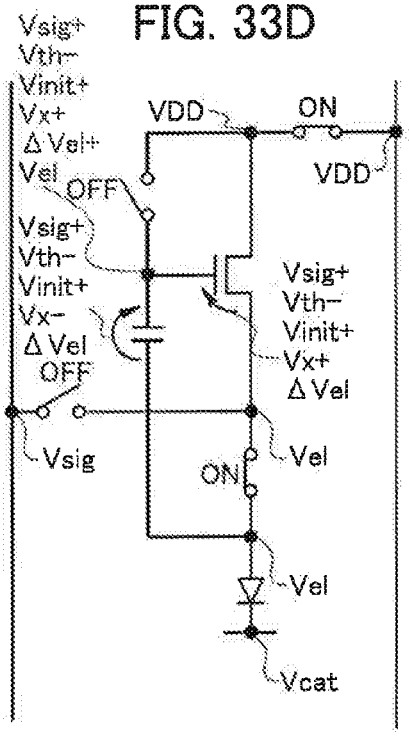

Next, a fourth operation is described with reference to FIG. 33D, as in FIGS. 31A and 31B. Note that the fourth operation illustrated in FIG. 33D is similar to the third operation described with reference to FIG. 31C; therefore, only an aspect different from the third operation with reference to FIG. 31C is described.

By the fourth operation, the nodeB and the nodeC are set at Vel, the nodeE is set at (Vsig+Vth−Vinit+Vx−ΔVel+Vel), and the nodeF is set at VDD. The potential Vgs becomes (Vsig+Vth−Vinit+Vx−ΔVel) and Vc becomes (Vsig+Vth−Vinit+Vx).

In the fourth operation, Vgs of the transistor 101 becomes (Vsig+Vth−Vinit+Vx+ΔVel), which can be set in consideration of the threshold voltage and the mobility of the transistor 101. Accordingly, through the above operations, adverse effect of variations in the threshold voltage and the mobility of the transistor on the amount of current supplied to the light-emitting element can be reduced.

The location of the switch or the number of switches can be changed and appropriate voltage can be supplied so as to achieve the similar operation to the operation described in FIGS. 33A to 33D in which the threshold voltage of the transistor is corrected. In such a manner, a variety of circuits can be employed.

Figure 34A:
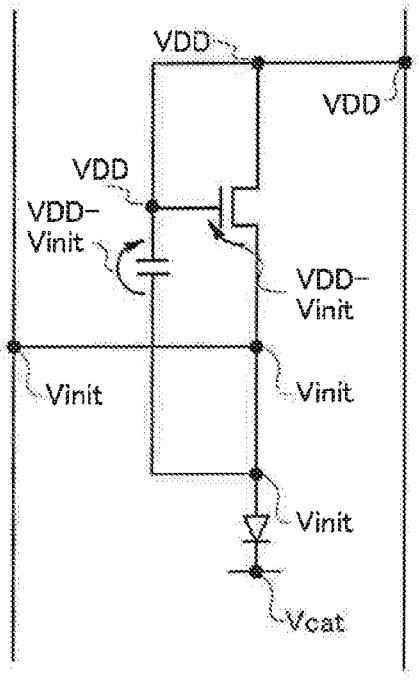
FIGS. 34A to 34D are circuit diagrams each illustrating an example of a pixel of one embodiment of the present invention.
Figure 34B:
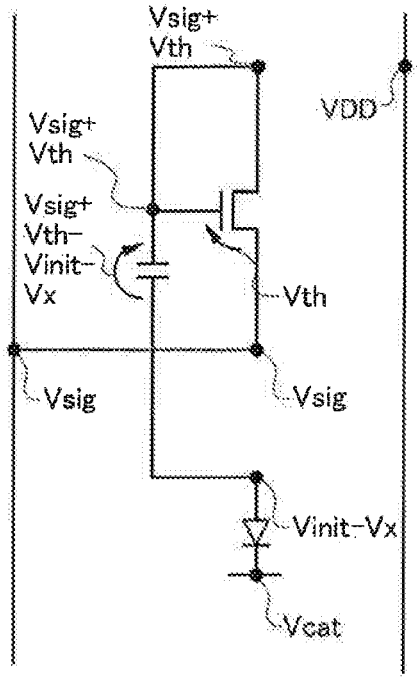
Figure 34C:
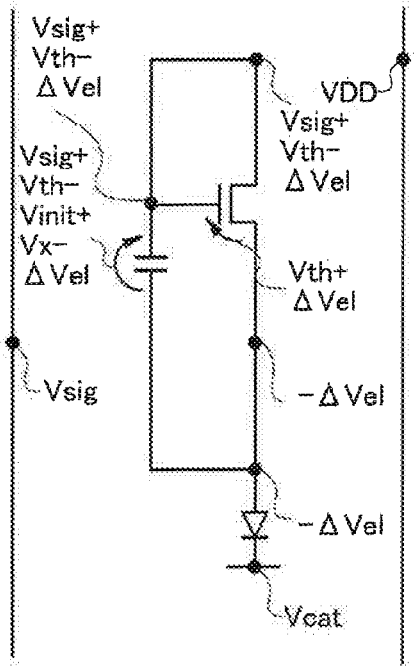
Figure 34D:
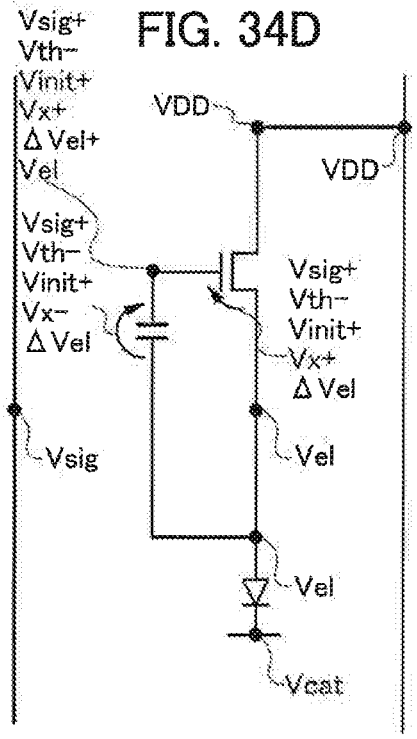

For example, specifically, the switch 102, the switch 103, the switch 104, and the switch 105 can be provided any place and the numbers thereof is not limited as long as the switches can control a conduction state and a non-conduction state between nodes. In the case of the first operation described with reference to FIG. 33A, a connection relation illustrated in FIG. 34A can be employed. In the case of the second operation described with reference to FIG. 33B, a connection relation illustrated in FIG. 34B can be employed. In the case of the third operation described with reference to FIG. 33C, a connection relation illustrated in FIG. 34C can be employed. In the case of the fourth operation described with reference to FIG. 33D, a connection relation illustrated in FIG. 34D can be employed. The potential of each node can have any level unless the node affects the operations.

Note that FIG. 28A illustrates the circuit configuration of this embodiment but one embodiment of the present invention is not limited thereto. The number of transistors 101 or the locations of the transistors 101 can be changed and a variety of circuits can be employed.

Figure 35:
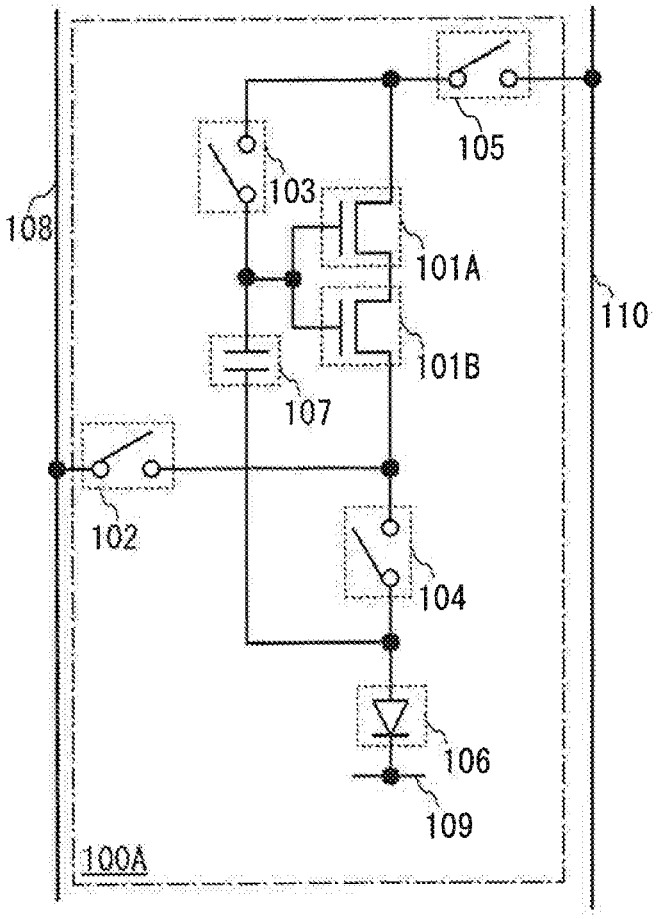
FIG. 35 is a circuit diagram illustrating an example of a pixel of one embodiment of the present invention.

For example, as in a pixel 100A illustrated in FIG. 35, the transistor 101A and the transistor 101B which have gates connected to each other and which are connected in series can be used as transistors which allow the semiconductor device to serve as a current source. Note that components in common with those in FIG. 28A are denoted by common reference numerals, and the description thereof is omitted.

Figure 36:
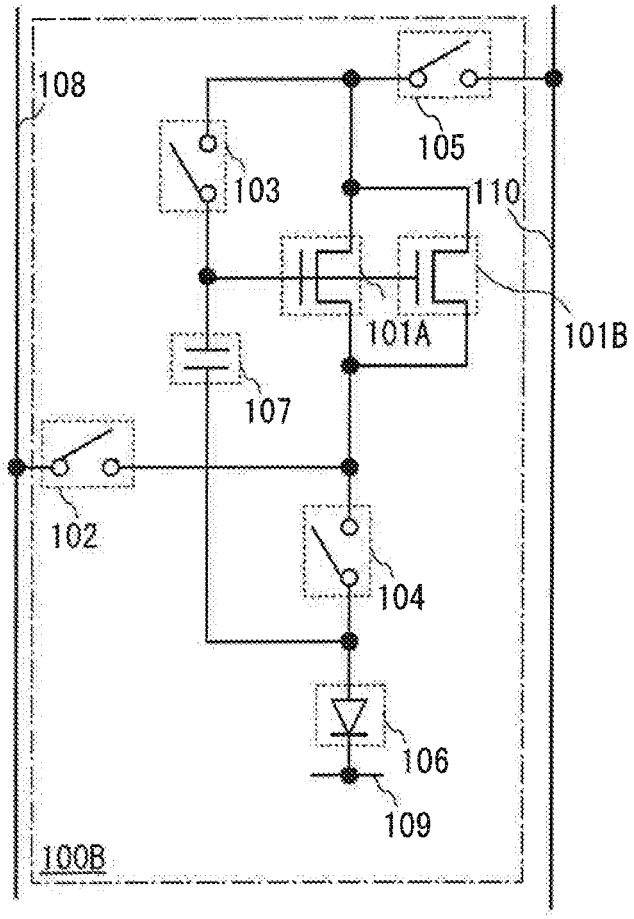
FIG. 36 is a circuit diagram illustrating an example of a pixel of one embodiment of the present invention.

As another example, as in a pixel 100B illustrated in FIG. 36, the transistor 101A and the transistor 101B which have gates connected to each other and which are connected in parallel can be used as transistors which allow the semiconductor device to serve as a current source. Note that components in common with those in FIG. 28A are denoted by common reference numerals, and the description thereof is omitted.

Figure 37:
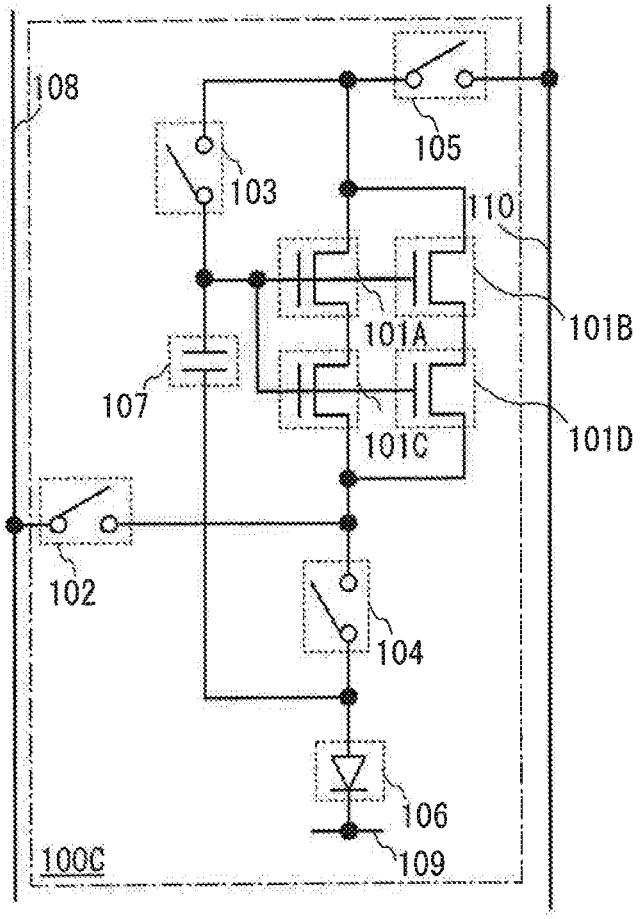
FIG. 37 is a circuit diagram illustrating an example of a pixel of one embodiment of the present invention.

As another example, as in a pixel 100C illustrated in FIG. 37, the transistor 101A, the transistor 101B, the transistor 101C, and the transistor 101D which have gates connected to each other and which are connected in series and parallel can be used as transistors which allow the semiconductor device to serve as a current source. Note that components in common with those in FIG. 28A are denoted by common reference numerals, and the description thereof is omitted.

The channel width and/or the channel length of the transistor 101 can be changed by application of the structures illustrated in FIG. 35, FIG. 36, and FIG. 37. With the structures illustrated in FIG. 35, FIG. 36, and FIG. 37 in which channel widths and/or channel lengths of a plurality of transistors can be changed after the transistors are combined, adverse effect of variations in characteristics of the transistors can be smaller in comparison with the structure in which transistors each having a large channel width and/or a large channel length is provided in advance.

Note that FIG. 28A, FIG. 29A, or the like illustrates an example of a circuit configuration; accordingly, a transistor can be provided additionally. On the other hand, in each node in FIG. 28A, FIG. 29A, or the like, it is also possible not to provide an additional transistor, switch, passive element, or the like. For example, it is possible not to increase the number of transistors directly connected to the nodeA, the nodeB, the nodeC, the nodeD, the nodeE, the nodeF, or/and the nodeG. Accordingly, for example, the following structure can be used: only the transistor 104T is directly connected to the nodeC and the other transistors are not directly connected to the nodeC.

Therefore, a circuit can be formed with a small number of transistors in the case where a transistor is not added.

Note that variations in the threshold voltage or the like of a transistor is corrected in this embodiment, but one embodiment of the present invention is not limited thereto. For example, current can be supplied to the light-emitting element 106 and the semiconductor device can be driven without performing the operation for correcting variations in threshold voltage.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 8

In this embodiment, an example of a configuration different from the circuit configuration of the pixel described in Embodiment 7 is described.

Figure 30:
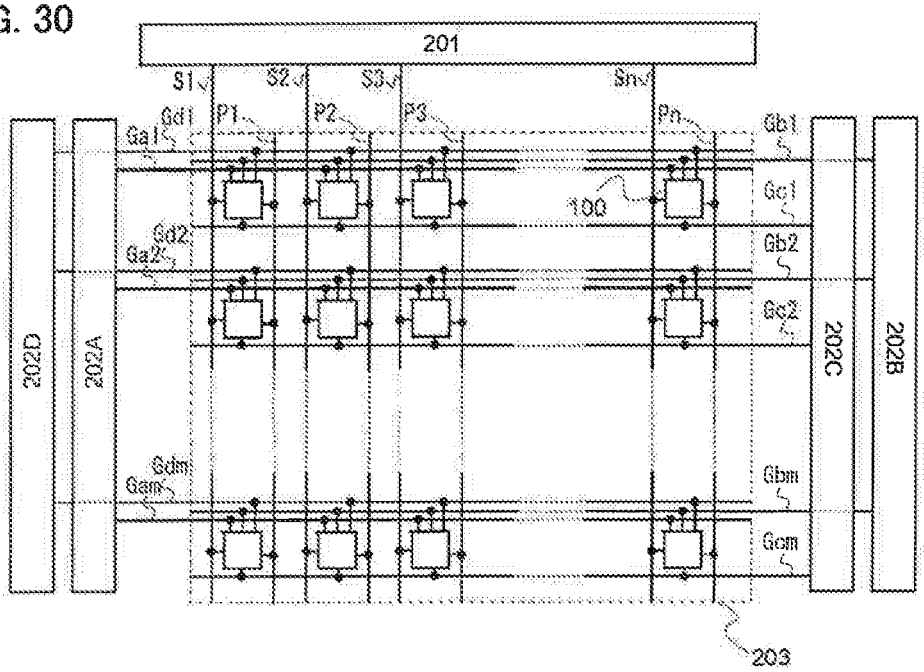
FIG. 30 is a circuit diagram illustrating an example of a pixel of one embodiment of the present invention.
Figure 38:
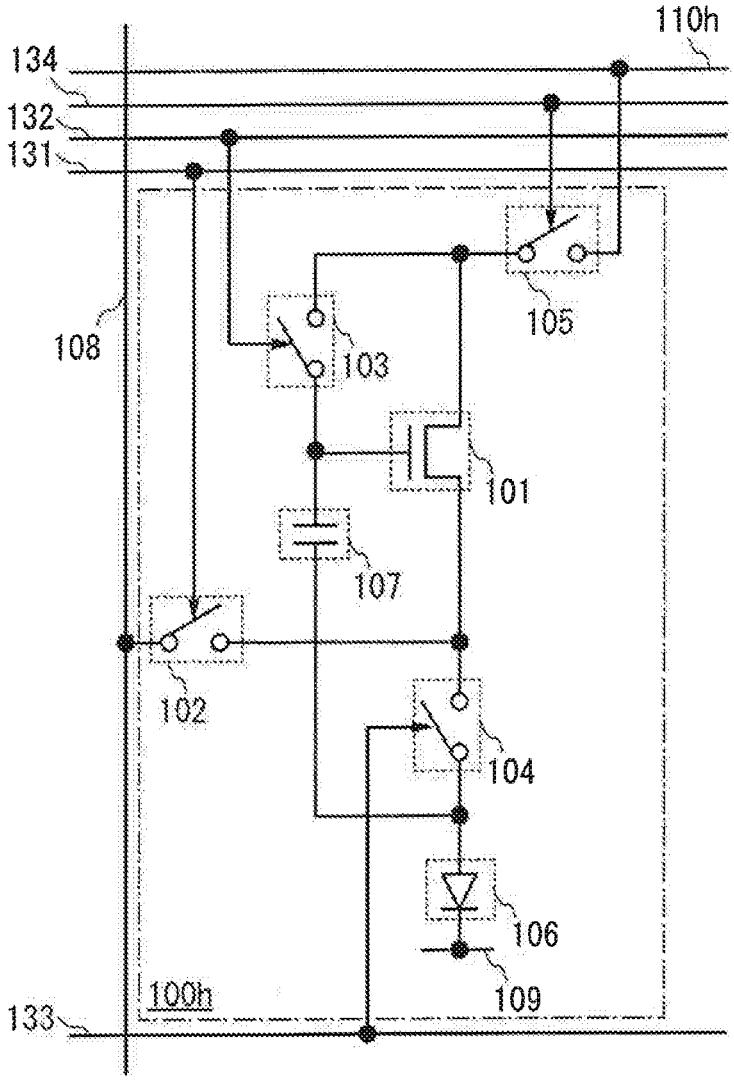
FIG. 38 is a circuit diagram illustrating an example of a pixel of one embodiment of the present invention.

FIG. 38 illustrates a pixel 100h having a circuit configuration similar to the pixel 100 illustrated in FIG. 30. The pixel 100h illustrated in FIG. 38 is different from the pixel 100 illustrated in FIG. 30 in that the wiring 110 is replaced with a wiring 110h provided in parallel to the wirings 131 to 134, Vsig and Vinit are supplied from the wiring 108, and at least Vinit or VDD is supplied, switching them as necessary, from the wiring 110h. Note that components in common with those in FIG. 30 are denoted by common reference numerals, and the description thereof is omitted.

Figure 39:
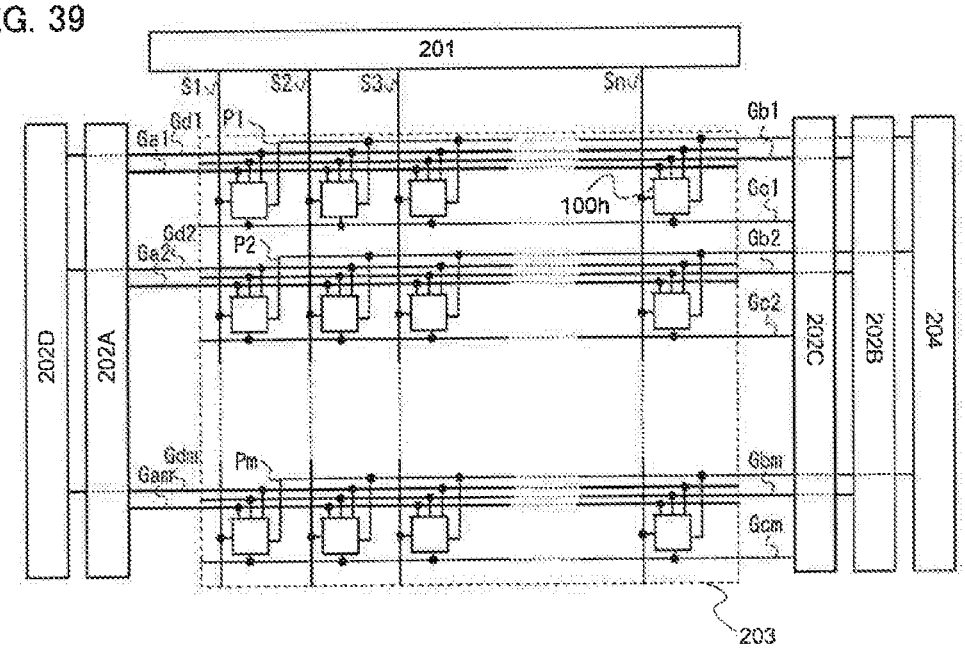
FIG. 39 is a circuit diagram illustrating an example of a pixel of one embodiment of the present invention.

Here, a display device including the pixel 100h is described with reference to a block diagram of FIG. 39.

The display device includes a signal line driver circuit 201, a scan line driver circuit 202A, a scan line driver circuit 202B, a scan line driver circuit 202C, a scan line driver circuit 202D, a pixel region 203, and a power supply line control circuit 204. The pixel region 203 is provided with a plurality of signal lines S1 to Sn extended from the signal line driver circuit 201 in a column direction; a plurality of scan lines Ga1 to Gam extended from the scan line driver circuit 202A in a row direction; a plurality of scan lines Gb1 to Gbm extended from the scan line driver circuit 202B in a row direction; a plurality of scan lines Gc1 to Gcm extended from the scan line driver circuit 202C in a row direction; a plurality of scan lines Gd1 to Gdm extended from the scan line driver circuit 202D in a row direction; a plurality of pixels 100 provided in matrix, connected to respective signal lines S1 to Sn, and connected to respective scan lines Ga1 to Gam, Gb1 to Gbm, Gc1 to Gcm, and Gd1 to Gdm; and power supply lines P1 to Pm which are parallel to the scan lines Ga1 to Gam, Gb1 to Gbm, Gc1 to Gcm, and Gd1 to Gdm. The pixel 100h is connected to the signal line Sj (one of the signal lines S1 to Sn), the scan line Gai (one of the scan lines Ga1 to Gam), the scan line Gbi (one of the scan lines Gb1 to Gbm), the scan line Gci (one of the scan lines Gc1 to Gcm), the scan line Gdi (one of the scan lines Gd1 to Gdm), and the power supply line Pj (one of the power supply lines P1 to Pn).

The scan line Gai corresponds to the wiring 131 in FIG. 38. The scan line Gbj corresponds to the wiring 132 in FIG. 38. The scan line Gcj corresponds to the wiring 133 in FIG. 38. The scan line Gdj corresponds to the wiring 134 in FIG. 38. The signal line Sj corresponds to the wiring 108 in FIG. 38. The power supply line Pj corresponds to the wiring 110h in FIG. 38. Although not illustrated in FIG. 39, a cathode line which the pixels use in common and the cathode line corresponds to the wiring 109.

A scan line is selected with the use of a signal output from the scan line driver circuits 202A to 202D. An operation in which a potential for initialization is applied to some extent to each node of the pixels 100 connected to the selected scan line before initialization of the potential of each node (initialization before initialization) is performed (first operation). The potential of each node of the pixels 100 connected to the selected scan line is initialized (second operation). Then, a video signal is written to the initialized pixel 100 to obtain the threshold voltage of a transistor (third operation). After the threshold voltage of the transistor is obtained by writing of the video signal, the operation moves to light emission. The pixel emits light in accordance with the video signal written to the pixel (fourth operation). In this manner, the initialization before the initialization, the initialization of the pixel 100, obtaining of the threshold voltage, and a light-emitting operation are sequentially performed.

Next, the operation of the pixel 100h illustrated in FIG. 38 is described. The operation of the pixel 100h illustrated in FIG. 38 can be mainly divided into a first operation, a second operation, a third operation, and a fourth operation. One operation is added to the operations of the pixel 100 illustrated in FIG. 31A or the like. The second operation, the third operation, and the fourth operation of the semiconductor device 10h illustrated in FIGS. 40B to 40D correspond to the first operation, the second operation, and the third operation of the pixel 100 illustrated in FIG. 31A, respectively.

Note that in order to explain the operation of the circuit configuration illustrated in FIG. 38, FIG. 38 shows symbols representing the potentials of nodes between elements and the potentials of wirings, as FIG. 29B does. The operation of the circuit configuration illustrated in FIG. 38 is explained with symbols of Vgs and Vc, as in FIG. 29B.

Figure 40A:
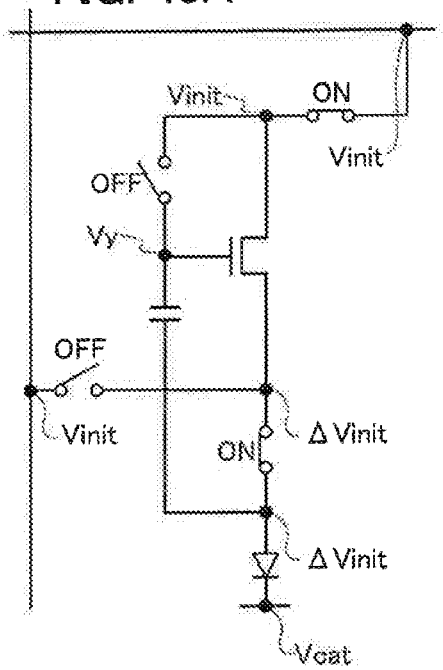
FIGS. 40A to 40D are circuit diagrams illustrating an example of a pixel of one embodiment of the present invention.

First, the first operation is described with reference to FIG. 40A. Note that reference numerals of elements in FIG. 40A are omitted. The first operation is additionally provided to the operation of the pixel 100 illustrated in FIG. 29A or the like. Note that in the drawings, a conduction state and a non-conduction state of the switches are denoted by ON and OFF. In addition, how Vgs, Vc, the potential of the nodeA, the potential of the nodeB, the potential of the nodeC, the potential of the nodeD, the potential of the nodeE, the potential of the nodeF, and the potential of the nodeG, which are illustrated in FIG. 29B, are applied is described.

In the first operation, a potential for initialization is applied to some extent at each node before initialization of the potential of each node (initialization before initialization). Specifically, the nodeG is set at Vinit and the nodeD is set at Vcat. The nodeA can be set at any potential. In addition, the switch 104 and the switch 105 are turned on, and the switch 102 and the switch 103 are turned off. The nodeB and the nodeC are then set at Vinit or the potential ΔVinit which is close to Vinit. The nodeE is set at Vy and the nodeF is set at Vinit. Note that Vgs and Vc are omitted because the first operation uses Vy which is a signal of an operation before the first operation.

The potential Vy is input before the first operation. The case where Vy enables the transistor 101 to operate as part of a current source is explained. The potential Vy is set so that current flows between the first terminal and the second terminal of the transistor 101 in the first operation. Usually, Vinit is very low and accordingly the transistor 101 is turned on because of Vy in many cases.

Therefore, in the first operation, the nodeF is set at Vinit and current flows between the first terminal and the second terminal of the transistor 101; as a result, the nodeB and the nodeC are set at Vinit or the potential ΔVinit which is close to Vinit.

That is, the first operation decreases the potentials of the nodeB and the nodeC. By the decrease in the potentials of the nodeB and the nodeC in the first operation, the following second operation can initialize the potential of each node at high speed. In particular, when the light-emitting element 106 has large capacitance, the following operation can be performed smoothly by the decrease in the potentials of the nodeB and the nodeC in advance. Note that even if the potentials of the nodeB and the nodeC cannot be sufficiently decreased, it is not a problem unless subsequent operations are adversely affected.

Figure 40B:
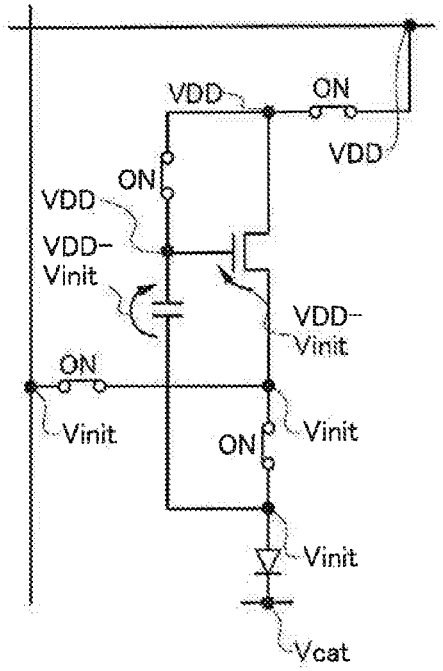

The second operation described with reference to FIG. 40B is the same as the first operation described with reference to FIG. 31A and therefore the description thereof is omitted.

In the second operation, the switch 102 and the switch 103 are turned on and the potential of the nodeG is set to VDD, and these operations can be performed at the same time or at different timings.

It is preferable that, for example, the potential of the nodeG be changed from Vinit to VDD before or at the same time as the switch 103 is turned on. This is because the potential of the nodeE can be increased easily in that case.

Figure 40C:
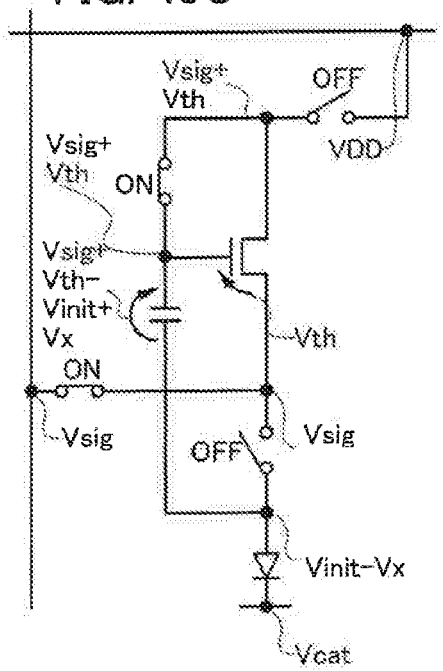
Figure 40D:
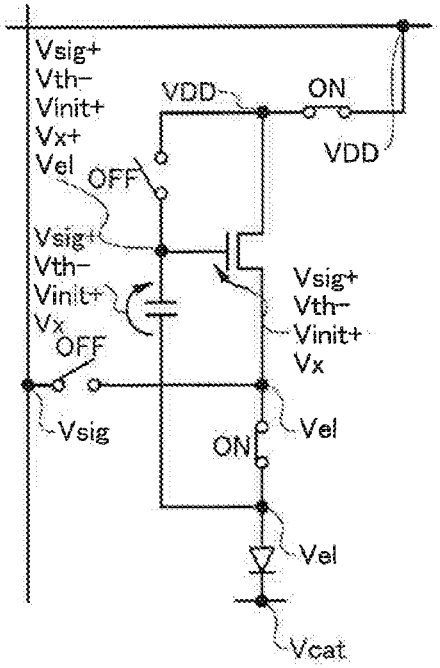

Then, the third operation illustrated in FIG. 40C is the same as the second operation described with reference to FIG. 31B and therefore the description thereof is omitted. Then, the fourth operation illustrated in FIG. 40D is the same as the third operation described with reference to FIG. 31C and therefore the description thereof is omitted.

The location of the switch or the number of switches can be changed and appropriate voltage can be supplied so as to achieve the similar operation to the operation described in FIGS. 40A to 40D in which the threshold voltage of the transistor is corrected. In such a manner, a variety of circuits can be employed.

Figure 41A:
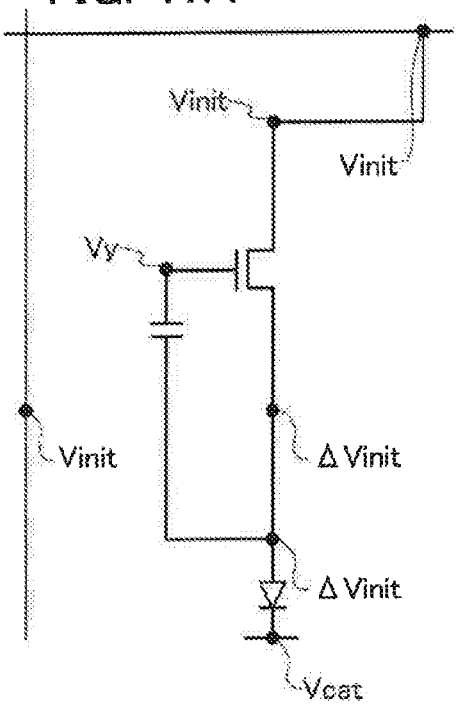
FIGS. 41A to 41D are circuit diagrams each illustrating an example of a pixel of one embodiment of the present invention.
Figure 41B:
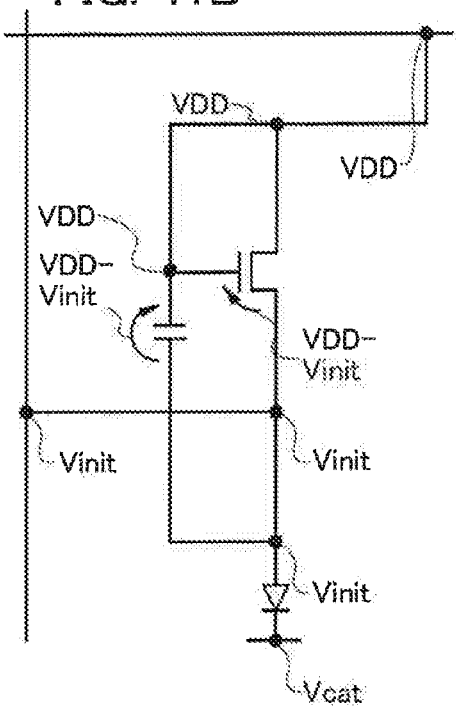
Figure 41C:
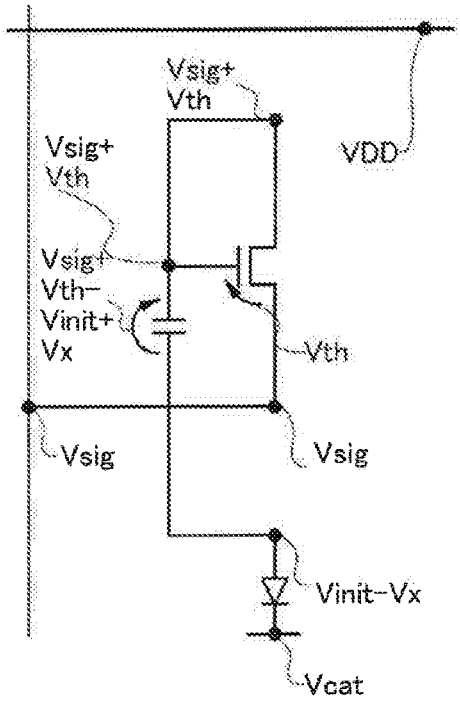
Figure 41D:
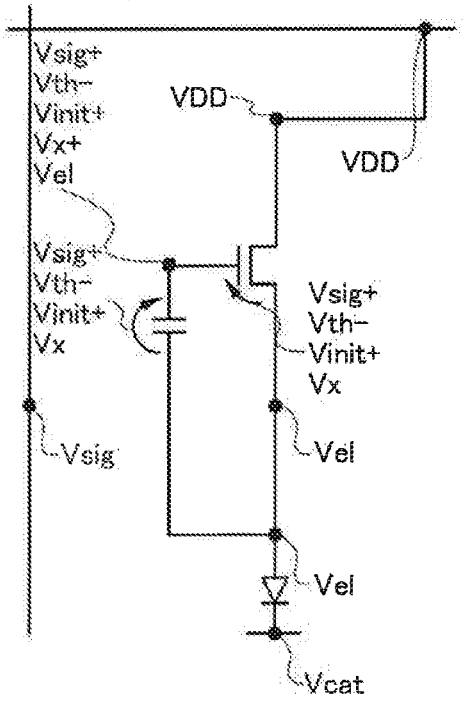

For example, specifically, the switch 102, the switch 103, the switch 104, and the switch 105 can be provided any place and the numbers thereof is not limited as long as the switches can control a conduction state and a non-conduction state between nodes. In the case of the first operation described with reference to FIG. 40A, a connection relation illustrated in FIG. 41A can be employed. In the case of the second operation described with reference to FIG. 40B, a connection relation illustrated in FIG. 41B can be employed. In the case of the third operation described with reference to FIG. 40C, a connection relation illustrated in FIG. 41C can be employed. In the case of the fourth operation described with reference to FIG. 40D, a connection relation illustrated in FIG. 41D can be employed. The potential of each node can have any level unless the node affects the operations.

Note that the operation for correcting the threshold voltage of the transistor is described with reference to FIGS. 40A to 40D but one embodiment of the present invention is not limited thereto. For example, the operation for correcting variations in the mobility of the transistor 101 may be performed between the third operation in FIG. 40C and the fourth operation in FIG. 40D.

The operation for correcting the mobility of the transistor 101 is described with reference to FIG. 42A.

The operation for correcting the mobility of the transistor 101 is the same as the third operation described with reference to FIG. 33C and the description thereof is omitted.

In the operation for correcting the mobility of the transistor 101, the potential of the gate of the transistor 101 becomes (Vsig+Vth−ΔVel) which is set in consideration of the mobility of the transistor 101. Accordingly, through the above operation, adverse effect of variations in the mobility of the transistor on the amount of current supplied to the light-emitting element can be reduced.

Figure 42A:
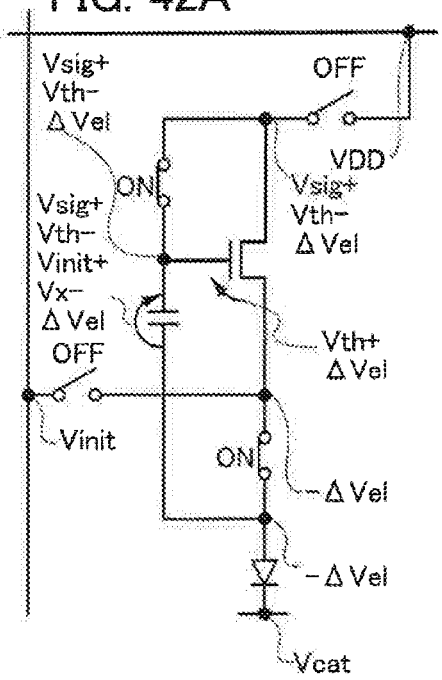
FIGS. 42A and 42B are circuit diagrams each illustrating an example of a pixel of one embodiment of the present invention.

The location of the switch or the number of switches can be changed and appropriate voltage can be supplied so as to achieve the similar operation to the operation described in FIG. 42A in which the mobility of the transistor is corrected. In such a manner, a variety of circuits can be employed.

Figure 42B:
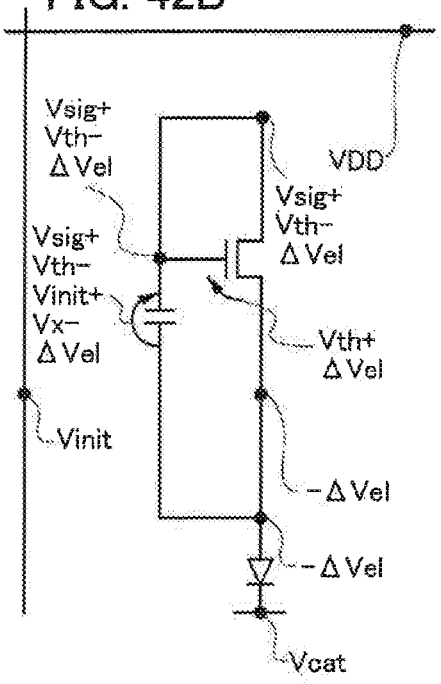

For example, specifically, the switch 102, the switch 103, the switch 104, and the switch 105 can be provided any place and the numbers thereof is not limited as long as the switches can control a conduction state and a non-conduction state between nodes. In the case of the operation for correcting the mobility of the transistor described with reference to FIG. 42A, a connection relation illustrated in FIG. 42B can be employed.

The potential of the wiring 110h is switched between Vinit and VDD in the circuit configuration illustrated in FIG. 38, but another configuration can be used. For example, a configuration illustrated in FIG. 43 may be employed: a wiring 110A and a wiring 110B are provided instead of the wiring 110h, and Vinit is supplied to the wiring 110A and VDD is supplied the wiring 110B. At this time, a switch 105A provided between the wiring 110A and the nodeF and a switch 105B provided between the wiring 110B and the nodeF may perform switching so as to achieve the similar operation to the operation described with reference to FIGS. 40A to 40D.

Figure 43:
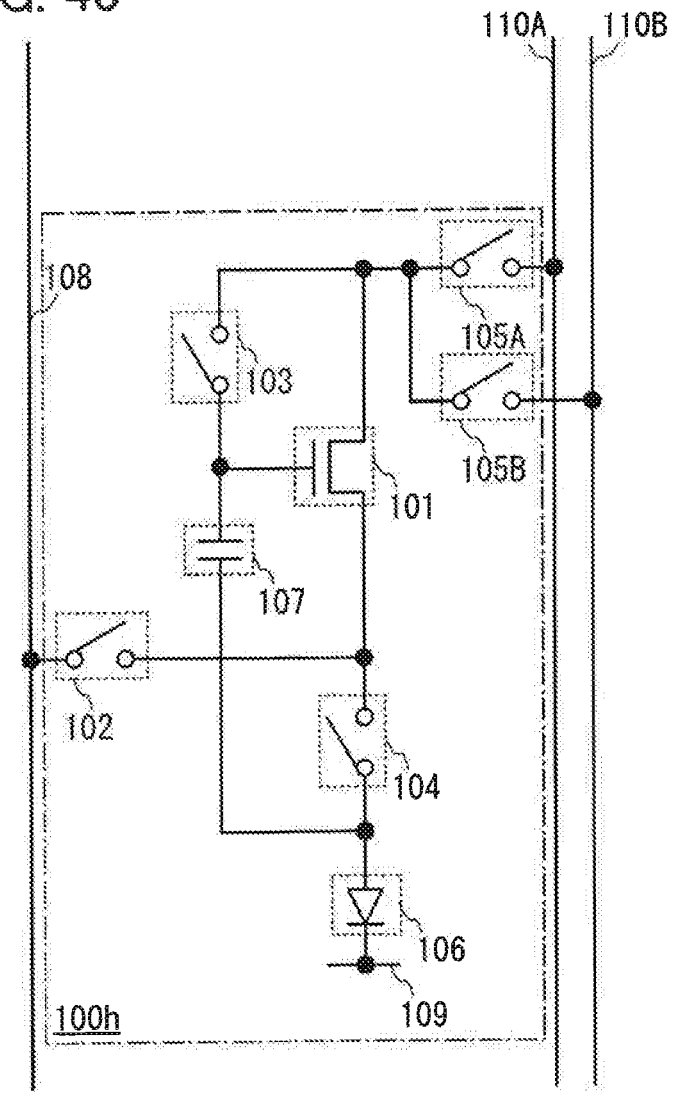
FIG. 43 is a circuit diagram illustrating an example of a pixel of one embodiment of the present invention.
Figure 82:
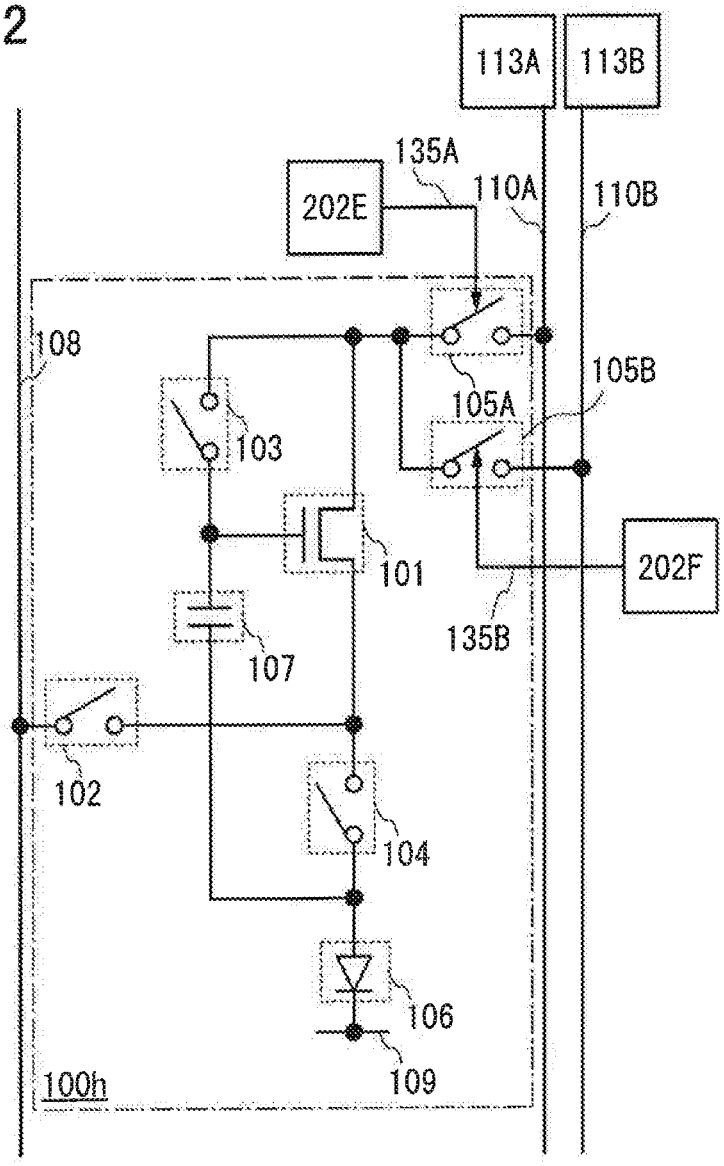
FIG. 82 is a circuit diagram illustrating an example of a pixel of one embodiment of the present invention.

The case of FIG. 43 is further described with reference to FIG. 82. FIG. 82 illustrates a circuit 113A connected to the wiring 110A in FIG. 43, a circuit 113B connected to the wiring 110B in FIG. 43, a wiring 135A connected to the switch 105A, a scan line driver circuit 202E connected to the wiring 135A, a wiring 135B connected to the switch 105B, and a scan line driver circuit 202F connected to the wiring 135B.

The circuit 113A has a function of supplying Vinit and examples of the circuit 113A are a power supply circuit and a voltage follower circuit. The circuit 113B has a function of supplying VDD and an example of the circuit 113B is a power supply circuit. In addition, the switching of the switch 105A is controlled with a wiring 135A and the switching of the switch 105B is controlled with a wiring 135B. As an example, the wiring 135A and the wiring 135B are connected to a scan line driver circuit 202E and a scan line driver circuit 202F, respectively. The scan line driver circuit 202E and the scan line driver circuit 202F each have at least a function of supplying an H-level signal or an L-level signal.

Figure 83:
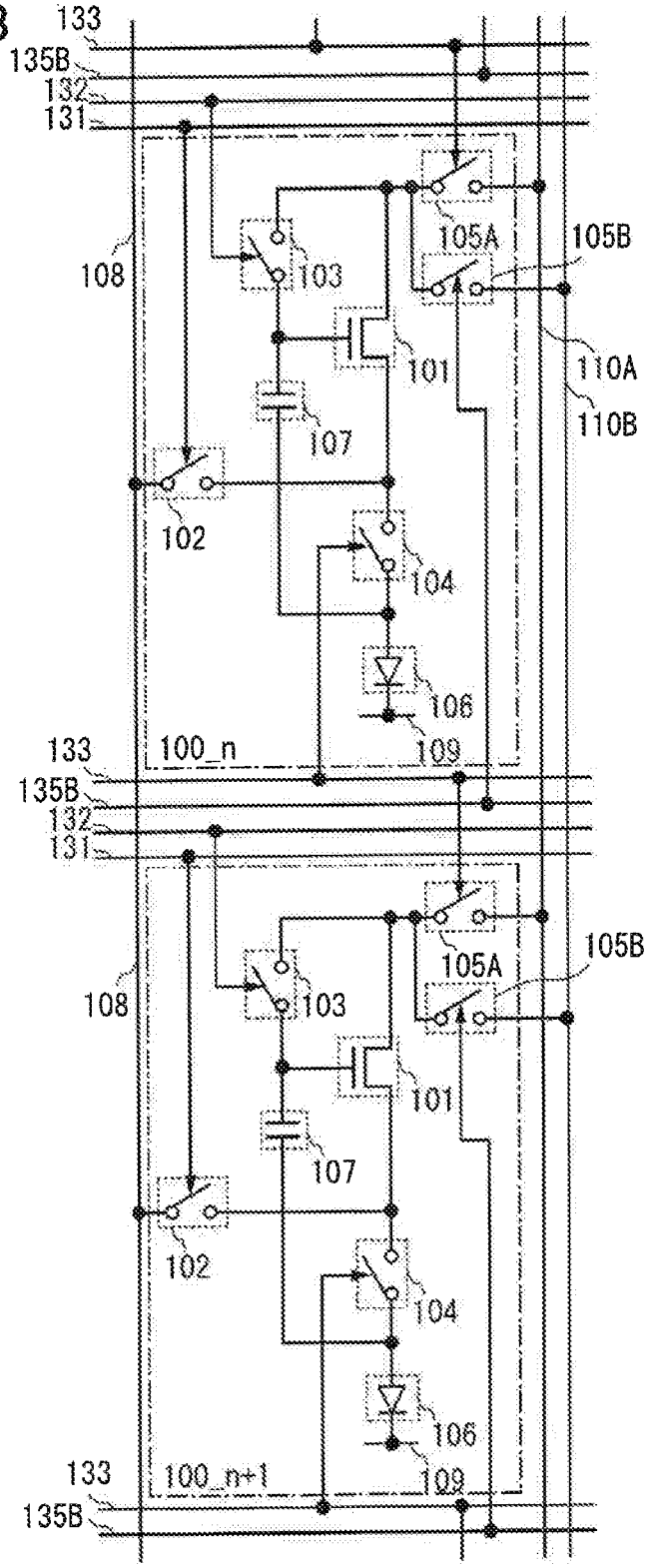
FIG. 83 is a circuit diagram illustrating an example of a pixel of one embodiment of the present invention.

In the case of the circuit configuration illustrated in FIG. 43 or FIG. 82, pixels adjacent to each other in a column direction can share wirings to be driven. Specifically, as illustrated in FIG. 83, when attention is paid to the pixel 100_n and the pixel 100_n+1 which are a pixel in the n-th row and a pixel in the (n+1)th row, which have the structures illustrated in FIG. 43 and FIG. 82, respectively, the structure in which the wiring 133 in the n-th row and the wiring 135A in the (n+1)th row branches from a wiring connected to the scan line driver circuit can be used. With such a structure, the area of the wirings in the pixel region can be reduced.

Figure 84:
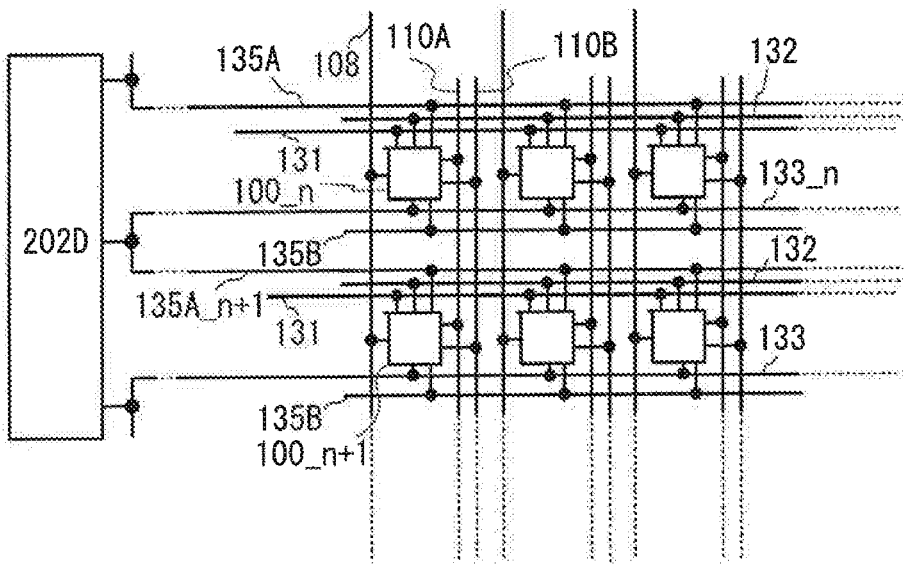
FIG. 84 is a circuit diagram illustrating an example of a pixel of one embodiment of the present invention.

The wirings explained with reference to FIG. 83 can be used in common outside the pixel region. Specifically, the following structure illustrated in FIG. 84 is also possible: the wiring from the scan line driver circuit 202D branches outside the pixel region, and the branched wirings function as the wiring 133_n of the pixel 100_n and the wiring 135A_n+1 of the pixel 100_n+1. With such a structure, the number of output terminals of the scan line driver circuit 202D can be reduced.

As described above, in the circuit configuration described in this embodiment, initialization before initialization can be performed by switching of the potential of the wiring 110h between Vinit and VDD. Accordingly, the potential of each node can be initialized at high speed. In the fourth operation, Vgs of the transistor 101 becomes (Vsig+Vth−Vinit+Vx), which includes the threshold voltage of the transistor 101. Accordingly, with this structure, adverse effect of variations in the threshold voltage of the transistor on the amount of current supplied to the load can be reduced.

Note that FIG. 43, or the like illustrates an example of a circuit configuration; accordingly, a transistor can be provided additionally. In each node in FIG. 43, or the like, it is possible not to provide an additional transistor, switch, a passive element, or the like. For example, transistors directly connected to the nodeA, the nodeB, the nodeC, the nodeD, the nodeE, the nodeF, or/and the nodeG are not additionally provided. Accordingly, for example, the following structure can be used: only the transistor 104T is directly connected to the nodeC and the other transistors are not directly connected to the nodeC.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 9

In this embodiment, an example of a configuration different from the circuit configurations of the pixel of the display devices described in Embodiments 7 and 8 is described.

Figure 44:
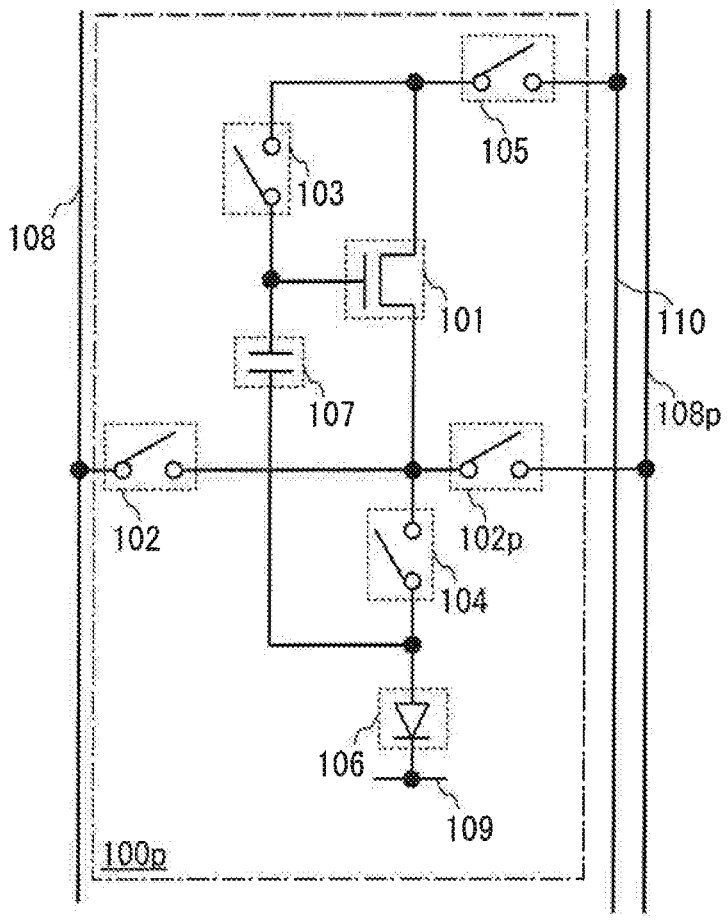
FIG. 44 is a circuit diagram illustrating an example of a pixel of one embodiment of the present invention.

FIG. 44 illustrates a pixel 100p having a circuit configuration similar to the pixel 100 illustrated in FIG. 28A. The pixel 100p illustrated in FIG. 44 is different from the pixel 100 illustrated in FIG. 28A in that the potential supplied to the wiring 108 is Vsig, a wiring 108p and a switch 102p are provided, and Vinit is supplied from the wiring 108p. Note that components in common with those in FIG. 28A are denoted by common reference numerals, and the description thereof is omitted.

A transistor can be applied to each of the switch 102, the switch 102p, the switch 103, the switch 104, and the switch 105 in the pixel 100p illustrated in FIG. 44. When an n-channel transistor is applied to each of the switch 102, the switch 103, the switch 104, and the switch 105, as illustrated in FIG. 45, switching is controlled with the wirings 131 to 134 and the wiring 131p.

In FIG. 44, a first terminal of the switch 102p is connected to the first terminal of the transistor 101, the first terminal of the switch 102, and the first terminal of the switch 104. A second terminal of the switch 102p is connected to the wiring 108p. The switching of the switch 102p is controlled with the wiring 131p.

Figure 45:
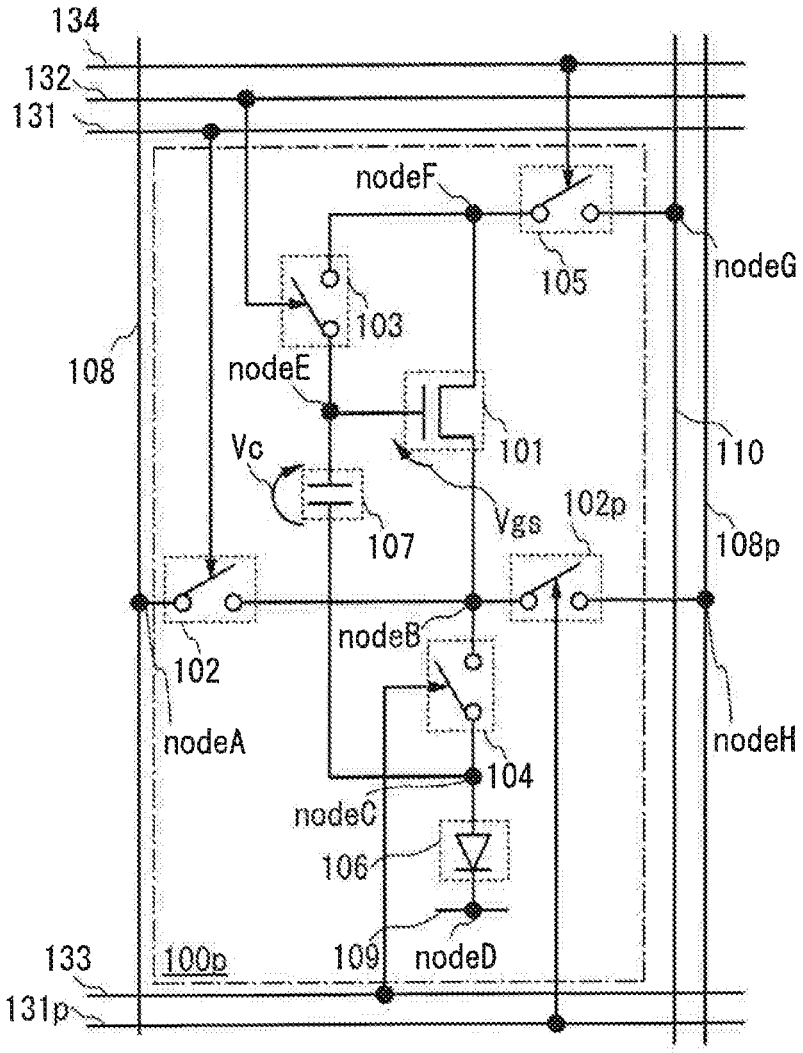
FIG. 45 is a circuit diagram illustrating an example of a pixel of one embodiment of the present invention.

Note that in order to explain the operation of the pixel 100p illustrated in FIG. 44, FIG. 45 shows symbols representing the potentials of nodes between elements and the potentials of wirings. FIG. 45 also shows Vgs between the one of the terminals (mainly serving as a source) and the gate of the transistor 101 and Vc between the electrodes of the capacitor 107.

A nodeA, a nodeB, a nodeC, a nodeD, a nodeE, a nodeF, a nodeG, and a nodeH correspond to nodes and wirings illustrated in FIG. 45. The potential of the nodeA corresponds to the potential of the wiring 108. The potential of the nodeB corresponds to the potential of a wiring connecting the first terminal of the transistor 101, the first terminal of the switch 102, the first terminal of the switch 104, and the first terminal of the switch 102p. The potential of the nodeC corresponds to the potential of a wiring connecting the second terminal of the switch 104, the one of the electrodes of the light-emitting element 106, and the other of the electrodes of the capacitor 107. The potential of the nodeD corresponds to the potential of the wiring 109. The potential of the nodeE corresponds to the potential of a wiring connecting the gate of the transistor 101, the one of electrodes of the capacitor 107, and the first terminal of the switch 103. The potential of the nodeF corresponds to the potential of a wiring connecting the second terminal of the transistor 101, the second terminal of the switch 103, and the first terminal of the switch 105. The potential of the nodeG corresponds to the potential of the wiring 110. The potential of the nodeE the nodeH corresponds to the potential of the wiring 108p.

Figure 46:
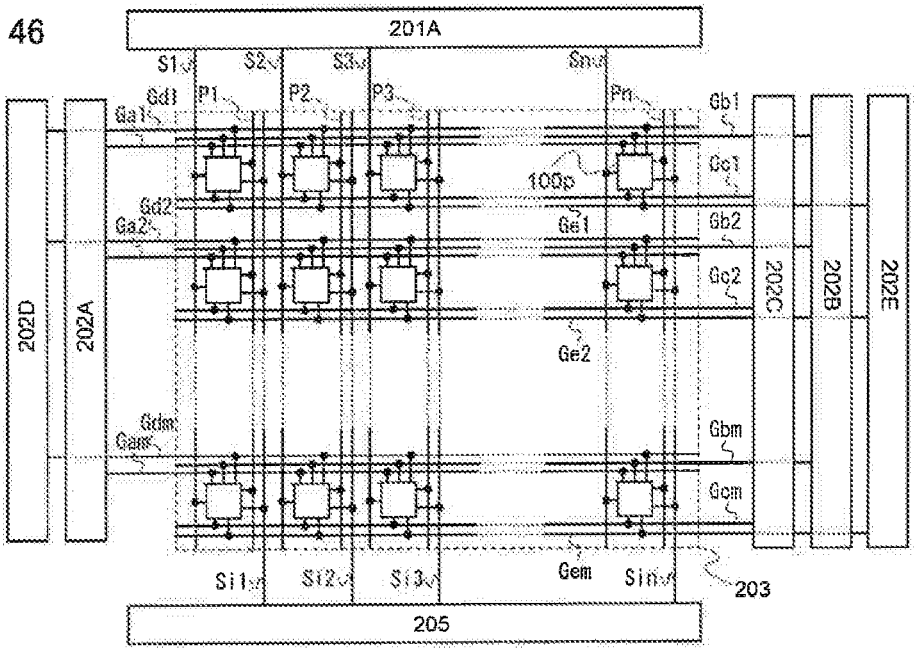
FIG. 46 is a circuit diagram illustrating an example of a pixel of one embodiment of the present invention.

Here, a display device including the pixel 100p is described with reference to a block diagram of FIG. 46.

The display device includes a signal line driver circuit 201, a scan line driver circuit 202A, a scan line driver circuit 202B, a scan line driver circuit 202C, a scan line driver circuit 202D, a scan line driver circuit 202E, a pixel region 203, and an initialization signal line driver circuit 205. The pixel region 203 is provided with a plurality of signal lines S1 to Sn extended from the signal line driver circuit 201 in a column direction; a plurality of signal lines Sil to Sin extended from the initialization signal line driver circuit 205 in a column direction; a plurality of scan lines Ga1 to Gam extended from the scan line driver circuit 202A in a row direction; a plurality of scan lines Gb1 to Gbm extended from the scan line driver circuit 202B in a row direction; a plurality of scan lines Gc1 to Gcm extended from the scan line driver circuit 202C in a row direction; a plurality of scan lines Gd1 to Gdm extended from the scan line driver circuit 202D in a row direction; a plurality of scan lines Gel to Gem extended from the scan line driver circuit 202E in a row direction; a plurality of pixels 100p provided in matrix, connected to respective signal lines S1 to Sn, and connected to respective scan lines Ga1 to Gam, Gb1 to Gbm, Gc1 to Gcm, Gd1 to Gdm, and Gel to Gem; and power supply lines P1 to Pn which are parallel to the signal lines S1 to Sn. The pixel 100 is connected to the signal line Sj (one of the signal lines S1 to Sn), the initialization signal line Sij (one of the initialization signal lines S1 to Sn), the scan line Gai (one of the scan lines Ga1 to Gam), the scan line Gbi (one of the scan lines Gb1 to Gbm), the scan line Gci (one of the scan lines Gc1 to Gcm), the scan line Gdi (one of the scan lines Gd1 to Gdm), the scan line Gei (one of the scan lines Gel to Gem), and the power supply line Pj (one of the power supply lines P1 to Pn).

The scan line Gai corresponds to the wiring 131 in FIG. 45. The scan line Gbj corresponds to the wiring 132 in FIG. 45. The scan line Gcj corresponds to the wiring 133 in FIG. 45. The scan line Gdj corresponds to the wiring 134 in FIG. 45. The scan line Gej corresponds to the wiring 131p in FIG. 45. The signal line Sj corresponds to the wiring 108 in FIG. 45. The initialization signal line Sij corresponds to the wiring 108p in FIG. 45. The power supply line Pj corresponds to the wiring 110 in FIG. 45. Although not illustrated in FIG. 46, cathode lines each of which a plurality of pixels uses in common and the cathode line corresponds to the wiring 109.

A scan line is selected with the use of a signal output from the scan line driver circuits 202A to 202E. The potential of each node of the pixels 100 connected to the selected scan line is initialized (first operation). Then, a video signal is written to the initialized pixel 100 to obtain the threshold voltage of a transistor (second operation). After the threshold voltage of the transistor is obtained by writing of the video signal, the operation moves to light emission. The pixel emits light in accordance with the video signal written to the pixel (third operation). In this manner, the initialization of the pixel 100, obtaining of the threshold voltage, and a light-emitting operation are sequentially performed.

Next, the operation of the pixel 100h illustrated in FIG. 44 is described. The operation of the pixel 100h illustrated in FIG. 44 can be mainly divided into the first operation, the second operation, and the third operation.

Figure 47A:
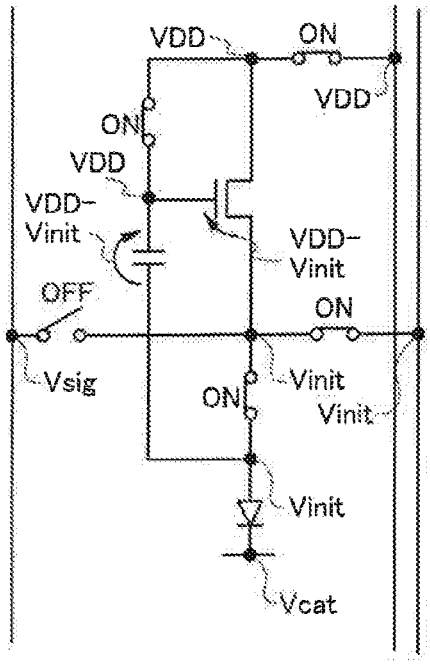
FIGS. 47A to 47C are circuit diagrams illustrating an example of a pixel of one embodiment of the present invention.

First, the first operation is described with reference to FIG. 47A. Note that reference numerals of elements in FIG. 47A are omitted. A conduction state and a non-conduction state of the switches are denoted by ON and OFF. In addition, how Vgs, Vc, the potential of the nodeA, the potential of the nodeB, the potential of the nodeC, the potential of the nodeD, the potential of the nodeE, the potential of the nodeF, the potential of the nodeG, and the potential of the nodeH, which are illustrated in FIG. 45, are applied is described.

The first operation initializes the potential of each node. Specifically, the nodeA is set at any potential, for example, Vsig, the nodeD is set at Vcat, the nodeG is set at VDD, and the nodeH is set at Vinit. Then, the switch 102p, the switch 103, the switch 104, and the switch 105 are turned on, and the switch 102 is turned off. Thus, the nodeB is set at Vinit, the nodeC is set at Vinit, the nodeE is set at VDD, and the nodeF is set at VDD. Further, Vgs becomes (VDD−Vinit), and Vc becomes (VDD−Vinit).

The first operation described with reference to FIG. 47A is different from that of described with reference to FIG. 31A in Embodiment 7 in that Vinit supplied to the nodeB and the nodeC is supplied from the wiring 108p through the switch 102p. With the structure, initialization can be performed without change in potential of the wiring 108 and the initialization of each node can be performed at high speed. Alternatively, initialization of each node can be performed while a potential is supplied from the wiring 108 to another pixel 100p connected to the wiring 108. Therefore, an operation period for the initialization can be longer.

Next, the second operation is described with reference to FIG. 47B, as in FIG. 47A.

The second operation is the operation for obtaining the threshold voltage of the transistor 101 with the use of Vgs by discharging the potential of the gate of the transistor 101 (or the electric charge of the capacitor 107). Specifically, the nodeA is set at Vsig, the nodeD is set at Vcat, the nodeG is set at VDD, and the nodeH is set at Vinit though it can be any potential. Then, the switch 102 and the switch 103 are turned on, and the switch 104, the switch 102p, and the switch 105 are turned off. Thus, the potential of the nodeB becomes Vsig, the potential of the nodeC becomes (Vinit−Vx), the potential of the nodeE becomes (Vsig+Vth), and the potential of the nodeF becomes (Vsig+Vth). Further, Vgs becomes Vth and Vc becomes (Vsig+Vth−Vinit+Vx).

Figure 47B:
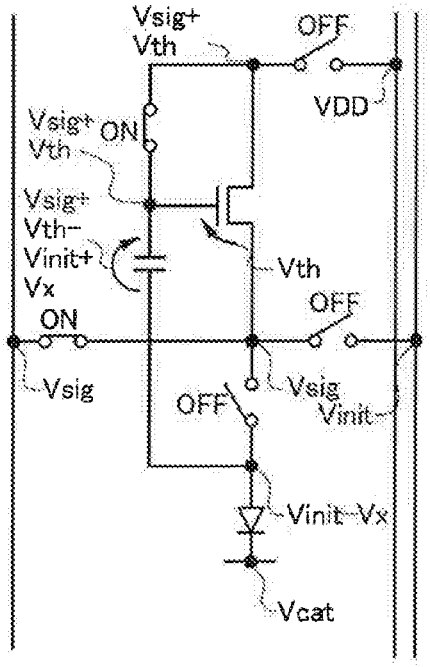

The second operation described with reference to FIG. 47B is different from that described in Embodiment 7 with reference to FIG. 31B in that the switch 102p is turned off. Therefore, the second operation in this embodiment is the same as the second operation described with reference to FIG. 31B. By the second operation, the potential of the nodeE corresponding to the potential of the gate of the transistor 101 can be (Vsig+Vth) which includes the threshold voltage of the transistor 101.

Note that in the second operation, the switch 104, the switch 105, and the switch 102p are turned off and the switch 102 is turned on, and these operations can be performed at the same time or at different timings.

For example, it is preferable that the switch 102 be turned on at the same time as or after the switch 102p is turned off. This is because a short circuit between the nodeA and the nodeH can be prevented easily.

Next, the third operation is described with reference to FIG. 47C, as in FIGS. 47A and 47B.

The third operation is the operation for outputting current to the light-emitting element 106 with the use of the transistor 101 as part of a current source. Specifically, the nodeA is set at Vsig though it can be any potential, the nodeD is set at Vcat, the nodeG is set at VDD, and the nodeH can be set at Vinit though it can be any potential. Then, the switch 104 and the switch 105 are turned on, and the switch 102, the switch 102p, and the switch 103 are turned off. Then, the nodeB and the nodeC become Vel, the nodeE becomes (Vsig+Vth−Vinit+Vx+Vel), and the nodeF becomes VDD. In addition, Vgs becomes (Vsig+Vth−Vinit+Vx) and Vc becomes (Vsig+Vth−Vinit+Vx).

Figure 47C:
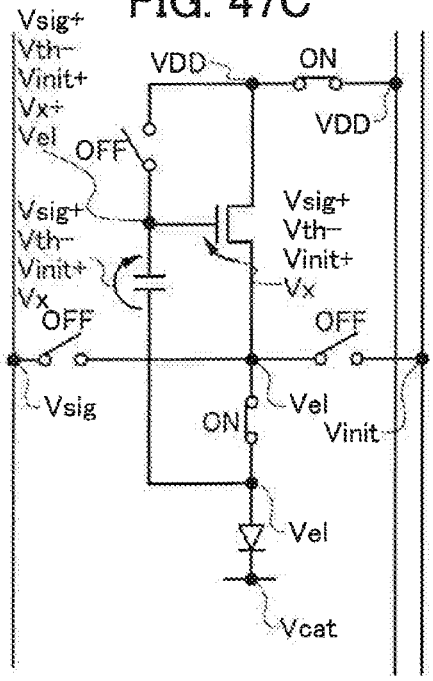

The third operation described with reference to FIG. 47C is different from that described in Embodiment 7 with reference to FIG. 31C in that the switch 102p is turned off. Therefore, the third operation in this embodiment is the same as the third operation described with reference to FIG. 31C. By the third operation, Vgs of the transistor 101 becomes (Vsig+Vth−Vinit+Vx), which includes the threshold voltage of the transistor 101. Accordingly, through the above operations, adverse effect of variations in the threshold voltage of the transistor on the amount of current supplied to the light-emitting element can be reduced.

Note that FIG. 44 illustrates the circuit configuration of this embodiment but one embodiment of the present invention is not limited thereto. The location of the switch or the number of switches can be changed and appropriate voltage can be supplied so as to achieve the similar operation to the operation described in FIGS. 47A to 47C in which the threshold voltage of the transistor is corrected. In such a manner, a variety of circuits can be employed.

Figure 48A:
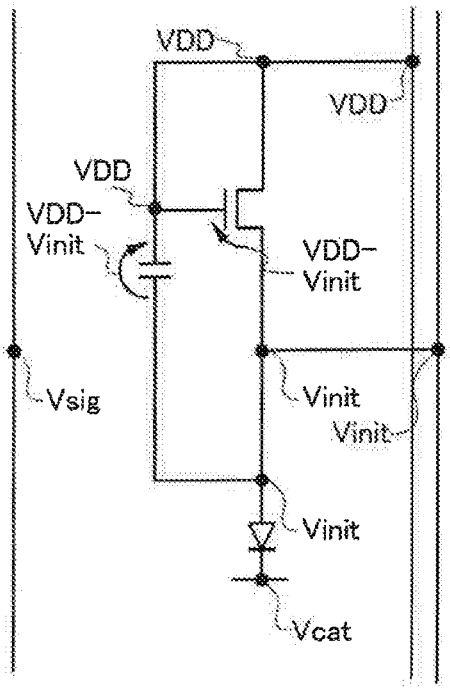
FIGS. 48A to 48C are circuit diagrams each illustrating an example of a pixel of one embodiment of the present invention.
Figure 48B:
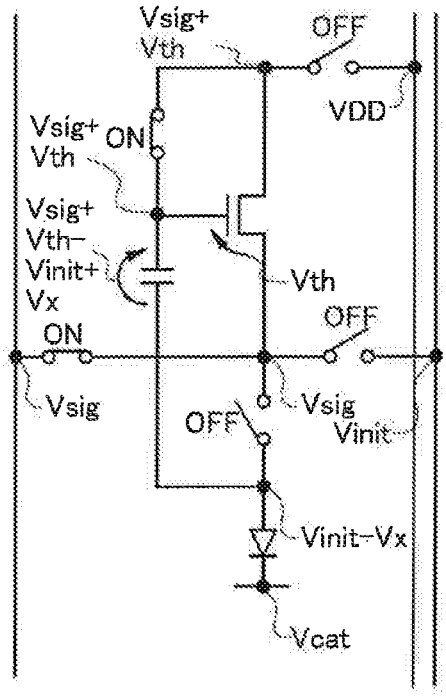
Figure 48C:
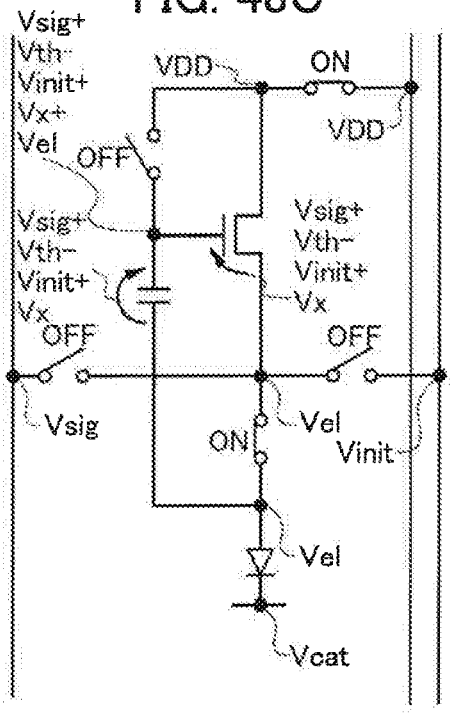

For example, specifically, the switch 102, the switch 102p, the switch 103, the switch 104, and the switch 105 can be provided any place and the numbers thereof is not limited as long as the switches can control a conduction state and a non-conduction state between nodes. In the case of the first operation described with reference to FIG. 47A, a connection relation illustrated in FIG. 48A can be employed. In the case of the second operation described with reference to FIG. 47B, a connection relation illustrated in FIG. 48B can be employed. In the case of the third operation described with reference to FIG. 47C, a connection relation illustrated in FIG. 48C can be employed. The potential of each node can have any level unless the node affects the operations.

As described above, in the circuit configuration described in this embodiment, the wiring 108p is provided and the initialization can be performed with the use of Vinit supplied from the wiring 108p through the switch 102p. Accordingly, time for initializing the potential of each node can be long. Alternatively, the initialization with the use of Vinit is not necessarily performed by using the wiring 108, which can save time allowing time for the second operation to be longer. In the third operation, Vgs of the transistor 101 becomes (Vsig+Vth−Vinit+Vx), which includes the threshold voltage of the transistor 101. Accordingly, with this structure, adverse effect of variations in the threshold voltage of the transistor on the amount of current supplied to the load can be reduced.

Figure 85:
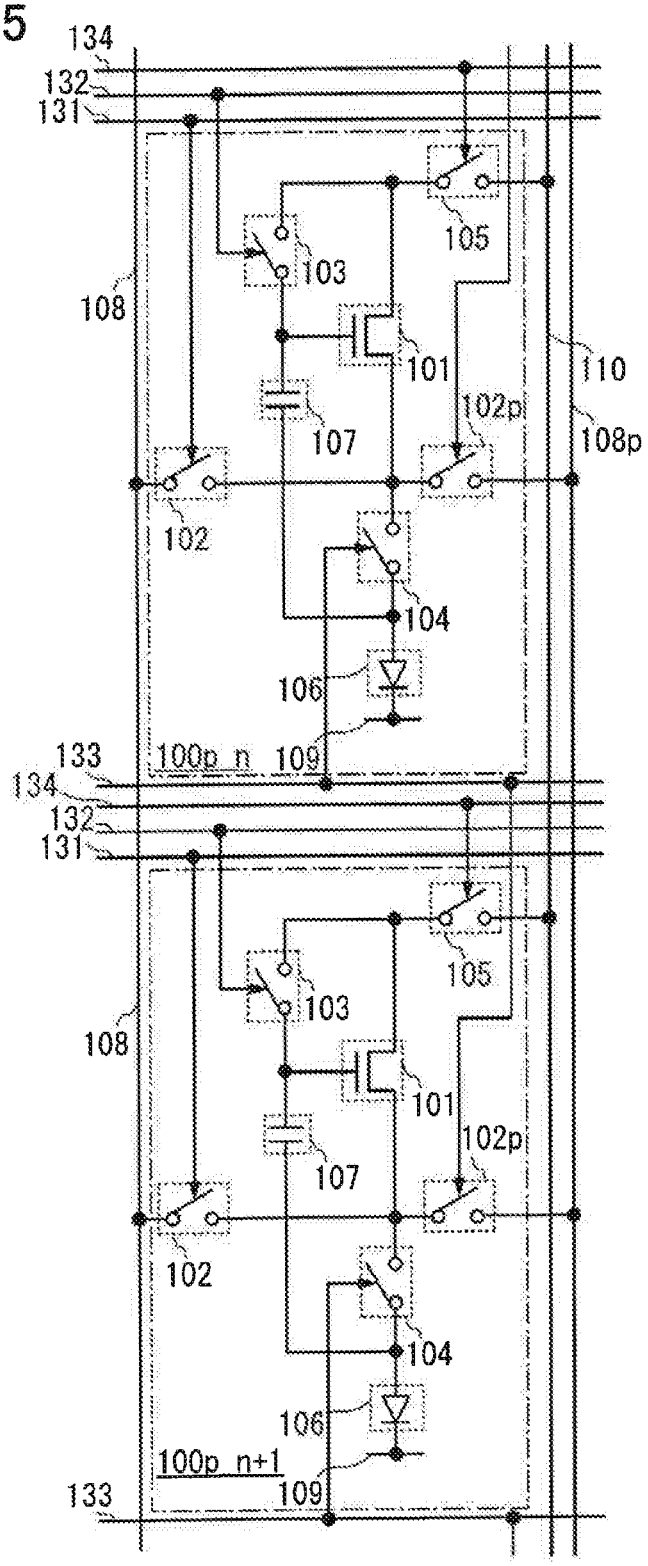
FIG. 85 is a circuit diagram illustrating an example of a pixel of one embodiment of the present invention.

In the case of the circuit configuration illustrated in FIG. 44 or FIG. 45, pixels adjacent to each other in a column direction can share wirings to be driven. Specifically, as illustrated in FIG. 85, when attention is paid to the pixel 100_n and the pixel 100_n+1 which are a pixel in the n-th row and a pixel in the (n+1)th row, which have the structures illustrated in FIG. 44 and FIG. 45, respectively, the structure in which the wiring 133 in the n-th row and the wiring 131p in the (n+1)th row branches from a wiring connected to the scan line driver circuit can be used. With such a structure, the area of the wirings in the pixel region can be reduced.

Figure 86:
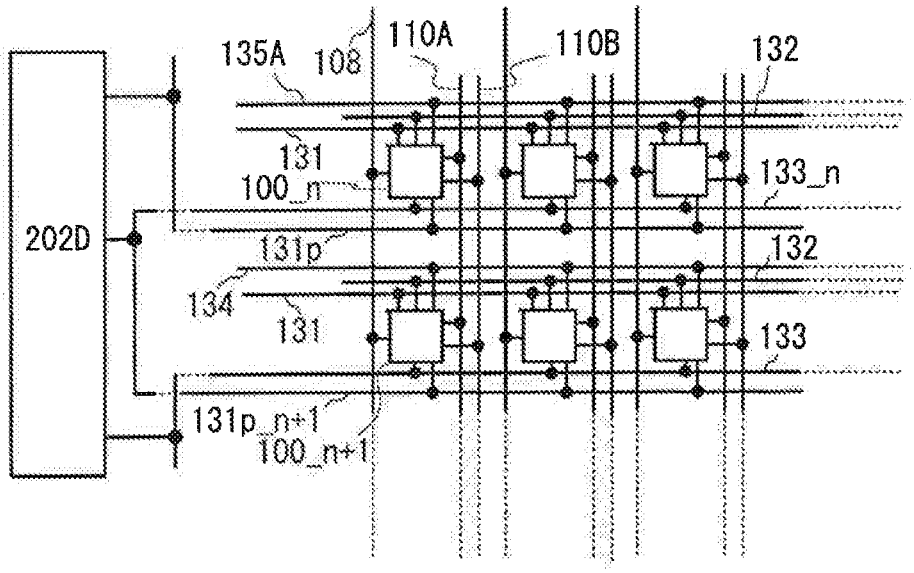
FIG. 86 is a circuit diagram illustrating an example of a pixel of one embodiment of the present invention.

The wirings explained with reference to FIG. 85 can be used in common outside the pixel region. Specifically, the following structure illustrated in FIG. 86 is also possible: the wiring from the scan line driver circuit 202D branches outside the pixel region, and the branched wirings function as the wiring 133_n of the pixel 100_n and the wiring 131p_n+1 of the pixel 100_n+1. With such a structure, the number of output terminals of the scan line driver circuit 202D can be reduced.

Note that the operation for correcting mobility can be performed with the use of the circuits illustrated in FIG. 44 and FIG. 45, as the operations illustrated in FIG. 33C, FIG. 34C, FIG. 42A, and FIG. 42B.

Note that FIG. 44, or the like illustrates an example of a circuit configuration; accordingly, a transistor can be provided additionally. In each node in FIG. 44, or the like, it is possible not to provide an additional transistor, switch, a passive element, or the like. For example, transistors directly connected to the nodeA, the nodeB, the nodeC, the nodeD, the nodeE, the nodeF, or/and the nodeG are not additionally provided. Accordingly, for example, the following structure can be used: only the transistor 104T is directly connected to the nodeC and the other transistors are not directly connected to the nodeC.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 10

The operations of the circuit configurations are described in Embodiments 7 to 9 under the assumption that the parasitic capacitance of the light-emitting element 106 is utilized; however, another configuration can be used. In this embodiment, a configuration in which a capacitor is electrically connected in parallel to the light-emitting element 106 provided in the circuit configuration in any of the above embodiments.

Figure 49:
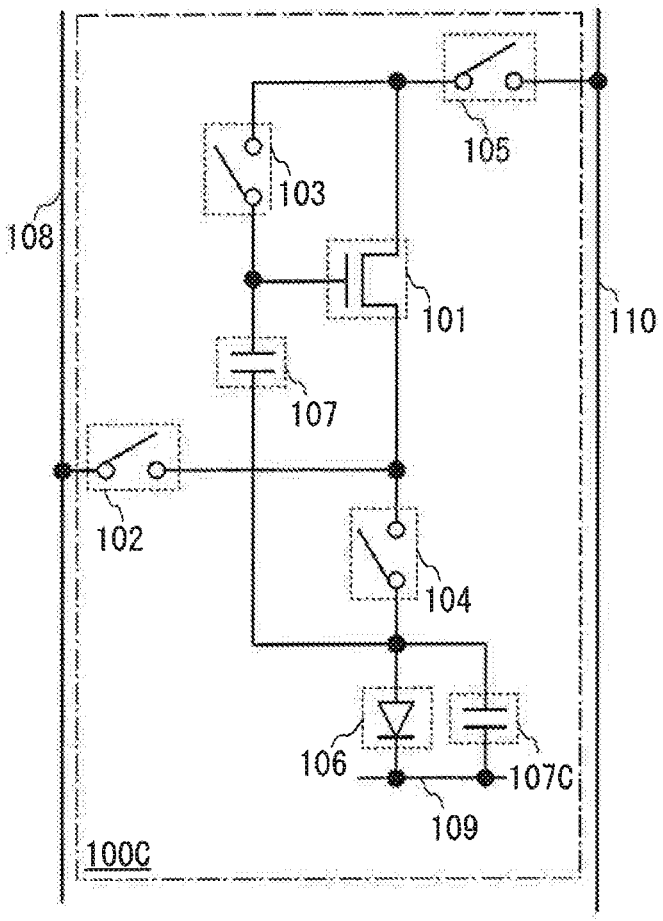
FIG. 49 is a circuit diagram illustrating an example of a pixel of one embodiment of the present invention.
Figure 50:
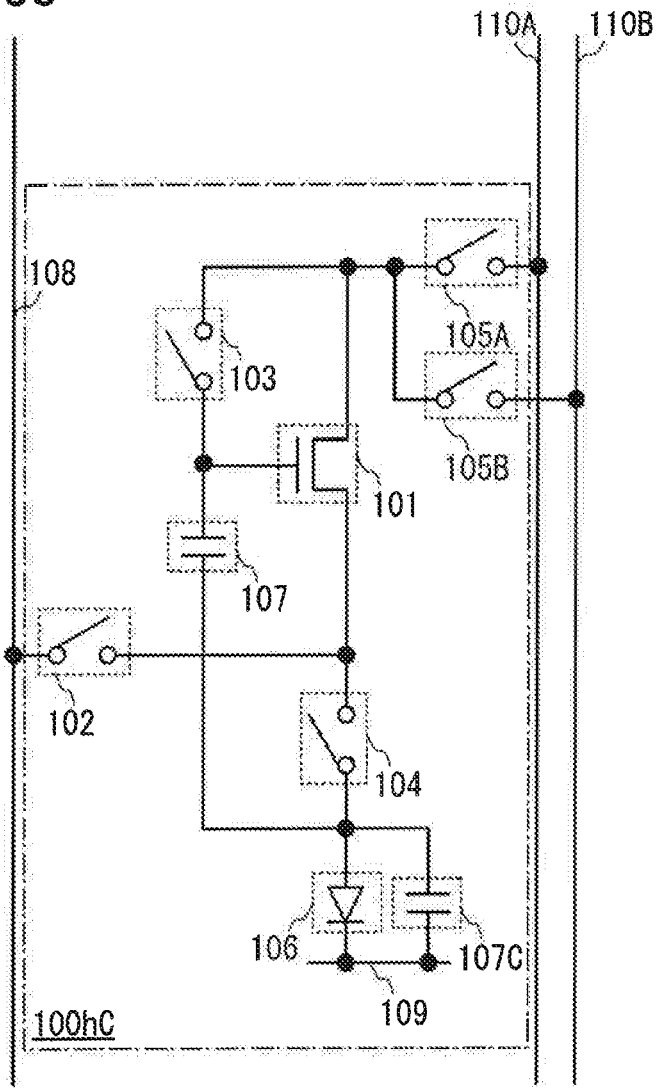
FIG. 50 is a circuit diagram illustrating an example of a pixel of one embodiment of the present invention.
Figure 51:
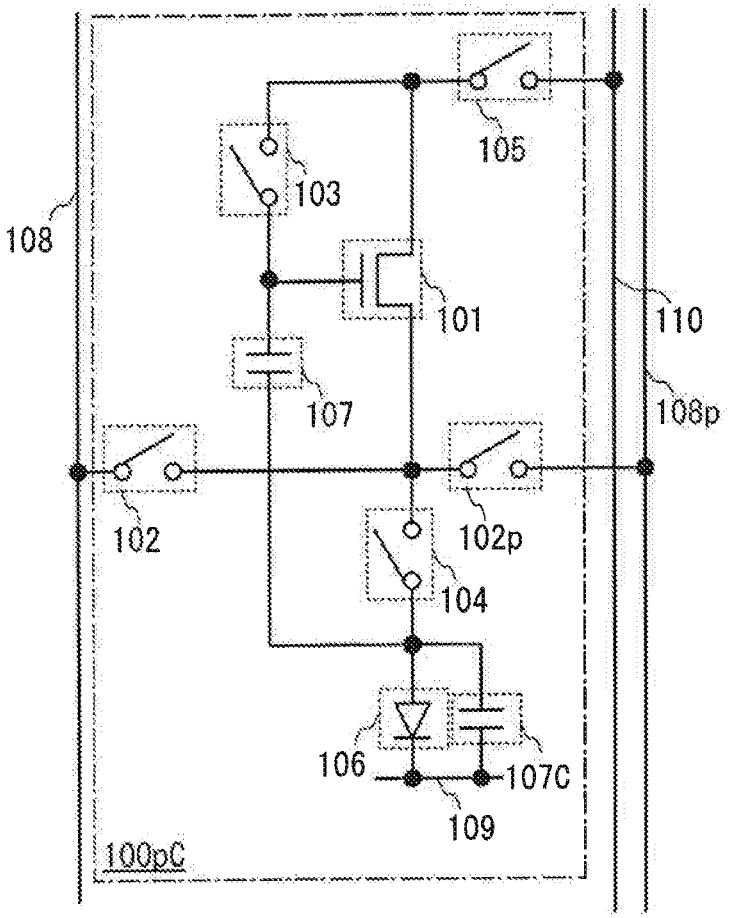
FIG. 51 is a circuit diagram illustrating an example of a pixel of one embodiment of the present invention.
Figure 87:
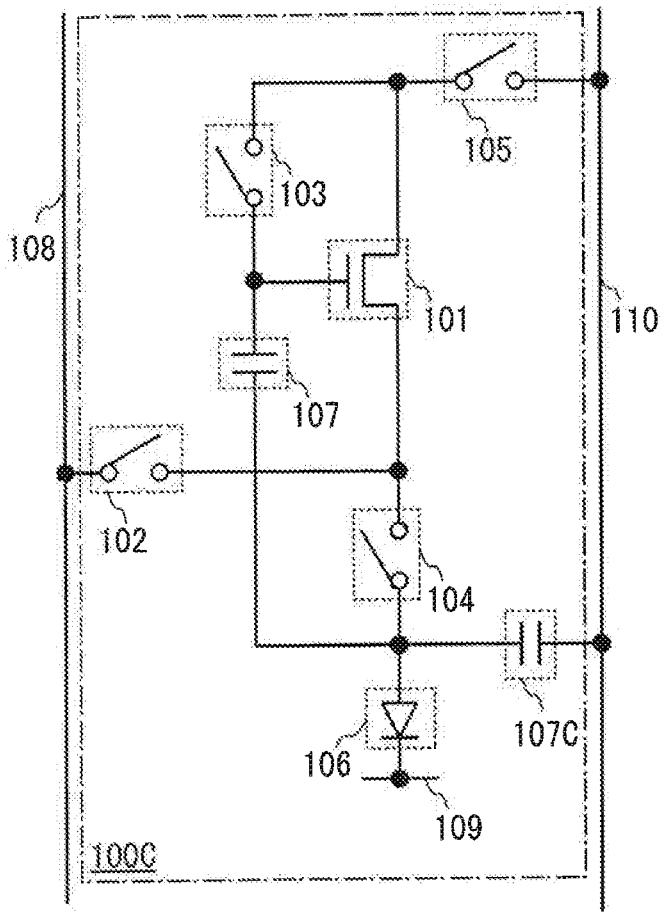
FIG. 87 is a circuit diagram illustrating an example of a pixel of one embodiment of the present invention.
Figure 88:
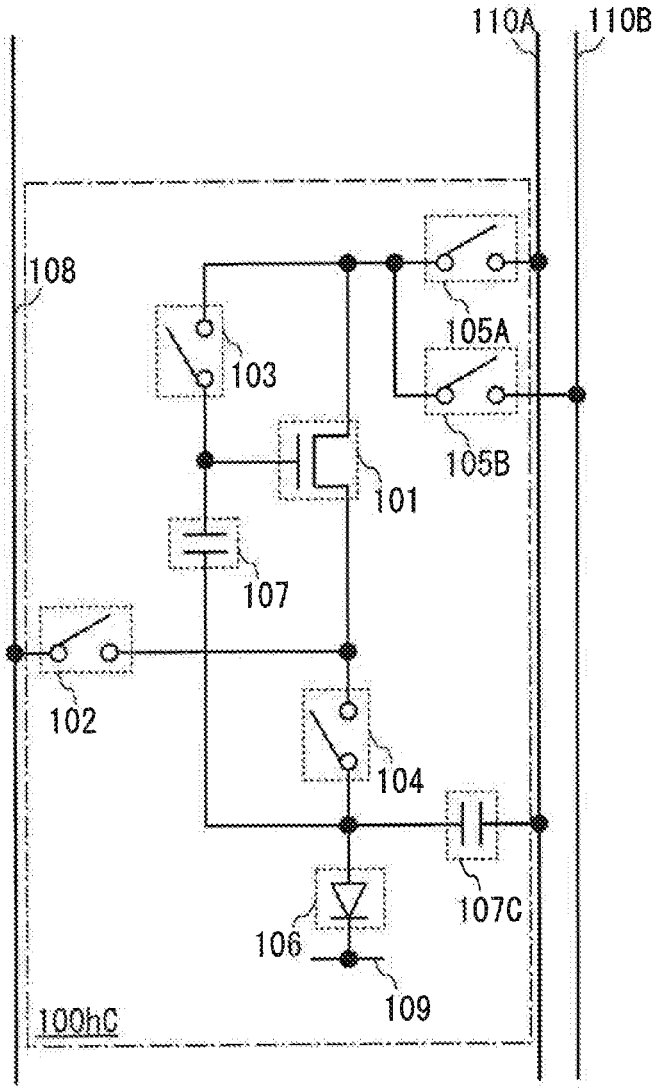
FIG. 88 is a circuit diagram illustrating an example of a pixel of one embodiment of the present invention.
Figure 89:
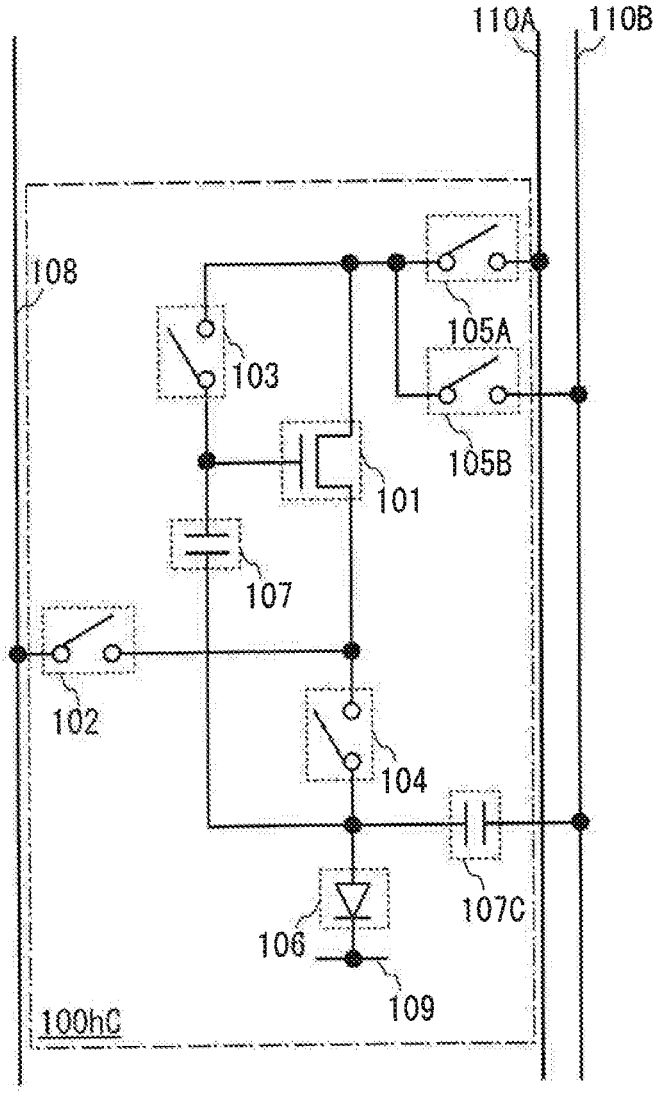
FIG. 89 is a circuit diagram illustrating an example of a pixel of one embodiment of the present invention.
Figure 90:
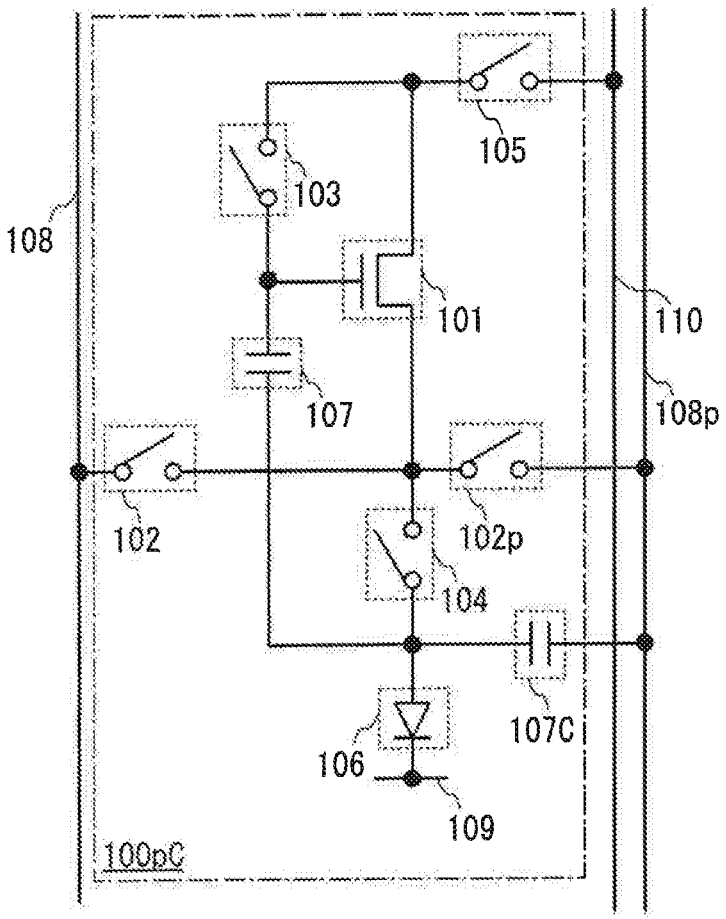
FIG. 90 is a circuit diagram illustrating an example of a pixel of one embodiment of the present invention.

FIG. 49 illustrates a pixel 100C and is different from FIG. 28A in that a capacitor 107C is electrically connected in parallel to the light-emitting element 106 connected to the pixel 100C. The capacitor 107C can be connected to the wiring 110 as illustrated in FIG. 87. Alternatively, the capacitor 107C can be connected to another wiring. Further, FIG. 50 illustrates a pixel 100hC and is different from FIG. 43 in that the capacitor 107C is electrically connected in parallel to the light-emitting element 106 connected to the pixel 100hC. The capacitor 107C can be connected to the wiring 110A or the wiring 110B as illustrated in FIG. 88 or FIG. 89. Moreover, FIG. 51 illustrates a pixel 100pC and is different from FIG. 44 in that a capacitor 107C is electrically connected in parallel to the light-emitting element 106 connected to the pixel 100hC. The capacitor 107C can be connected to the wiring 108p as illustrated in FIG. 90.

The capacitor 107C is electrically connected to the light-emitting element 106 as illustrated in FIG. 49, FIG. 50, and FIG. 51, so that variations in electric charge at the nodeC can be small or Vx can be low in the operation for initialization and the operation for obtaining threshold voltage which are described in any of the above embodiments. When Vx can be low, the semiconductor device can supply a more accurate amount of current to the light-emitting element 106.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 11

In this embodiment, a configuration different from the circuit configurations of the pixels described in Embodiments 7 to 10 is described.

Figure 52:
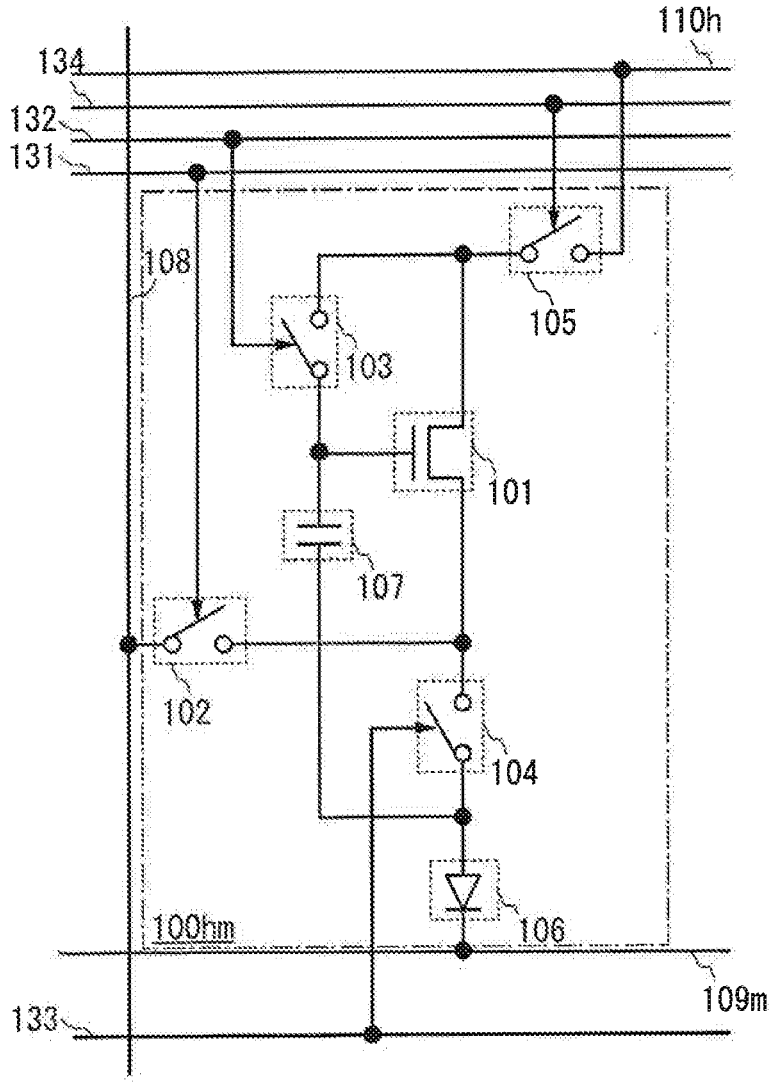
FIG. 52 is a circuit diagram illustrating an example of a pixel of one embodiment of the present invention.

FIG. 52 illustrates a pixel 100h having a circuit configuration similar to the pixel 100 illustrated in FIG. 29B. The pixel 100hm illustrated in FIG. 52 is different from the pixel 100 illustrated in FIG. 29B in that the pixel 100hm is connected to a wiring 109m. The potential Vup or Vcat is supplied to the wiring 109m, switching the potentials as necessary. Note that components in common with those in FIG. 29B are denoted by common reference numerals, and the description thereof is omitted.

The potential Vup can be higher than Vcat. The potential Vup is high, so that Vinit is prevented from being too low.

Figure 53:
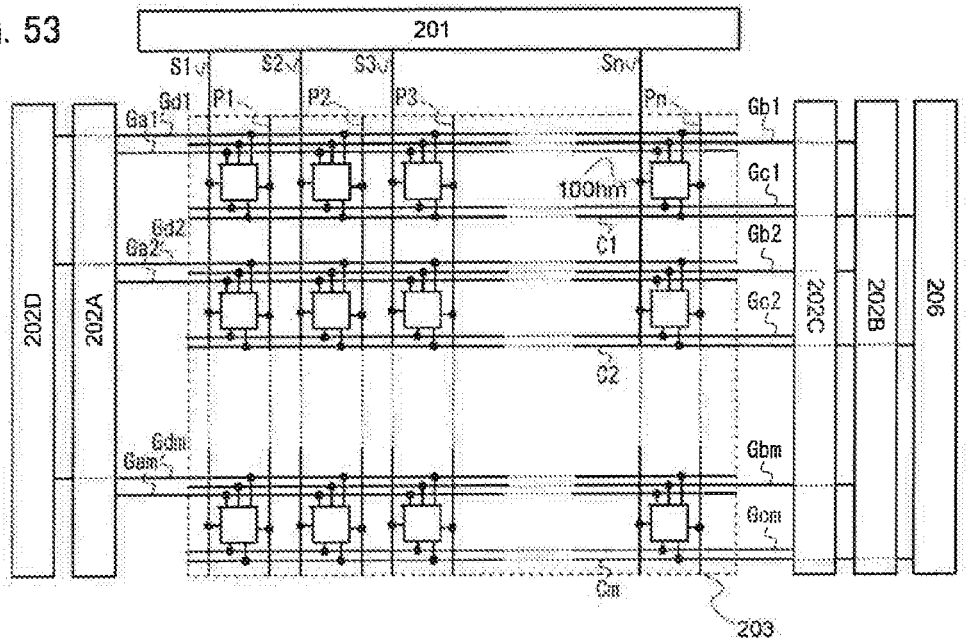
FIG. 53 is a circuit diagram illustrating an example of a pixel of one embodiment of the present invention.

Here, a display device including the pixel 100hm is described with reference to a block diagram of FIG. 53.

The display device includes a signal line driver circuit 201, a scan line driver circuit 202A, a scan line driver circuit 202B, a scan line driver circuit 202C, a scan line driver circuit 202D, a pixel region 203, and a cathode line driver circuit 206. The pixel region 203 is provided with a plurality of signal lines S1 to Sn extended from the signal line driver circuit 201 in a column direction; a plurality of scan lines Ga1 to Gam extended from the scan line driver circuit 202A in a row direction; a plurality of scan lines Gb1 to Gbm extended from the scan line driver circuit 202B in a row direction; a plurality of scan lines Gc1 to Gcm extended from the scan line driver circuit 202C in a row direction; a plurality of scan lines Gd1 to Gdm extended from the scan line driver circuit 202D in a row direction; a plurality of cathode lines C1 to Cm extended from the cathode line driver circuit 206 in a row direction; a plurality of pixels 100hm provided in matrix, connected to respective signal lines S1 to Sn, and connected to respective scan lines Ga1 to Gam, Gb1 to Gbm, Gc1 to Gcm, and Gd1 to Gdm; and power supply lines P1 to Pn which are parallel to the signal lines S1 to Sn. The pixel 100 is connected to the signal line Sj (one of the signal lines S1 to Sn), the scan line Gai (one of the scan lines Ga1 to Gam), the scan line Gbi (one of the scan lines Gb1 to Gbm), the scan line Gci (one of the scan lines Gc1 to Gcm), the scan line Gdi (one of the scan lines Gd1 to Gdm), the cathode line Ci (one of cathode lines C1 to Cm) and the power supply line Pj (one of the power supply lines P1 to Pn).

The scan line Gai corresponds to the wiring 131 in FIG. 52. The scan line Gbj corresponds to the wiring 132 in FIG. 52. The scan line Gcj corresponds to the wiring 133 in FIG. 52. The scan line Gdj corresponds to the wiring 134 in FIG. 52. The signal line Sj corresponds to the wiring 108 in FIG. 52. The power supply line Pj corresponds to the wiring 110 in FIG. 52. The cathode line Ci corresponds to the wiring 109 in FIG. 52.

A scan line is selected with the use of a signal output from the scan line driver circuits 202A to 202D. The potential of each node of the pixels 100hm connected to the selected scan line is initialized (first operation). Then, a video signal is written to the initialized pixel 100hm to obtain the threshold voltage of a transistor (second operation). After the threshold voltage of the transistor is obtained by writing of the video signal, the operation moves to light emission. The pixel emits light in accordance with the video signal written to the pixel (third operation). In this manner, the initialization of the pixel 100hm, obtaining of the threshold voltage, and light-emitting operation are sequentially performed.

Next, the operation of the pixel 100hm illustrated in FIG. 52 is described. The operation of the pixel 100hm illustrated in FIG. 52 can be mainly divided into a first operation, a second operation, and a third operation.

Note that in order to explain the operation of the circuit configuration illustrated in FIG. 52, FIG. 52 shows symbols representing the potentials of nodes between elements and the potentials of wirings, as FIG. 29B does. The operation of the circuit configuration illustrated in FIG. 52 is explained with symbols of Vgs and Vc, as in FIG. 29B.

Figure 54A:
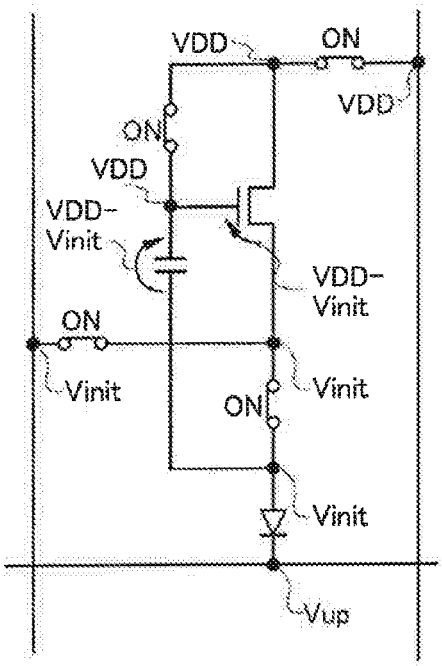
FIGS. 54A to 54C are circuit diagrams illustrating an example of a pixel of one embodiment of the present invention.

The first operation illustrated in FIG. 54A is the same as the first operation described with reference to FIG. 31A except that the nodeD is set at Vup. The description of the same portions is omitted. When the nodeD is set at Vup, current flowing to the light-emitting element 106 in the first operation can be reduced more surely. Alternatively, a normal operation can be performed with ease without making Vinit extremely low. Therefore, another potential can have smaller amplitude, resulting in reduction in power consumption.

The potential Vup is higher than Vinit and Vsig. Alternatively, Vup is approximately equal to Vinit. Note that the potential is preferably set so as not to cause dielectric breakdown of the light-emitting element 106.

Figure 54B:
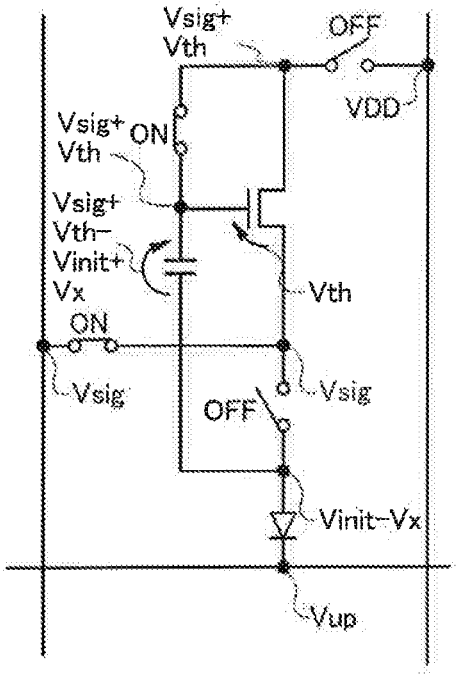

The second operation illustrated in FIG. 54B is the same as the second operation described with reference to FIG. 31B except that the nodeD is set at Vup. The description of the same portions is omitted. When the nodeD is set at Vup, current flowing to the light-emitting element 106 in the second operation can be reduced more surely.

Figure 54C:
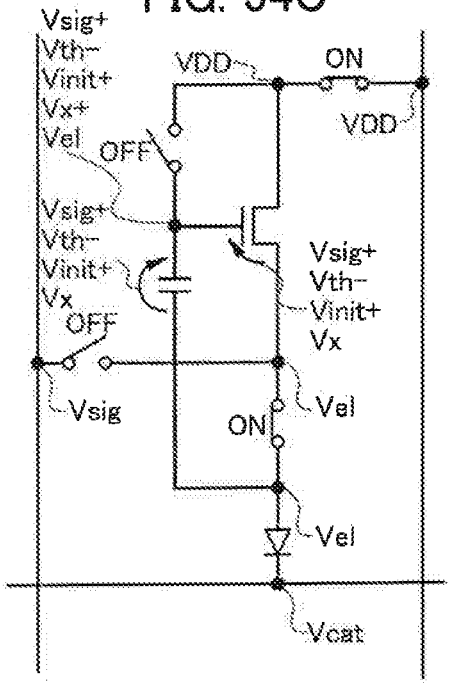

Then, the third operation illustrated in FIG. 54C is the same as the third operation described with reference to FIG. 31C and therefore the description thereof is omitted. Note that the third operation illustrated in FIG. 54C is different from the first operation described with reference to FIG. 54A and the second operation described with reference to FIG. 54B in that the nodeD is set at Vcat and current flows through the load.

With the structure described with reference to FIGS. 54A to 54C, only when the transistor 101 is completely set to allow the semiconductor device to serve as a current source, current can flow without causing malfunction.

Note that the operation for correcting mobility can be performed with the use of the circuits illustrated in FIG. 52, as the circuits illustrated in FIG. 33C, FIG. 34C, FIG. 42A, and FIG. 42B.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 12

In this embodiment, structures of a top view and a cross-sectional view corresponding to the circuit diagram of the pixel of the display device illustrated in FIG. 28A of Embodiment 7 are described.

Figure 55:
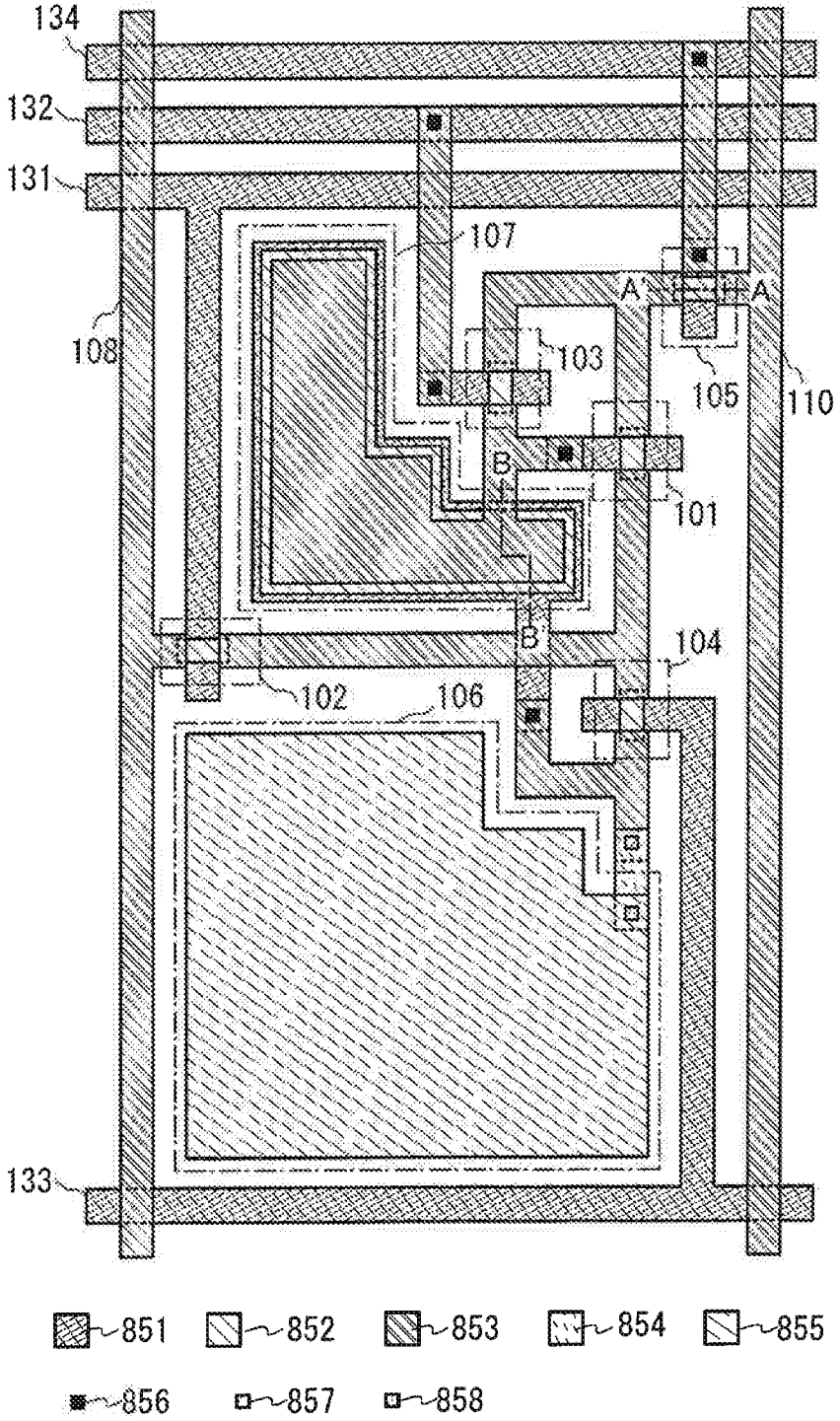
FIG. 55 is a top view illustrating an example of a pixel of one embodiment of the present invention.

A top view of FIG. 55 shows a structure described in Embodiment 7 with reference to FIG. 28A. In the top view of FIG. 55, each transistor is an inverted staggered transistor.

As a structure corresponding to that in FIG. 28A, the top view of FIG. 55 of a pixel which can be applied to the display device shows the transistor 101, the switch 102, the switch 103, the switch 104, the switch 105, the light-emitting element 106 (only one of electrodes is illustrated), the capacitor 107, the wiring 108, the wiring 110, the wiring 131, the wiring 132, the wiring 133, and the wiring 134.

The structure illustrated in FIG. 55 includes a conductive layer 851, a semiconductor layer 852, a conductive layer 853, a conductive layer 854, a conductive layer 855, a contact hole 856, a contact hole 857, and a contact hole 858. Note that an insulating layer in each layer is not illustrated here.

The conductive layer 851 has a region that functions as a gate electrode or a scan line. Note that the conductive layer 851 is formed over a substrate over which elements such as a transistor are provided. A base insulating layer may be sandwiched between the substrate and the conductive layer 851.

Although there is no particular limitation on a substrate used as the substrate, a glass substrate is preferably used. The base insulating layer has a function of preventing diffusion of an impurity element from the substrate, and can be formed to have a single-layer structure or a layered structure including any of a silicon nitride layer, a silicon oxide layer, a silicon nitride oxide layer, and a silicon oxynitride layer.

As the substrate, a semiconductor substrate (e.g., a single crystal substrate or a silicon substrate), an SOI substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. For a flexible substrate, a flexible synthetic resin such as plastics typified by polyethylene terephthalate (PET), polyethylene naphthalate (PEN), and polyether sulfone (PES), or acrylic can be used, for example. For an attachment film, polypropylene, polyester, polyvinyl fluoride, polyvinyl chloride, or the like can be used, for example. For a base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with the use of such a transistor, power consumption of the circuit can be reduced or the circuit can be highly integrated.

Note that the transistor may be formed using one substrate, and then, the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent properties or a transistor with low power consumption can be formed, a device with high durability or high heat resistance can be formed, or reduction in weight or thickness can be achieved.

The conductive layer 851 can be formed to have a single-layer structure or a stacked-layer structure using a metal material such as molybdenum (Mo), titanium (Ti), chromium (Cr), tantalum (Ta), tungsten (W), aluminum (Al), copper (Cu), neodymium (Nd), or scandium (Sc), or an alloy material including any of these as a main component.

The semiconductor layer 852 has a region functioning as a semiconductor layer of the transistor.

The semiconductor layer 852 may include amorphous silicon. The semiconductor layer 852 may include polycrystalline silicon. Alternatively, The semiconductor layer 852 may include an organic semiconductor, an oxide semiconductor, or the like.

The conductive layer 853 has regions functioning as wirings and source and drain of the transistor.

The conductive layer 853 can be formed using an element selected from Al, Cr, Cu, Ta, Ti, Mo, and W, an alloy including any of these elements as a main component, an alloy film including a combination of any of these elements, or the like. The conductive film may have a structure in which a high-melting-point metal layer of Ti, Mo, W, or the like is stacked over and/or below a metal layer of Al, Cu, or the like. When an Al material to which an element (e.g., Si, Nd, or Sc) which prevents generation of hillocks and whiskers in an Al film is added is used, heat resistance can be increased.

Alternatively, the conductive layer 853 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SaO_2$, abbreviated to ITO), indium oxide-zinc oxide ($In_2O_3$—ZnO), or any of these metal oxide materials containing silicon oxide can be used.

The conductive layer 854 has a region functioning as a wiring. Note that the conductive layer 854 is provided to improve the planarity of an insulating layer formed later to be in contact with a transparent conductive layer and is not necessarily provided.

The conductive layer 855 has a region functioning as one of the electrodes of the light-emitting element. The conductive layer 855 has a function of reflecting light in the case where light emitted from the light-emitting element is obtained from the counter substrate side. On the other hand, the conductive layer 855 has a function of transmitting light in the case where light emitted from the light-emitting element is obtained from the element substrate side.

The contact holes 856 each have a function of connecting the conductive layer 851 and the conductive layer 853. An insulating layer functioning as a gate insulating layer is sandwiched between the conductive layer 851 and the conductive layer 853. The insulating layer functioning as the gate insulating layer can be formed to have a single-layer structure or a layered structure of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by plasma-enhanced CVD, sputtering, or the like.

The contact hole 857 has a function of connecting the conductive layer 853 and the conductive layer 854. An insulating layer functioning as a passivation layer is sandwiched between the conductive layer 853 and the conductive layer 854. For the passivation layer, an inorganic insulating film such as a silicon nitride film, an aluminum nitride film, a silicon nitride oxide film, or an aluminum nitride oxide film can be used.

The contact hole 858 has a function of connecting the conductive layer 854 and the conductive layer 855. An insulating layer providing the planarity of a surface is sandwiched between the conductive layer 854 and the conductive layer 855. For the insulating layer providing the planarity of the surface, an organic material such as polyimide, acrylic resin, or benzocyclobutene-based resin can be used. Other than such organic materials, it is also possible to use a low-dielectric constant material (low-k material) or the like.

Next, structures of a cross section (taken along the chain double-dashed line A-A' in FIG. 55) of a transistor functioning as the switch 105 and structures of a cross section (taken along the chain double-dashed line B-B' in FIG. 55) of the capacitor 107 which is shown in the top view of FIG. 55 are described with reference to FIGS. 91A and 91B.

Figure 91A:
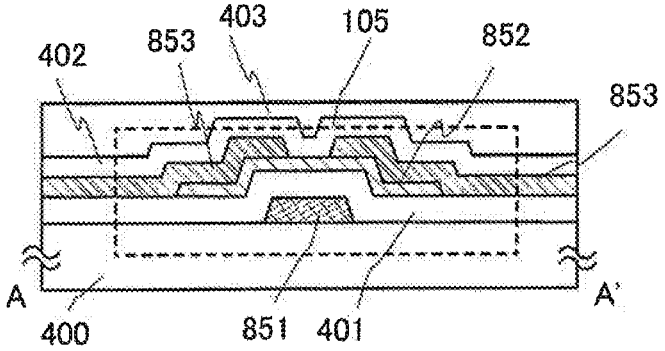
FIGS. 91A and 91B are cross-sectional views each illustrating an example of a pixel of one embodiment of the present invention.

The transistor functioning as the switch 105 in FIG. 91A is a bottom-gate transistor and also referred to as an inverted staggered transistor, for example. There is no particular limitation on the structure of the transistor; for example, a staggered type transistor or a planar type transistor having a top-gate structure or a bottom-gate structure can be employed. Further, the transistor may have a single gate structure including one channel formation region, a double gate structure including two channel formation regions, or a triple gate structure including three channel formation regions. Alternatively, the transistor may have a dual gate structure including two gate electrode layers positioned over and below a channel region with a gate insulating layer provided therebetween.

The transistor functioning as the switch 105 illustrated in FIG. 91A includes, over a substrate 400, the conductive layer 851 functioning as a gate, an insulating layer 401 functioning as a gate insulating layer, the semiconductor layer 852, and the conductive layers 853 functioning as a source and a drain. An insulating layer 402 is provided as a passivation layer so as to cover the transistor functioning as the switch 105. An insulating layer 403 providing the planarity of the surface is formed over the insulating layer 402.

Figure 91B:
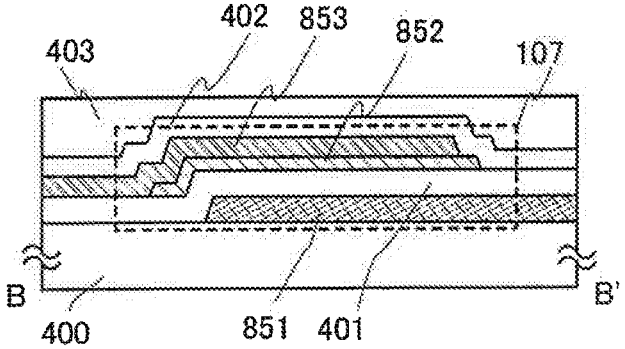

The capacitor 107 illustrated in FIG. 91B includes, over the substrate 400, the conductive layer 851 functioning as one of the electrodes, the insulating layer 401, the semiconductor layer 852, and the conductive layer 853 functioning as the other of the electrodes. An insulating layer 402 is provided as a passivation layer so as to cover the capacitor 107. An insulating layer 403 providing the planarity of the surface is formed over the insulating layer 403.

Note that a top view of the pixel which can be applied to the display device illustrated in FIG. 55 is not limited to the above top view, and another structure can be used.

Figure 56:
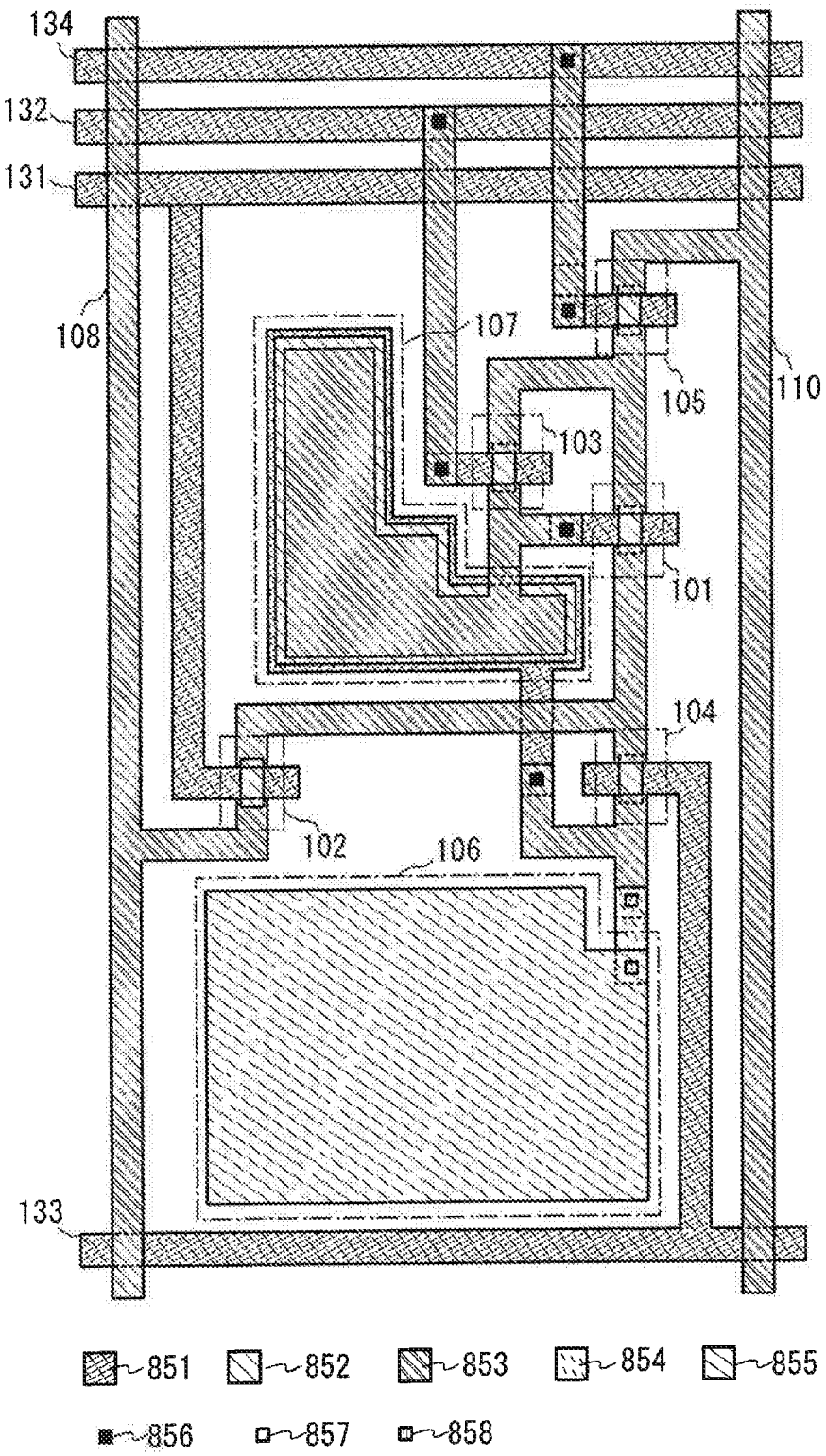
FIG. 56 is a top view illustrating an example of a pixel of one embodiment of the present invention.

As an example, a top view of the pixel described with reference to FIG. 28A can be a top view illustrated in FIG. 56. FIG. 56 is different from FIG. 55 in that the sources and the drains which are provided to sandwich channels of the transistors forming pixels are provided to be in the same direction. With the structure, variations in characteristics of the transistors forming the pixels can be reduced.

Figure 57:
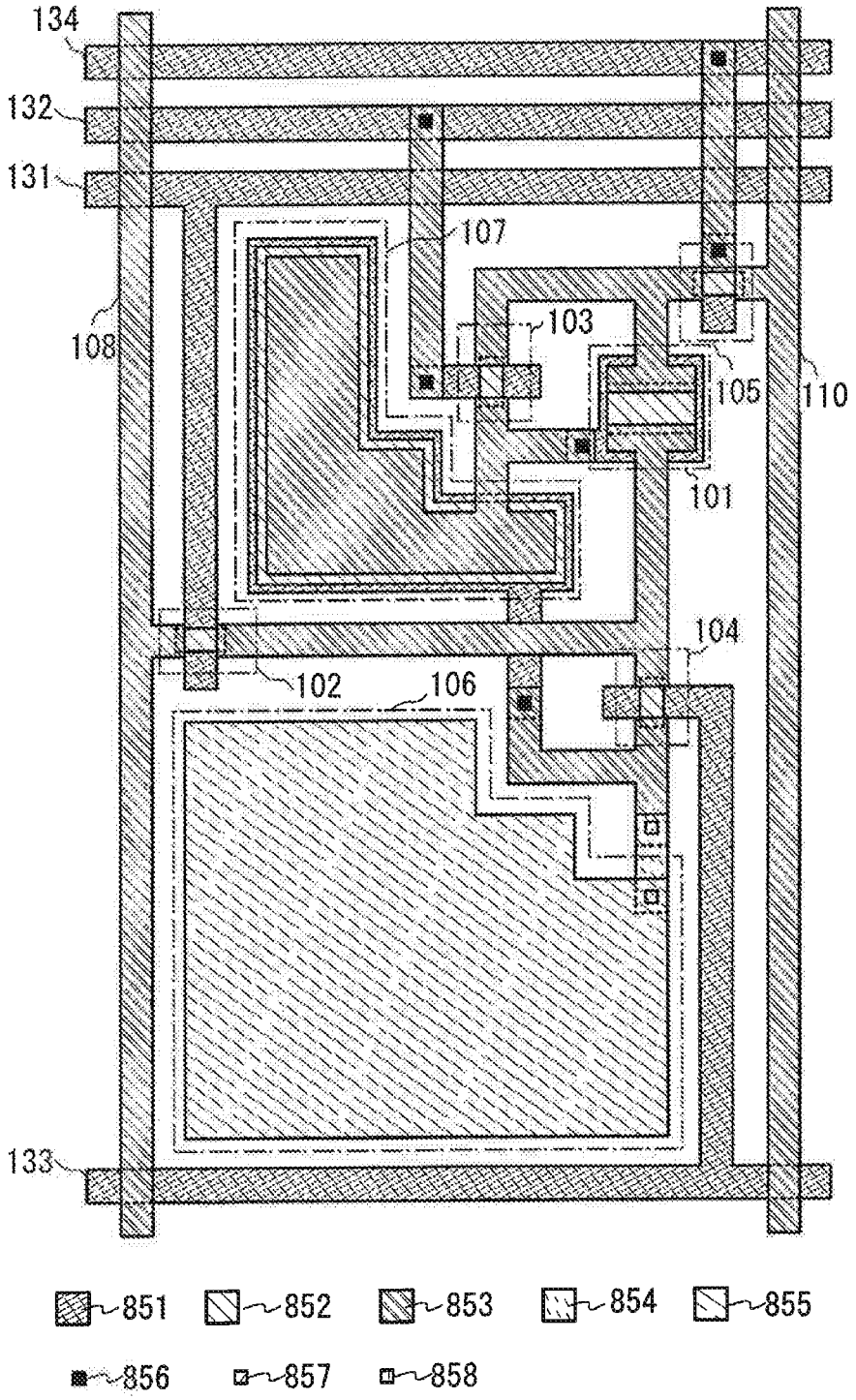
FIG. 57 is a top view illustrating an example of a pixel of one embodiment of the present invention.

The structure of a top view can also be a top view illustrated in FIG. 57. FIG. 57 is different from FIG. 55 in that the size of the transistor 101 which allows the semiconductor device to function as a current source is larger than the size of the transistor functioning as a switch. With the structure, the amount of current flowing through the transistor 101 which allows the semiconductor device to function as a current source can be increased.

Figure 58:
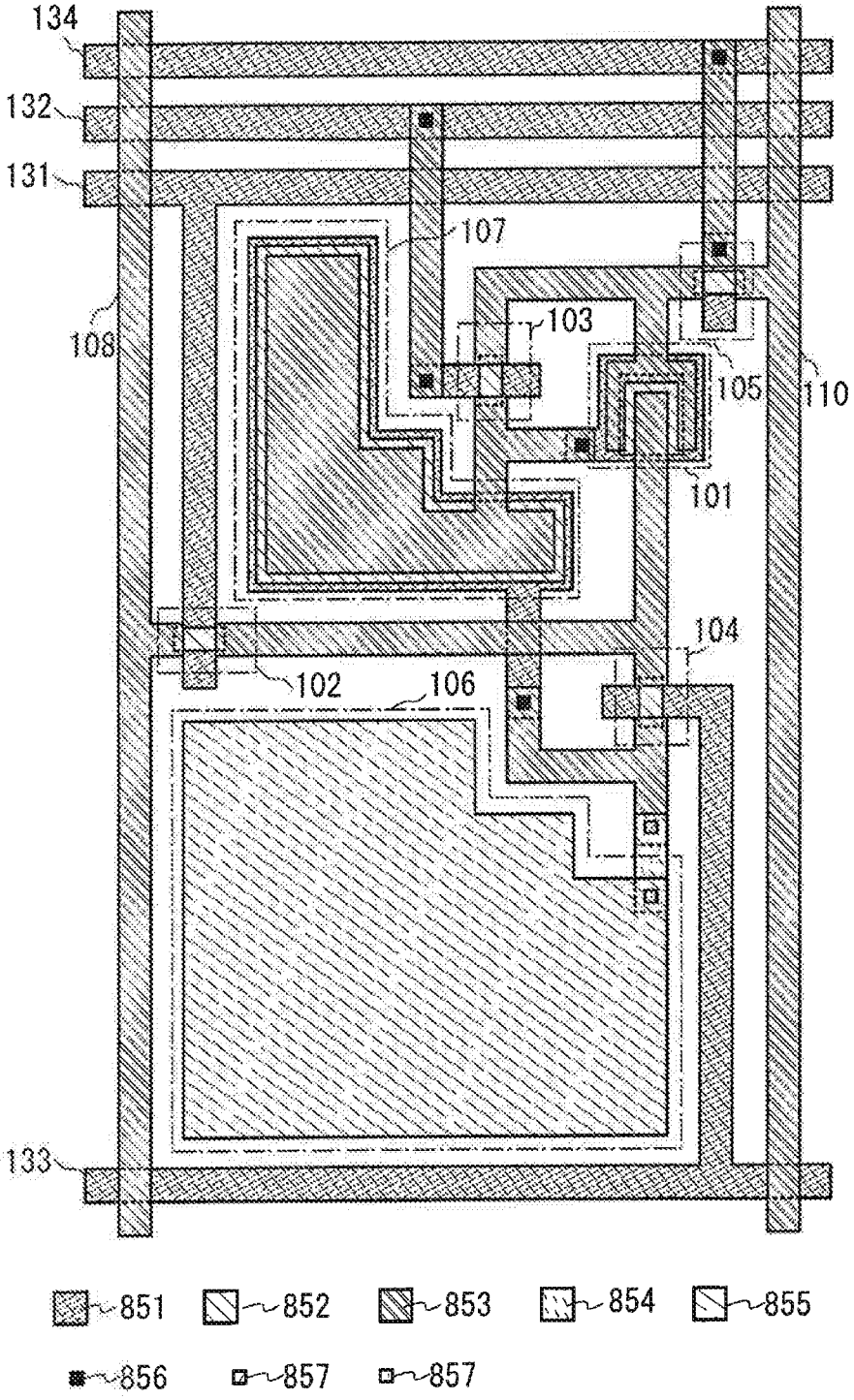
FIG. 58 is a top view illustrating an example of a pixel of one embodiment of the present invention.

The structure of a top view can also be a top view illustrated in FIG. 58. FIG. 58 is different from FIG. 55 in that the other of the terminals of the transistor 101 which allows the semiconductor device to function as a current source is provided to have a U-shape and cover the one of the terminals of the transistor 101. With the structure, the amount of current flowing through the transistor 101 which allows the semiconductor device to function as a current source can be increased.

Figure 59:
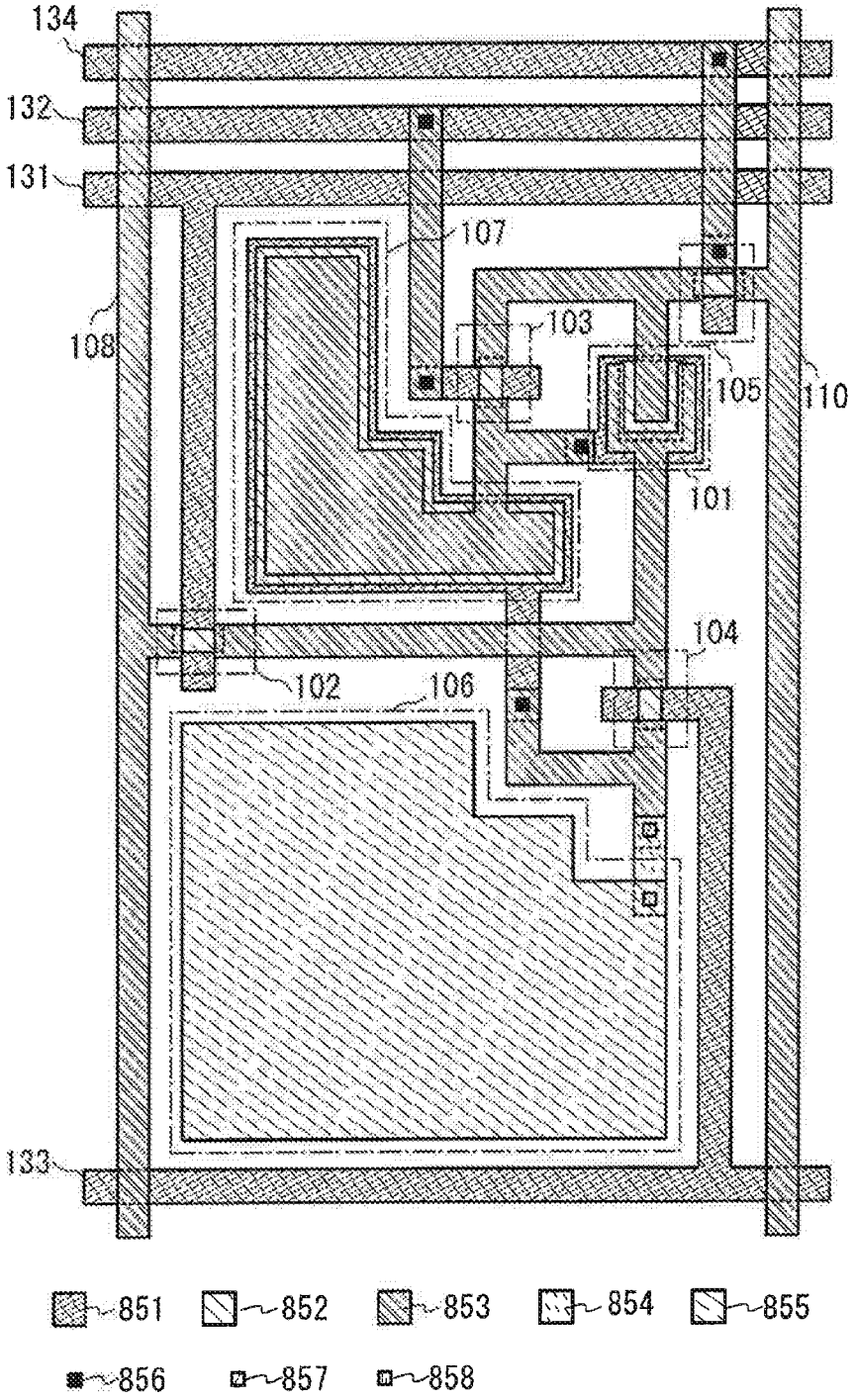
FIG. 59 is a top view illustrating an example of a pixel of one embodiment of the present invention.

The structure of a top view can also be a top view illustrated in FIG. 59. FIG. 59 is different from FIG. 55 in that the one of the terminals of the transistor 101 which allows the semiconductor device to function as a current source is provided to have a U-shape and cover the other of the terminals of the transistor 101. With the structure, the amount of current flowing through the transistor 101 which allows the semiconductor device to function as a current source can be increased. Further, parasitic capacitance when the potential of the gate of the transistor 101 is increased by capacitive coupling can be large.

Figure 60:
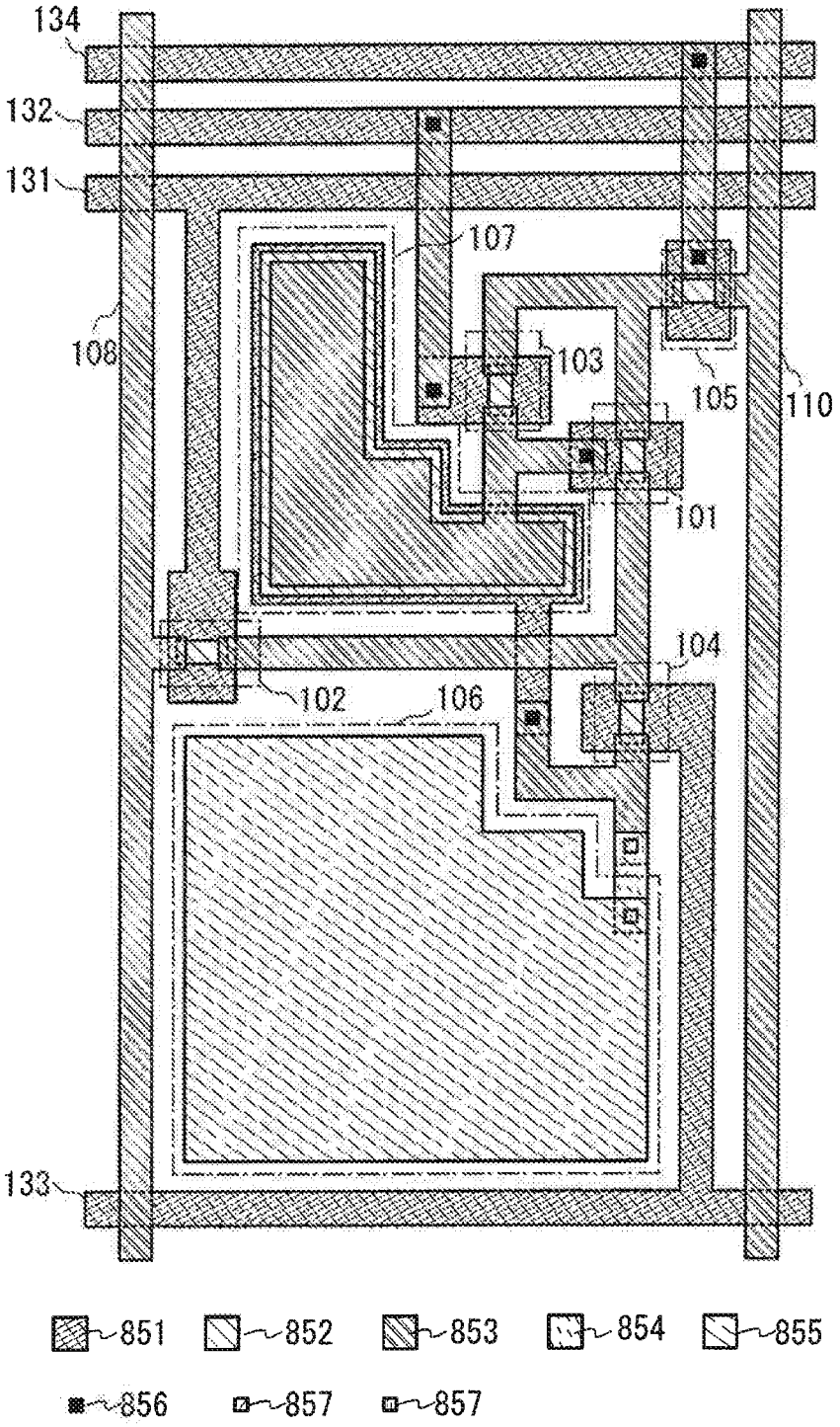
FIG. 60 is a top view illustrating an example of a pixel of one embodiment of the present invention.

The structure of a top view can also be a top view illustrated in FIG. 60. FIG. 60 is different from FIG. 55 in that the gate electrode of the transistor forming the pixel is provided to cover the channel formation region of the transistor. With the structure, light incident to the channel formation region can be reduced and therefore light deterioration in characteristics of the transistor can be reduced.

Figure 61:
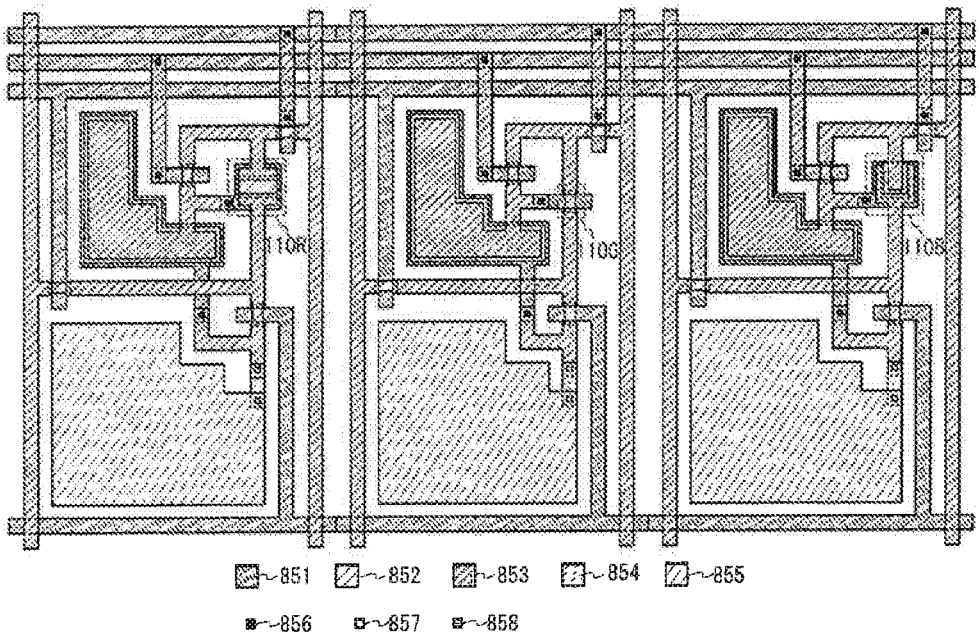
FIG. 61 is a top view illustrating an example of a pixel of one embodiment of the present invention.

Note that when the pixels described with reference to FIG. 28A have light-emitting elements emitting light of different colors and are arranged, the sizes of the transistors 101 which allow the semiconductor device to function as a current source can be different depending on the color. FIG. 61 is a top view of the structure in which the sizes of the transistors 101 which allow the semiconductor device to function as a current source are changed every color. A transistor 101R in FIG. 61 is a transistor which allows the semiconductor device to function as a current source, in a pixel including a red light emitting element. A transistor 101G in FIG. 61 is a transistor which allows the semiconductor device to function as a current source, in a pixel including a green light emitting element. A transistor 101B in FIG. 61 is a transistor which allows the semiconductor device to function as a current source, in a pixel including a blue light emitting element. With the structure, the proper amount of current of the light-emitting elements emitting light of colors can be supplied.

Figure 62:
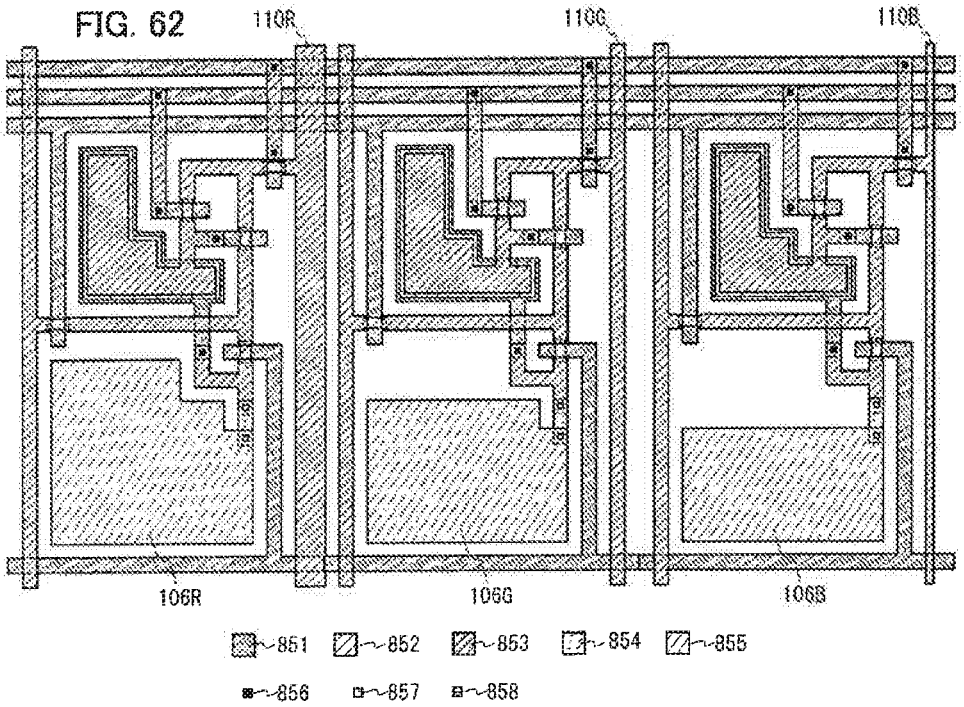
FIG. 62 is a top view illustrating an example of a pixel of one embodiment of the present invention.

Note that when the pixels each described with reference to FIG. 28A have light-emitting elements with different colors and are arranged, the widths of the wirings 110 each functioning as a power source line can be different depending on colors. FIG. 62 is a top view of the structure of the wirings 110 each functioning as a power source line, whose widths are different depending on colors. A wiring 110R in FIG. 62 is a wiring for supplying current to a red light emitting element. A wiring 110G in FIG. 62 is a wiring for supplying current to a green light emitting element. A wiring 110B in FIG. 62 is a wiring for supplying current to a blue light emitting element. With the structure, the proper amount of current of light-emitting elements emitting each color of light can be supplied.

Figure 63:
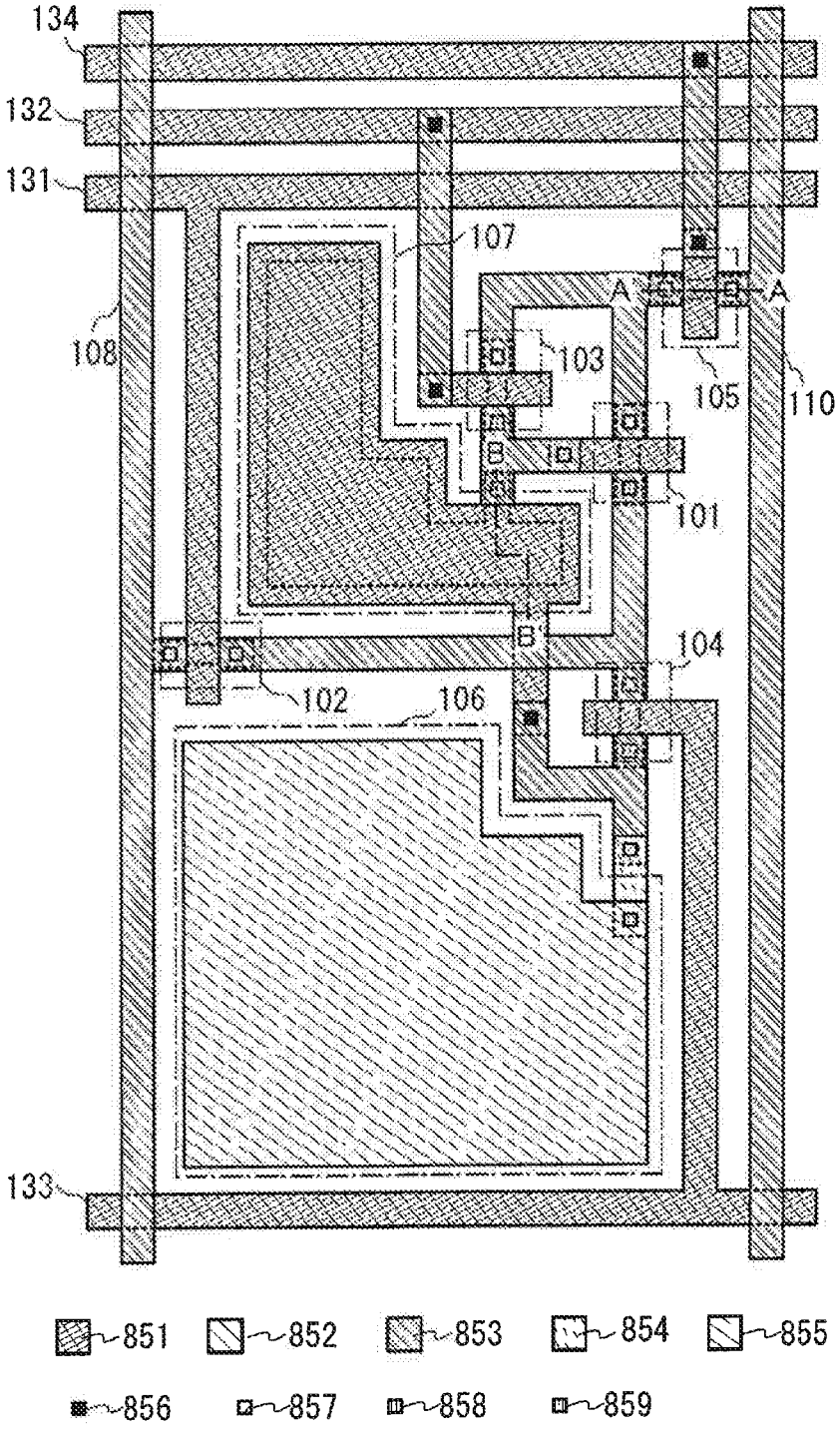
FIG. 63 is a top view illustrating an example of a pixel of one embodiment of the present invention.

The above top view illustrates an inverted staggered transistor as each transistor, but the transistors may be top-gate transistors. FIG. 63 is a top view where each transistor forming the pixel is a top-gate transistor. In that case, contact holes 859 are added in comparison with the top view illustrated in FIG. 55.

The contact holes 859 each have a function of connecting the semiconductor layer 852 and the conductive layer 853.

In the case where the transistor forming the pixel is a top-gate transistor as illustrated in FIG. 63, a semiconductor layer of the transistor is preferably formed using amorphous silicon or polycrystalline silicon. With the structure, the semiconductor layer can be used as a wiring between the transistors in such a manner that an impurity element such as phosphorus or boron is added to the semiconductor layer to increase the conductivity of the semiconductor layer.

Next, structures of a cross section (taken along the chain double-dashed line A-A' in FIG. 63) of a transistor functioning as the switch 105 which is shown in the top view of FIG. 63 and structures of a cross section (taken along the chain double-dashed line B-B' in FIG. 63) of the capacitor 107 are described with reference to FIGS. 92A and 92B.

Figure 92A:
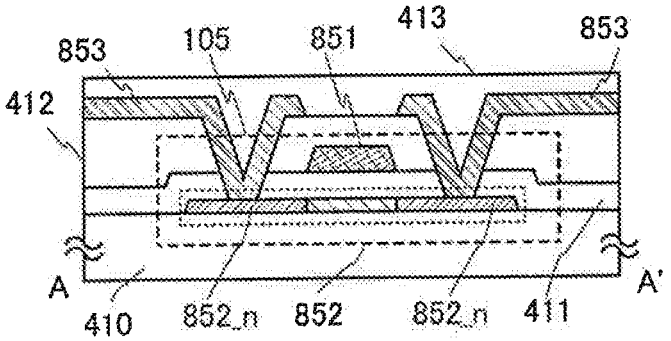
FIGS. 92A and 92B are cross-sectional views each illustrating an example of a pixel of one embodiment of the present invention.

The transistor functioning as the switch 105 in FIG. 92A is a top-gate transistor, for example. Further, the transistor may have a single gate structure including one channel formation region, a double gate structure including two channel formation regions, or a triple gate structure including three channel formation regions. Alternatively, the transistor may have a dual gate structure including two gate electrode layers positioned over and below a channel region with a gate insulating layer provided therebetween.

The transistor functioning as the switch 105 illustrated in FIG. 92A includes, over the substrate 410, the semiconductor layer 852 including impurity regions 852_n to which an impurity is added; an insulating layer 411 functioning as a gate insulating layer; the conductive layer 851 functioning as a gate; an insulating layer 412 functioning as an interlayer insulating layer; and the conductive layers 853 functioning as a source and a drain. An insulating layer 413 providing the planarity of the surface is formed to cover the insulating layer 412 and the conductive layer 853.

Figure 92B:
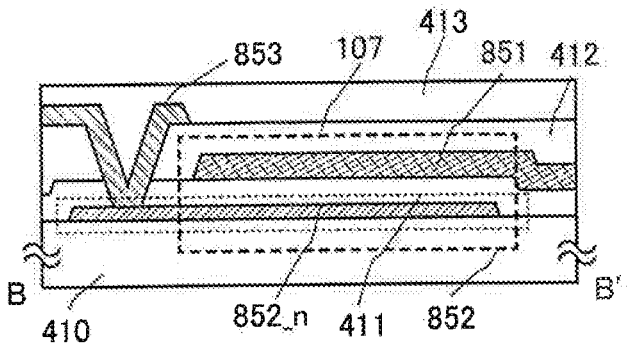

The capacitor 107 illustrated in FIG. 92B includes, over the substrate 410, the semiconductor layer 852 including impurity regions 852_n to each of which an impurity is added; an insulating layer 411 functioning as a gate insulating layer; and the conductive layer 851 functioning as the other of the electrodes. The impurity regions 852_n function as the one of the electrodes. The conductive layer 853 connected to the semiconductor layer 852 through a contact hole provided in the insulating layer 411 and the insulating layer 412 is provided. An insulating layer 413 providing the planarity of the surface is formed to cover the insulating layer 412 and the conductive layer 853.

Figure 64:
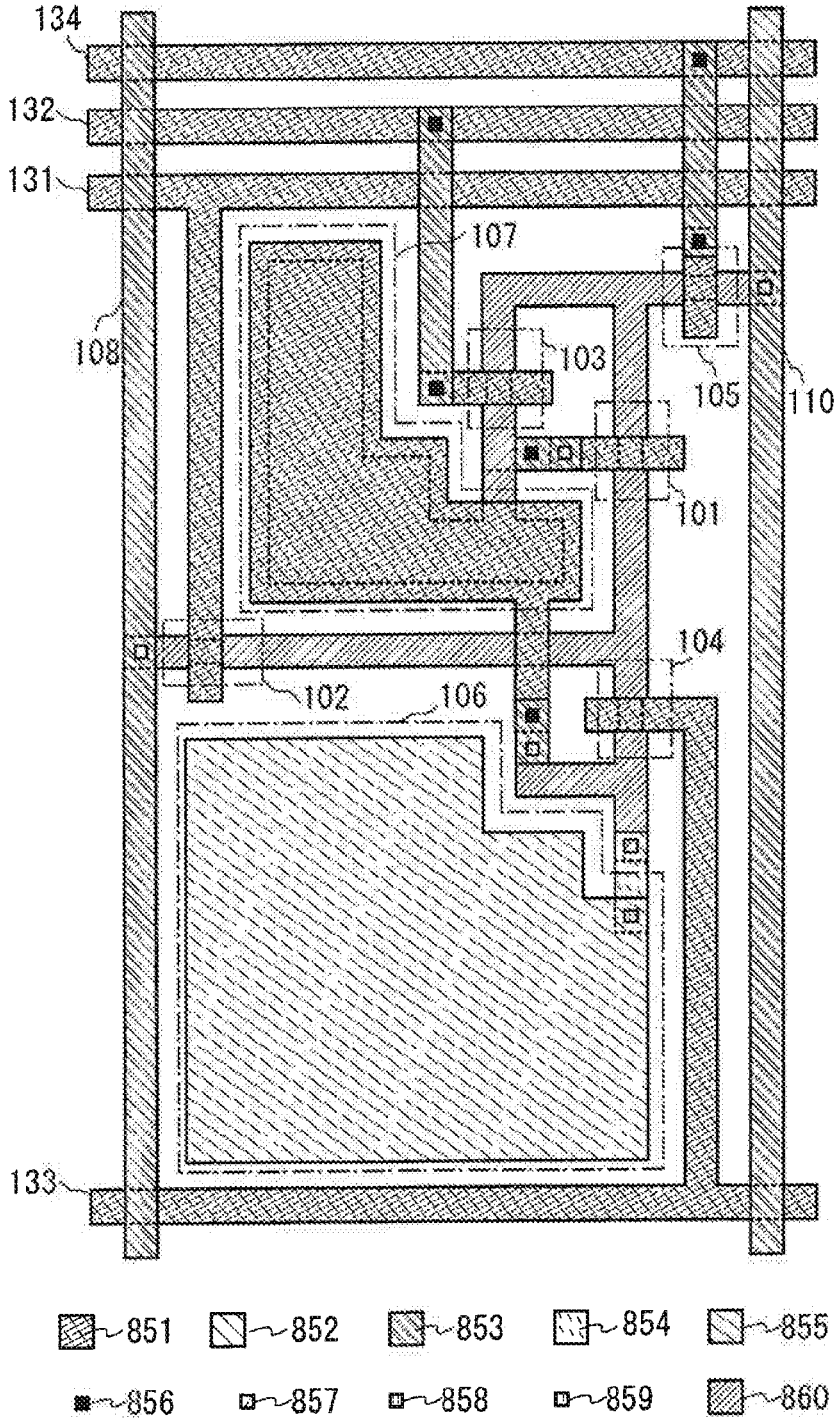
FIG. 64 is a top view illustrating an example of a pixel of one embodiment of the present invention.

FIG. 64 is a top view illustrating a structure in which the semiconductor layer is used as a wiring between the transistors in such a manner that the semiconductor layer is amorphous silicon or polycrystalline silicon and an impurity element such as phosphorus or boron is added to the semiconductor layer to increase the conductivity of the semiconductor layer. A semiconductor layer 860 in FIG. 64 is a conductive layer whose conductivity is increased by addition of an impurity element.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 13

In the above embodiment, a transistor forming the pixel of the display device is an re-channel transistor. On the other hand, in this embodiment, a circuit configuration in which a p-channel transistor is used for the pixel of the display device is described.

Figure 65:
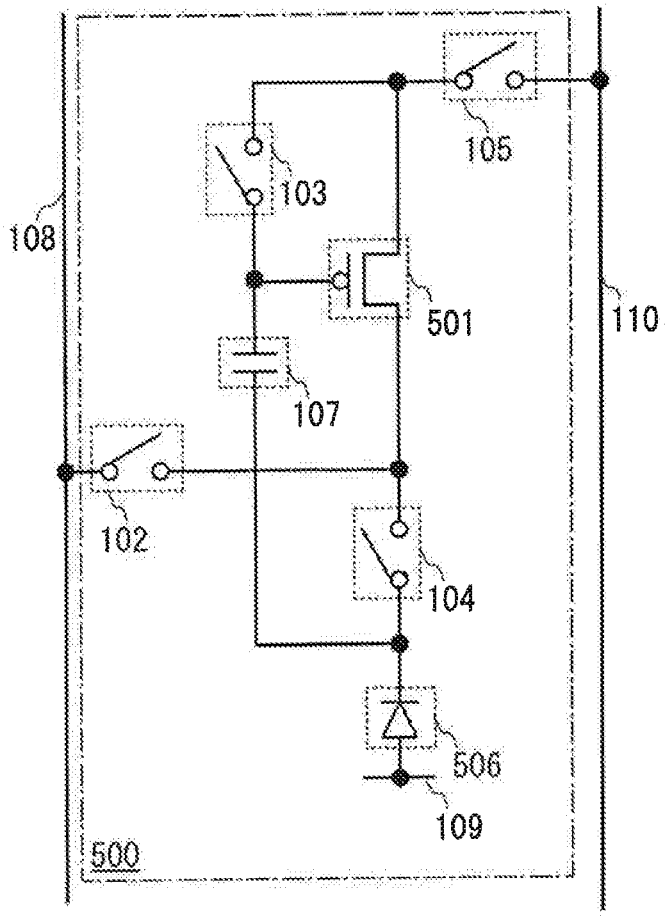
FIG. 65 is a circuit diagram illustrating an example of a pixel of one embodiment of the present invention.

The transistor 101 of the pixel 100 in FIG. 28A is an n-channel transistor, but the transistor of the pixel can be a p-channel transistor as illustrated in FIG. 65 (p-channel transistor 501 of a pixel 500).

As shown by comparison between FIG. 28A and FIG. 65, a light-emitting element is connected to make current flow in a direction opposite to that in the case of the light-emitting element 106. Specifically, a light-emitting element 506 may be connected as shown in FIG. 65.

In FIG. 28A, the wiring 109 and the wiring 110 are supplied with Vcat and VDD, respectively. In FIG. 65, the potentials can be switched; specifically, the wiring 109 and the wiring 110 are supplied with VDD and Vcat, respectively. The potential Vinit for initializing the potential of each node in the pixel can be higher than VDD and Vcat.

As described above, the transistor which allows the semiconductor device to function as a current source can be a p-channel transistor.

Note that each switch forming the pixel 100 in FIG. 28A can be a p-channel transistor. Specifically, as described in FIG. 66, a transistor 502T, a transistor 503T, a transistor 504T, and a transistor 505T, which are p-channel transistors, may be used as the switches and the pixel is controlled by the switching of the p-channel transistors. A signal for switching the transistors may be supplied to the wirings 131 to 134 in such a manner that the operation of the pixel is the same as the operation described with reference to FIGS. 31A to 31C.

Note that in FIG. 28A, it is also possible to employ the structure in which each switch of the pixel 100 is an n-channel transistor and only the transistor which allows the semiconductor device to function as a current source is a p-channel transistor. Specifically, as illustrated in FIG. 67, each switch may be an n-channel transistor and only the transistor which allows the semiconductor device to function as a current source is a p-channel transistor.

Figure 66:
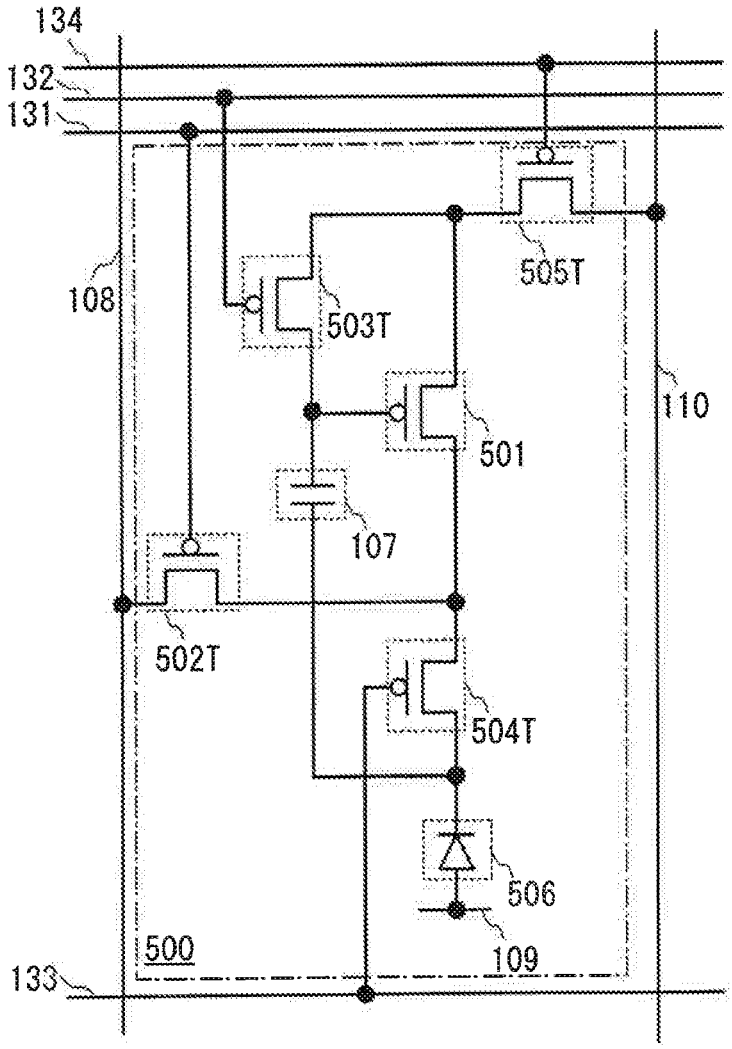
FIG. 66 is a circuit diagram illustrating an example of a pixel of one embodiment of the present invention.
Figure 67:
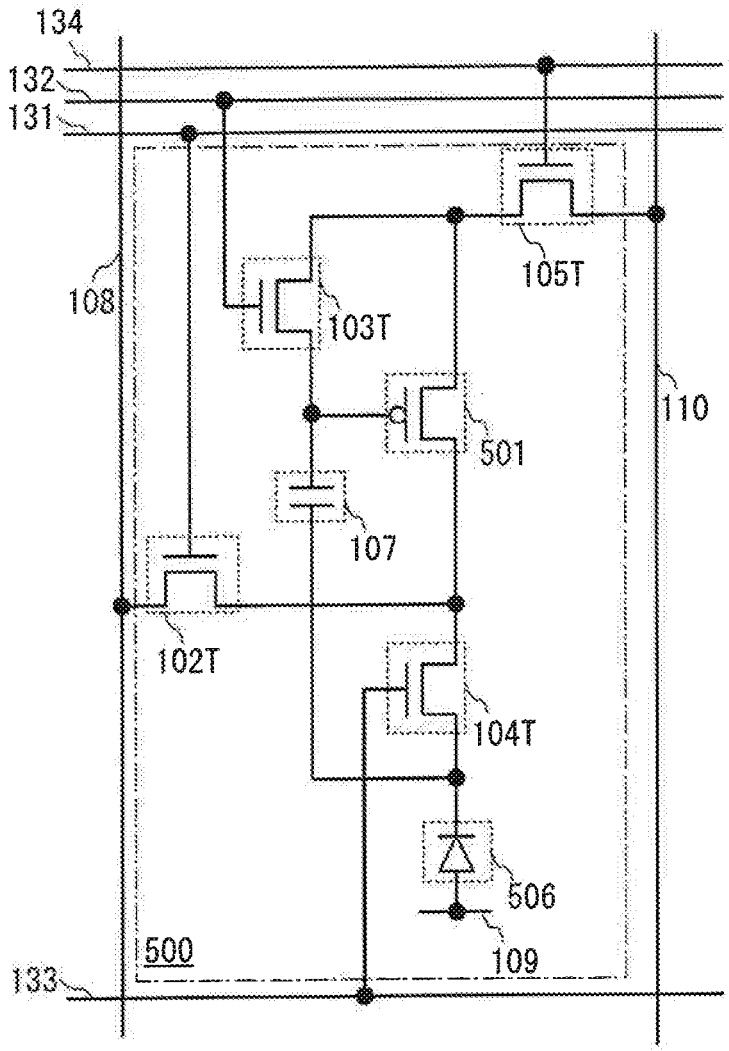
FIG. 67 is a circuit diagram illustrating an example of a pixel of one embodiment of the present invention.
Figure 68:
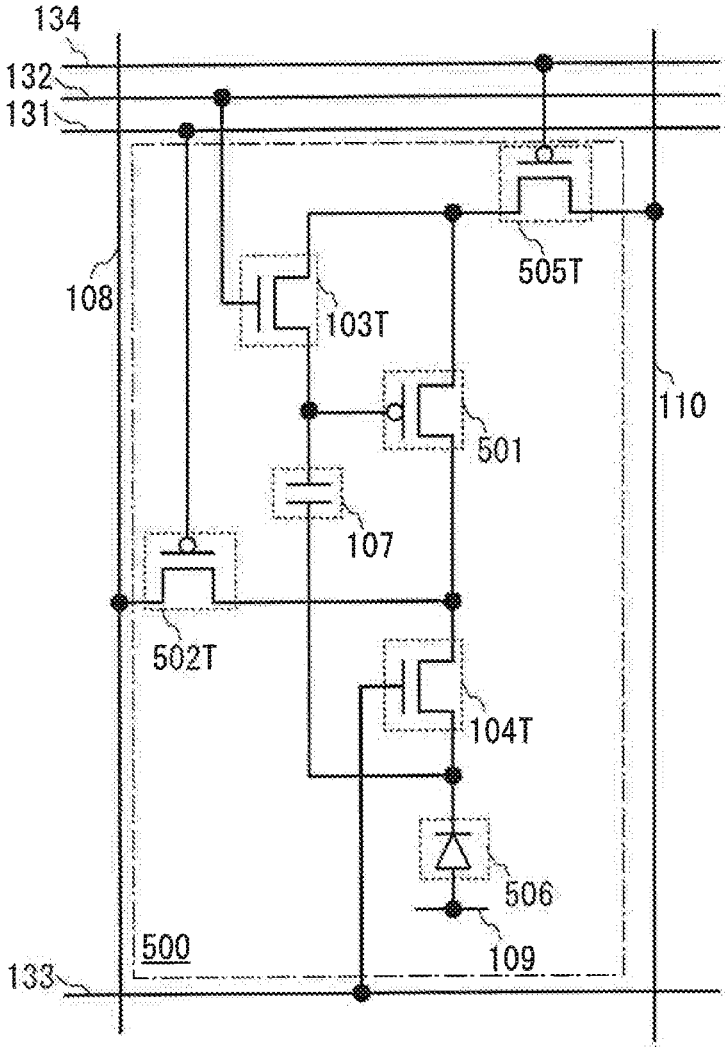
FIG. 68 is a circuit diagram illustrating an example of a pixel of one embodiment of the present invention.

Note that the switches of the pixel have the same polarity in each of FIG. 66 and FIG. 67, but the switches can have different polarities from each other. Specifically as illustrated in FIG. 68, the switches of the pixel 500 can include the p-channel transistor 502T, the n-channel transistor 103T, the n-channel transistor 104T, and the p-channel transistor 505T.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 14

In the above embodiments, transistors forming the pixels of the display devices are re-channel transistors in many cases. In particular, the case where a transistor which includes a channel formation region in an oxide semiconductor layer is used in the circuit configuration of the pixel of the display device is described in this embodiment.

Figure 69:
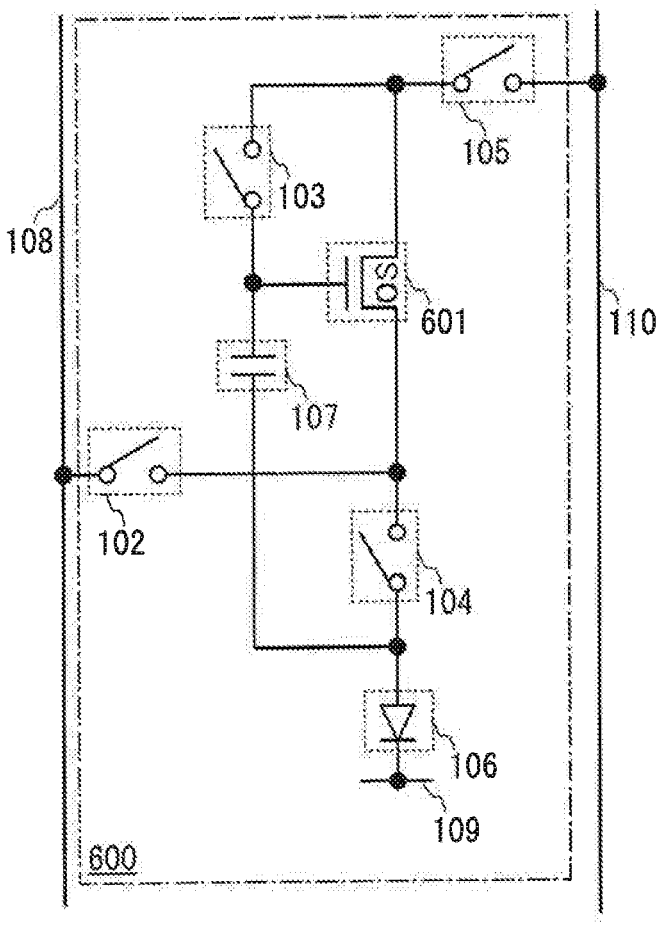
FIG. 69 is a circuit diagram illustrating an example of a pixel of one embodiment of the present invention.

In FIG. 28A, the transistor 101 of the pixel 100 is a simple n-channel transistor, but the transistor can be a transistor which includes a channel formation region in an oxide semiconductor layer, as illustrated in FIG. 69 (transistor 601 of a pixel 600). Note that a transistor which includes a channel formation region in an oxide semiconductor layer is labeled as OS in the figures, similarly to the transistor 601 in FIG. 69.

In the structure in FIG. 69, the transistor 601 is a transistor which includes a channel formation region in an oxide semiconductor layer and therefore off-state current of the transistor can be reduced. Accordingly, the pixel can have a circuit configuration which does not easily allow malfunction.

Figure 70:
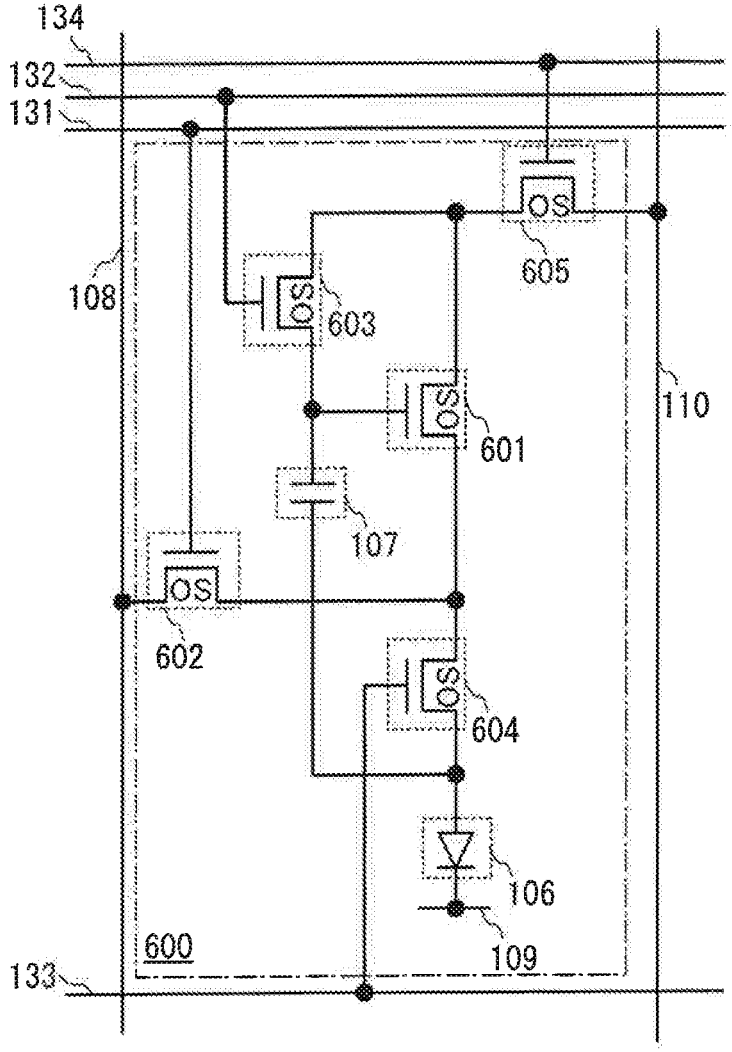
FIG. 70 is a circuit diagram illustrating an example of a pixel of one embodiment of the present invention.

Each switch forming the pixel 600 can be a transistor which includes a channel formation region in an oxide semiconductor layer. Specifically, as illustrated in FIG. 70, the switches can be transistors 602 to 605 each of which includes a channel formation region in an oxide semiconductor layer.

Note that in this specification, the off-state current is current that flows between a source and a drain when a transistor is off. In the case of an n-channel transistor (whose threshold voltage is, for example, about 0 to 2 V), off-state current refers to current flowing between the source and the drain when negative voltage is applied between the gate and the source.

Next, a material of an oxide semiconductor layer in which a channel formation region is provided is described below. As described above, a structure in this embodiment may include a layer formed using an oxide semiconductor (an oxide semiconductor layer), for example.

Examples of an oxide semiconductor include a four-component metal oxide such as an In—Sn—Ga—Zn—O-based oxide semiconductor; three-component metal oxides such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, and a Hf—In—Zn—O-based oxide semiconductor; two-component metal oxides such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; and the like. In addition, any of the above oxide semiconductors may contain an element other than In, Ga, Sn, and Zn, for example, $SiO_2$.

For example, an In—Sn—Zn—O-based oxide semiconductor means an oxide semiconductor containing indium (In), tin (Sn), and zinc (Zn), and there is no limitation on the composition ratio. For example, an In—Ga—Zn—O-based oxide semiconductor means an oxide semiconductor containing indium (In), gallium (Ga), and zinc (Zn), and there is no limitation on the composition ratio. An In—Ga—Zn—O-based oxide semiconductor can be referred to as IGZO.

The oxide semiconductor layer can be formed using an oxide semiconductor film. In the case where an In—Sn—Zn—O-based oxide semiconductor film is formed by sputtering, a target which has a composition ratio of In:Sn:Zn=1:2:2, 2:1:3, 1:1:1, 20:45:35, or the like in an atomic ratio is used.

In the case where an In—Zn—O-based oxide semiconductor film is formed by sputtering, a target has a composition ratio of In:Zn=50:1 to 1:2 in an atomic ratio ($In_2O_3$:

ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target which has an atomic ratio of In:Zn:O=X:Y:Z, an inequality of Z>1.5X+Y is satisfied.

In the case where an In—Ga—Zn—O-based oxide semiconductor film is formed by sputtering, a target can have a composition ratio of In:Ga:Zn=1:1:0.5, 1:1:1, or 1:1:2 in an atomic ratio.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that it has been pointed out that an oxide semiconductor is insensitive to impurities, there is no problem when a considerable amount of metal impurities is contained in the film, and therefore, soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes $Na^+$ when an insulating film in contact with the oxide semiconductor layer is an oxide and Na diffuses into the insulating layer. Further, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variations in characteristics also occurs. Such deterioration of characteristics and variations in characteristics of the transistor due to the impurity remarkably appear when the concentration of hydrogen in the oxide semiconductor layer is extremely low. Therefore, when the hydrogen concentration in the oxide semiconductor layer is less than or equal to $1\times10^{18}/cm^3$, preferably less than or equal to $1\times10^{17}/cm^3$, the concentration of the above impurity is preferably reduced. Specifically, a measurement value of a Na concentration by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, a measurement value of a Li concentration is preferably less than or equal to $5\times10^{15}/cm^3$, more preferably less than or equal to $1\times10^{15}/cm^3$. In a similar manner, a measurement value of a K concentration is preferably less than or equal to $5\times10^{15}/cm^3$, more preferably less than or equal to $1\times10^{15}/cm^3$.

The oxide semiconductor film is in a single crystal state, a polycrystalline (also referred to as polycrystal) state, an amorphous state, or the like.

The oxide semiconductor layer is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is prevented.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With use of the CAAC-OS film in a transistor, change in electric characteristics of the transistor due to irradiation with visible light or ultraviolet light can be reduced. Thus, the transistor has high reliability.

An example of a crystal structure of the CAAC-OS film is described in detail with reference to FIGS. 71A to 71E, FIGS. 72A to 72C, FIGS. 73A to 73C, and FIGS. 74A and 74B. In FIGS. 71A to 71E, FIGS. 72A to 72C, FIGS. 73A to 73C, and FIGS. 74A and 74B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 71A to 71E, O surrounded by a circle represents tetracoordinate O and O surrounded by a double circle represents tricoordinate O.

Figure 71A:
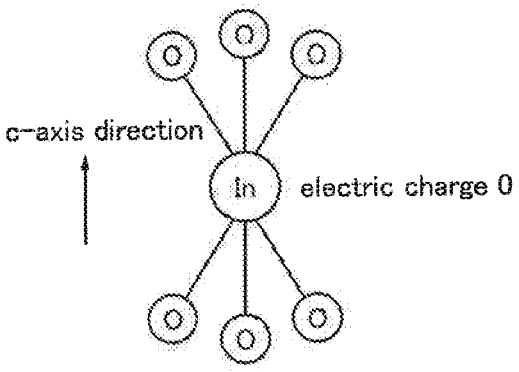
FIGS. 71A to 71E each illustrate a structure of an oxide material of one embodiment of the present invention.

FIG. 71A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 71A is actually an octahedral structure, but is illustrated as a planar structure for simplicity. Note that three tetracoordinate O atoms exist in each of an upper half and a lower half in FIG. 71A. In the small group illustrated in FIG. 71A, electric charge is 0.

Figure 71D:
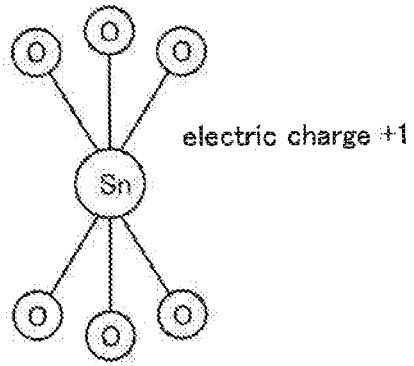
Figure 71B:
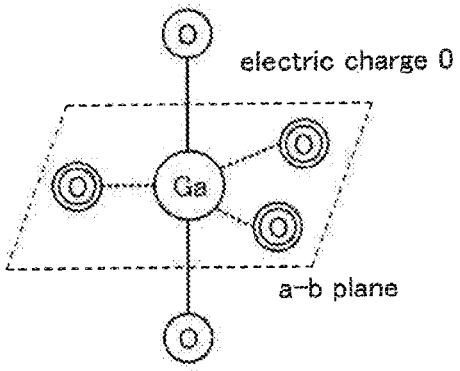

FIG. 71B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 71B. An In atom can also have the structure illustrated in FIG. 71B because an In atom can have five ligands. In the small group illustrated in FIG. 71B, electric charge is 0.

Figure 71E:
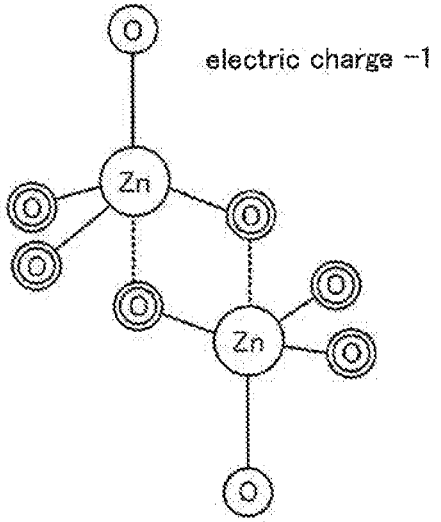
Figure 71C:
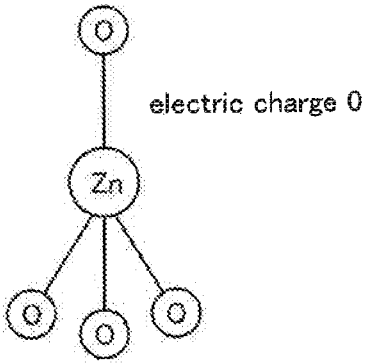

FIG. 71C illustrates a structure including one tetracoordinate Zn atom and four tetracoordinate O atoms proximate to the Zn atom. In FIG. 71C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 71C. In the small group illustrated in FIG. 71C, electric charge is 0.

FIG. 71D illustrates a structure including one hexacoordinate Sn atom and six tetracoordinate O atoms proximate to the Sn atom. In FIG. 71D, three tetracoordinate O atoms exist in each of an upper half and a lower half. In the small group illustrated in FIG. 71D, electric charge is +1.

FIG. 71E illustrates a small group including two Zn atoms. In FIG. 71E, one tetracoordinate O atom exists in each of an upper half and a lower half. In the small group illustrated in FIG. 71E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 71A each have three proximate In atoms in the downward direction, and the three O atoms in the lower half each have three proximate In atoms in the upward direction. The one O atom in the upper half with respect to the pentacoordinate Ga atom in FIG. 71B has one proximate Ga atom in the downward direction, and the one O atom in the lower half has one proximate Ga atom in the upward direction. The one O atom in the upper half with respect to the tetracoordinate Zn atom in FIG. 71C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described as follows. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 72A:
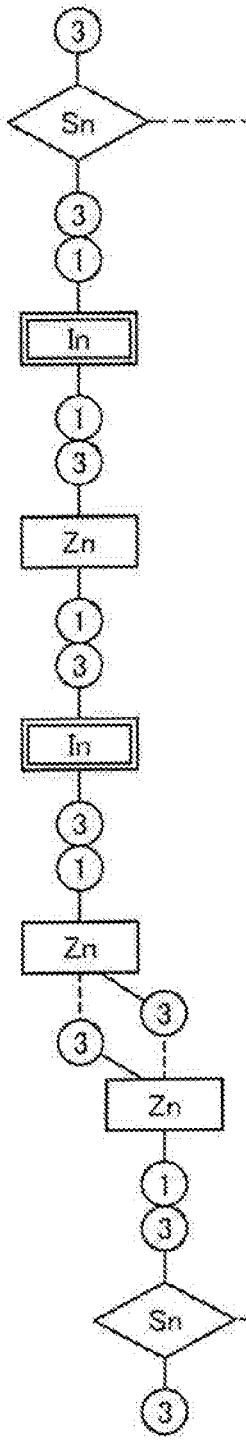
FIGS. 72A to 72C illustrate a structure of an oxide material of one embodiment of the present invention.
Figure 72B:
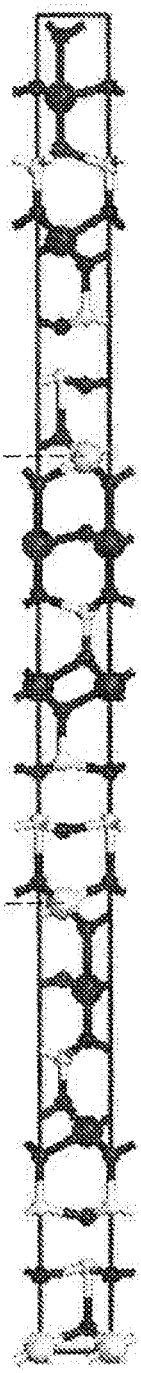
Figure 72C:
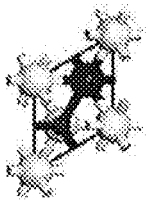

FIG. 72A illustrates a model of a medium group included in a layered structure of an In—Sn—Zn—O-based material. FIG. 72B illustrates a large group including three medium groups. Note that FIG. 72C illustrates an atomic arrangement in the case where the layered structure in FIG. 72B is observed from the c-axis direction.

In FIG. 72A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 72A, one tetracoordinate O atom existing in each of an upper half and a lower half with respect to an In atom is denoted by circled 1. FIG. 72A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 72A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 71E can be given. For example, with one small group including two Zn atoms, electric charge of one small group including a Sn atom can be cancelled, so that the total electric charge of the layered structure can be 0.

When the large group illustrated in FIG. 72B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following materials: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

Figure 73A:
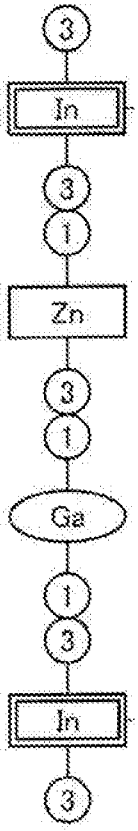
FIGS. 73A to 73C are views illustrating a structure of an oxide material of one embodiment of the present invention.

As an example, FIG. 73A illustrates a model of a medium group included in a layered structure of an In—Ga—Zn—O-based material.

In the medium group included in the layered structure of the In—Ga—Zn—O-based material in FIG. 73A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 73B:
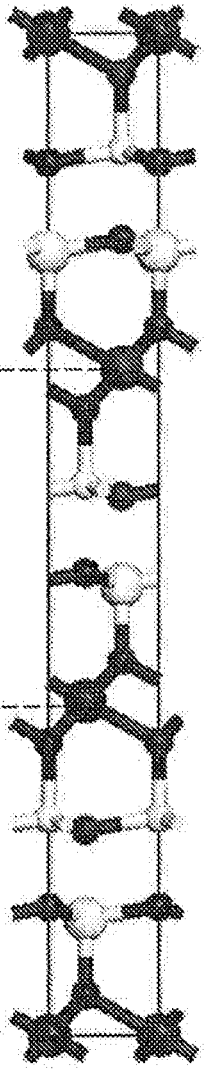
Figure 73C:
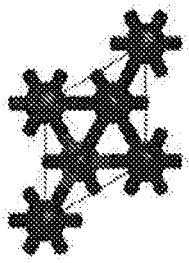

FIG. 73B illustrates a large group including three medium groups. Note that FIG. 73C illustrates an atomic arrangement in the case where the layered structure in FIG. 73B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 73A but also a medium group in which the arrangement of the In atom, the Ga atom, and the Zn atom is different from that in FIG. 73A.

When the large group shown in FIG. 73B is repeated, a crystal of an In—Ga—Zn—O system can be obtained. Note that a layered structure of the obtained In—Ga—Zn—O-based crystal can be expressed as a composition formula, $InGaO_3(ZnO)_n$ (n is a natural number).

Figure 74A:
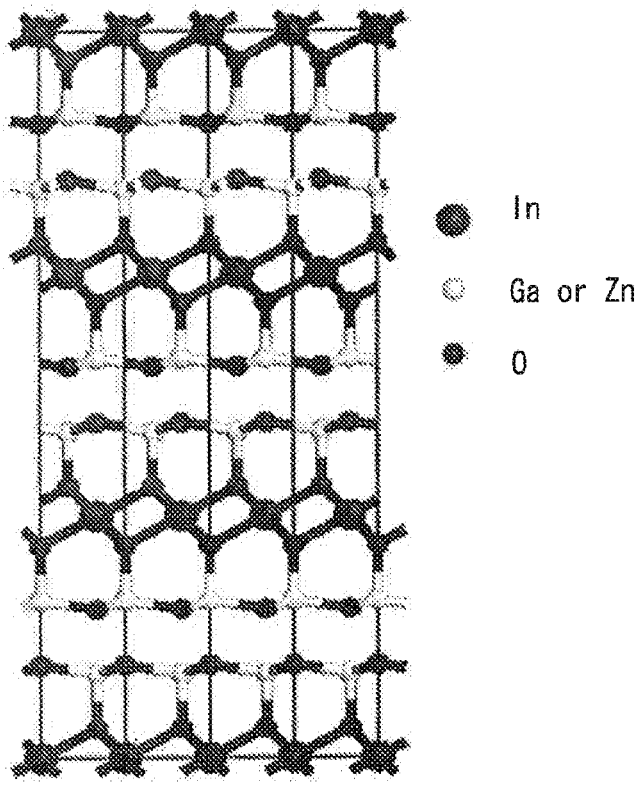
FIGS. 74A and 74B are views each illustrating a structure of an oxide material of one embodiment of the present invention.

In the case where n=1 ($InGaZnO_4$), a crystal structure illustrated in FIG. 74A can be obtained, for example. Note that in the crystal structure in FIG. 74A, a Ga atom and an In atom each have five ligands as described in FIG. 71B, a structure in which Ga is replaced with In can be obtained.

Figure 74B:
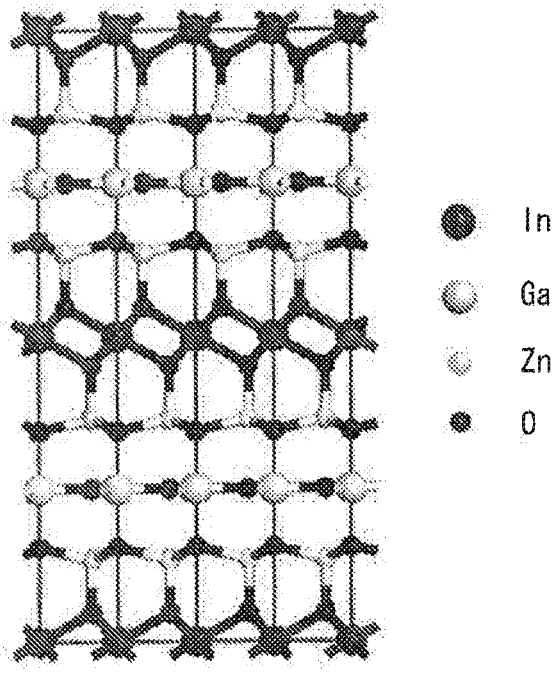

In the case where n is 2 ($InGaZn_2O_5$), a crystal structure illustrated in FIG. 74B can be obtained, for example. Note that in the crystal structure in FIG. 74B, since a Ga atom and an In atom each have five ligands as described in FIG. 71B, a structure in which Ga is replaced with In can be obtained.

A CAAC-OS film can be formed by sputtering. The above material can be used as a target material. In the case where the CAAC-OS film is formed by a sputtering method, the proportion of an oxygen gas in an atmosphere is preferably high. In the case where sputtering is performed in a mixed gas of argon and oxygen, for example, the proportion of an oxygen gas is preferably 30% or higher, more preferably 40% or higher because supply of oxygen from the atmosphere promotes crystallization of the CAAC-OS film.

In the case where the CAAC-OS film is formed by a sputtering method, a substrate over which the CAAC-OS film is formed is heated preferably to 150° C. or higher, more preferably to 170° C. or higher. This is because the higher the substrate temperature becomes, the more crystallization of the CAAC-OS film is promoted.

After heat treatment is performed on the CAAC-OS film in a nitrogen atmosphere or in vacuum, heat treatment is preferably performed in an oxygen atmosphere or a mixed gas of oxygen and another gas. This is because oxygen deficiency due to the former heat treatment can be reduced by supply of oxygen from the atmosphere in the latter heat treatment.

A film surface on which the CAAC-OS film is formed (deposition surface) is preferably flat. This is because roughness of the deposition surface leads to generation of grain boundaries in the CAAC-OS film because the c-axis approximately perpendicular to the deposition surface exists in the CAAC-OS film. For this reason, the deposition surface is preferably subjected to planarization treatment such as chemical mechanical polishing (CMP) before the CAAC-OS film is deposited. The average roughness of the deposition surface is preferably 0.5 nm or less, more preferably 0.3 nm or less.

Note that an oxide semiconductor film (or an oxide semiconductor layer formed using an oxide semiconductor film) formed by a sputtering method or the like contains moisture or hydrogen (including a hydroxyl group) as impurities in some cases. In one embodiment of the present invention, in order to reduce impurities such as moisture or hydrogen in the oxide semiconductor film (the oxide semiconductor layer) (in order to perform dehydration or dehydrogenation), heat treatment is performed on the oxide semiconductor film (the oxide semiconductor layer) in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

Heat treatment can eliminate moisture or hydrogen in the oxide semiconductor film (the oxide semiconductor layer). Specifically, the heat treatment may be performed at temperature higher than or equal to 250° C. and lower than or equal to 750° C., preferably higher than or equal to 400° C. and lower than the strain point of a substrate. For example, the heat treatment may be performed at 500° C. for 3 minutes or longer and 6 minutes or shorter. When RTA is used for the heat treatment, dehydration or dehydrogenation can be performed in a short time; thus, treatment can be performed even at temperature higher than the strain point of a glass substrate.

After moisture or hydrogen in the oxide semiconductor film is eliminated in such a manner, oxygen is added to the oxide semiconductor film (the oxide semiconductor layer). Thus, oxygen defects in the oxide semiconductor film (oxide semiconductor layer), or the like is reduced, so that the oxide semiconductor layer can be an i-type or substantially i-type oxide semiconductor layer.

The addition of oxygen can be performed in such a manner that an insulating film including a region where the amount of oxygen is greater than that in the stoichiometric composition ratio is formed in contact with the oxide semiconductor film (or the oxide semiconductor layer), and then heated. In such a manner, excessive oxygen in the insulating film can be supplied to the oxide semiconductor film (oxide semiconductor layer). Thus, the oxide semiconductor film (oxide semiconductor layer) can contain oxygen excessively. Oxygen contained excessively exists, for example, between lattices of a crystal included in the oxide semiconductor film (oxide semiconductor layer).

Note that the insulating film including a region where the amount of oxygen is greater than that in the stoichiometric composition ratio may be used for either the insulating film positioned on the upper side of the oxide semiconductor film (oxide semiconductor layer) or the insulating film positioned on the lower side of the oxide semiconductor film (oxide semiconductor layer) of the insulating films in contact with the oxide semiconductor film (oxide semiconductor layer); however, it is preferable to use such an insulating film to both of the insulating films in contact with the oxide semiconductor film (oxide semiconductor layer). The above-described effect can be enhanced with a structure, in which the insulating films each including a region where the amount of oxygen is greater than that in the stoichiometric composition ratio are used as the insulating films in contact with the oxide semiconductor film (oxide semiconductor layer) and positioned on the upper side and the lower side of the oxide semiconductor film (oxide semiconductor layer) so that the oxide semiconductor film (oxide semiconductor layer) is provided between the insulating films.

Here, the insulating film including a region where the amount of oxygen is greater than that in the stoichiometric composition ratio may be a single-layer insulating film or a plurality of insulating films which are stacked. Note that it is preferable that the insulating film include impurities such as moisture and hydrogen as little as possible. When hydrogen is contained in the insulating film, entry of the hydrogen to the oxide semiconductor film (oxide semiconductor layer) or extraction of oxygen from the oxide semiconductor film (oxide semiconductor layer) by the hydrogen occurs, whereby the oxide semiconductor film has lower resistance (has n-type conductivity); thus, a parasitic channel might be formed. Therefore, it is important that a film formation method in which hydrogen is not used be employed in order to form the insulating film containing as little hydrogen as possible. In addition, a material having a high barrier property is preferably used for the insulating film. For example, a silicon nitride film, a silicon nitride oxide film, an aluminum nitride film, an aluminum oxide film, an aluminum nitride oxide film, or the like can be used as the insulating film having a high barrier property. In the case of using a plurality of insulating films which are stacked, an insulating film having a lower proportion of nitrogen such as a silicon oxide film or a silicon oxynitride film is formed to be closer to the oxide semiconductor film (oxide semiconductor layer) than the insulating film having high barrier property. Then, the insulating film having a high barrier property is formed to overlap with the oxide semiconductor film (oxide semiconductor layer) with the insulating film having a lower proportion of nitrogen provided therebetween. With the use of the insulating film having a high barrier property, impurities such as moisture or hydrogen can be prevented from entering the oxide semiconductor film (oxide semiconductor layer), the interface between the oxide semiconductor film and another insulating film, and the vicinity thereof. In addition, the insulating film having lower proportion of nitrogen such as a silicon oxide film or a silicon oxynitride film is formed to be in contact with the oxide semiconductor film (oxide semiconductor layer), so that the insulating film formed using a material having a high barrier property can be prevented from being in contact with the oxide semiconductor film (oxide semiconductor layer) directly.

Alternatively, the addition of oxygen after moisture or hydrogen in the oxide semiconductor film (oxide semiconductor layer) is eliminated may be performed by heat treatment on the oxide semiconductor film (oxide semiconductor layer) in an oxygen atmosphere. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%), further preferably greater than or equal to 7N (99.99999%) (that is, the impurity concentration in the oxygen gas is less than or equal to 1 ppm, preferably less than or equal to 0.1 ppm).

Further alternatively, the addition of oxygen after moisture or hydrogen in the oxide semiconductor film (oxide semiconductor layer) is eliminated may be performed by an ion implantation method or an ion doping method. For example, oxygen made to be plasma with a microwave of 2.45 GHz may be added to the oxide semiconductor film (oxide semiconductor layer).

The thus formed oxide semiconductor layer can be used as the semiconductor layer of the transistor 601. In this manner, the transistor 601 with extremely low off-state current can be obtained.

Alternatively, the semiconductor layer of the transistor 601 may include microcrystalline silicon. Note that microcrystalline silicon is a semiconductor having an intermediate structure between an amorphous structure and a crystalline structure (including single crystal and polycrystal). In the microcrystalline silicon, columnar or needle-like crystal grains having a grain size of 2 nm to 200 nm, preferably 10 nm to 80 nm, further preferably 20 nm to 50 nm, still further preferably 25 nm to 33 nm have grown in a direction normal to the substrate surface. Therefore, there are some cases in which a crystal grain boundary is formed at the interface between the columnar or needle-like crystal grains.

Alternatively, the semiconductor layer of the transistor 601 may include amorphous silicon. Alternatively, the semiconductor layer of the transistor 601 may include polycrystalline silicon. Alternatively, the semiconductor layer of the transistor 601 may include an organic semiconductor, a carbon nanotube, or the like.

This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 15

In this embodiment, the structures of a display panel cell having the pixel configuration described in Embodiments 7 to 14 are described with reference to FIGS. 75A and 75B.

Figure 75A:
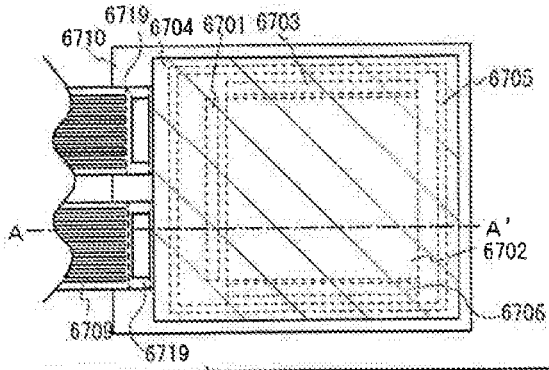
FIG. 75A is a top view illustrating an example of a display panel cell of one embodiment of the present invention and FIG. 75B is a cross-sectional view illustrating an example of a display panel cell of one embodiment of the present invention.
Figure 75B:
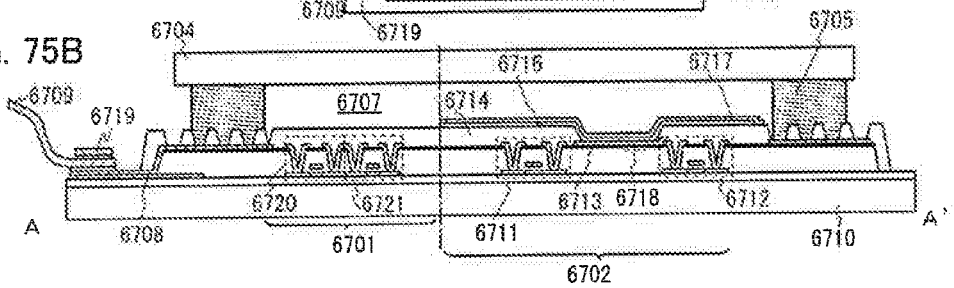

It is to be noted that FIG. 75A is a top plan view of the display panel cell and FIG. 75B is a cross sectional diagram along a line A-A' of FIG. 75A. The display panel cell includes a signal line driver circuit 6701, a pixel portion 6702, a first scan line driver circuit 6703, and a second scan line driver circuit 6706, which are shown by dotted lines. Further, a sealing substrate 6704 and a sealing material 6705 are provided. A portion surrounded by the sealing material 6705 is a space 6707.

Note that a wire 6708 is a wire for transmitting a signal input to the first scan line driver circuit 6703, the second scan line driver circuit 6706, and the signal line driver circuit 6701 and receives a video signal, a clock signal, a start signal, and the like from a flexible printed circuit (FPC) 6709 functioning as an external input terminal. An IC chip (semiconductor chip including a memory circuit, a buffer circuit, and the like) 6719 is mounted over a connecting portion of the FPC 6709 and the display panel cell by chip on glass (COG) or the like. It is to be noted that only the FPC 6709 is shown here; however, a printed wire board (PWB) may be attached to the FPC 6709. The display device in this specification includes not only a main body of the display panel cell but also one with an FPC or a PWB attached thereto and one on which an IC chip or the like is mounted.

Next, description is made with reference to FIG. 75B of a cross-sectional structure. The pixel portion 6702 and peripheral driver circuits (the first scan line driver circuit 6703, the second scan line driver circuit 6706, and the signal line driver circuit 6701) are formed over a substrate 6710. Here, the signal line driver circuit 6701 and the pixel portion 6702 are shown.

Note that the signal line driver circuit 6701 is formed of a p-channel or n-channel transistor such as an n-channel transistor 6720 or an n-channel transistor 6721. As for a pixel configuration, a pixel can be formed of a p-channel or n-channel transistor by applying the pixel configuration of FIG. 28A, FIG. 43, or FIG. 44. Accordingly, the peripheral driver circuits are formed of n-channel transistors, thereby a unipolar display panel cell can be manufactured. Needless to say, a CMOS circuit may be formed of a p-channel transistor as well as a p-channel or n-channel transistor. Further, in this example, a display panel cell in which the peripheral driver circuits are formed over the same substrate is shown; however, the present invention is not limited to this. All or some of the peripheral driver circuits may be formed into an IC chip or the like and mounted by COG or the like. In that case, the driver circuit is not required to be unipolar and can be formed in combination with a p-channel transistor.

Further, the pixel portion 6702 includes transistors 6711 and 6712. It is to be noted that a source electrode of the transistor 6712 is connected to a first electrode (pixel electrode) 6713. An insulator 6714 is formed so as to cover end portions of the first electrode 6713. Here, a positive photosensitive acrylic resin film is used for the insulator 6714.

In order to obtain excellent coverage, the insulator 6714 is formed to have a curved surface having a curvature at a top end portion or a bottom end portion of the insulator 6714. For example, in the case of using a positive photosensitive acrylic as a material for the insulator 6714, it is preferable that only the top end portion of the insulator 6714 has a curved surface having a curvature radius (0.2 to 3 μm). Moreover, either a negative photosensitive acrylic which becomes insoluble in etchant by light or a positive photosensitive acrylic which becomes soluble in etchant by light can be used as the insulator 6714.

A layer 6716 containing an organic compound and a second electrode (opposite electrode) 6717 are formed over the first electrode 6713. Here, it is preferable to use a material having a high work function as a material used for the first electrode 6713 which functions as an anode. For example, a single layer of an indium tin oxide film, an indium zinc oxide film, a titanium nitride film, a chromium film, a tungsten film, a Zn film, a Pt film, or the like, a stacked layer of a titanium nitride film and a film containing aluminum as a main component, a three-layer structure of a titanium nitride film, a film containing aluminum as a main component, and a titanium nitride film, or the like can be used. It is to be noted that with a stacked layer structure, resistance as a wire is low, good ohmic contact can be obtained, and a function as an anode can be obtained.

The layer 6716 containing an organic compound is formed by an evaporation method using an evaporation mask, or ink-jet. A complex of a metal belonging to group 4 of the periodic table of the elements is used for a part of the layer 6716 containing an organic compound. Besides, a low molecular material or a high molecular material may be used in combination as well. Further, as a material used for the layer containing an organic compound, a single layer or a stacked layer of an organic compound is often used; however, in this example, an inorganic compound may be used in a part of a film formed of an organic compound. Moreover, a known triplet material can also be used.

Further, as a material used for the second electrode 6717 which functions as a cathode and is formed over the layer 6716 containing an organic compound, a material having a low work function (Al, Ag, Li, Ca, or an alloy thereof such as MgAg, MgIn, AlLi, $CaF_2$, or $Ca_3N_2$) may be used. In the case where light generated from the layer 6716 containing an organic compound passes through the second electrode 6717, a stacked layer of a thin metal film with a thinner thickness and a transparent conductive layer (e.g., an indium tin oxide film, indium oxide zinc oxide ($In_2O_3$—ZnO), or zinc oxide (ZnO)) is preferably used as the second electrode 6717 (cathode).

Further, by attaching the sealing substrate 6704 to the substrate 6710 with the sealing material 6705, a light-emitting element 6718 is provided in the space 6707 surrounded by the substrate 6710, the sealing substrate 6704, and the sealing material 6705. It is to be noted that the space 6707 may be filled with the sealing material 6705, as well as with an inert gas (nitrogen, argon, or the like).

Note that an epoxy-based resin is preferably used for the sealing material 6705. Further, it is preferable that these materials should not transmit moisture or oxygen as much as possible. As a material for the sealing substrate 6704, a glass substrate, a quartz substrate, a plastic substrate formed of FRP (Fiberglass-Reinforced Plastics), PVF (polyvinylfluoride), polyester, acrylic, or the like can be used.

In the above manner, the display panel cell with the pixel structures in Embodiments 7 to 14 can be obtained.

Figure 99:
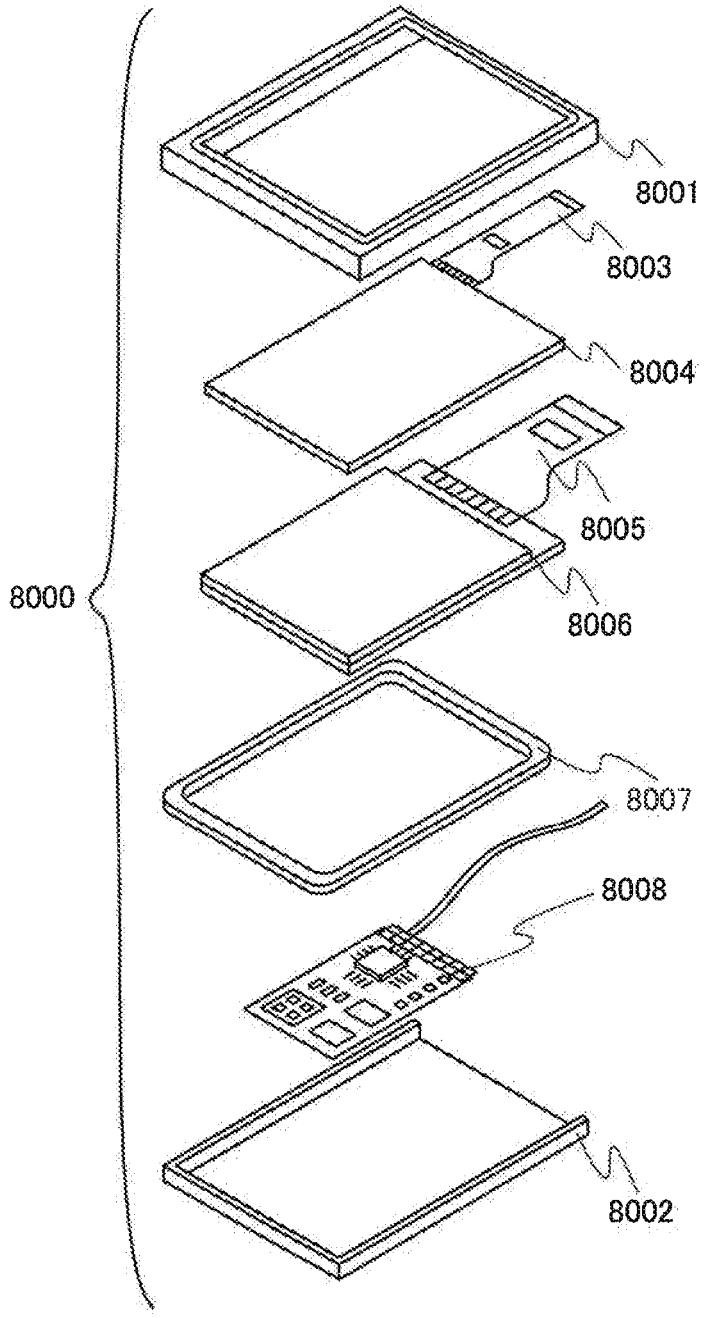
FIG. 99 is a diagram of a display module of one embodiment of the present invention.

Next, a structural example of a display module which includes the display panel cell described with reference to FIGS. 75A and 75B is described with reference to FIG. 99.

A display module 8000 has an upper cover 8001 and a lower cover 8002 with a touch panel cell 8004 connected to an FPC 8003, a display panel cell 8006 connected to an FPC 8005, a frame 8007, and a printed circuit 8008 provided therebetween.

The shapes and sizes of the upper cover 8001 and the lower cover 8002 can be changed as appropriate in accordance with the sizes of the touch panel cell 8004 and the display panel cell 8006.

The touch panel cell 8004 can be a resistive touch panel cell or a capacitive touch panel cell and may be formed to overlap with the display panel cell 8006. A counter substrate (sealing substrate) of the display panel cell 8006 can have a touch panel function. A photosensor may be provided in each pixel of the display panel cell 8006 and the touch panel cell 8004 can be an optical touch panel.

The display panel cell illustrated in FIGS. 75A and 75B can be used for the display panel cell 8006. That is, as for a pixel structure, a pixel can be formed of a p-channel or n-channel transistor by applying the pixel structure of FIG. 28A, FIG. 43, or FIG. 44. When the peripheral driver circuits are formed using n-channel transistors, a unipolar display panel cell can be formed.

The frame 8007 has a function of protecting the display panel cell 8006 and functions as an electromagnetic shield for blocking electromagnetic waves generated by the operation of the printed circuit 8008. The frame 8007 may function as a radiator plate.

The printed circuit 8008 has a power supply circuit and a signal processing circuit for outputting a video signal and a clock signal. A power source for supplying power to the power supply circuit can be an external commercial power source or a power source using a battery which is additionally provided.

The display module 8000 can be additionally provided with a member such as a polarizing plate, a retardation plate, or a prism sheet This embodiment is obtained by performing change, addition, modification, removal, application, superordinate conceptualization, or subordinate conceptualization on part of or the whole of the other embodiment. Thus, part of or the whole of this embodiment can be freely combined with, applied to, or replaced with part of or the whole of another embodiment.

Embodiment 16

In this embodiment, examples of electronic devices are described.

FIGS. 76A to 76H and FIGS. 77A to 77D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, smell, or infrared ray), a microphone 5008, and the like.

Figure 76A:
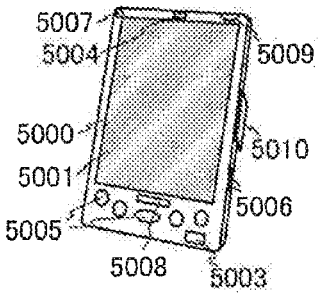
FIGS. 76A to 76H are diagrams each illustrating an electronic device to which a display device of one embodiment of the present invention can be applied.
Figure 76B:
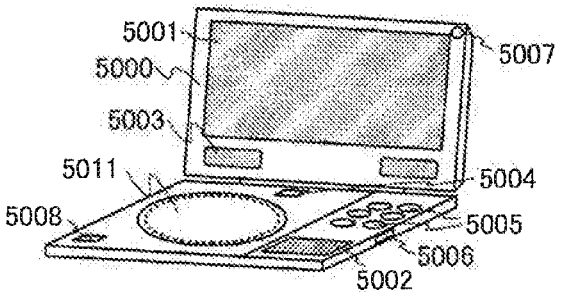
Figure 76C:
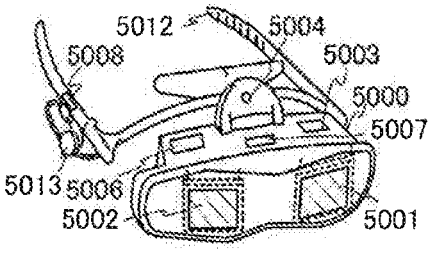
Figure 76D:
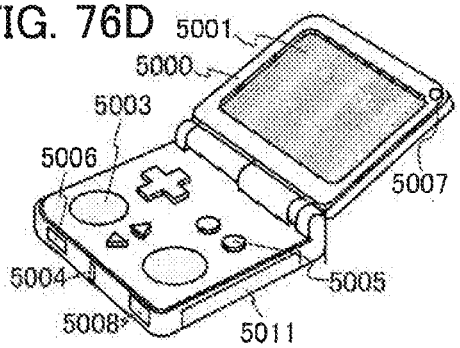
Figure 76E:
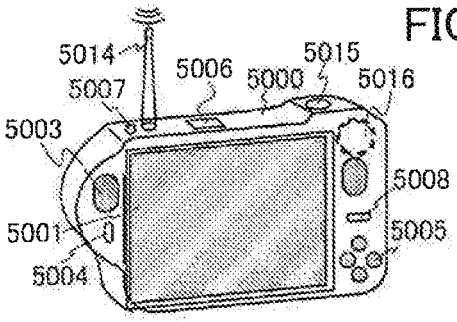
Figure 76F:
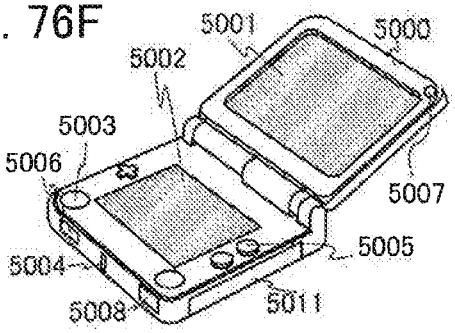
Figure 76G:
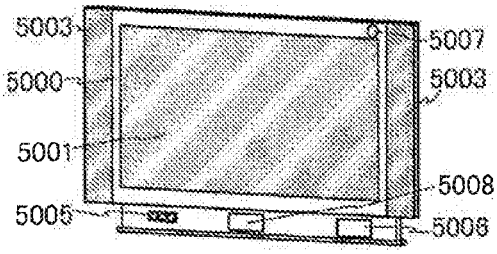
Figure 76H:
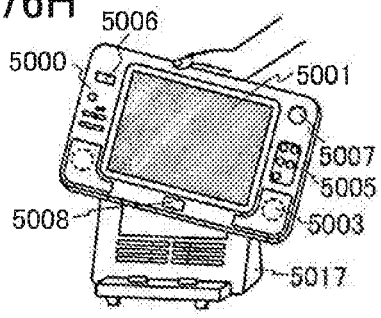
Figure 77A:
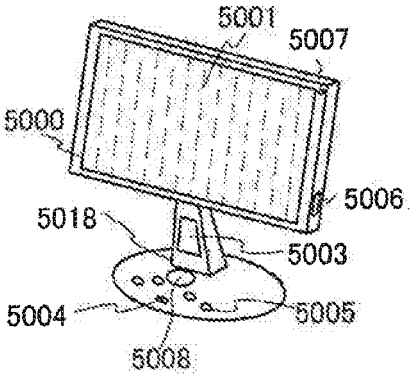
FIGS. 77A to 77H are diagrams each illustrating an electronic device to which a display device of one embodiment of the present invention can be applied.
Figure 77B:
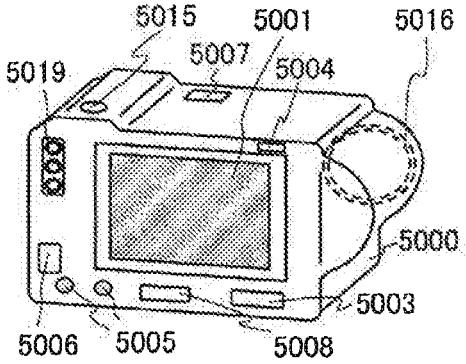
Figure 77C:
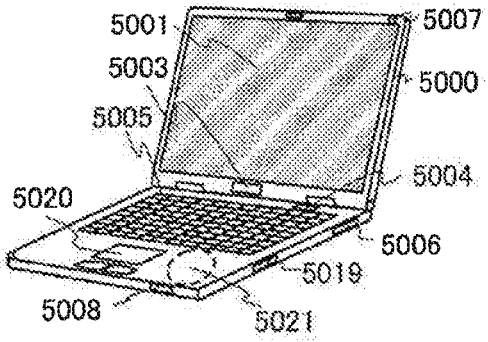
Figure 77D:
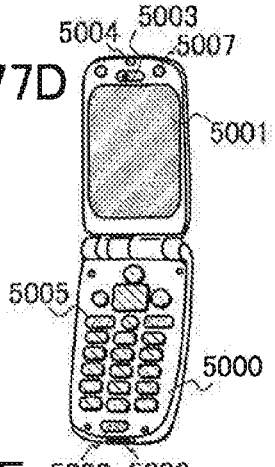

FIG. 76A illustrates a portable computer, which can include a switch 5009, an infrared port 5010, and the like in addition to the above objects. FIG. 76B illustrates a portable image reproducing device provided with a memory medium (e.g., a DVD reproducing device), which can include a second display portion 5002, a memory medium read portion 5011, and the like in addition to the above objects. FIG. 76C illustrates a goggle-type display, which can include the second display portion 5002, a support 5012, an earphone 5013, and the like in addition to the above objects. FIG. 76D illustrates a portable game machine, which can include the memory medium read portion 5011 and the like in addition to the above objects. FIG. 76E illustrates a digital camera with a television reception function, which can include an antenna 5014, a shutter button 5015, an image reception portion 5016, and the like in addition to the above objects. FIG. 76F illustrates a portable game machine, which can include the second display portion 5002, the memory medium read portion 5011, and the like in addition to the above objects. FIG. 76G illustrates a television receiver, which can include a tuner, an image processing portion, and the like in addition to the above objects. FIG. 76H illustrates a portable television receiver, which can include a charger 5017 capable of transmitting and receiving signals and the like in addition to the above objects. FIG. 77A illustrates a display, which can include a support base 5018 and the like in addition to the above objects. FIG. 77B illustrates a camera, which can include an external connection port 5019, a shutter button 5015, an image reception portion 5016, and the like in addition to the above objects. FIG. 77C illustrates a computer, which can include a pointing device 5020, the external connection port 5019, a reader/writer 5021, and the like in addition to the above objects. FIG. 77D illustrates a mobile phone, which can include a transmitter, a receiver, a tuner of 1 seg partial reception service for mobile phones and mobile terminals, and the like in addition to the above objects.

The electronic devices illustrated in FIGS. 76A to 76H and FIGS. 77A to 77D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 76A to 76H and FIGS. 77A to 77D are not limited them, and the electronic devices can have a variety of functions.

The electronic devices in this embodiment each include a display portion for displaying some kind of information.

Next, application examples of semiconductor devices are described.

Figure 77E:
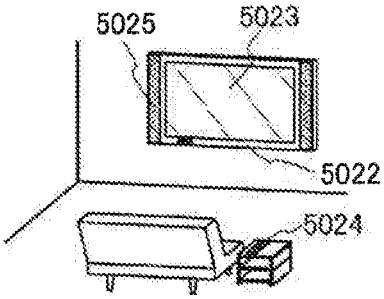

FIG. 77E illustrates an example in which a semiconductor device is incorporated in a building structure. FIG. 77E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 77F:
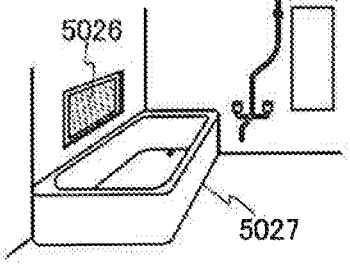

FIG. 77F illustrates another example in which a semiconductor device is incorporated in a building structure. A display module 5026 is incorporated in a prefabricated bath unit 5027, so that a bather can view the display module 5026.

Note that although this embodiment describes the wall and the prefabricated bath unit as examples of the building structures, this embodiment is not limited thereto. The semiconductor devices can be provided in a variety of building structures.

Next, examples in which semiconductor devices are incorporated in moving objects are described.

Figure 77G:
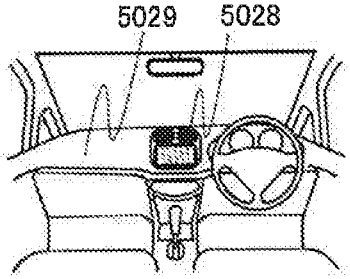

FIG. 77G illustrates an example in which a semiconductor device is incorporated in a car. A display module 5028 is incorporated in a car body 5029 of the car and can display information related to the operation of the car or information input from inside or outside of the car on demand. Note that the display module 5028 may have a navigation function.

Figure 77H:
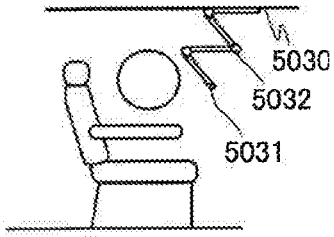

FIG. 77H illustrates an example in which a semiconductor device is incorporated in a passenger airplane. FIG. 77H illustrates a usage pattern when a display module 5031 is provided for a ceiling 5030 above a seat of the passenger airplane. The display module 5031 is incorporated in the ceiling 5030 through a hinge portion 5032, and a passenger can view the display module 5031 by stretching of the hinge portion 5032. The display module 5031 has a function of displaying information by the operation of the passenger.

Note that although bodies of a car and an airplane are illustrated as examples of moving objects in this embodiment, this embodiment is not limited to them. The semiconductor devices can be provided for a variety of objects such as two-wheeled vehicles, four-wheeled vehicles (including cars, buses, and the like), trains (including monorails, railroads, and the like), and vessels.

Note that in this specification and the like, in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted.

Note that in this specification and the like, in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted.

Note that in this specification and the like, a content described in at least a diagram (or may be part of the diagram) is disclosed as one embodiment of the invention, and one embodiment of the invention can be constituted. Thus, when a certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted.

This application is based on Japanese Patent Application serial No. 2011-145262 filed with Japan Patent Office on Jun. 30, 2011, the entire contents of which are hereby incorporated by reference.

What is claimed is:

1. A display module comprising:

*a display panel comprising:* a [semiconductor device] *pixel* comprising:

a first transistor;

a second transistor;

a third transistor;

a fourth transistor;

*a fifth transistor;* a capacitor; *and* a [load] *light-emitting element*; *and*

[a first line;

a second line; and a third line; and]

at least one of flexible printed circuit and printed circuit, wherein:

one of a source and a drain of the first transistor is electrically connected to [the first] *a power supply* line;

one of a source and a drain of the second transistor is electrically connected to the other of the source and the drain of the first transistor;

the other of the source and the drain of the second transistor is electrically connected to one of a source and a drain of the third transistor and one of a source and a drain of the fourth transistor;

a gate of the second transistor is electrically connected to [one] *a first* electrode of the capacitor;

[the other] *a second* electrode of the capacitor is [directly] *electrically* connected to the other of the source and the drain of the fourth transistor [and a first terminal of the load];

*the second electrode of the capacitor is electrically connected to the light-emitting element;*

[the other electrode of the capacitor is not directly connected to any other transistor other than the fourth transistor;]

the other of the source and the drain of the third transistor is electrically connected to [the second line; and] *a signal line*

[a second terminal of the load is electrically connected to the third line]

*one of a source and a drain of the fifth transistor is electrically connected to the gate of the second transistor;*

*the other of the source and the drain of the fifth transistor is electrically connected to the one of the source and the drain of the first transistor;*

*the first transistor, the second transistor, the third transistor, the fourth transistor and the fifth transistor each have a channel length direction defined as a direction of a shortest path between a source of the transistor and a drain of the transistor, and*

*the first transistor, the second transistor, the third transistor, the fourth transistor, and the fifth transistor are configured such that the first transistor, the second transistor, the third transistor, the fourth transistor and the fifth transistor have a same channel length direction.*

[2. The display module according to claim 1, further comprising a fifth transistor, wherein:

the one of the source and the drain of the second transistor is electrically connected to one of a source and a drain of the fifth transistor; and the gate of the second transistor is electrically connected to the other of the source and the drain of the fifth transistor.]

[3. The display module according to claim 1, wherein the load is a display element having a rectification property.]

[4. The display module according to claim 1, wherein the second line is a signal line.]

[5. The display module according to claim 1, wherein the first line is a power supply line.]

[6. The display module according to claim 1, wherein the third line is a cathode line.]

[7. A display device comprising the display module according to claim 1.]

8. An electronic device comprising the display module according to claim 1.

9. A display module comprising:

*a display panel comprising:* a [semiconductor device] *pixel* comprising:

a first transistor;

a second transistor;

a third transistor;

a fourth transistor;

*a fifth transistor;* a capacitor; *and* a [load] *light-emitting element*; *and*

[a first line;

a second line; and a third line; and]

at least one of flexible printed circuit and printed circuit, wherein:

one of a source and a drain of the first transistor is electrically connected to the [first] *power supply* line;

one of a source and a drain of the second transistor is electrically connected to the other of the source and the drain of the first transistor;

the other of the source and the drain of the second transistor is electrically connected to one of a source and a drain of the third transistor and one of a source and a drain of the fourth transistor;

a gate of the second transistor is electrically connected to [one] *a first* electrode of the capacitor;

[the other] *a second* electrode of the capacitor is [directly] *electrically* connected to the other of the source and the drain of the fourth transistor [and a first terminal of the load];

*the second electrode of the capacitor is electrically connected to the light-emitting element;*

[the other electrode of the capacitor is not directly connected to any other transistor other than the fourth transistor;]

the other of the source and the drain of the third transistor is electrically connected to the [second] *signal* line;

*one of a source and a drain of the fifth transistor is electrically connected to the gate of the second transistor;*

*the other of the source and the drain of the fifth transistor is electrically connected to the one of the source and the drain of the first transistor; and*

[a second terminal of the load is electrically connected to the third line; and each of the first transistor, the second transistor, the third transistor and the fourth] *the fifth* transistor [includes] *comprises* a channel formation region [containing] *comprising* an oxide semiconductor.

[10. The display module according to claim 9, further comprising a fifth transistor, wherein:

the one of the source and the drain of the second transistor is electrically connected to one of a source and a drain of the fifth transistor; and the gate of the second transistor is electrically connected to the other of the source and the drain of the fifth transistor.]

[11. The display module according to claim 9, wherein the load is a display element having a rectification property.]

[12. The display module according to claim 9, wherein the second line is a signal line.]

[13. The display module according to claim 9, wherein the first line is a power supply line.]

[14. The display module according to claim 9, wherein the third line is a cathode line.]

[15. A display device comprising the display module according to claim 9.]

16. An electronic device comprising the display module according to claim 9.

*17. A display module comprising:*

*a display panel comprising:*

*a pixel comprising:*

*a first transistor;*

*a second transistor;*

*a third transistor;*

*a fourth transistor;*

*a fifth transistor;*

*a first capacitor;*

*a second capacitor; and*

*a light-emitting element; and*

*at least one of flexible printed circuit and printed circuit,*

*wherein:*

*one of a source and a drain of the first transistor is electrically connected to a power supply line;*

*one of a source and a drain of the second transistor is electrically connected to the other of the source and the drain of the first transistor;*

*the other of the source and the drain of the second transistor is electrically connected to one of a source and a drain of the third transistor and one of a source and a drain of the fourth transistor;*

*a gate of the second transistor is electrically connected to a first electrode of the first capacitor;*

*a second electrode of the first capacitor is electrically connected to the other of the source and the drain of the fourth transistor;*

*the second electrode of the first capacitor is electrically connected to the light-emitting element;*

*a first electrode of the second capacitor is electrically connected to the second electrode of the first capacitor,*

*the other of the source and the drain of the third transistor is electrically connected to a signal line;*

*one of a source and a drain of the fifth transistor is electrically connected to the gate of the second transistor; and*

*the other of the source and the drain of the fifth transistor is electrically connected to the one of the source and the drain of the first transistor.*

*18. The display panel according to claim 17,*

*wherein a second electrode of the second capacitor is electrically connected to a cathode line.*

*19. An electronic device comprising the display module according to claim 17.*

* * * * *